(12) United States Patent
Johnson et al.

(10) Patent No.: US 9,660,293 B2
(45) Date of Patent: *May 23, 2017

(54) METHOD AND SYSTEM FOR BATTERY PROTECTION

(71) Applicant: Milwaukee Electric Tool Corporation, Brookfield, WI (US)

(72) Inventors: Todd W. Johnson, Wauwatosa, WI (US); Jay J. Rosenbecker, Menonomee Falls, WI (US); Gary D. Meyer, Waukesha, WI (US); Jeffrey M. Zeiler, Pewaukee, WI (US); Kevin L. Glasgow, Lomira, WI (US); Jonathan A. Zick, Waukesha, WI (US); Jeffrey M. Brozek, Whitefish Bay, WI (US); Karl F. Scheucher, Waite Hill, OH (US)

(73) Assignee: MILWAUKEE ELECTRIC TOOL CORPORATION, Brookfield, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/799,629

(22) Filed: Jul. 15, 2015

(65) Prior Publication Data

US 2015/0318581 A1 Nov. 5, 2015

Related U.S. Application Data

(63) Continuation of application No. 13/889,036, filed on May 7, 2013, now Pat. No. 9,112,248, which is a
(Continued)

(51) Int. Cl.
*H02J 7/00* (2006.01)
*H02J 7/04* (2006.01)
(Continued)

(52) U.S. Cl.
CPC ..... *H01M 10/0525* (2013.01); *H01M 2/1055* (2013.01); *H01M 10/425* (2013.01);
(Continued)

(58) Field of Classification Search
USPC ........ 320/119, 125, 124, 128, 116, 132, 113, 320/114, 115, 134, 145, 121, 122;
(Continued)

(56) References Cited

U.S. PATENT DOCUMENTS 3,816,805 A 6/1974 Terry
3,886,426 A 5/1975 Daggett
(Continued)

FOREIGN PATENT DOCUMENTS

CA 2231260 6/1999
DE 3637669 5/1988
(Continued)

OTHER PUBLICATIONS

IEEE, 7th Edition, 2000, p. 91.
(Continued)

*Primary Examiner* — Alexis A Boateng
(74) *Attorney, Agent, or Firm* — Michael Best & Friedrich LLP

(57) ABSTRACT

An electrical combination. The combination comprises a hand held power tool, a battery pack and a controller. The battery pack includes a battery pack housing connectable to and supportable by the hand held power tool, a plurality of battery cells supported by the battery pack housing, each of the plurality of battery cells having a lithium-based chemistry, being individually tapped and having an individual state of charge. A communication path is provided by a battery pack sense terminal and a power tool sense terminal. The controller is operable to monitor a state of charge of a number of battery cells less than the plurality of battery cells
(Continued)

and to generate a signal based on the monitored state of charge of the number of battery cells less than the plurality of battery cells, the signal being operable to control the operation of the hand held power tool.

11 Claims, 105 Drawing Sheets

Related U.S. Application Data continuation of application No. 12/558,919, filed on Sep. 14, 2009, now Pat. No. 8,436,584, which is a continuation of application No. 11/138,070, filed on May 24, 2005, now Pat. No. 7,589,500, which is a continuation-in-part of application No. 10/720,027, filed on Nov. 20, 2003, now Pat. No. 7,157,882, and a continuation-in-part of application No. 10/719,680, filed on Nov. 20, 2003, now Pat. No. 7,176,654, and a continuation-in-part of application No. 10/721,800, filed on Nov. 24, 2003, now Pat. No. 7,253,585.

(60) Provisional application No. 60/574,278, filed on May 24, 2004, provisional application No. 60/574,616, filed on May 25, 2004, provisional application No. 60/582,138, filed on Jun. 22, 2004, provisional application No. 60/582,728, filed on Jun. 24, 2004, provisional application No. 60/582,730, filed on Jun. 24, 2004, provisional application No. 60/612,352, filed on Sep. 22, 2004, provisional application No. 60/626,013, filed on Nov. 5, 2004, provisional application No. 60/626,230, filed on Nov. 9, 2004, provisional application No. 60/643,396, filed on Jan. 12, 2005, provisional application No. 60/428,358, filed on Nov. 22, 2002, provisional application No. 60/428,450, filed on Nov. 22, 2002, provisional application No. 60/428,452, filed on Nov. 22, 2002, provisional application No. 60/440,692, filed on Jan. 17, 2003, provisional application No. 60/440,693, filed on Jan. 17, 2003, provisional application No. 60/523,716, filed on Nov. 19, 2003, provisional application No. 60/523,712, filed on Nov. 19, 2003, provisional application No. 60/428,358, filed on Nov. 22, 2002, provisional application No. 60/428,450, filed on Nov. 22, 2002, provisional application No. 60/428,452, filed on Nov. 22, 2002, provisional application No. 60/440,692, filed on Jan. 17, 2003, provisional application No. 60/440,693, filed on Jan. 17, 2003, provisional application No. 60/523,716, filed on Nov. 19, 2003, provisional application No. 60/523,712, filed on Nov. 19, 2003, provisional application No. 60/428,356, filed on Nov. 22, 2002, provisional application No. 60/428,358, filed on Nov. 22, 2002, provisional application No. 60/428,450, filed on Nov. 22, 2002, provisional application No. 60/428,452, filed on Nov. 22, 2002, provisional application No. 60/440,692, filed on Jan. 17, 2003, provisional application No. 60/440,693, filed on Jan. 17, 2003, provisional application No. 60/523,712, filed on Nov. 19, 2003, provisional application No. 60/523,716, filed on Nov. 19, 2003.

(51) Int. Cl.
| | |
|---|---|
| *H01M 10/0525* | (2010.01) |
| *H01M 10/42* | (2006.01) |
| *H01M 2/10* | (2006.01) |
| *H01M 10/48* | (2006.01) |

(52) U.S. Cl.
CPC ..... *H01M 10/4257* (2013.01); *H01M 10/482* (2013.01); *H01M 2010/4271* (2013.01); *H01M 2010/4278* (2013.01); *H01M 2200/00* (2013.01); *H01M 2220/30* (2013.01)

(58) Field of Classification Search
USPC ....... 324/427, 428, 431, 433, 426, 429, 434, 324/435, 436
See application file for complete search history.

(56) References Cited

U.S. PATENT DOCUMENTS

| | | |
|---|---|---|
| 4,056,764 A | 11/1977 | Endo et al. |
| 4,845,419 A | 7/1989 | Hacker |
| 4,893,067 A | 1/1990 | Bhagwat et al. |
| 4,937,528 A | 6/1990 | Palanisamy |
| 4,973,896 A | 11/1990 | Shiga et al. |
| 5,153,449 A | 10/1992 | Crook et al. |
| 5,200,688 A | 4/1993 | Patino et al. |
| 5,206,097 A | 4/1993 | Burns et al. |
| 5,268,630 A | 12/1993 | Bhagwat et al. |
| 5,272,380 A | 12/1993 | Clokie |
| 5,280,229 A | 1/1994 | Faude et al. |
| 5,332,927 A | 7/1994 | Paul et al. |
| 5,350,993 A | 9/1994 | Toya et al. |
| 5,355,073 A | 10/1994 | Nguyen |
| 5,371,453 A | 12/1994 | Fernandez |
| 5,391,972 A | 2/1995 | Gardner et al. |
| 5,401,592 A | 3/1995 | Gilpin et al. |
| 5,498,950 A | 3/1996 | Ouwerkerk |
| 5,510,690 A | 4/1996 | Tanaka et al. |
| 5,545,491 A | 8/1996 | Farley |
| 5,547,775 A | 8/1996 | Eguchi et al. |
| 5,557,192 A | 9/1996 | Tamai |
| 5,563,496 A | 10/1996 | McClure |
| 5,567,542 A | 10/1996 | Bae |
| 5,572,108 A | 11/1996 | Windes |
| 5,576,612 A | 11/1996 | Garrett |
| 5,580,679 A | 12/1996 | Tanaka |
| 5,598,085 A | 1/1997 | Hasler |
| 5,606,242 A | 2/1997 | Hull et al. |
| 5,646,503 A | 7/1997 | Stockstad |
| 5,684,387 A | 11/1997 | Patino |
| 5,691,620 A | 11/1997 | Nagai et al. |
| 5,691,623 A | 11/1997 | Tsantilis |
| 5,708,351 A | 1/1998 | Takamoro |
| 5,744,937 A | 4/1998 | Cheon |
| 5,757,163 A | 5/1998 | Brotto et al. |
| 5,789,900 A | 8/1998 | Hasegawa et al. |
| 5,792,573 A | 8/1998 | Pitzen et al. |
| 5,795,664 A | 8/1998 | Kelly |
| 5,811,890 A | 9/1998 | Hamamoto |
| 5,818,201 A | 10/1998 | Stockstad et al. |
| 5,835,351 A | 11/1998 | Ulanski et al. |
| 5,871,859 A | 2/1999 | Parise |
| 5,872,444 A | 2/1999 | Nagano et al. |
| 5,894,212 A | 4/1999 | Balogh |
| 5,945,811 A | 8/1999 | Hasegawa et al. |
| 5,963,019 A | 10/1999 | Cheon |
| 5,977,746 A | 11/1999 | Hershberger et al. |
| 5,986,430 A | 11/1999 | Fernandez et al. |
| 5,994,875 A | 11/1999 | Lee |
| 5,998,966 A | 12/1999 | Gaza |
| 5,998,967 A | 12/1999 | Umeki et al. |
| 5,998,969 A | 12/1999 | Tsuji et al. |
| 6,002,237 A | 12/1999 | Gaza |
| 6,010,800 A | 1/2000 | Stadnick et al. |
| 6,031,302 A | 2/2000 | Levesque |
| 6,040,683 A | 3/2000 | Mottier |
| 6,064,179 A | 5/2000 | Ito et al. |
| 6,072,300 A | 6/2000 | Tsuji |
| 6,074,775 A | 6/2000 | Gartstein |
| 6,084,523 A | 7/2000 | Gelnovatch et al. |
| 6,104,162 A | 8/2000 | Sainsbury et al. |
| 6,124,698 A | 9/2000 | Sakakibara |

(56) References Cited

U.S. PATENT DOCUMENTS

| | | |
|---|---|---|
| 6,144,186 A | 11/2000 | Thandiwe et al. |
| 6,191,560 B1 | 2/2001 | Sakakibara |
| 6,198,254 B1 | 3/2001 | Satake et al. |
| 6,204,640 B1 | 3/2001 | Sakakibara |
| 6,222,343 B1 | 4/2001 | Crisp et al. |
| 6,229,280 B1 | 5/2001 | Sakoh et al. |
| 6,232,747 B1 | 5/2001 | Takahashi et al. |
| 6,235,427 B1 | 5/2001 | Idota et al. |
| 6,237,698 B1 | 5/2001 | Carrier et al. |
| 6,268,710 B1 | 7/2001 | Koga |
| 6,275,004 B1 | 8/2001 | Tamai et al. |
| 6,286,609 B1 | 9/2001 | Carrier et al. |
| 6,294,894 B1 | 9/2001 | Ochiai et al. |
| 6,296,065 B1 | 10/2001 | Carrier |
| 6,313,611 B1 | 11/2001 | Mowry et al. |
| 6,324,339 B1 | 11/2001 | Hudson et al. |
| 6,326,767 B1 | 12/2001 | Small et al. |
| 6,326,768 B2 | 12/2001 | Nagai et al. |
| 6,329,788 B1 | 12/2001 | Bailey, Jr. et al. |
| 6,329,796 B1 | 12/2001 | Popescu |
| 6,337,557 B1 | 1/2002 | Kates et al. |
| 6,362,600 B2 | 3/2002 | Sakakibara |
| 6,369,546 B1 | 4/2002 | Canter |
| 6,373,226 B1 | 4/2002 | Itou et al. |
| 6,377,024 B1 | 4/2002 | Choy |
| 6,388,426 B1 | 5/2002 | Yokoo et al. |
| 6,433,510 B1 | 8/2002 | Ribellino et al. |
| 6,440,602 B1 | 8/2002 | Morita |
| 6,452,362 B1 | 9/2002 | Choo |
| 6,456,035 B1 | 9/2002 | Crisp et al. |
| 6,458,488 B1 | 10/2002 | Honbo et al. |
| 6,489,751 B2 | 12/2002 | Small et al. |
| 6,501,250 B2 | 12/2002 | Bito et al. |
| 6,509,114 B1 | 1/2003 | Nakai et al. |
| 6,518,731 B2 | 2/2003 | Thomas et al. |
| 6,522,100 B2 | 2/2003 | Hansford |
| 6,552,904 B2 | 4/2003 | Fung |
| 6,571,091 B1 | 5/2003 | Janssen et al. |
| 6,577,104 B2 | 6/2003 | Sakakibara |
| 6,803,766 B2 | 10/2004 | Kobayashi et al. |
| 6,926,992 B2 | 8/2005 | Isozaki et al. |
| 6,930,467 B2 | 8/2005 | Suzuki |
| 6,948,078 B2 | 9/2005 | Odaohhara |
| 6,983,212 B2 | 1/2006 | Burns |
| 7,039,150 B1 | 5/2006 | Drori |
| 7,045,990 B2 | 5/2006 | Takimoto et al. |
| 7,273,159 B2 | 9/2007 | Brotto |
| 7,521,892 B2 | 4/2009 | Funabashi et al. |
| 7,589,500 B2 | 9/2009 | Johnson et al. |
| 8,436,584 B2 | 5/2013 | Johnson et al. |
| 8,822,067 B2 * | 9/2014 | Johnson .................. B25F 5/00 429/149 |
| 9,112,248 B2 | 8/2015 | Johnson et al. |
| 2001/0045803 A1 | 11/2001 | Cencur |
| 2002/0079867 A1 | 6/2002 | Sakakibara et al. |
| 2002/0125860 A1 | 9/2002 | Schworm et al. |
| 2003/0027037 A1 | 2/2003 | Moores, Jr. et al. |
| 2003/0044689 A1 | 3/2003 | Miyazaki et al. |
| 2003/0096158 A1 | 5/2003 | Takano et al. |
| 2003/0129457 A1 | 7/2003 | Kawai et al. |
| 2003/0151393 A1 | 8/2003 | Takano |
| 2003/0222619 A1 | 12/2003 | Formenti et al. |
| 2004/0135545 A1 | 7/2004 | Fowler et al. |
| 2004/0174138 A1 | 9/2004 | Moores, Jr. et al. |
| 2005/0258801 A9 | 11/2005 | Johnson et al. |
| 2005/0258805 A1 | 11/2005 | Thomas et al. |
| 2006/0097699 A1 | 5/2006 | Kamenoff |
| 2007/0108941 A1 | 5/2007 | Sainomoto et al. |
| 2008/0238370 A1 | 10/2008 | Carrier et al. |

FOREIGN PATENT DOCUMENTS

| | | |
|---|---|---|
| DE | 19617805 | 11/1996 |
| DE | 19705192 | 10/1997 |
| DE | 10153083 | 5/2003 |
| EP | 240883 | 10/1987 |
| EP | 265144 | 4/1988 |
| EP | 419806 | 4/1991 |
| EP | 621990 | 11/1994 |
| EP | 669692 | 2/1995 |
| EP | 940864 | 8/1995 |
| EP | 767524 | 4/1997 |
| EP | 1039612 | 9/2000 |
| EP | 1191616 | 3/2002 |
| GB | 2289581 | 11/1995 |
| GB | 2293060 | 3/1996 |
| GB | 2336955 | 11/1999 |
| GB | 2354891 | 4/2001 |
| GB | 2354892 | 4/2001 |
| JP | 07-023532 | 1/1995 |
| JP | 07-192772 | 7/1995 |
| JP | 8196042 | 7/1996 |
| JP | 9074689 | 3/1997 |
| JP | 10-112301 | 4/1998 |
| JP | 11-052034 | 2/1999 |
| JP | 11-126585 | 5/1999 |
| JP | 11-283677 | 10/1999 |
| JP | 2000030751 | 1/2000 |
| JP | 200067825 | 3/2000 |
| JP | 2000102185 | 4/2000 |
| JP | 2000102195 | 4/2000 |
| JP | 2000270488 | 9/2000 |
| JP | 2000-294299 | 10/2000 |
| JP | 2001112182 | 4/2001 |
| JP | 2001218376 | 8/2001 |
| JP | 2001283934 | 10/2001 |
| JP | 2002008732 | 1/2002 |
| JP | 2002093466 | 3/2002 |
| JP | 2002-315198 | 10/2002 |
| JP | 2002369400 | 12/2002 |
| RO | 116233 | 11/2000 |
| WO | WO 93/07735 | 4/1993 |
| WO | WO 93/14548 | 7/1993 |
| WO | WO 96/21954 | 7/1996 |
| WO | WO 99/50946 | 10/1999 |
| WO | WO 99/63613 | 12/1999 |
| WO | WO 00/49699 | 8/2000 |
| WO | WO 01/03231 | 1/2001 |

OTHER PUBLICATIONS

Makstar Ni-MH Battery System, Makita U.S.A., Inc., 1999-2002, 8 pages, La Mirada, CA USA.

Richards, Paul W., etal., "A Computer Controlled Power Tool for the Servicing of the Hubble Space Telescope," May 15, 1996, 30th Aerospace Mechanisms Symposium, p. 325-328.

Tailor, Devin, "Pistol Grip Tool Technician Manual," Sep. 1997, p. 42-46.

"Hubble Servicing Calls for Dazzling Array of Crew Aids and Tools," Spaceport News, Feb. 14, 1997, p. 1, 8.

* cited by examiner

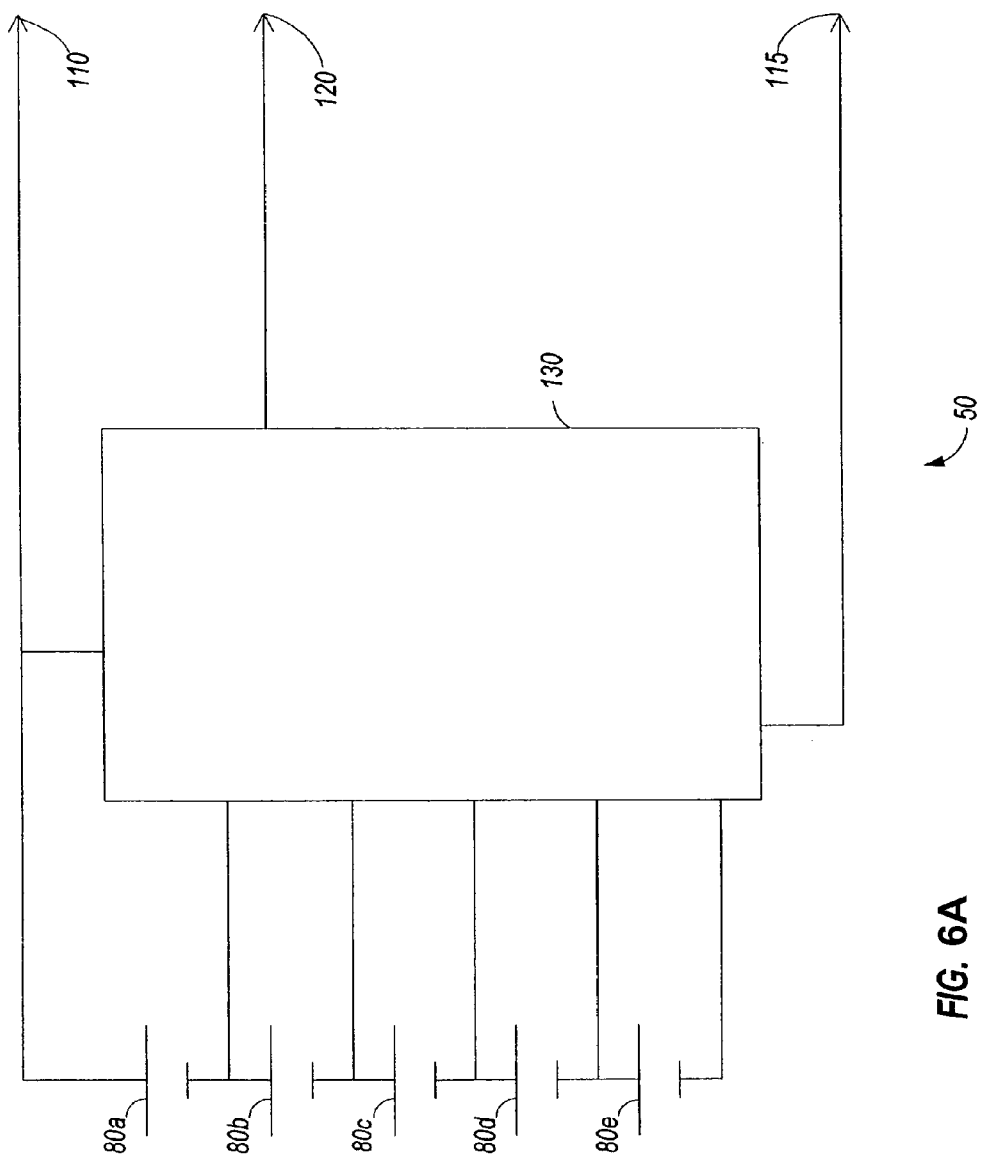

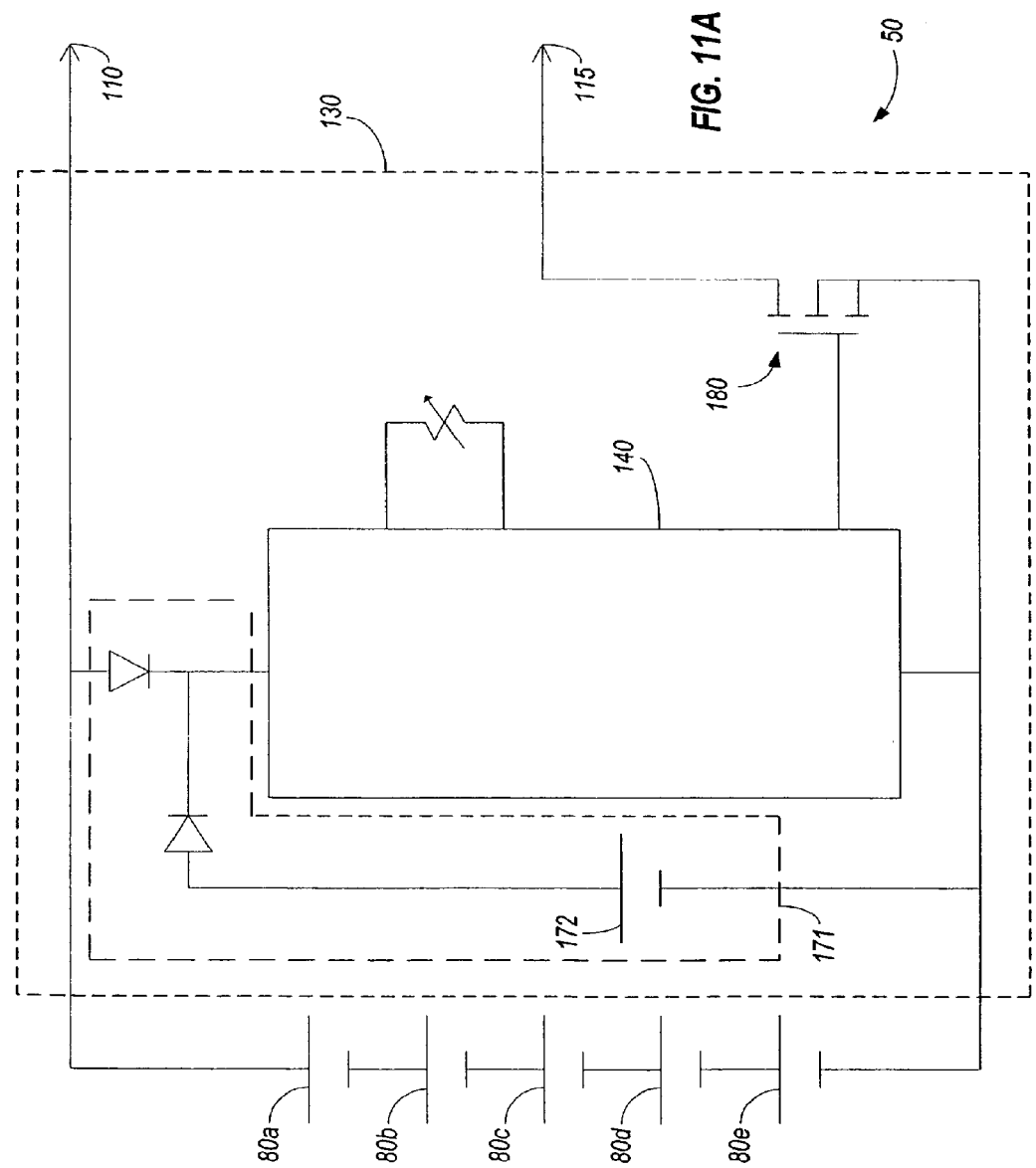

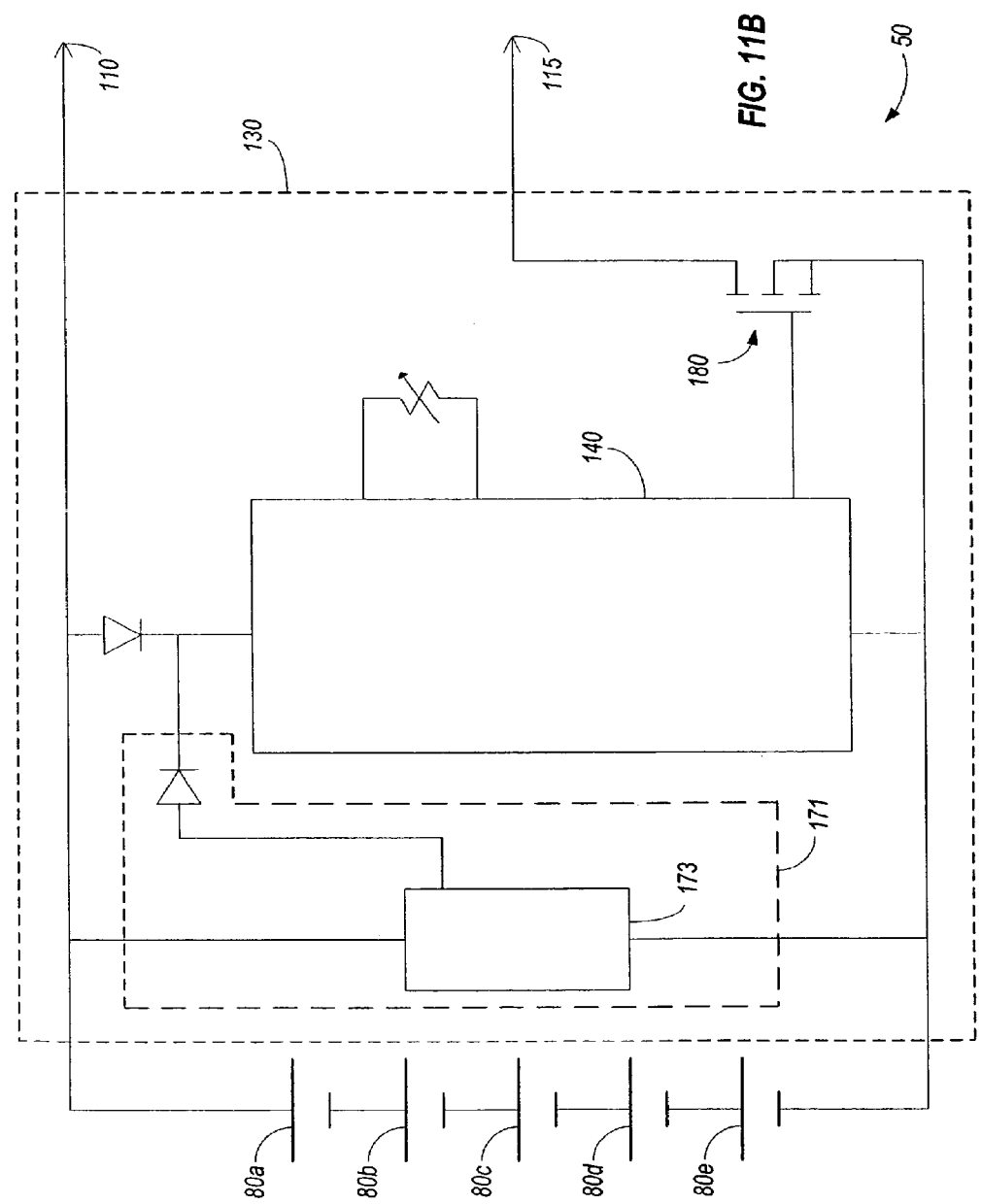

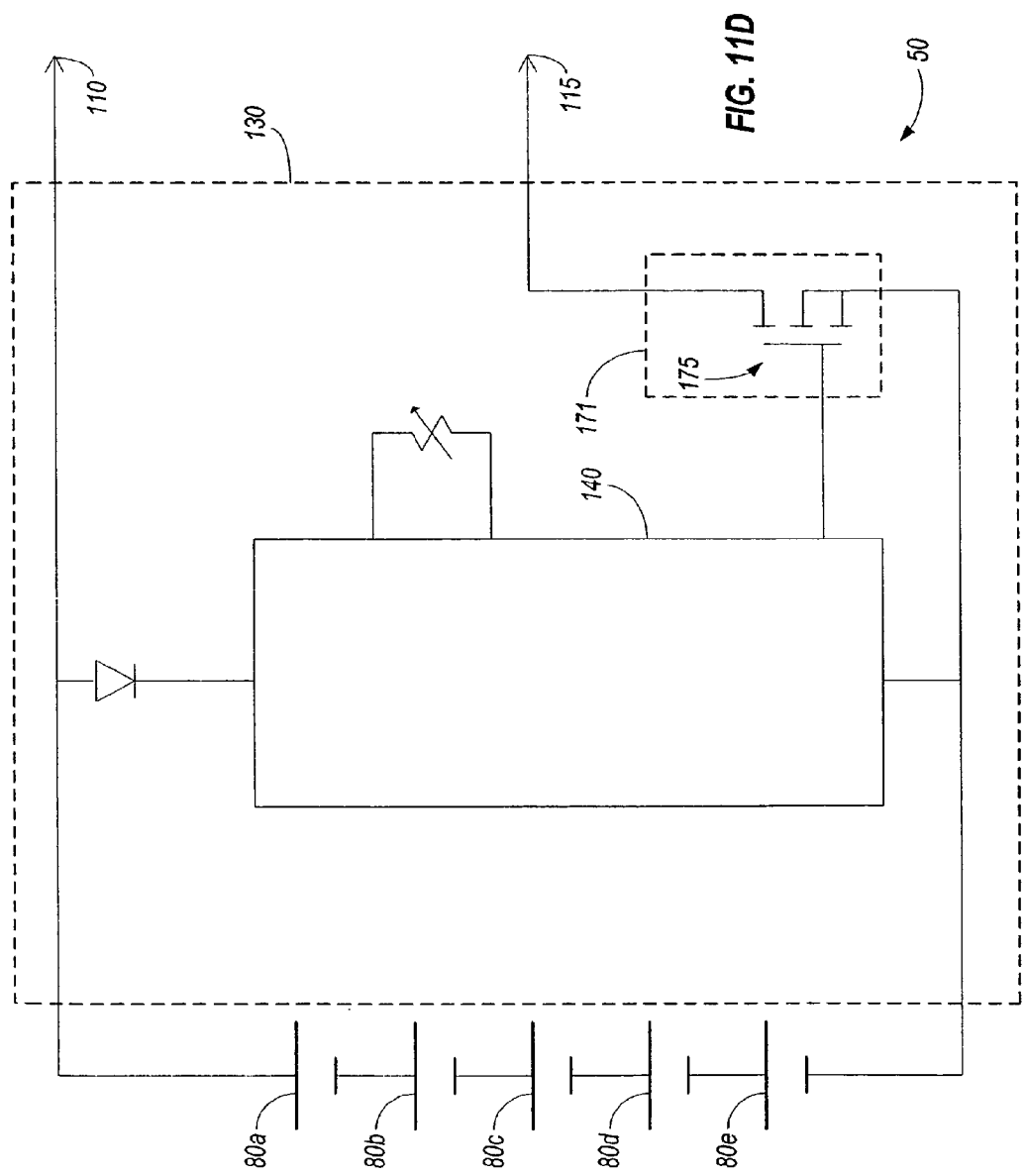

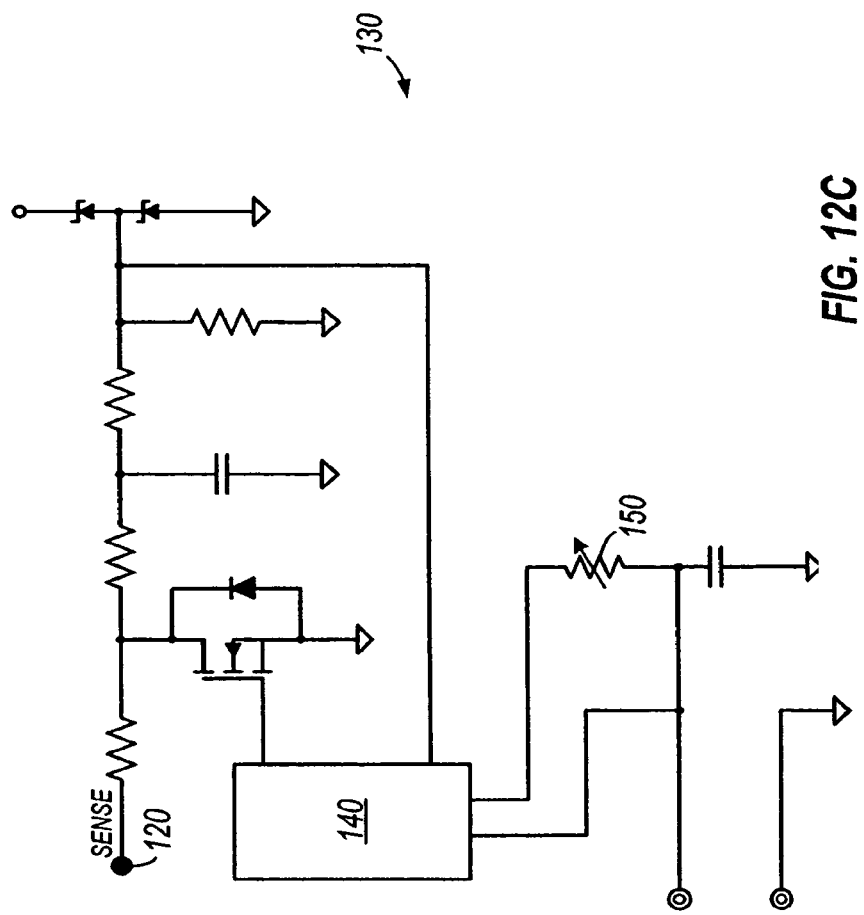

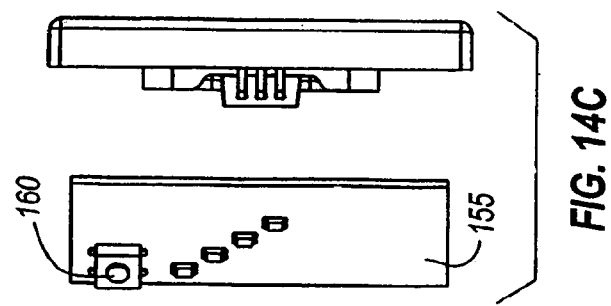
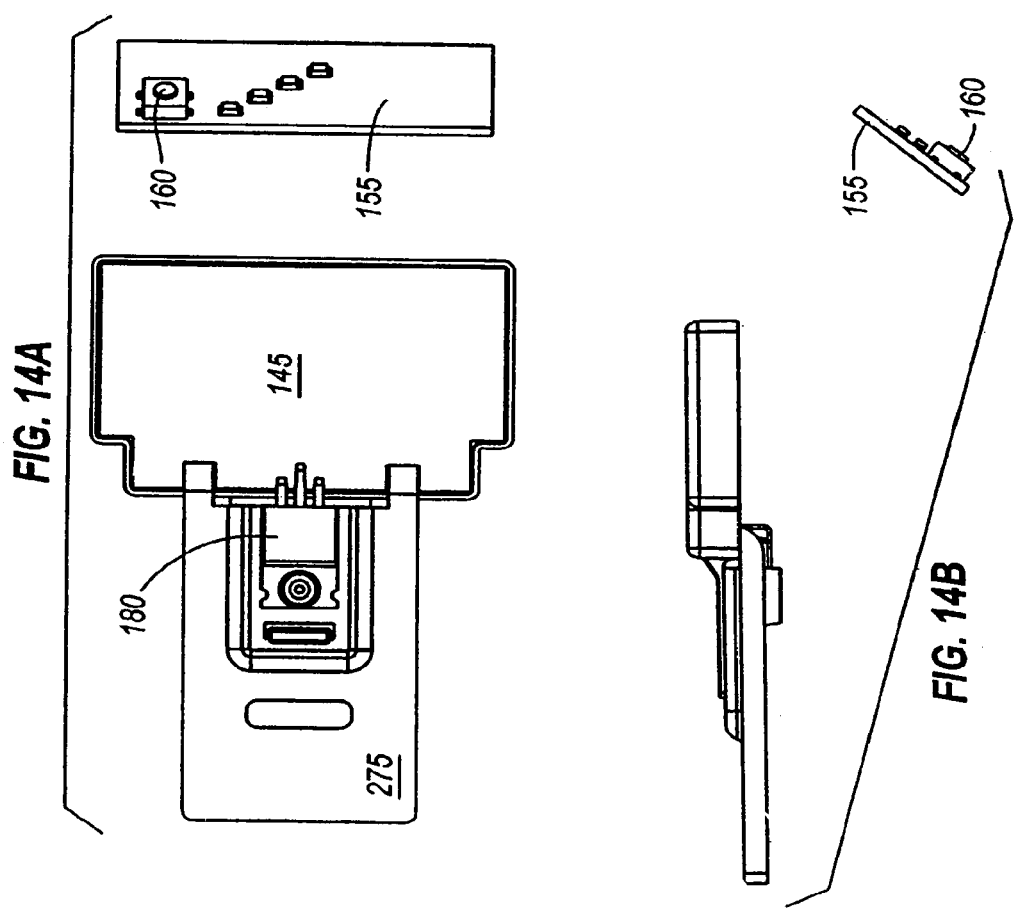

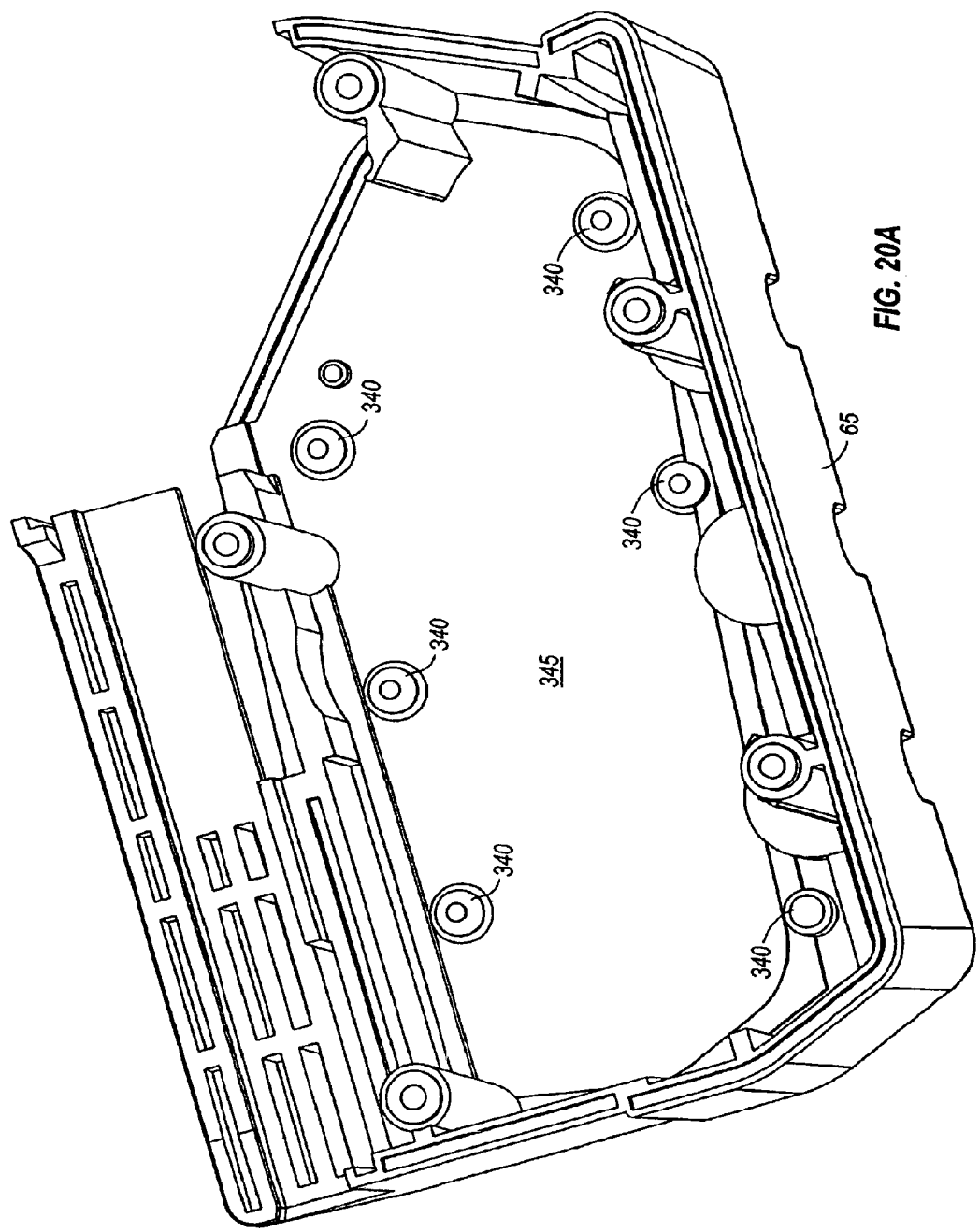

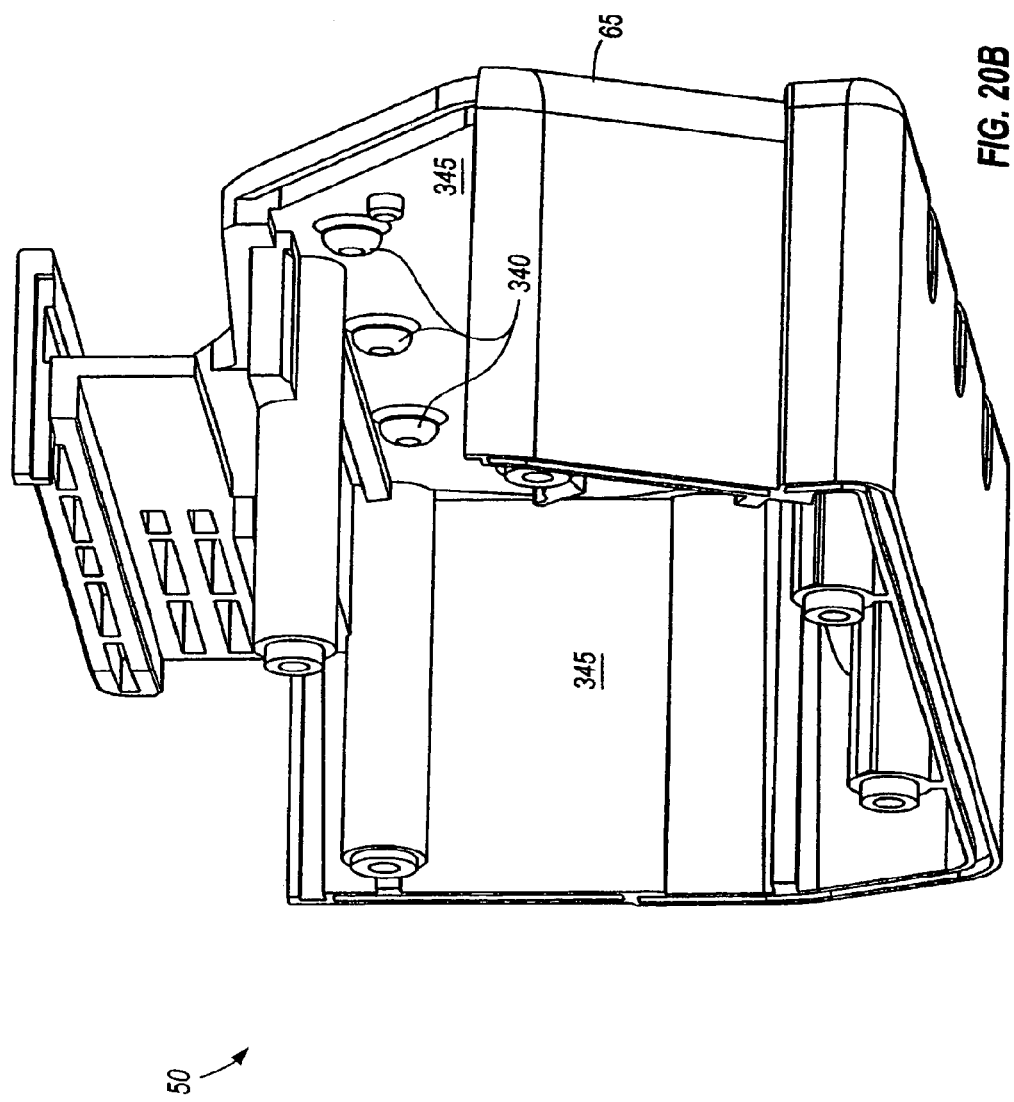

METHOD AND SYSTEM FOR BATTERY PROTECTION

RELATED APPLICATIONS

This application is a continuation of U.S. patent application Ser. No. 13/889,036, filed May 7, 2013, which is a continuation of U.S. patent application Ser. No. 12/558,919, filed Sep. 14, 2009, now U.S. Pat. No. 8,436,584, which is a continuation of U.S. patent application Ser. No. 11/138,070, filed on May 24, 2005, now U.S. Pat. No. 7,589,500, which claims the benefit of U.S. Provisional Patent Application No. 60/574,278, filed on May 24, 2004, U.S. Provisional Patent Application No. 60/574,616, filed on May 25, 2004, U.S. Provisional Patent Application No. 60/582,138, filed on Jun. 22, 2004, U.S. Provisional Patent Application No. 60/582,728, filed on Jun. 24, 2004, U.S. Provisional Patent Application No. 60/582,730, filed on Jun. 24, 2004, U.S. Provisional Patent Application No. 60/612,352, filed on Sep. 22, 2004, U.S. Provisional Patent Application No. 60/626,013, filed on Nov. 5, 2004, U.S. Provisional Patent Application No. 60/626,230, filed on Nov. 9, 2004, and U.S. Provisional Patent Application No. 60/643,396, filed on Jan. 12, 2005, the entire contents of all of which are hereby incorporated by reference.

This application, through U.S. patent application Ser. No. 11/138,070, also claims the benefit of prior filed U.S. patent application Ser. No. 10/720,027, filed on Nov. 20, 2003, which claims the benefit of prior filed U.S. U.S. Provisional Patent Application No. 60/428,358, filed on Nov. 22, 2002, U.S. Provisional Patent Application No. 60/428,450, filed on Nov. 22, 2002, U.S. Provisional Patent Application No. 60/428,452, filed on Nov. 22, 2002, U.S. Provisional Patent Application No. 60/440,692, filed on Jan. 17, 2003, U.S. Provisional Patent Application No. 60/440,693, filed on Jan. 17, 2003, U.S. Provisional Patent Application No. 60/523,716, filed on Nov. 19, 2003, and U.S. Provisional Patent Application No. 60/523,712, filed on Nov. 19, 2003, the entire contents of all of which are hereby incorporated by reference.

This application, through U.S. patent application Ser. No. 11/138,070, also claims the benefit of U.S. patent application Ser. No. 10/719,680, filed on Nov. 20, 2003, which claims the benefit of prior filed U.S. U.S. Provisional Patent Application No. 60/428,358, filed on Nov. 22, 2002, U.S. Provisional Patent Application No. 60/428,450, filed on Nov. 22, 2002, U.S. Provisional Patent Application No. 60/428,452, filed on Nov. 22, 2002, U.S. Provisional Patent Application No. 60/440,692, filed on Jan. 17, 2003, U.S. Provisional Patent Application No. 60/440,693, filed on Jan. 17, 2003, U.S. Provisional Patent Application No. 60/523,716, filed on Nov. 19, 2003, and U.S. Provisional Patent Application No. 60/523,712, filed on Nov. 19, 2003, the entire contents of all of which are hereby incorporated by reference.

This application, through U.S. patent application Ser. No. 11/138,070, also claims the benefit of U.S. patent application Ser. No. 10/721,800, filed on Nov. 24, 2003, which claims the benefit of U.S. U.S. Provisional Patent Application No. 60/428,356, filed on Nov. 22, 2002, U.S. Provisional Patent Application No. 60/428,358, filed on Nov. 22, 2002, U.S. Provisional Patent Application No. 60/428,450, filed on Nov. 22, 2002, U.S. Provisional Patent Application No. 60/428,452, filed on Nov. 22, 2002, U.S. Provisional Patent Application No. 60/440,692, filed on Jan. 17, 2003, U.S. Provisional Patent Application No. 60/440,693, filed on Jan. 17, 2003, U.S. Provisional Patent Application No. 60/523,712, filed on Nov. 19, 2003, and U.S. Provisional Patent Application No. 60/523,716, filed on Nov. 19, 2003, the entire contents of all of which are hereby incorporated by reference.

This application is related to U.S. patent application Ser. No. 13/745,314, filed on Jan. 18, 2013, and to U.S. patent application Ser. No. 13/745,349, filed on Jan. 18, 2013, the entire contents of both of which are hereby incorporated by reference.

FIELD OF THE INVENTION

The present invention generally relates to a method and system for battery protection and, more particularly, to a method and system for power tool battery protection.

BACKGROUND OF THE INVENTION

Cordless power tools are typically powered by portable battery packs. These battery packs range in battery chemistry and nominal voltage and can be used to power numerous tools and electrical devices. Typically, the battery chemistry of a power tool battery is either Nickel-cadmium ("NiCd"), Nickel-Metal Hydride ("NiMH") or lead-acid. Such chemistries are known to be robust and durable.

SUMMARY OF THE INVENTION

Some battery chemistries (such as, for example, Lithium ("Li"), Lithium-ion ("Li-ion") and other Li-based chemistries) require precise charging schemes and charging operations with controlled discharge. Insufficient charging schemes and uncontrolled discharging schemes may produce excessive heat build-up, excessive overcharged conditions and/or excessive overdischarged conditions. These conditions and build-ups can cause irreversible damage to the batteries and can severely impact the battery's capacity. Various factors, such as, for example, excessive heat, can cause one or more cells within the battery pack to become imbalanced, that is, to have a present state of charge that is substantially lower than the remaining cells in the pack. Imbalanced cells can severely impact the performance of the battery pack (e.g., run-time and/or voltage output) and can shorten the life of the battery pack.

The present invention provides a system and method for battery protection. In one construction and in some aspects, the invention provides a system and method for monitoring the temperature of a battery. In another construction and in some aspects, the invention provides a system and method for transferring heat within a battery pack. In another construction and in some aspects, the invention provides a system and method for transferring heat within a battery pack via a phase change material. In a further construction and in some aspects, the invention provides a system and method for monitoring cell imbalance. In yet another construction and in some aspects, the invention provides a system and method for controlling the operation of an electrical device based on a battery's temperature and/or cell imbalance. In another construction and in some aspects, the invention provides a system and method for determining the present state of charge of the battery and indicating or displaying a battery's present state of charge. In yet another construction and in some aspects, the invention provides a system and method for interrupting discharge current based on battery temperature.

In one embodiment, the invention provides a battery pack. The battery pack includes a housing, a plurality of terminals, a plurality of lithium-based battery cells, and a controller.

The plurality of terminals electrically connect to an electrical device. The electrical device is able to support the battery pack. Each of the plurality of battery cells are individually tapped and have an individual state of charge. The plurality of terminals includes a sense terminal. The controller is operable to monitor a characteristic of each of the plurality of battery cells and to communicate the monitored characteristic of each of the plurality of battery cells to the electrical device via the sense terminal.

Independent features and independent advantages of the invention will become apparent to those skilled in the art upon review of the detailed description and drawings.

BRIEF DESCRIPTION OF THE DRAWINGS

FIG. 6A is a schematic view of a battery, such as one of the batteries shown in FIGS. 1-3.

FIG. 11A is still another schematic view of a battery, such as one of the batteries shown in FIGS. 1-3.

FIG. 11B is still another schematic view of a battery, such as one of the batteries shown in FIGS. 1-3.

FIG. 11D is still another schematic view of a battery, such as one of the batteries shown in FIGS. 1-3.

FIGS. 12A-C are still other schematic views of a battery, such as one of the batteries shown in FIGS. 1-3.

FIGS. 14A-E includes views of portions of the battery shown in FIG. 13A.

FIGS. 20A-B are perspective cross-sectional views of a portion of a battery, such as one of the batteries shown in FIGS. 1-3, with portions removed.

Before any embodiments of the invention are explained in detail, it is to be understood that the invention is not limited in its application to the details of construction and the arrangement of components set forth in the following description or illustrated in the following drawings. The invention is capable of other constructions and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. The terms "mounted," "connected," and "coupled" are used broadly and encompass both direct and indirect mounting, connecting and coupling. Further, "connected" and "coupled" are not restricted to physical or mechanical connections or couplings and can include electrical connections and couplings, whether direct or indirect.

DETAILED DESCRIPTION

Figure 1:
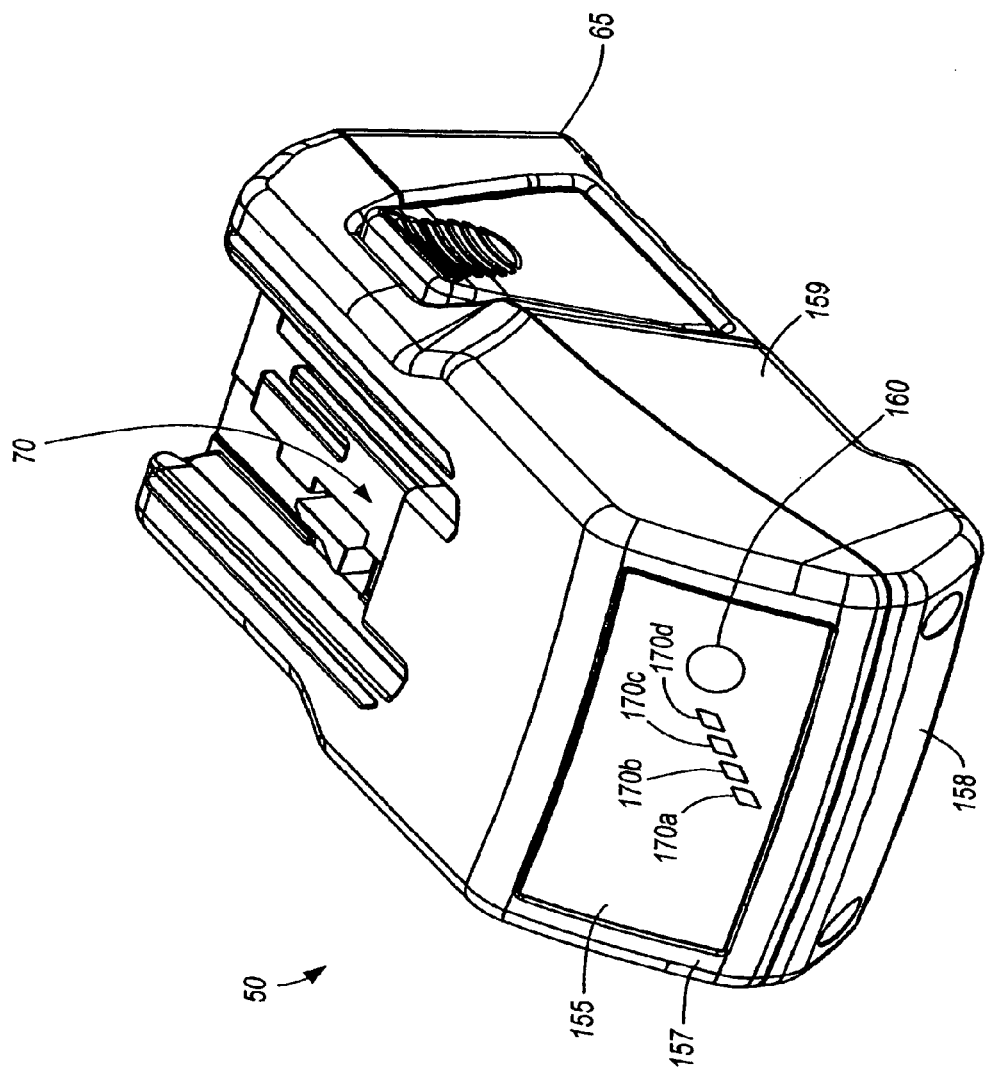
FIG. 1 is a perspective view of a battery.
Figure 2:
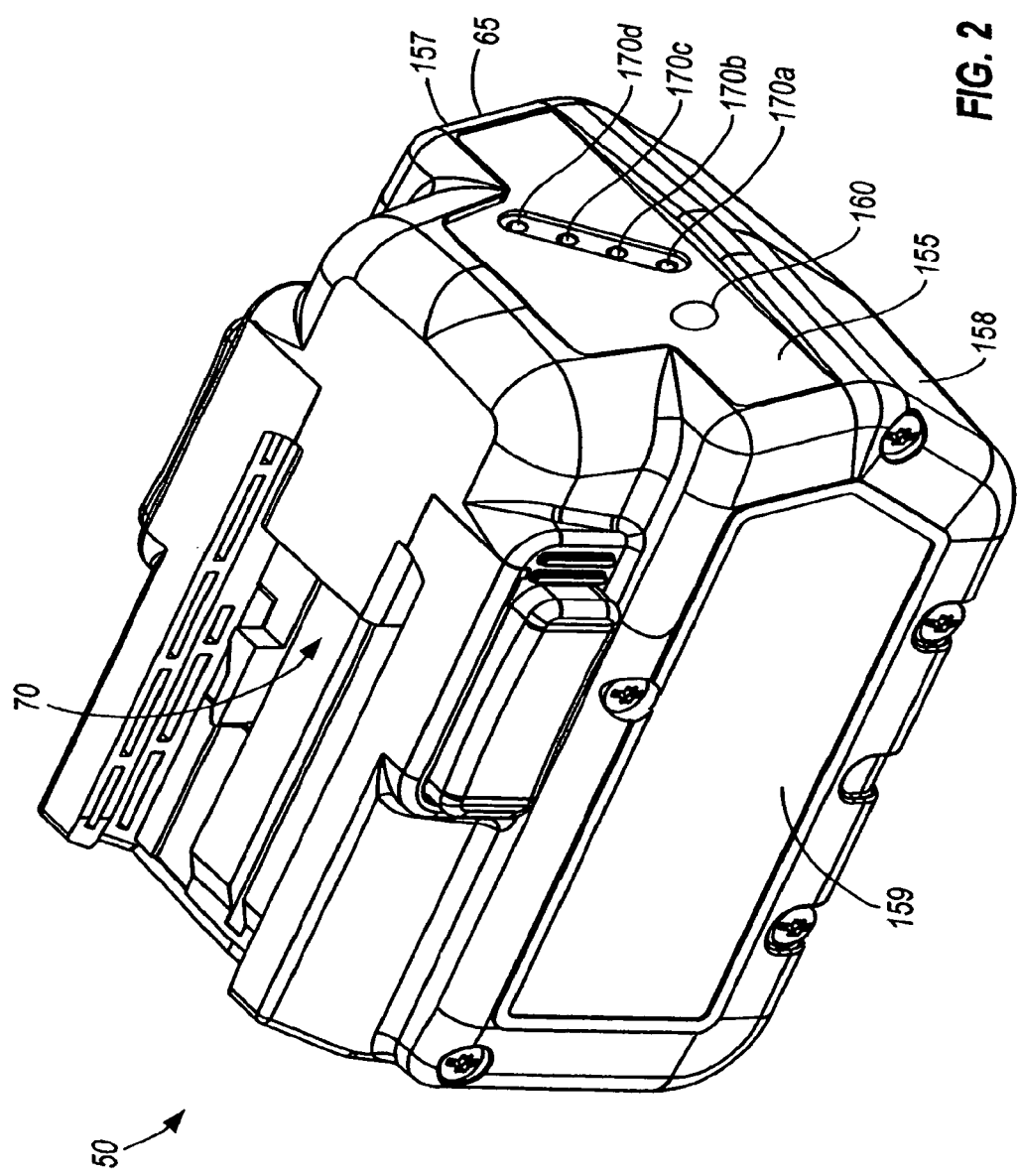
FIG. 2 is a perspective view of another battery.
Figure 3:
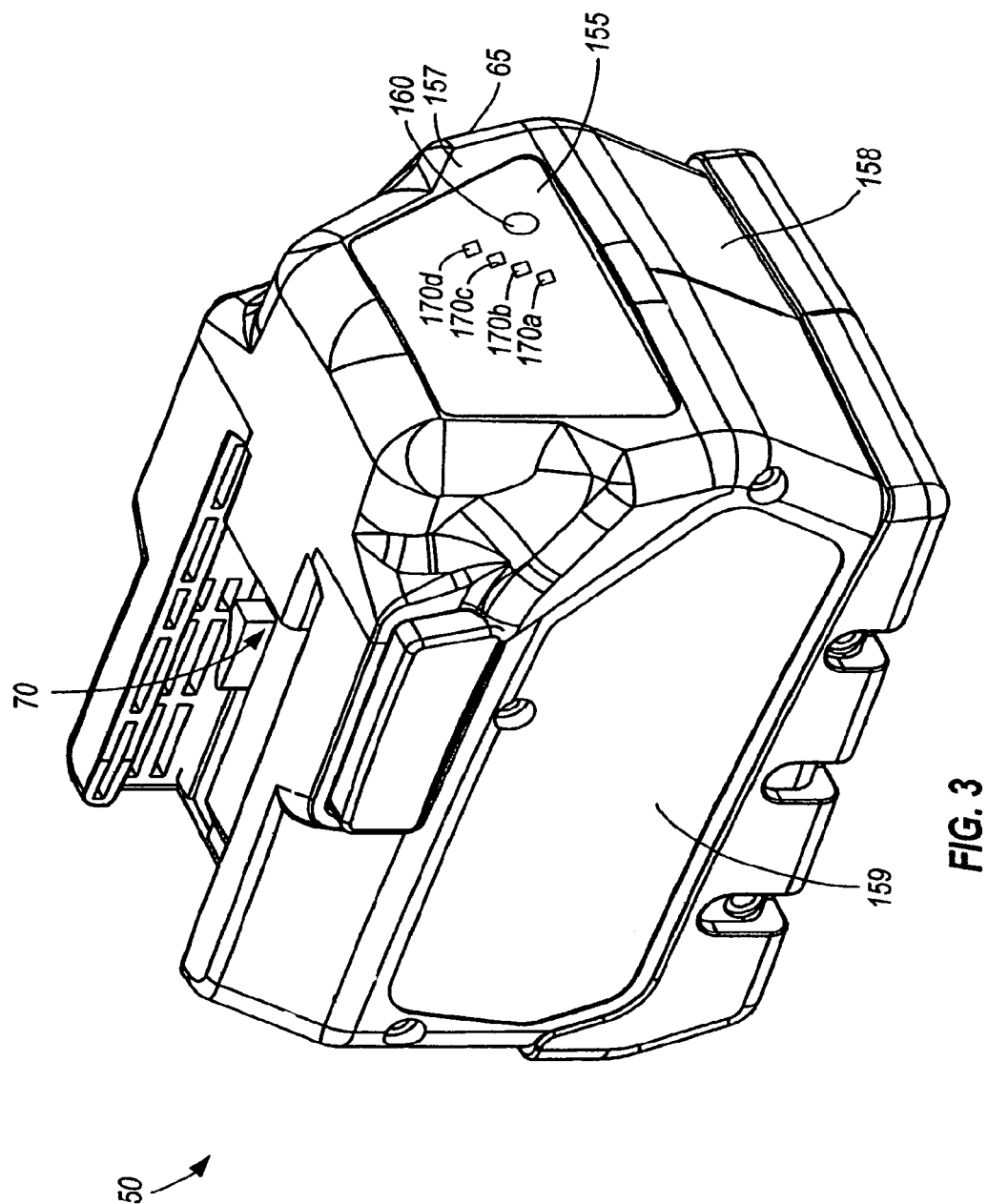
FIG. 3 is a perspective view of a further battery.
Figure 4:
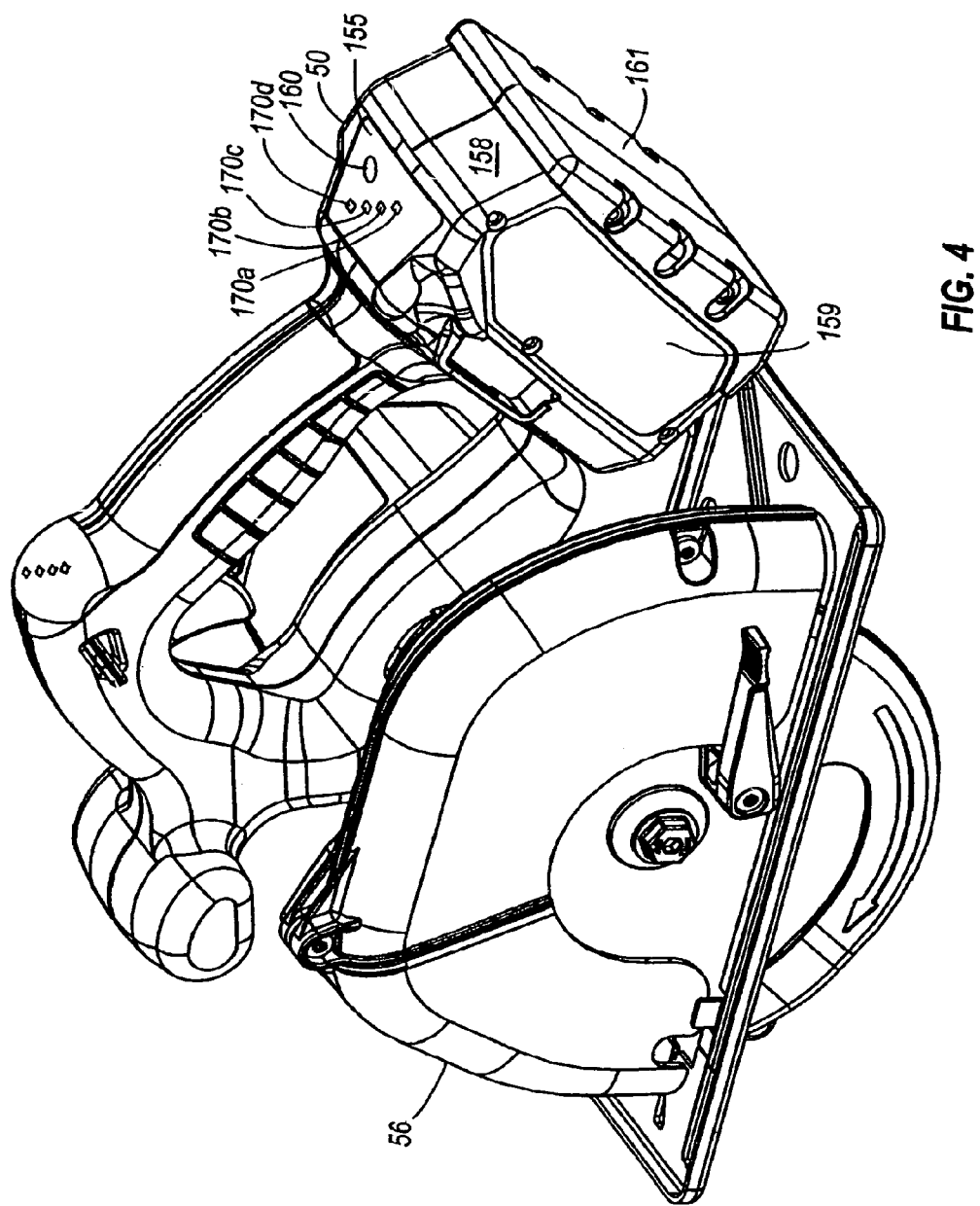
FIG. 4 is a perspective view of a battery, such as the battery shown in FIG. 3, in use with a first electrical device, such as a power tool.
Figure 5:
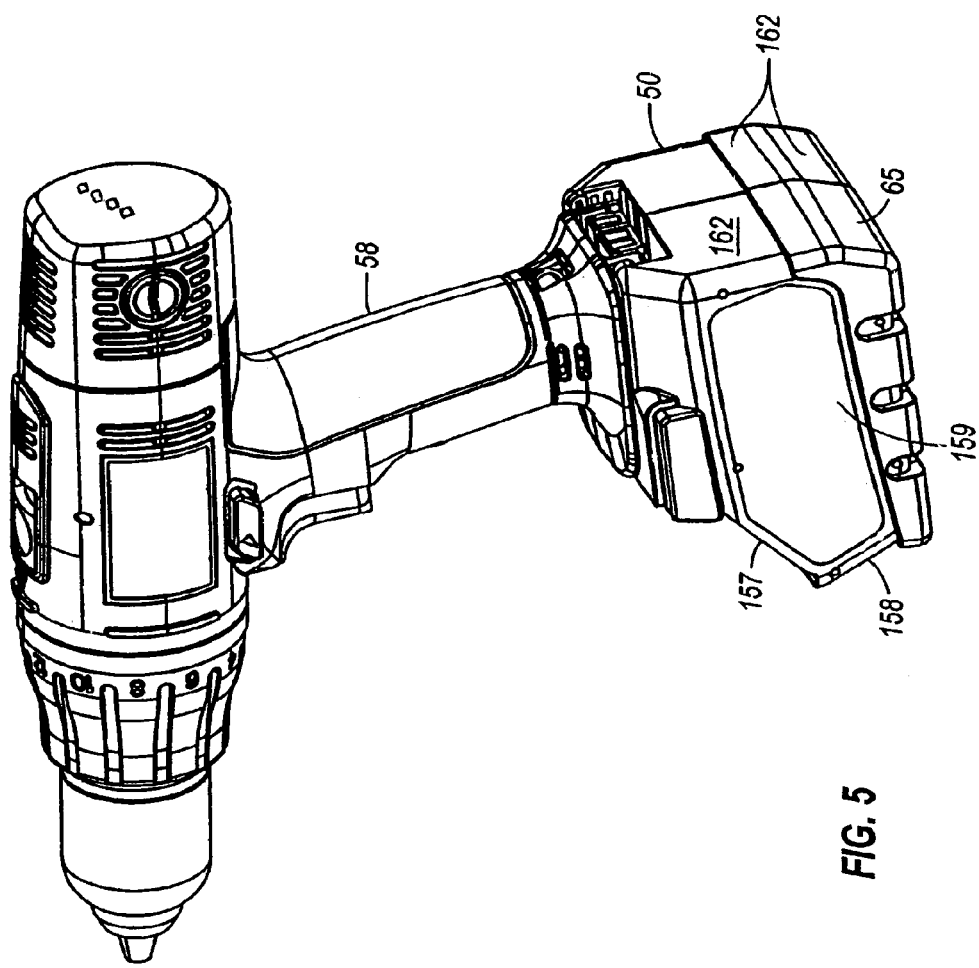
FIG. 5 is a perspective view of a battery, such as the battery shown in FIG. 3, in use with a second electrical device, such as a power tool.

A battery pack or battery 50 is illustrated in FIGS. 1-3. The battery 50 can be configured for transferring power to and receiving power from one or more electrical devices, such as, for example, a power tool 55 (shown in FIGS. 4-5), a battery charger 60 (shown in FIG. 24) and the like. As shown in the constructions illustrated in FIGS. 4 and 5, the battery 50 can transfer power to various power tools, such as, for example, a circular saw 56, a driver drill 58, a reciprocating saw (not shown), a band saw (not shown), an impact wrench (not shown), a right-angle drill (not shown), a work light (not shown) and the like. In some constructions and in some aspects, the battery 50 can supply a high discharge current to electrical devices, such as, for example, a power tool 55, having high-current discharge rates. For example, the battery 50 can power a wide range of power tools 55 including a circular saw 56, a driver drill 58, and the like, as shown in FIGS. 4 and 5 and mentioned above.

In other constructions, the battery pack 50 can be configured for transferring power to various high-power electrical devices, such as, for example: various power tools and including electrically powered tools used in manufacturing and assembly; lawn and garden equipment and including tools used in agricultural applications; portable lighting, signaling devices, and flashlights; motorized vehicles including electrically powered scooters, mopeds, motorized carts, and the like; vacuum cleaners and other electrically powered household and commercial applications, tools, and devices; electrically powered toys; remote-controlled airplanes, automobiles, and other vehicles as well as auxiliary motors and the like. For example, the battery pack 30 can supply an average discharge current that is equal to or greater than approximately 20 A, and can have an amperehour capacity of approximately 3.0 A-h. In other constructions, the battery 50 can supply an average discharge current that is equal to or greater than approximately 15 A. In still further constructions, the battery 50 can have different ampere-hour capacity, such as, for example, approximately 2.5 A-h or approximately 2.8 A-h for battery cells 80 arranged in series or approximately 1.3 A-h or approximately 1.5 A-h for battery cells 80 arranged in parallel.

In some constructions and in some aspects, the battery 50 can have any battery chemistry such as, for example, leadacid, Nickel-cadmium ("NiCd"), Nickel-Metal Hydride ("NiMH"), Lithium ("Li"), Lithium-ion ("Li-ion"), another Lithium-based chemistry or another rechargeable or nonrechargeable battery chemistry. In the illustrated constructions, the battery 50 can have a battery chemistry of Li, Li-ion or another Li-based chemistry and can supply an average discharge current that is equal to or greater than approximately 20 A. For example, in the illustrated construction, the battery 50 can have a chemistry of Lithium Cobalt ("Li—Co"), Lithium Manganese ("Li—Mn") Spinel, or Li—Mn Nickel.

In some constructions and in some aspects, the battery 50 can also have any nominal voltage. In some constructions, for example, the battery 50 can have a nominal voltage of approximately 9.6 V. In other constructions, for example, the battery 50 can have a nominal voltage up to approximately 50 V. In the some constructions, for example, the battery 50 can have a nominal voltage of approximately 21 V. In other constructions, for example, the battery 50 can have a nominal voltage of approximately 28 V.

The battery 50 also includes a housing 65 which can provide terminal supports 70. The battery 50 can further include one or more battery terminals (not shown in FIGS. 1-5) supported by the terminal supports 70 and connectable to an electrical device, such as the power tool 55, the battery charger 60, and the like.

In some constructions and in some aspects, the housing 65 can substantially enclose a supporting circuit electrically connected to one or more battery terminals. In some constructions, the circuit may include a microcontroller or microprocessor. In some constructions, the circuit can communicate with the electrical devices, such as a power tool 55 (e.g., a circular saw 56, a driver drill 58, and the like), a battery charger 60, and the like, and can provide information to the devices regarding one or more battery characteristics or conditions, such as, for example, the nominal voltage of the battery 50, the temperature of the battery 50, the chemistry of the battery 50 and similar characteristics, as discussed below. In further constructions, the circuit included in the battery 50 can also receive information from the device, such as a power tool 55 (e.g., a circular saw 56, a driver drill 58, and the like), a battery charger 60 and the like, regarding one or more characteristics or conditions of the device, such as, for example, the type of device (e.g., battery charger 60, circular saw 56, driver drill 58, and the like), the power, current and/or voltage requirements of the device, thresholds for battery operation, sampling rates, and the like.

The battery 50 is schematically illustrated in FIGS. 6A-D, 7-10, 11A-D and 12A-C and portions of the battery 50 are shown in FIGS. 13-16 and 20A-B. As illustrated, the battery 50 can include one or more battery cells 80 each having a chemistry and a nominal voltage. Also, each battery cell 80 can include a positive end 90 and a negative end 95. In some constructions such as, for example, the constructions illustrated in FIGS. 6A and C, the battery 50 can have a battery chemistry of Li-ion, a nominal voltage of approximately 18 V or approximately 21 V (depending on the type of battery cell, for example), and can include five battery cells 80*a*, 80*b*, 80*c*, 80*d* and 80*e*. In other constructions, such as for example the constructions illustrated in FIGS. 6B and D, the battery 50 can have a battery chemistry of Li-ion, a nominal voltage of approximately 24 V, approximately 25 V or approximately 28 V (depending on the type of battery cell, for example) and can include seven battery cells 80*a*, 80*b*, 80*c*, 80*d*, 80*e*, 80*f* and 80*g*. In further constructions, the battery 50 can have more or fewer battery cells 80 than shown and described. In an exemplary construction, each battery cell 80 has a chemistry of Li-ion, and each battery cell 80 has substantially the same nominal voltage, such as, for example, approximately 3.6 V, approximately 4 V or approximately 4.2 V.

Figure 6B:
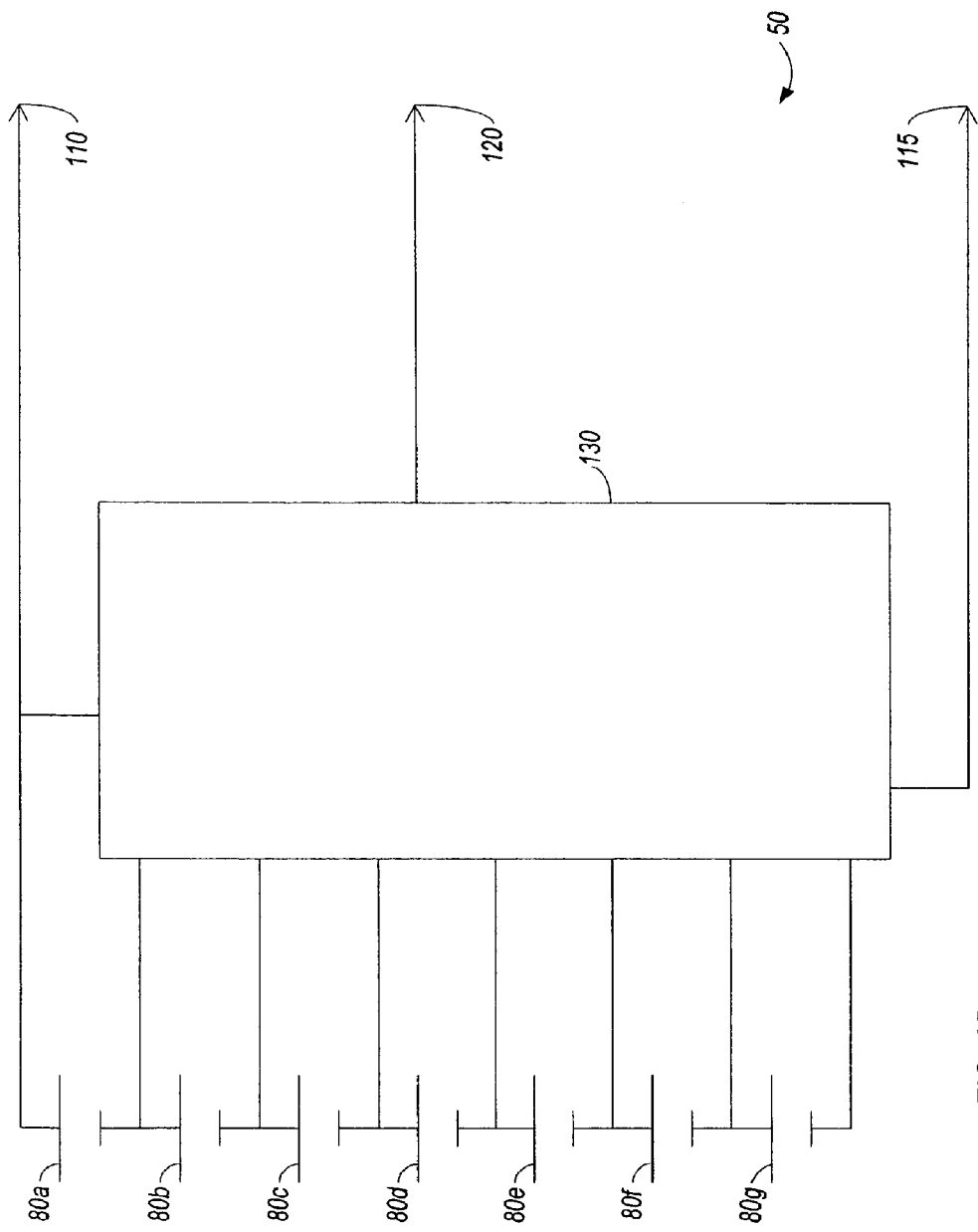
FIG. 6B is another schematic view of a battery, such as one of the batteries shown in FIGS. 1-3.
Figure 6C:
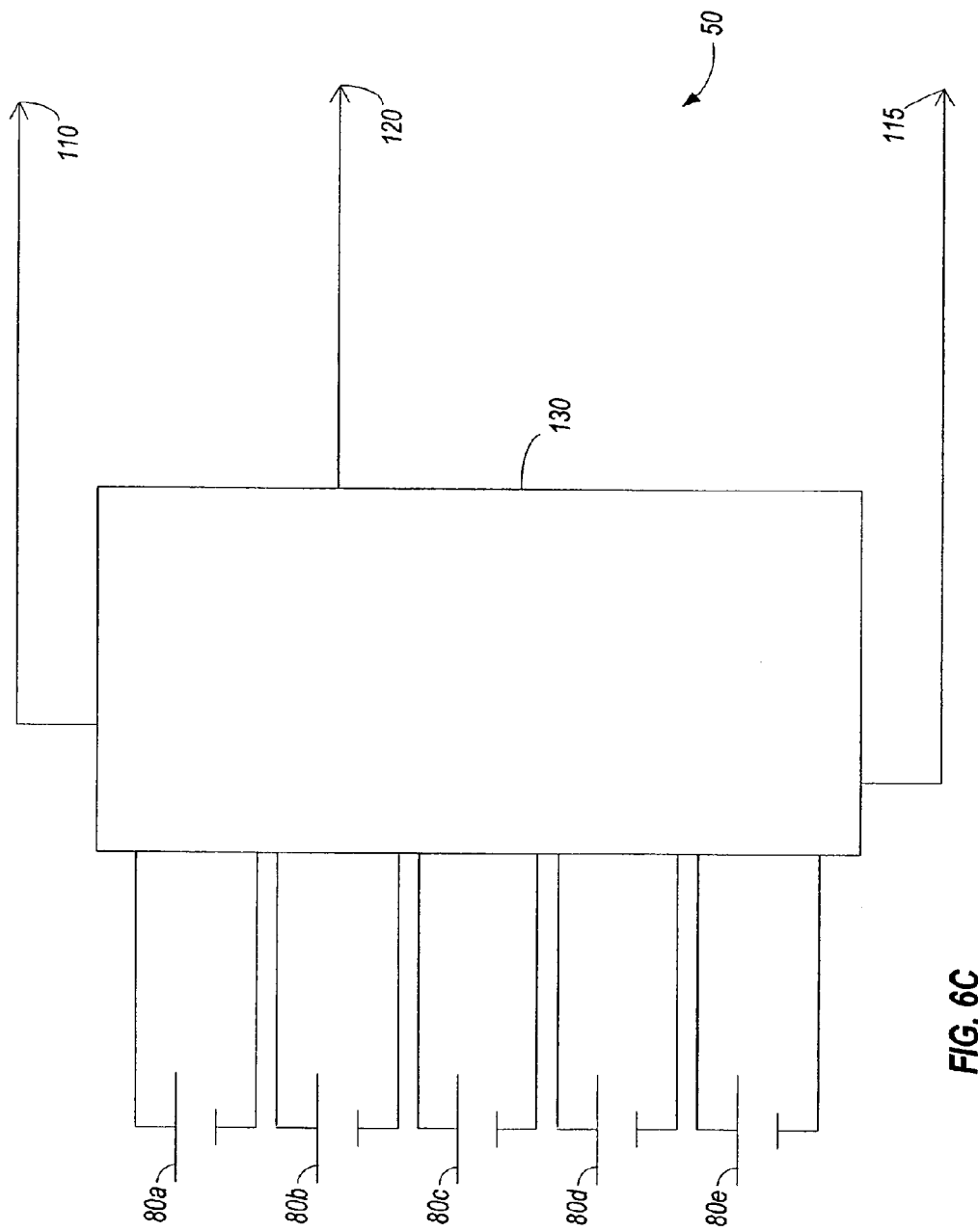
FIG. 6C is a further schematic view of a battery, such as one of the batteries shown in FIGS. 1-3.
Figure 6D:
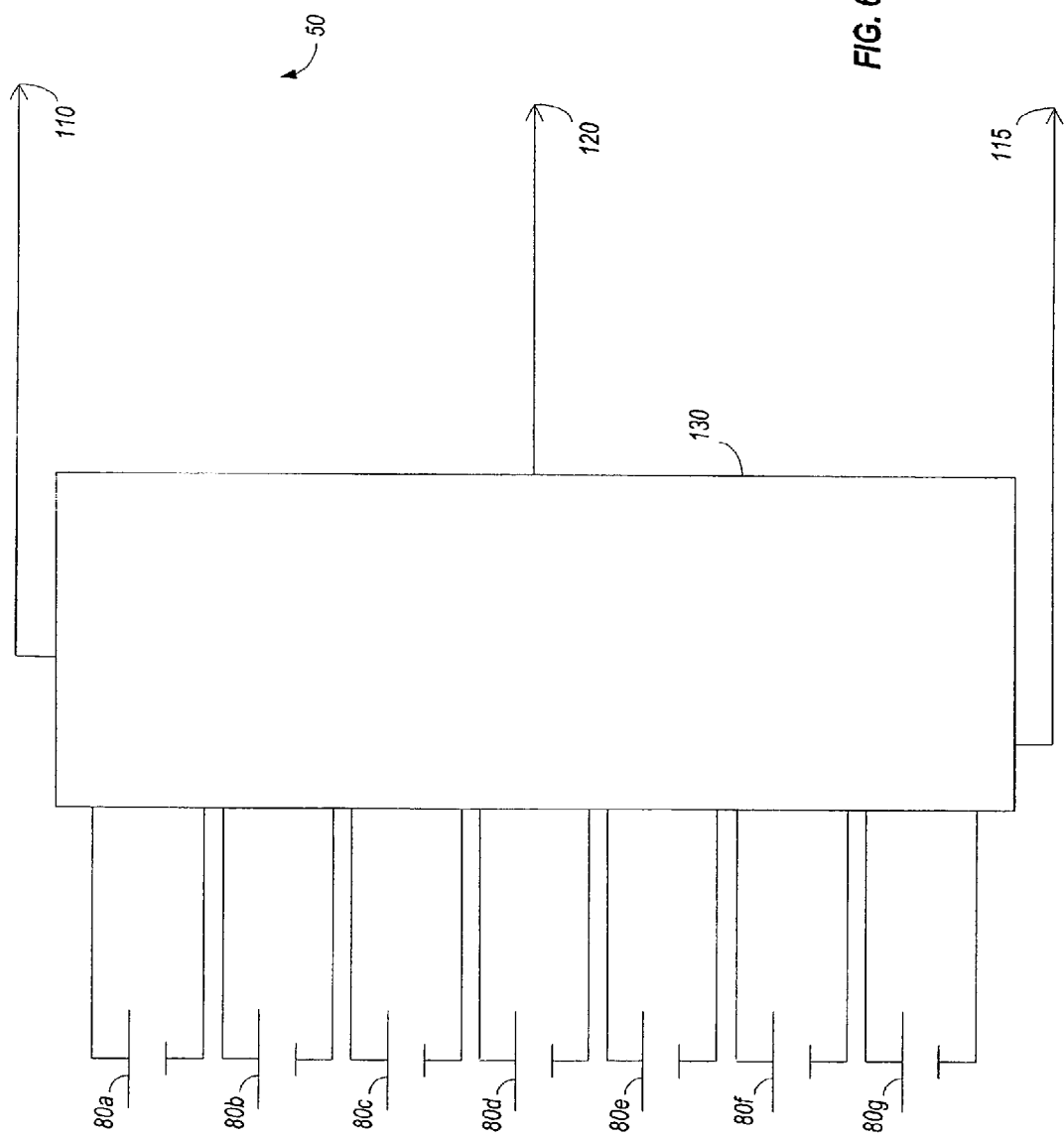
FIG. 6D is yet another schematic view of a battery, such as one of the batteries shown in FIGS. 1-3.

In some constructions, two or more battery cells 80 can be arranged in series with the positive end 90 of one battery cell 80 electrically connected to the negative end 95 of another battery cell 80, as shown in FIGS. 6A and C. The battery cells 80 can be electrically connected by a conductive link or strap 100. In other constructions, the battery cells 80 can be arranged in another manner such as, for example, in parallel with the positive ends 90 of the battery cells 80*a-e* electrically connected to each other and the negative ends 95 of the battery cells 80*a-e* electrically connected to each other or in a combination of series and parallel. As shown in FIGS. 6B and D, the battery cells 80 can be individually coupled to a circuit 130. In some constructions, the circuit 130 can configure the battery cells 80 into various arrangements such as, for example, in a parallel arrangement, a serial arrangement (such as the series of battery cells 80 illustrated in FIGS. 6A and C), an individual arrangement (e.g., drawing current from or supplying current to a single battery cell 80), a partial parallel arrangement (e.g., arranging a few of the battery cells 80 into a serial arrangement), a partial serial arrangement (e.g., arranging a few of the battery cells into a parallel arrangement), or a combination of the serial, partial serial, parallel, and partial parallel arrangements. In some constructions, a circuit 130 included in the battery 50 can establish the arrangements permanently via software (e.g., a program executed by a processor, such as microprocessor 140 discussed below) or hardware. In some constructions, the circuit 130 can modify the arrangements via software or hardware (e.g., one or more switches, logic components, and the like).

The battery 50 can also include a terminal block 105 which may include the one or more battery terminals supported by the terminal supports 70 (shown in FIG. 1). In some constructions, the terminal block 105 is floating with respect to the housing 65 of the battery 50, as discussed below. In the illustrated construction, the terminal block 105 can include a positive terminal 110, a negative terminal 115, and a sense terminal 120. The positive terminal 110 can be electrically connected to the positive end 90 of a first battery cell 80a, and the negative terminal 115 can be electrically connected to the negative end 95 of a second battery cell 80e (or battery cell 80g). In the illustrated constructions, the first battery cell 80a is the first cell of the battery cells 80 to be serially linked, and the second battery cell 80e or 80g is the last cell of the battery cells 80a-e or 80a-g to be serially linked, respectively.

In some constructions and in some aspects, the battery 50 can also include another sense terminal in addition to the sense terminal 120, as discussed below. The additional sense terminal (or additional sense terminals) can provide another communication path between the electrical device (e.g., circular saw 56, driver drill 58, battery charger 60, and the like) and the battery 50.

As mentioned previously, the battery 50 can include a circuit 130. The circuit 130 can be electrically connected to one or more battery cells 80, and can be electrically connected to one or more battery terminals of the terminal block 105. In some constructions, the circuit 130 can include components to enhance the performance of the battery 50. In some constructions, the circuit 130 can include components to monitor battery characteristics, to provide voltage detection, to store battery characteristics, to display battery characteristics, to inform a user of certain battery characteristics, to suspend current within the battery 50, to detect temperature of the battery 50, battery cells 80, and the like, and to transfer heat from and/or within the battery 50. In some constructions and in some aspects, the circuit 130 includes a voltage detection circuit, a boosting circuit, a state of charge indicator, and the like, discussed below. In some constructions, the circuit 130 can be coupled to a print circuit board ("PCB") 145, discussed below. In other constructions, the circuit 130 can be coupled to a flexible circuit 145a. In some constructions, the flexible circuit 145a can wrap around one or more cells 80 or wrap around the interior of the housing 65.

In some constructions and in some aspects, the circuit 130 can also include a microprocessor 140. The microprocessor 140 can store battery characteristics or battery identification information, such as, for example, battery chemistry, nominal voltage, and the like. In other constructions and in other aspects, the microprocessor 140 can store additional battery characteristics, such as, for example, battery temperature, ambient temperature, number of times the battery 50 has been charged, the number of times the battery 50 has been discharged, various monitoring thresholds, various discharging thresholds, various charging thresholds, and the like, and can store information about the microprocessor 140 itself and its operation, such as, for example, frequency and/or number of times battery characteristics have been calculated, number of times the microprocessor 140 disabled the battery 50, and the like. The microprocessor 140 can also control other electrical components of the circuit 130 included in the battery 50, as discussed below.

In the illustrated construction and in some aspects, the microprocessor 140 can be electrically connected to the PCB 145. In the illustrated construction, the PCB 145 can provide the necessary electrical connections between the microprocessor 140 and the terminals 110, 115 and 120, the battery cells 80a-g and other electrical components included in the battery 50, as discussed below. In other constructions, the PCB 145 may include additional electrical circuitry and/or components, such as, for example, additional microprocessors, transistors, diodes, current-limiting components, capacitors, etc.

In some constructions and in some aspects, the circuit 130 also can include a temperature-sensing device, such as, for example, a thermistor 150. In other constructions, the battery 50 can include a thermostat (not shown). The temperature-sensing device can sense the temperature of one or more battery cells 80a-g included in the battery 50, can sense the temperature of battery 50 as a whole, or can sense ambient temperature and the like. In some constructions, the resistance value of the temperature-sensing device, such as the thermistor 150, for example, can be indicative of the temperature of the one or more battery cells 80a-g being sensed and can change as the temperature of the one or more battery cells 80a-g changes. In some constructions, the microprocessor 140 can determine the temperature of the one or more battery cells 80a-g based on the resistance value of the thermistor 150. The microprocessor 140 can also monitor the change in temperature verses time by monitoring the thermistor 150 over time. The microprocessor 140 can also send the temperature information to an electrical device, such as the power tool 55 and/or the battery charger 60, and/or use the temperature information to initiate certain functions or to control other components within the battery 50, as discussed below. As shown in the illustrated construction, the thermistor 150 is mounted on the PCB 145.

In some constructions and in some aspects, the circuit 130 can also include a present state of charge indicator, such as, for example, a fuel gauge 155 shown in the illustrated constructions. The fuel gauge 155 can include a light-emitting diode ("LED") display that indicates the present state of charge of the battery 50. In other constructions, the fuel gauge 155 can include a matrix display. As shown in FIGS. 1-3, the fuel gauge 155 can be located on an upper face 157 of the battery housing 65. In other constructions, the fuel gauge 155 can be located anywhere on the housing 65 such as, for example, on a lower face 158 of the housing 65, on one of the sides 159 of the housing 65, on the bottom face 161 of the housing, on the rear face 162 of the housing 65, on two or more of the faces or sides of the housing 65, and the like. In further constructions, a fuel gauge 155a, similar to the fuel gauge 155, can be located on the electrical device, such as a power tool 55 (shown in FIG. 21C). The fuel gauge 155*a* can be driven by circuitry 420 (shown in FIG. 21C) included in the power tool 55 or driven by the microcontroller 140 (or circuit 130) included in the battery 50.

In some constructions, the gauge 155 can be enabled via a push-button switch 160 located on the housing 65 of the battery 50. In other constructions, the gauge can be activated automatically by a predefined time period as counted by a timer, by a predefined battery characteristic, and the like. In the illustrated construction, the gauge 155 can be electrically connected to the microprocessor 140 via a ribbon cable 165 and can include four LEDs 170*a*, 170*b*, 170*c* and 170*d* providing the LED display.

In some constructions, the microprocessor 140 can determine the present state of charge of the battery 50 (i.e., how much charge is left in the battery 50) when the push-button 160 is depressed and outputs the charge level to the fuel gauge 155. For example, if the present state of charge of the battery 50 is approximately 100%, all of the LEDs 170*a*, 170*b*, 170*c* and 170*d* will be turned on by the microprocessor 140. If the present state of charge of the battery 50 is approximately 50%, only two of the LEDs, such as, for example, LEDs 170*a* and 170*b*, will be turned on. If the present state of charge of the battery 50 is approximately 25%, only one of the LEDs, such as, for example, LED 170*a*, will be turned on.

In some constructions, the output can be displayed on the fuel gauge 155 for approximately a predefined time period (i.e., a "displaying time period") after the push-button 160 is initially depressed. In some constructions, the microprocessor 140 can disable the fuel gauge 155 or output a zero present state of charge output if the temperature of one or more battery cells 80*a-g* exceed a predetermined threshold. In some constructions, the microprocessor 140 can disable the fuel gauge 155 or output a zero present state of charge output when an abnormal battery characteristic such as, for example, a high battery temperature, is detected even if the battery 50 has a relatively high state of charge level remaining. In some constructions, the microprocessor 140 can disable the fuel gauge 155 or output a zero present state of charge output if the present state of charge of the battery 50 or the present state of charge of one or more cells 80*a-g* fall below a predetermined threshold. In some constructions, the microprocessor 140 can disable the fuel gauge 155 or output a zero present state of charge output approximately after a predefined time period (i.e., a "cut-off time period") regardless if the push-button 160 remains depressed or not. In some constructions, the cut-off time period can be substantially equal to the displaying time period, and, in other constructions, the cut-off time period can be greater than the displaying time period.

In some constructions, the microprocessor 140 does not enable the fuel gauge 155 when the push-button 160 is depressed during time periods when the battery 50 is active (e.g., during charging and/or discharging). Present battery state of charge information can be suppressed during these time periods to avoid erroneous state of charge readings. In these constructions, the microprocessor 140 may only provide present state of charge information in response to the depressed push-button 160 when the current through the battery 50 (e.g., charging current, discharging current, parasitic current, etc.) is below a predefined threshold.

In some constructions, the microprocessor 140 can enable the fuel gauge 155 whether or not the push-button 160 is depressed during time periods when the battery 50 is active (e.g., during charging and/or discharging). In one construction for example, the fuel gauge 155 can be operational during charging. In this construction, the microprocessor 140 can automatically enable the fuel gauge 155 to display the current state of charge of the battery 50 continuously, periodically (e.g., after certain predetermined time intervals or during periods of low current draw/supply), in response to certain battery characteristics (e.g., when the current state of charge reaches certain defined thresholds, such as, every 5% increase in state of charge), or in response to certain stages, modes, or changes in the charge cycle. In other constructions, the microprocessor 140 may enable the fuel gauge 155 in response to the depression of the push-button 160 when the battery 50 is active.

In some constructions and in some aspects, the fuel gauge 155 can be enabled via a touch pad, a switch, or the like. In other constructions, the battery 50 can include another push-button or switch (not shown) for enabling and disabling an automatic displaying mode. In these constructions, a user can select whether to have the circuit 130 operate in an automatic displaying mode or operate in a manual displaying mode. The automatic displaying mode can include the fuel gauge 155 displaying the current state of charge of the battery 50 without user activation. For example, in the automatic displaying mode, the fuel gauge 155 can display the current state of charge of the battery 50 periodically (e.g., after certain predetermined time intervals), in response to certain battery characteristics (e.g., when the current state of charge reaches certain defined thresholds, such as, every 5% increase or decrease in state of charge), or the like. The manual displaying mode can include the fuel gauge 155 displaying the current state of charge in response to user activation such as, for example, the depression of the push-button 160. In some constructions, the push-button 160 can be disabled when the circuit 130 is operating in the automatic displaying mode. In other constructions, the push-button 160 can still enable the fuel gauge 155 even when the circuit 130 is operating in the automatic displaying mode. In further constructions, the automatic displaying mode can be enabled and disabled via the push-button 160, a control signal from an electrical device such as, for example, a power tool 55 or battery charger 60, or the like.

In some constructions, the circuit 130 can include a boosting circuit 171. The boosting circuit 171 can provide additional power for components included in the circuit 130 during periods of low battery voltage, as discussed below. For example, the microprocessor 140 may need a voltage source of approximately 3 V or approximately 5 V in order to operate. If the present state of charge of the battery 50 falls below about 5 V or about 3 V, then the microprocessor 140 may not receive enough power to operate and control the remainder of the components included in the circuit 130. In other constructions, the boosting circuit 171 can "boost" a lower input voltage into a higher output voltage, as discussed below.

Various constructions of the boosting circuit 171 are illustrated in FIGS. 11A-F. In one construction such as, for example, the construction shown in FIG. 11A, the boosting circuit 171*a* can include a power source or power component such as, for example, another battery cell 172. In some constructions, the battery cell 172 can be different in chemistry, nominal voltage and the like than the battery cells 80 connected in series. For example, the battery cell 172 can be a 1.2 V cell of Li-ion.

In some constructions, the boosting circuit 171*a* may only supply power to the remainder of the circuit 130 (such as, for example, the microprocessor 140) when the combined present state of charge of the battery cells 80 drops below a threshold. In some constructions, the boosting circuit 171a may only supply power to the remainder of the circuit 130 when the temperature of the battery cells 80 drops below a low temperature threshold and when the combined present state of charge of the battery cells 80 drops below a low voltage threshold. In other constructions, the boosting circuit 171a may only supply power to the remainder of the circuit 130 during periods of operation in low temperature conditions (e.g., the pack temperature is below a low temperature threshold, or the ambient temperature is below a low temperature threshold). In these constructions, the boosting circuit 171a may only supply power in order to prevent the circuit 130 (e.g., the microprocessor 140) from experiencing a "brown-out" condition (e.g., an insufficient supply of voltage for a period of time). A brown-out condition may be caused by battery voltage fluctuations which can be more evident or pronounced during low operating temperatures (e.g., either pack temperature or ambient temperature).

In another construction such as, for example, the construction illustrated in FIG. 11B, the boosting circuit 171b can include a boost mechanism 173 such as, for example, an inductive "flyback" type converter, a switched capacitor converter, and the like. Similar to boosting circuit 171a, the boosting circuit 171b may supply power to the remainder of the circuit 130 in response to various battery conditions.

Figure 11C:
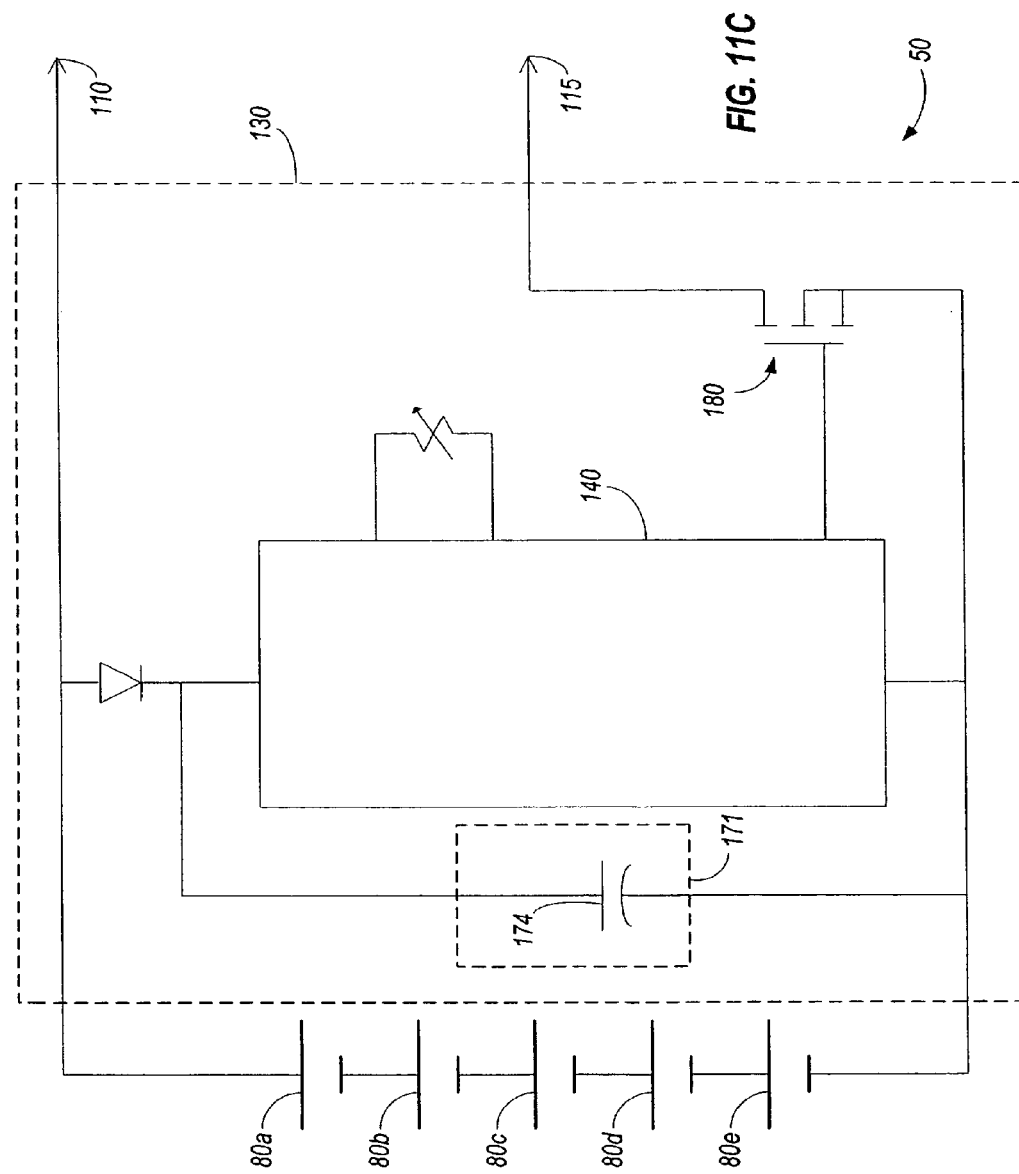
FIG. 11C is still another schematic view of a battery, such as one of the batteries shown in FIGS. 1-3.

In yet another construction such as, for example, the construction illustrated in FIG. 11C, the boosting circuit 171 can be a capacitive boosting circuit 171c. As shown, the capacitive boosting circuit 171c can include a capacitor 174. During operation, the capacitor 174 can be charged either by the discharge circuit from the battery cells 80 or by a signal from the microprocessor 140 or additional circuitry. Similar to boosting circuit 171a, the boosting circuit 171c may supply power to the remainder of the circuit 130 in response to various battery conditions.

In a further construction such as, for example, the construction illustrated in FIG. 11D, the boosting circuit 171d can include a transistor or switch 175. In an exemplary implementation, the switch 175 is a FET. In some constructions, the switch 175 can be a power field effect transistor ("FET") 180, as discussed below. In some constructions, the boosting 171d can operate by interrupting the discharge current from a certain period of time to allow the present state of charge of the battery 50 to recover. For example, the battery cells 80 may experience large voltage fluctuations due to low cell temperature, low ambient temperature, high discharge current (e.g., large load), and the like. By interrupting the discharge current for a period of time, the large fluctuations in state of charge may reduce, and the voltage of the battery cells 80 may rise. Activating and deactivating the switch 175 may prevent the large fluctuations from creating a brown-out condition for the circuit 130. Similar to the boosting circuit 171a, the boosting circuit 171d may be activated in response to certain battery conditions such as, for example, low temperature, low battery state of charge, and the like. In some constructions, the switch 175 can be used in combination with the capacitor 174 of circuit 171c to recharge the capacitor 174.

In some constructions, the switch 175 can be activated (e.g., repetitively switched) at a set frequency or duty cycle. In other constructions, the switch 175 can be activated in a hysteretic manner. For example, the switch 175 may only be activated if the voltage of the battery 50 reaches or drops below a first threshold. The switch 175 may remain open (e.g., interrupting the current flow) until the present state of charge of the battery 50 recovers to or exceeds a second threshold, typically greater than the first threshold. In some constructions, the second threshold can equal the first threshold. In some constructions, the more the battery state of charge is depleted, the time period that the state of charge takes to recover or reach the second threshold can be longer. In these instances, the circuit 130 can also include a timer (not shown). When a first time kept by the timer expires and the state of charge has not recovered to the second threshold, then the circuit 130 can infer that the battery 50 is fully discharged, and can continue to have the switch 175 remain open to prevent the battery 50 from entering an overdischarged state.

Figure 11F:
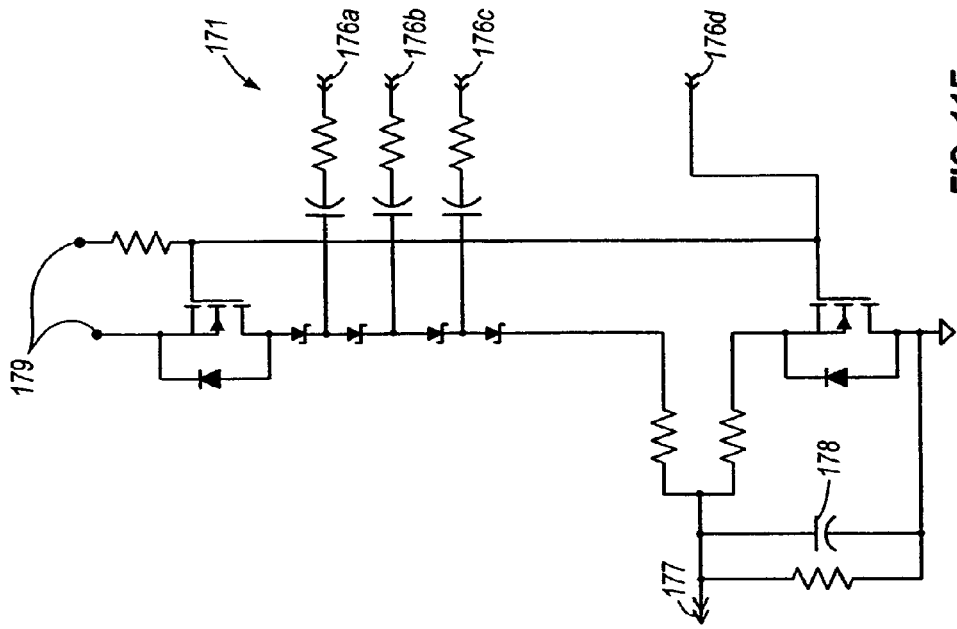
FIG. 11F is still another schematic view of a battery, such as one of the batteries shown in FIGS. 1-3.
Figure 11E:
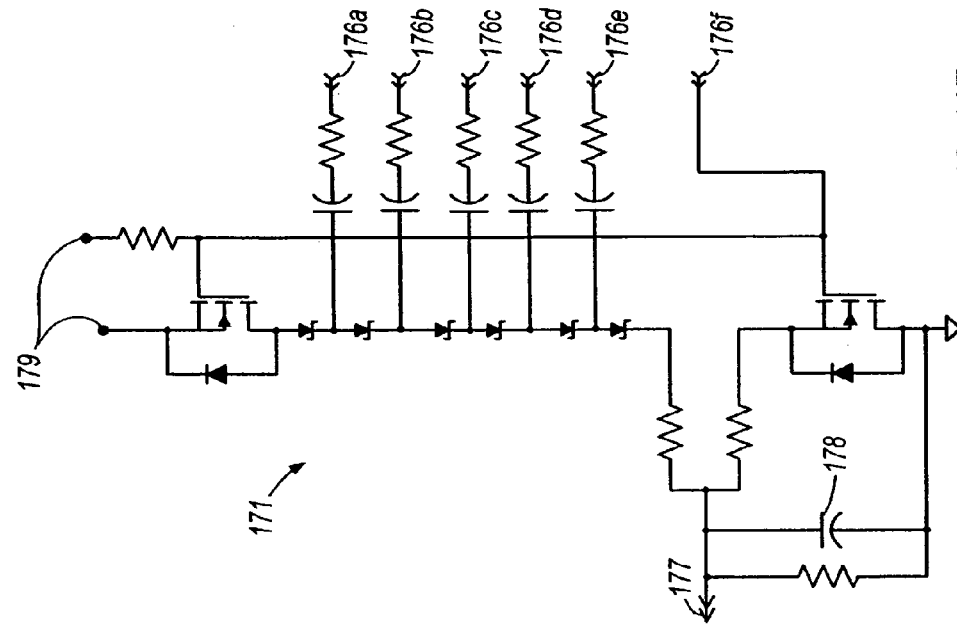
FIG. 11E is still another schematic view of a battery, such as one of the batteries shown in FIGS. 1-3.
Figure 12A:
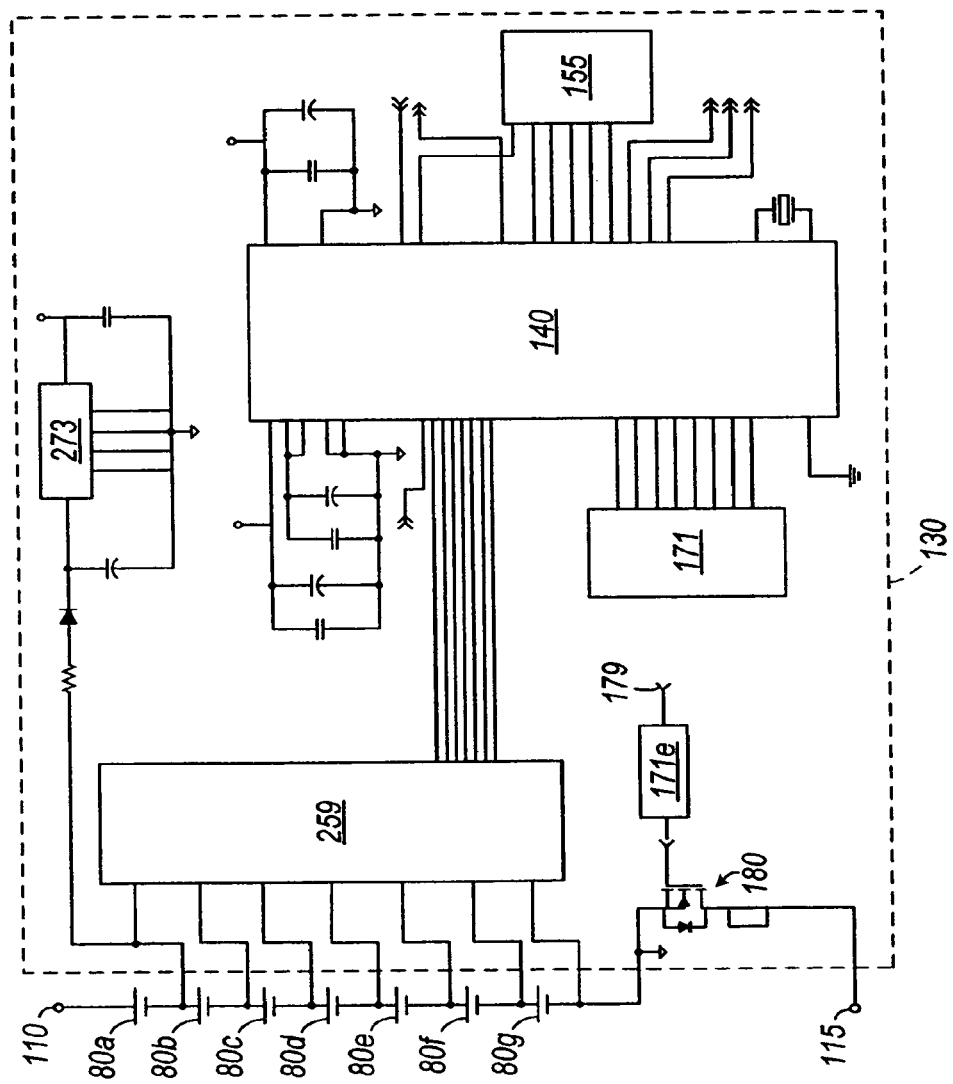
Figure 12B:
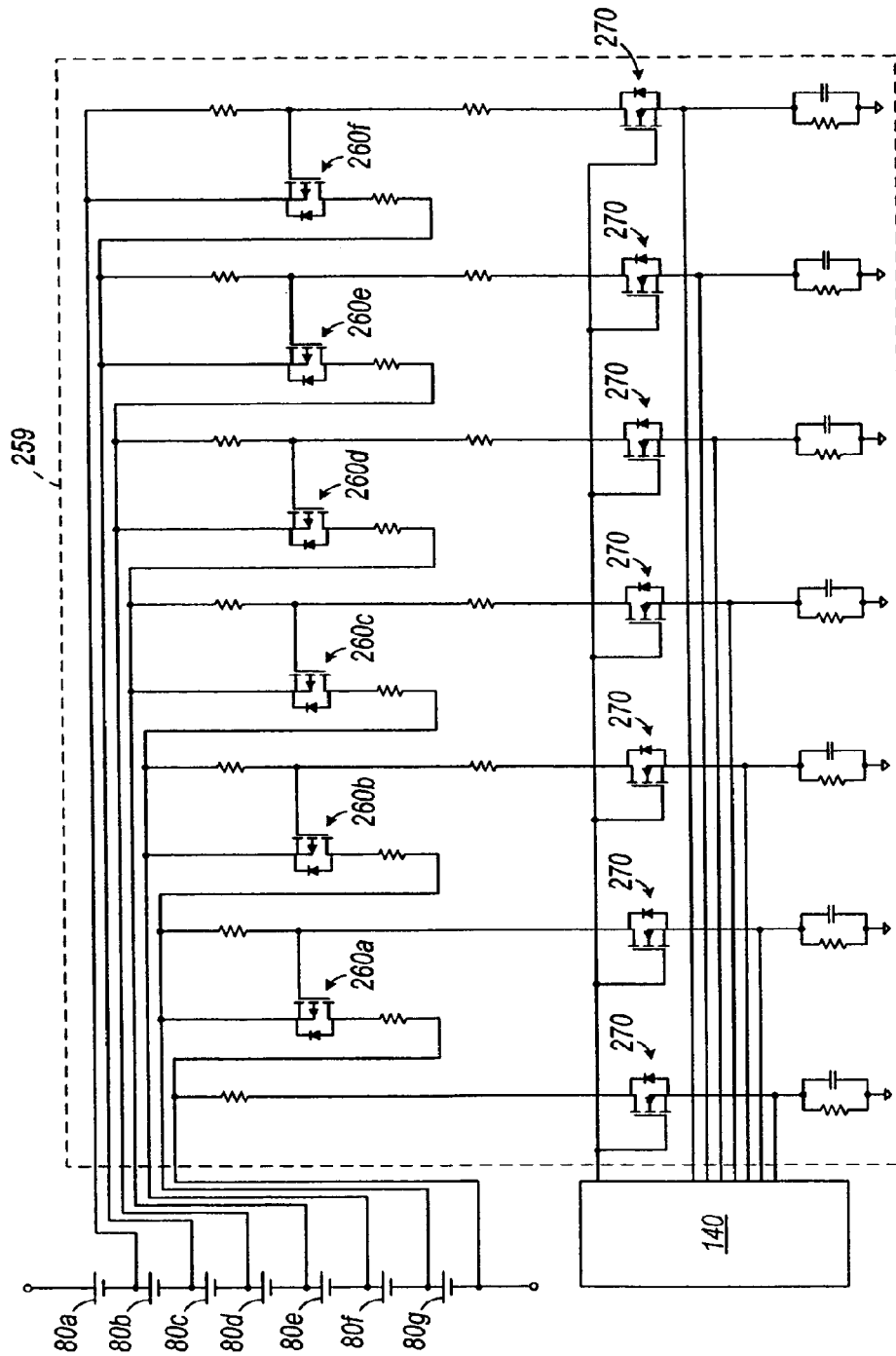
Figure 13A:
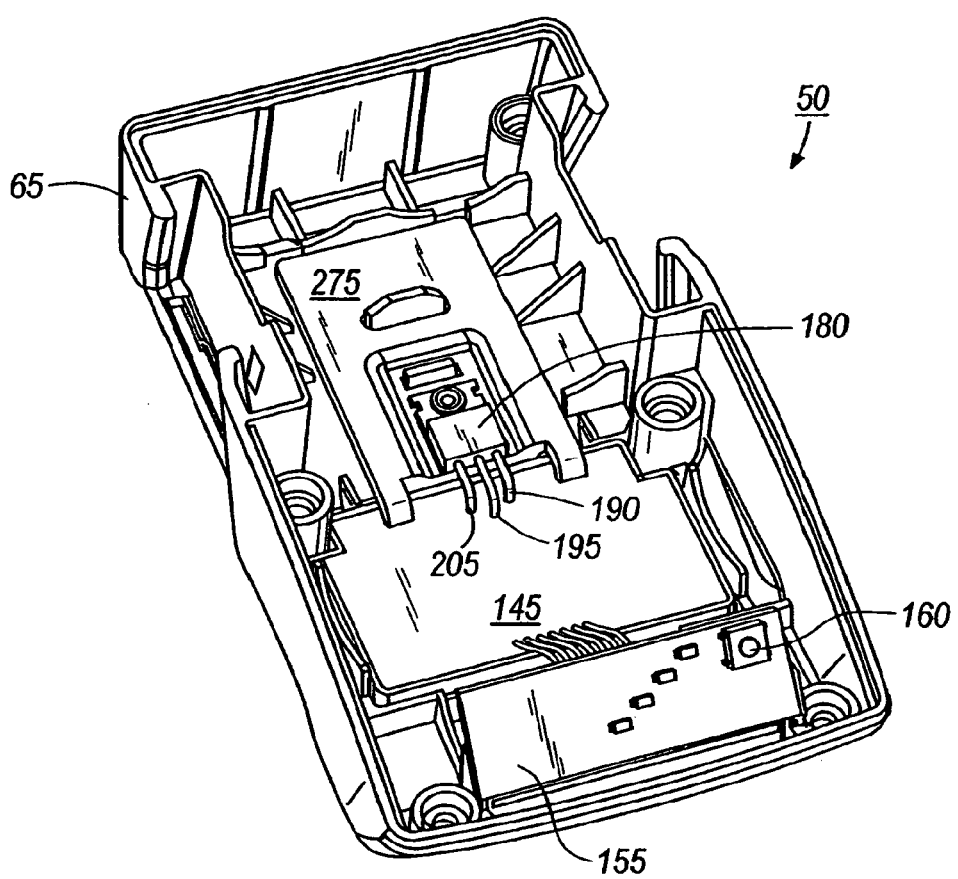
FIG. 13A is a perspective view of a portion of a battery, such as one of the batteries shown in FIGS. 1-3, with portions removed and illustrates the FET and the heat sink.
Figure 13B:
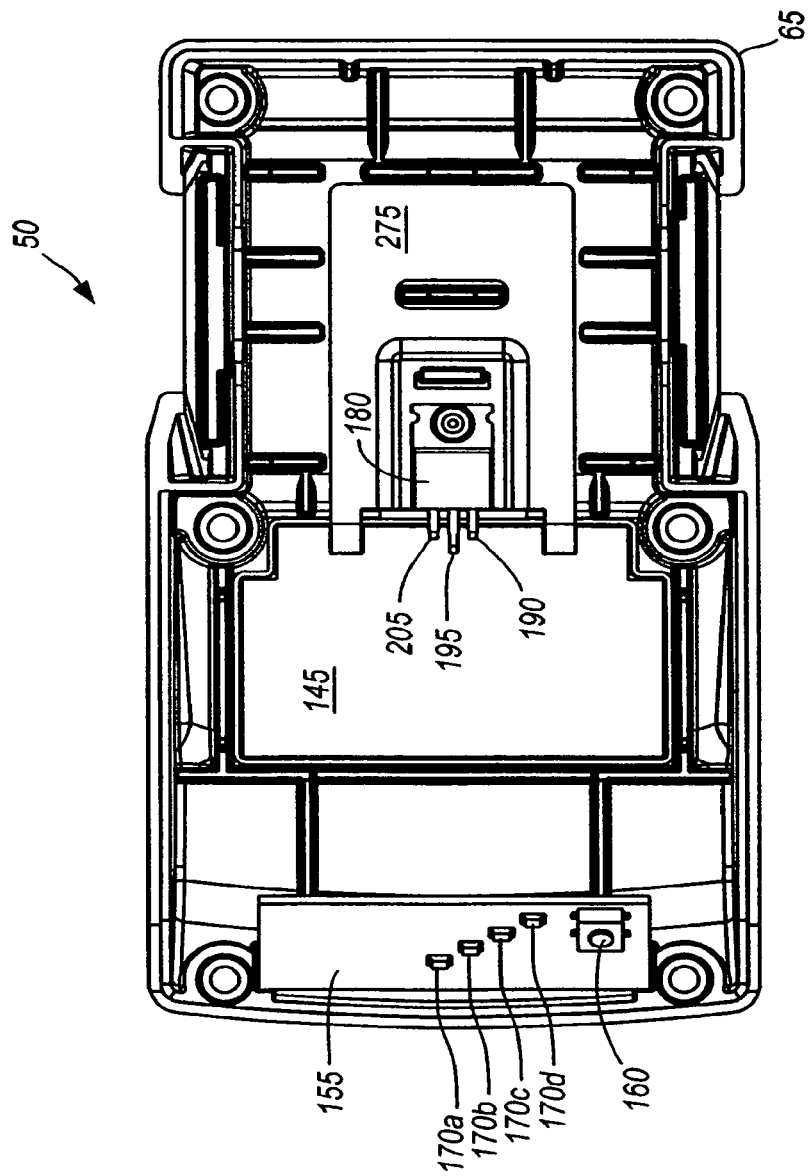
FIG. 13B is a plan view of the portion of the battery shown in FIG. 13A.
Figure 13C:
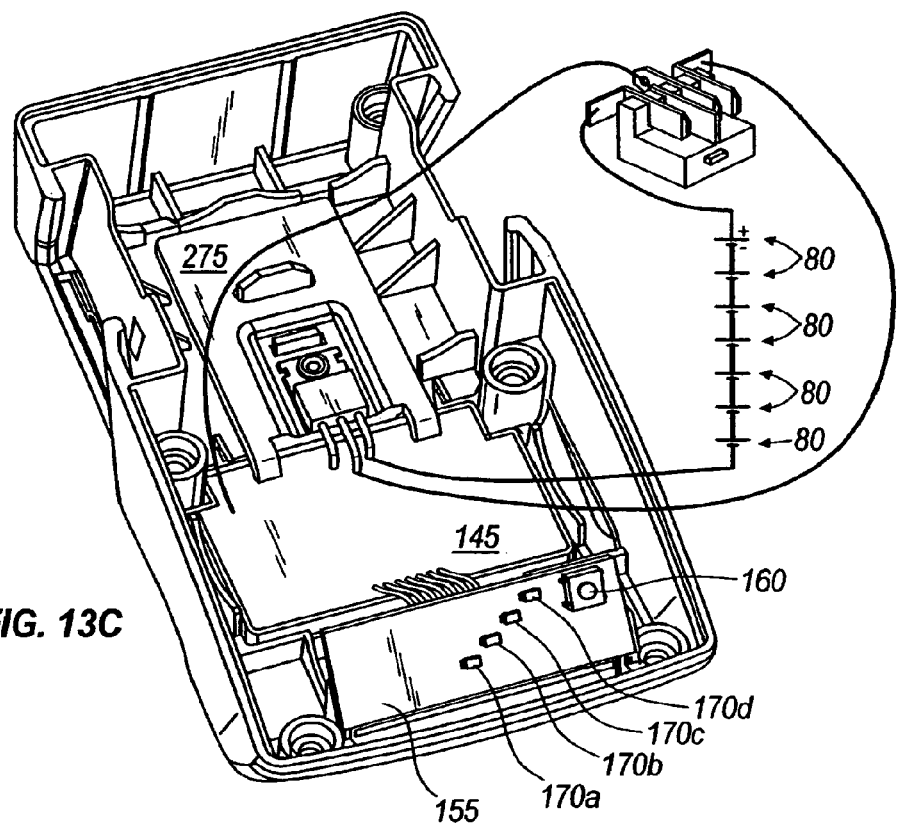
FIG. 13C is a perspective view of a portion of a battery, such as one of the batteries shown in FIGS. 1-3, with portions removed and illustrates the FET, the heat sink and electrical connections within the battery.

In a further construction such as, for example, the constructions illustrated in FIGS. 11E and 11F, the boosting circuit 171 can be a capacitive charge pump boost circuit such as the boosting circuits 171e and 171f. In these constructions, the boosting circuits 171e and 171f can "boost" one or more lower voltage signals into a higher output voltage signal. As shown in FIG. 11e, the boosting circuit 171e can include one or more inputs 176a-f for receiving AC signals, controls signal, and the like, and one or more low voltage inputs 179 for receiving one or more low voltage signals. The signals (e.g., the AC signals and/or the control signals) can be used to increase the low voltage signals and the charge stored on (or the voltage across) a capacitor 178, and generate a higher voltage output signal at output 177. Similar to the boosting circuit 171e, boosting circuit 171f can also include one or more inputs 176a-d for receiving low voltage AC power signals, control signals, and the like, and one or more low voltage inputs 179 for receiving one or more low voltage signals. In an exemplary implementation, the boosting circuit 171e can boost an approximately 3 V input signal to an approximately 10 V output signal, and the boosting circuit 171f can boost an approximately 3 V input signal to an approximately 5 V output signal.

In some constructions, the boosting circuits 171e and 171f can provide higher voltage signals to components within the circuit 130 at any time and during any battery condition. For example, the boosting circuit 171e can provide an output signal to power a power FET or switch, as discussed below, and the boosting circuit 171f can provide an output signal to power one or more transistors, as discussed below.

In some constructions and in some aspects, the circuit 130 can include a semiconducting switch 180 that interrupts the discharging current. In some constructions, the semiconducting switch 180 can be controlled to interrupt the discharging current when the circuit 130 (e.g., the microprocessor 140) determines or senses a condition above or below a predetermined threshold. In some constructions, the condition above or below a predetermined threshold can be an abnormal battery condition. In some constructions, an abnormal battery condition can include, for example, high or low battery cell temperature, high or low battery state of charge, high or low battery cell state of charge, high or low discharge current, high or low charge current, and the like. In the illustrated constructions, the switch 180 includes a power FET or a metal-oxide semiconductor FET ("MOSFET"). In other constructions, the circuit 130 can include two switches 180. In these constructions, the switches 180 can be arranged in parallel. Parallel switches 180 can be included in battery packs supplying a high average discharge current (such as, for example, the battery 50 supplying power to a circular saw 56, a driver drill 58, and the like).

Figure 7:
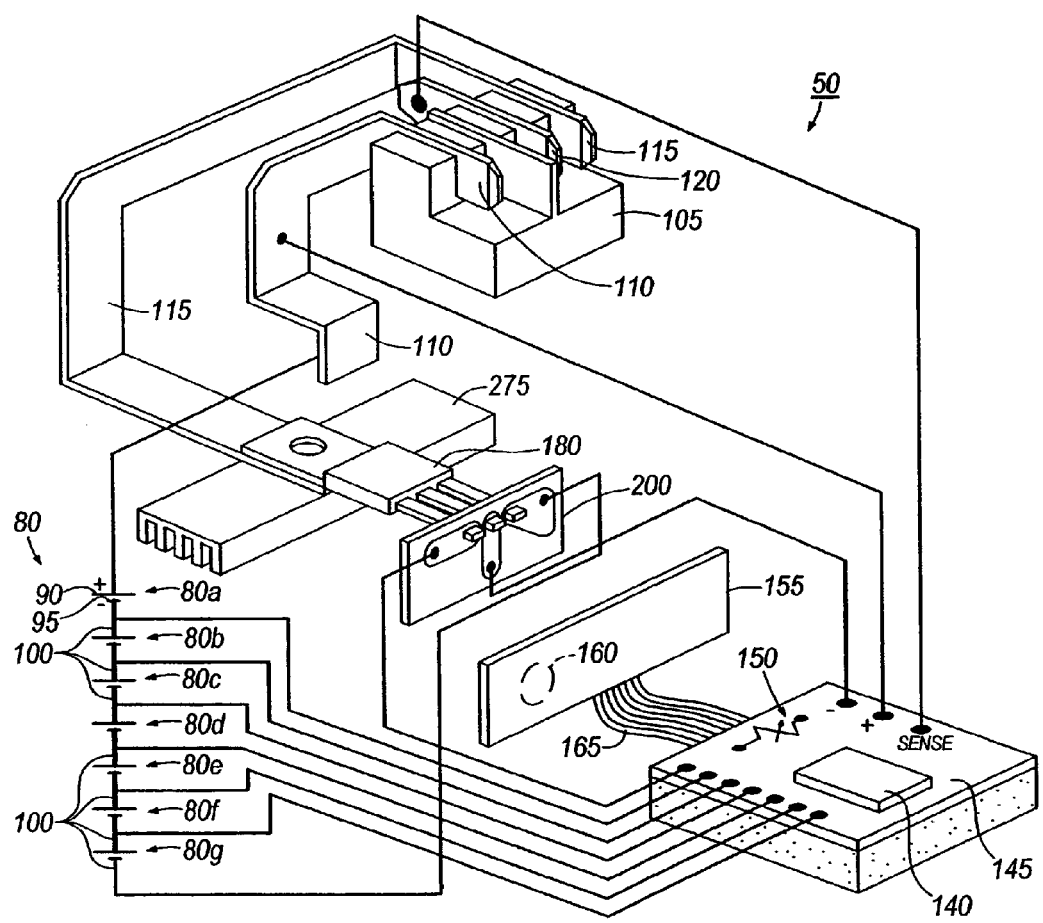
FIG. 7 is still another schematic view of a battery, such as one of the batteries shown in FIGS. 1-3.
Figure 8:
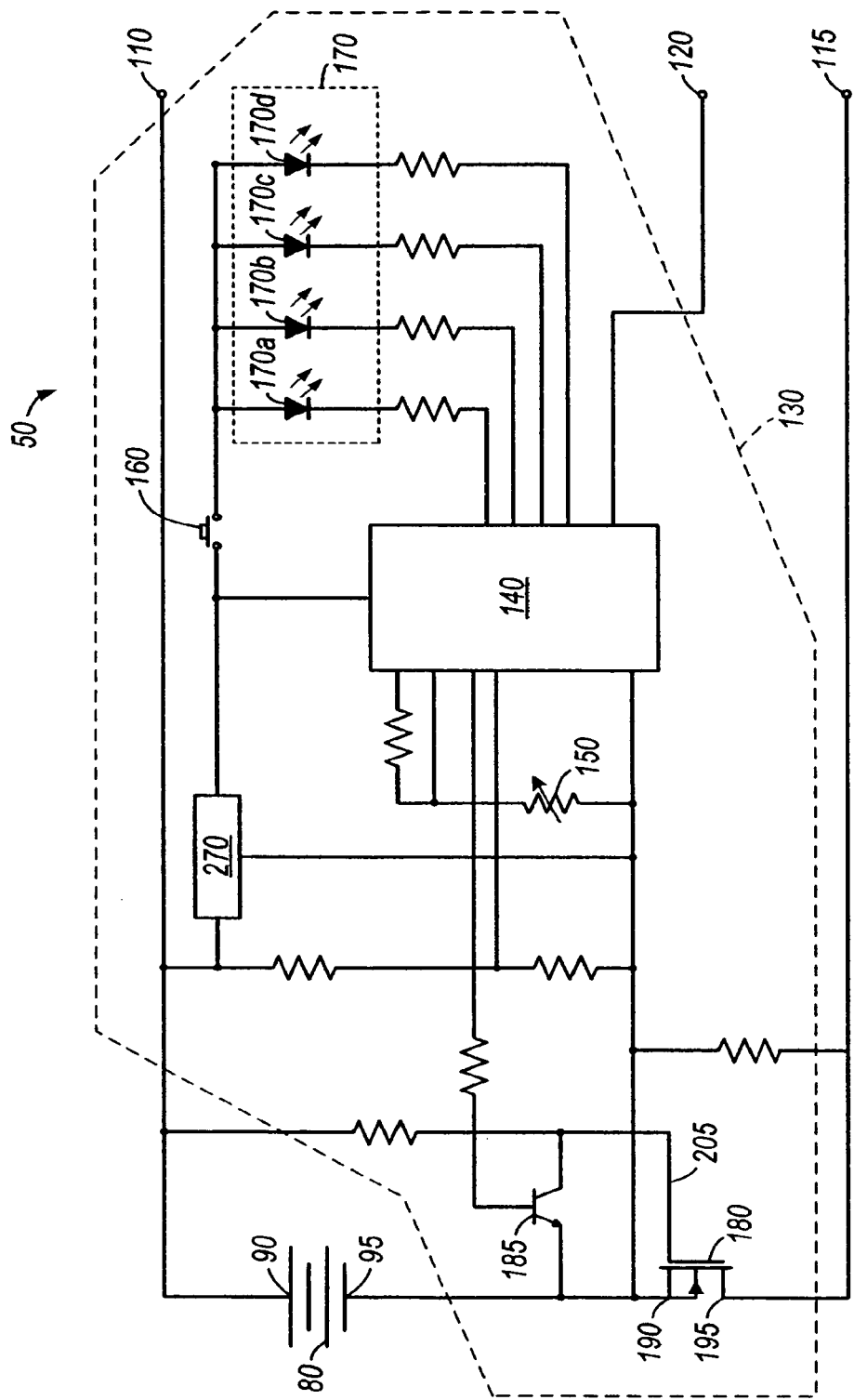
FIG. 8 is still another schematic view of a battery, such as one of the batteries shown in FIGS. 1-3.
Figure 9:
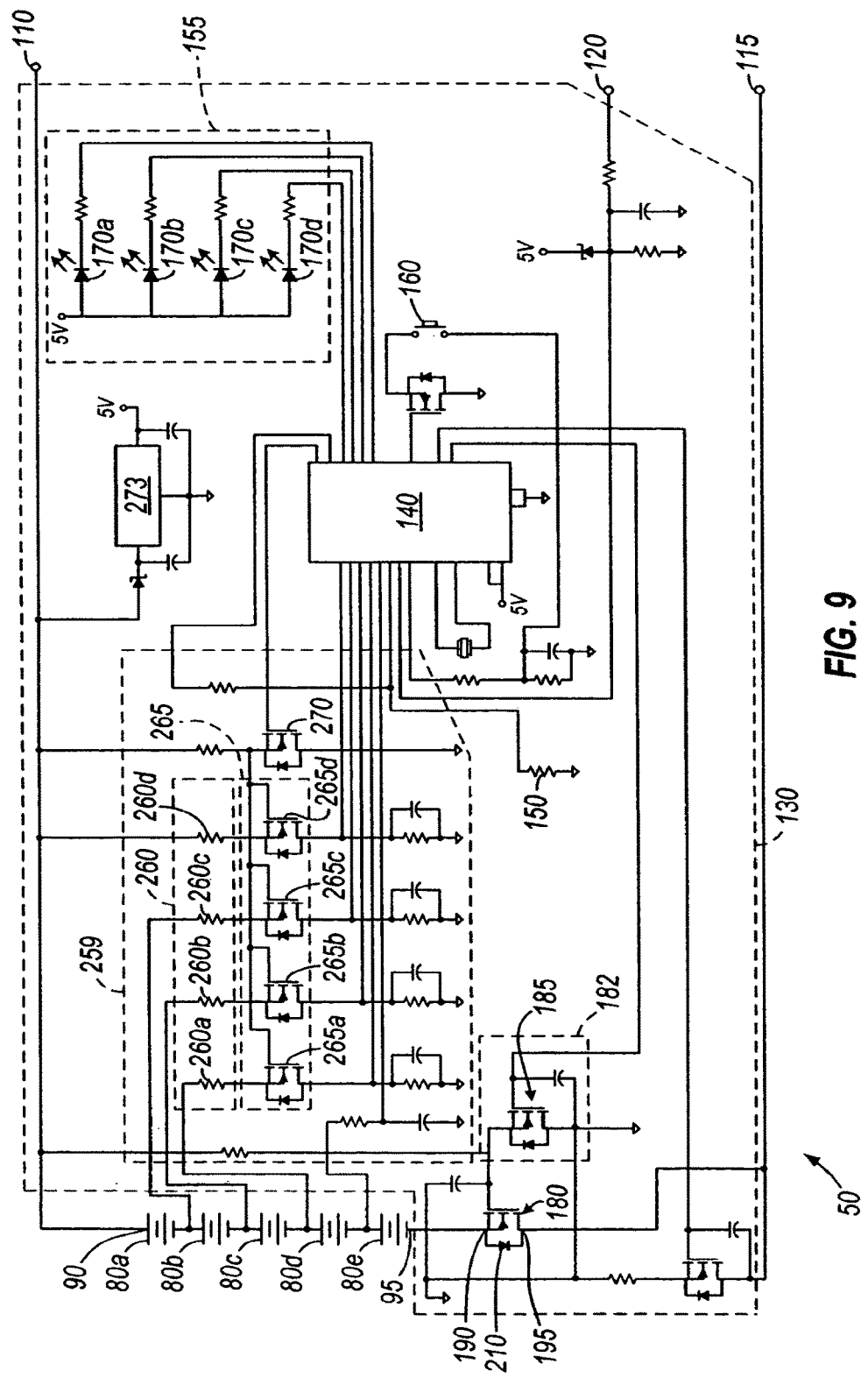
FIG. 9 is still another schematic view of a battery, such as one of the batteries shown in FIGS. 1-3.
Figure 10:
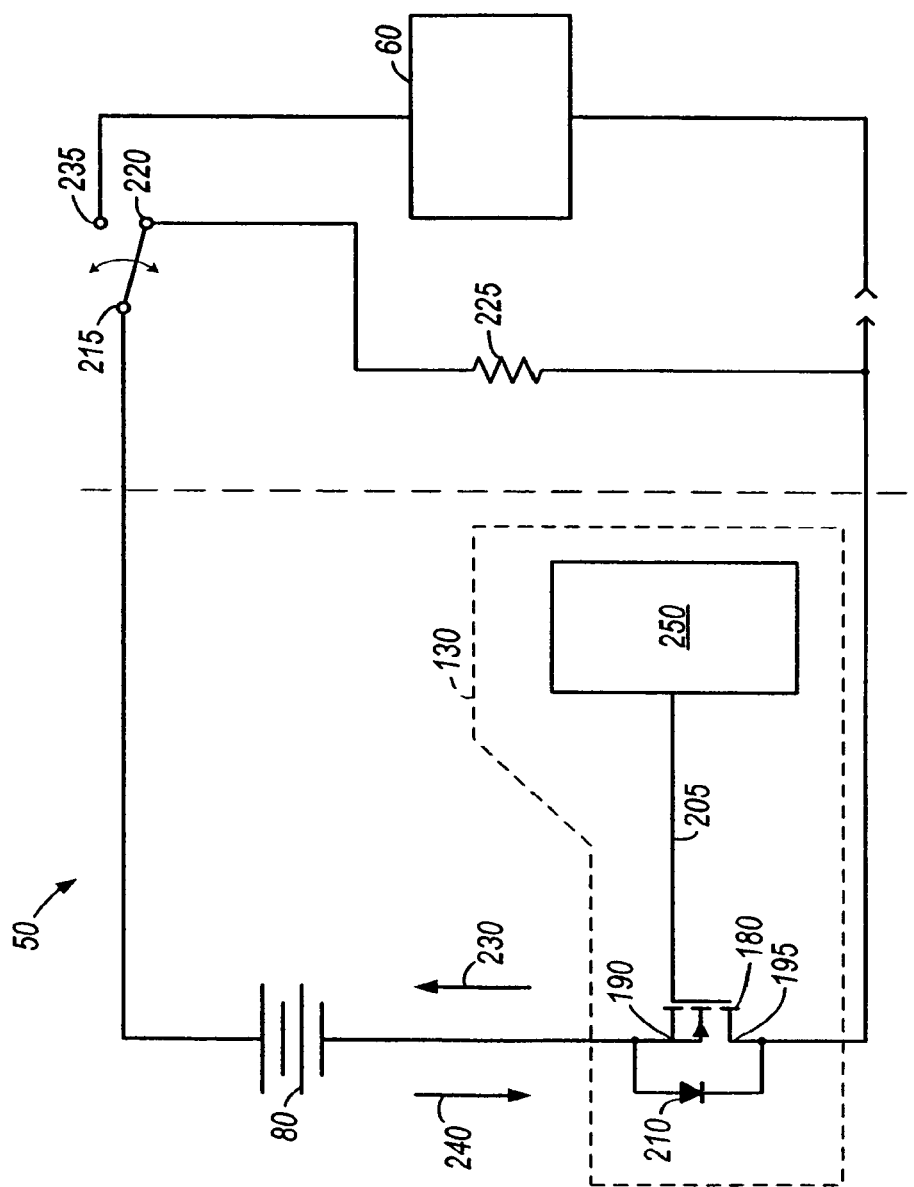
FIG. 10 is still another schematic view of a battery, such as one of the batteries shown in FIGS. 1-3.

In some constructions, the circuit 130 can further include a switch control circuit 182 to control the state of the switch 180 (or switches 180 if applicable). In some constructions, the switch control circuit 182 can include a transistor 185 such as, for example, a npn-bipolar junction transistor or a field-effect transistor ("FET"). In these constructions, the circuit 130 (e.g., the microprocessor 140) can control the switch 180 by changing the state of the transistor 185. As shown in FIGS. 7-9, the source 190 of the FET 180 can be electrically connected to the negative end 95 of the battery cell 80*a*-*e*, and the drain 195 of the FET 180 can be electrically connected to the negative terminal 115. The switch 180 can be mounted to a second PCB 200 (shown in FIG. 7). In some constructions and in some aspects, such as, for example, the constructions illustrated in FIGS. 14A-E, the switch 180 can be mounted on the PCB 145. In other constructions, the switch 180 can be mounted in another suitable position or location.

In an exemplary implementation, current will flow through the switch 180 from the drain 195 to the source 190 during discharging, and current will flow through the switch 180 from the source 190 to the drain 195 during charging. In the event a condition above or below the predetermined threshold (e.g., an abnormal battery condition) is detected by the circuit 130 (e.g., the microprocessor 140), the microprocessor 140, for example, can turn on the transistor 185, that is, bias the transistor 185 into a conducting state. When the transistor 185 is in a conducting state, there is not enough voltage across the gate 205 and the source 190 of the FET 180 for the switch 180 to be in a conducting state. Thus, the switch 180 becomes non-conducting, and current flow is interrupted.

In some constructions, once the switch 180 becomes non-conducting, the switch 180 may not reset even if the abnormal condition is no longer detected. In some constructions, the circuit 130 (e.g., the microprocessor 140) may reset the switch 180 only if an electrical device, such as, for example, a battery charger 60, instructs the microprocessor 140 to do so. In some constructions, the microprocessor 140 may reset the switch 180 after a predefined time period. In some constructions, if the microprocessor 140 detects an abnormal battery condition during discharge, the microprocessor 140 may not change the state of the switch 180 to non-conducting until the microprocessor 140 also detects a discharge current below a predetermined threshold (i.e., a low discharge current).

In some constructions, the switch 180 can be configured to only interrupt current flow when the battery 50 is discharging. That is, the battery 50 can be charged even when the switch 180 is in the non-conducting state. As shown in FIGS. 4 and 5, the switch 180 can include a body diode 210, which, in some constructions, is integral with a MOSFET and other transistors. In other constructions, the diode 210 can be electrically connected in parallel with the switch 180.

In another exemplary implementation, when the battery 50 is being discharged (i.e., represented in FIG. 5 as a switch 215 being in a first position 220 to allow current to flow through a load 225, such as, for example, a power tool 55), current flows through the battery 50 in direction 230, that is, through the drain 190 of the FET 180 to the source 190 of the FET 180. When the battery 50 is being charged (i.e., represented in FIG. 5 as the switch 215 being positioned in a second position 235 to allow current to flow from an electric device, such as, for example, a battery charger 60), current flows through the battery 50 in direction 240, that is, through the source 190 of the FET 180 to the drain 195 of the FET 180.

In this implementation, current flow in the direction 230 may be interrupted when the switch 180 is in the non-conducting state. Therefore, the battery 50 no longer supplies a discharge current to the load 225. In some constructions, the circuit 130 including, for example, the microprocessor 140 or additional circuitry 250 (which may or may not include the microprocessor 140), may change the state of the switch 180 from non-conducting to conducting when the microprocessor 140 receives an instruction or command to do so. In some constructions, the microprocessor 140 and/or additional circuitry 250 may not receive a command or an instruction and, therefore, may not change the state of the switch 180 from non-conducting to conducting. For example, the battery 50 may become deeply discharged that the battery 50 does not have enough power in the battery cells 80 to power the circuit 130. If the battery 50 does not have enough power to power the circuit 130, communication (as performed by the circuit 130) between the battery 50 and an electrical device (e.g., battery charger 60) may not be able to take place and then the electrical device may not be able to send a control signal to the battery 50 to re-set the switch 180. In these instances, the body diode 210 included in the switch 180 may conduct current in the direction 240 (i.e., a charging current) supplied by an electrical device such as, for example, the battery charger 60. This can allow the battery 50 to be charged even if the switch 180 is not conducting, or at least receive enough charge to power the circuit 130, re-set the switch 180, and commence communication or charging.

In some constructions and in some aspects, the switch 180 can be controlled to disable the battery 50 when the battery approaches a disable-required state. The disable-required state can include abnormal (high or low) battery voltage, abnormal (high or low) battery cell voltage, abnormal (high or low) battery temperature, and abnormal (high or low) battery cell temperature. In these constructions, the life of the battery 50 can be shortened if the battery 50 continues to operate close to or in a disable-required state. In one construction, the disable-required state includes a low battery voltage state, a low battery cell voltage state and a high battery temperature.

In some constructions, the microprocessor 140 monitors battery pack voltage, battery cell voltage and battery temperature to determine whether or not the battery 50 approaches a disable-required state during discharge. For example, in one construction shown in FIG. 88, the microprocessor 140 includes a first module 5010 to monitor battery cell voltages (also referred to as "battery cell state of charge"), a second module 5015 to monitor battery pack voltage (also referred to as "battery pack state of charge") and a third module 5020 to monitor battery temperature.

Figure 89:
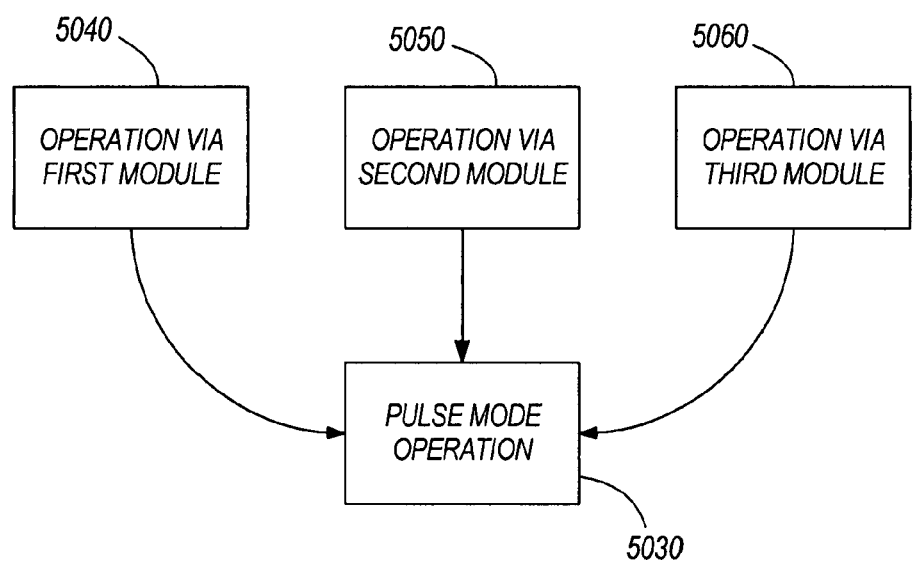
FIG. 89 is a diagram illustrating modes of operation of a microcontroller, such as the microcontroller shown in FIG. 88.

In some constructions, when the battery 50 approaches a disable-required state, such as, for example, a low battery voltage state, a low battery cell voltage state or a high battery temperature, the battery 50 can enter a pulse mode 5030 (shown in FIG. 89). When the battery 50 operates in the pulse mode 5030, power is being supplied to an electrical device, such as a power tool 55, in bursts or pulses. For example, during operation in pulse mode 5030, the switch 180 can be controlled to open and close at a set duty cycle or frequency, such as, for example, one 0.5-ms pulse per second or one 1-ms pulse per second. In some constructions, the frequency at which the switch 180 opens and closes can be modified such that the power being supplied to the electrical device indicates to the user that the battery 50 has neared or entered a disable-required state and should be recharged. In some constructions, the frequency at which the switch 180 opens and closes can be modified such that the power being supplied to the electrical device is insufficient to properly power the device.

As shown in FIG. 89, the battery 50 can enter the pulse mode operation 5030 through one (1) of three (3) events. The battery 50 can enter the pulse mode 5030 when the battery 50 reaches a disable-required state through detection and operation of the first module 5010, as indicated by the event 5040. As mentioned previously, in this construction, the first module 5010 monitors the voltages of the battery cells 80. The battery 50 can also enter the pulse mode 5030 when the battery 50 reaches a disable-required state through detection and operation of the second module 5015, as indicated by the event 5050. Also mentioned previously, in this construction, the second module 5015 monitors the voltage of the battery pack 50 (e.g., the total voltage of all the battery cells 80). The battery 50 can further enter the pulse mode 5030 when the battery 50 reaches a disable-required state through detection and operation of the third module 5020, as indicated by the event 5060. Also mentioned previously, in this constructions, the third module 5020 monitors the temperature of the battery 50 as sensed by the temperature-sensing device 150.

In one example, the first module 5010 can detect when one or more battery cell voltages drop below a predetermined threshold that is representative of a battery cell voltage nearing or at the voltage indicative of the disable-required state. In one construction, the first module monitors battery cell voltages in order to detect when one or more battery cells reaches a first threshold of approximately 1.4 V, which is a voltage nearing a disable-required state. In other constructions, the first threshold can be indicative of a cell "reversal" voltage. Battery cell damage can occur if the cell voltage drops to or below a certain voltage, such as, for example, a cell reversal voltage. In some constructions, cell reversal occurs at approximately 0 V. In some constructions, the first module 5010 can set the first threshold at a voltage higher than the cell reversal voltage to establish a cell reversal threshold as a preventative precaution. In some constructions, the cell reversal threshold can still be set at the cell reversal voltage. In a second construction, for example, the first module 5010 can set the first threshold (e.g., the cell reversal threshold) for approximately 1 V.

Figure 66:
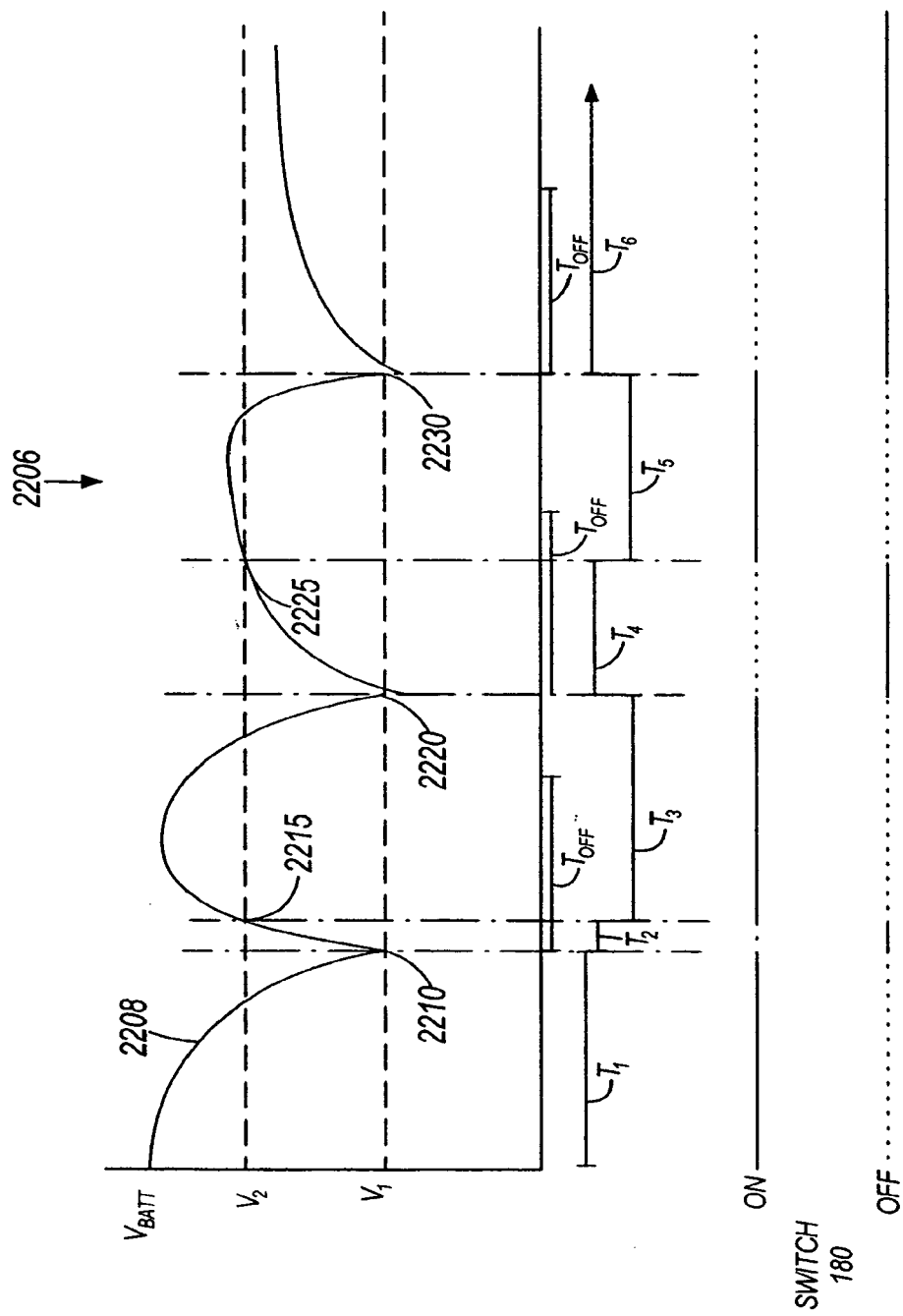
FIG. 66 is a graphical representation of a first mode of operation for a battery, such as one of the batteries shown in FIGS. 1-3.
Figure 67:
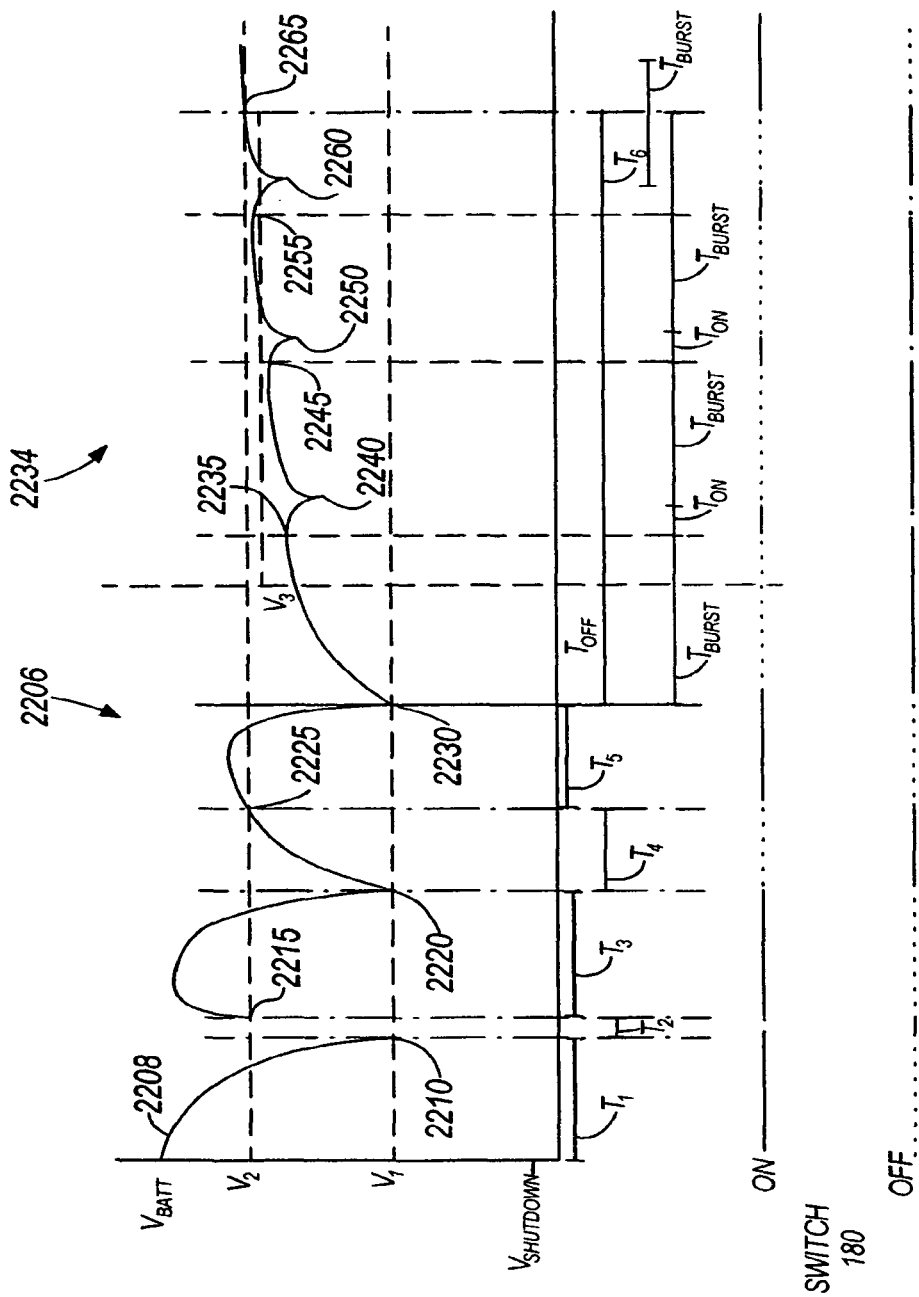
FIG. 67 is a graphical representation of a second mode of operation for a battery, such as one of the batteries shown in FIGS. 1-3.

In some constructions, when one or more battery cell voltages reaches this first threshold, the first module 5010 causes the battery 50 to enter one of the modes of operation shown and described in FIGS. 66 and 67. In some constructions, the first module 5010 can trigger the battery 50 to enter one of the modes of operation in order to signal to a user that the battery 50 is nearing end of discharge or nearing the disable-required state. In other constructions, the first module can trigger the battery 50 to enter one of the modes of operation in order to prolong the battery's ability to power an electrical device during discharge before the battery 50 enters the pulse mode 5030 discussed above.

In some instances, the battery 20 can experience a voltage "depression" (e.g., large temporary drop in voltage) during the start of discharge. The voltage depression can typically be temporary and most evident at low battery temperatures. In some constructions, a voltage depression can drop to or below the cell reversal threshold. In these constructions, the first module 5010 can control the switch 180 such that the battery 50 can continue operation (i.e., continue to supply discharge current) through the voltage depressions.

FIG. 66 illustrates a first exemplary implementation of the semiconductor switch 180 during battery discharge use. In this exemplary implementation, the switch 180 can be controlled by the first module 5010 of the microcontroller 140. Also, in this exemplary implementation, the semiconductor switch 180 operates in a hysteretic manner, such that a first voltage threshold $V_1$ triggers the switch 180 to turn off (e.g., enter a non-conductive state) and a second voltage threshold $V_2$ (different from the first voltage threshold $V_1$) triggers the switch 180 to turn on (e.g., enter a conductive state). This implementation can be used to maintain or continue battery operation during large voltage fluctuations and to avoid the semiconducting switch 180 from being prematurely held in a non-conducting state (i.e., prohibiting discharge current to be supplied to the load) by the circuit 130 (e.g., microcontroller 140). In the construction shown, the first voltage threshold $V_1$ is less than the second voltage threshold $V_2$. In other constructions and implementations, the battery 50 can include additional voltage thresholds which may or may not be dependent on other characteristics, such as, for example, battery temperature, battery cell temperature, run-time, load requirements (e.g., voltage requirements for certain power tools 55), and the like.

FIG. 66 illustrates a first mode 2206 of operation for the battery 50. During the first mode 2206 of operation, the semiconducting switch 180 of the battery 50 turns off and on (i.e., enters non-conducting and conducting states) during discharge operation when one or more battery cells voltages reaches a first voltage threshold $V_1$ and recovers to a second voltage threshold $V_2$, respectively. The first mode 2206 of operation can occur when the battery 50 approaches the end of discharge and can also provide an indication to the user that the battery 50 is approaching the end of discharge and, in some instances, the disable-required state. However, the first mode 2206 of operation can occur at such a fast pace such that the user is unaware that the battery 50 is operating in the first mode 2206. The first mode 2206 of operation can also occur when the battery 50 operates in low temperatures and experiences large voltage fluctuations. Again, the first mode 2206 of operation may indicate to a user that the battery 50 has entered the first mode 2206, but can also occur so rapidly that the user is unaware.

In some constructions during the first mode 2206 of operation, when one battery cell voltage reaches the first voltage threshold $V_1$ and the semiconducting switch 180 enters a non-conductive state, the battery 50 is considered to be in a "soft" shut-off state or establishes a "soft" shutdown. In some constructions, this is considered a soft shutdown due to the fact that the semiconducting switch 180 can be activated by the microcontroller 140 (or circuit 130) to enter a conductive state if the battery cell voltage recovers to the second voltage threshold $V_2$ within a predetermined amount of time, such as, for example, a shutdown time $T_{off}$ of approximately 100-ms. If the battery cell voltage does not recover to the second threshold voltage $V_2$ within the allotted shutdown time $T_{off}$, then the microcontroller 140 (or circuit 130), in some constructions, performs a "hard" shutdown. In some constructions, the hard shutdown requires an external signal, such as a signal from a battery charger 60, power tool 55, another electrical device, or the like, to be received by the battery 50. The signal can be an indication for the microcontroller 140 (or circuit 130) to "reset" the switch 180 (e.g., switch to the conducting state).

In the illustrated construction, the curve 2208 represents the voltage of a battery cell 80 during use with a power tool 55, such as, for example, a circular saw 56, a driver drill 58 or the like. During the start of operation (e.g., during time $T_1$), the microcontroller 140 drives the semiconducting switch 180 into a conducting state, thus allowing discharge current to be supplied to the power tool 55. When the battery cell voltage 2208 reaches the first voltage threshold $V_1$ at point 2210, the microcontroller 140 drives the semiconducting switch 180 to the non-conducting state, thus interrupting current from being supplied to the power tool 55.

While the semiconducting switch 180 is in the non-conducting state (e.g., in the off state), the battery cell voltage 2208 recovers. When the battery cell voltage 2208 recovers to the second voltage threshold $V_2$ at point 2215, the microcontroller 140 drives the semiconducting switch 180 to the conducting state, thus allowing discharge current to be supplied to the power tool 55 again.

The power tool 55 continues with operation during time $T_3$ until the battery cell voltage 2208 reaches the first voltage threshold $V_1$ at point 2220. The microcontroller 140 again drives the semiconducting switch 180 to the non-conducting state. The semiconducting switch 180 stays in the non-conducting state during time $T_4$ until the battery cell voltage 2208 recovers to the second voltage threshold $V_2$ at point 2225. During time $T_5$, the semiconducting switch 180 is conducting until the battery cell voltage 2208 again reaches the first voltage threshold $V_1$ at point 2230.

As shown in FIG. 66 with respect to time $T_6$, the battery cell voltage 2208 does not recover to the second voltage threshold $V_2$ prior to the expiration of the shutdown time $T_{off}$. Once the shutdown time $T_{off}$, the microcontroller 140 performs a hard shutdown. Accordingly, the semiconducting switch 180 remains in a non-conducting state even if the battery cell voltage 2208 subsequently recovers to the second threshold voltage $V_2$.

In some constructions, the battery 50 operates in the first mode 2206 only when power is needed to be delivered to the load, such as, for example, when an operator is depressing a trigger switch on a power tool 55.

FIG. 67 illustrates a second exemplary implementation of the semiconductor switch 180 during battery discharge use. In this exemplary implementation, the first module 5010 controls the battery 50 such that the battery 50 operates in a similar manner as shown and described in FIG. 66 (i.e., the first mode 2206 of operation). In the second implementation, the battery 50 operates a second mode 2234 of operation following the first mode 2206 of operation. In one construction, the second mode 2234 of operation is the pulse mode 5030 discussed above.

As shown in FIG. 67, once the battery cell voltage 2208 reaches the first threshold $V_1$ at point 2230, the semiconducting switch 180 is driven into the non-conducting state and the battery cell voltage 2208 does not recover to the second voltage threshold $V_2$ prior to the expiration of the shutdown time $T_{off}$. In one construction of this implementation, when the battery cell voltage 2208 fails to recover to the second voltage threshold $V_2$ prior to the expiration of the shutdown time $T_{off}$, the first module 5010 detects this event as a near disable-required state and controls the battery 50 to enter the second mode 2234 of operation (e.g., the pulse mode 5030).

As mentioned previously, when the shutdown time $T_{off}$ expires, the battery 50 enters the second mode 2234 of operation. During the second mode 2234 of operation, the microcontroller 140 (or circuit 130) can control the semiconducting switch 180 to open (i.e., enter non-conducting state) and close (i.e., enter conducting state) at a predetermined frequency or duty-cycle. For example, the microcontroller 140 (or circuit 130) drives the semiconducting switch 180 to a non-conducting state for a predetermined time $T_{burst}$, such as approximately 200-ms. Upon expiration of the predetermined time $T_{burst}$, the microcontroller (or circuit 130) drives the semiconducting switch 180 to a conducting state for a set time $T_{on}$, such as approximately 10-ms. In some constructions, the microcontroller 140 (or circuit 130) drives the semiconducting switch 180 to the conducting state at a duty-cycle of approximately 10%.

As shown in FIG. 67, during the second mode 2234, the semiconducting switch 180 is in the non-conducting state for the duration of the predetermined time $T_{burst}$. When the predetermined time $T_{burst}$ expires at point 2235, the microcontroller 140 (or circuit 130) drives the semiconducting switch 180 to the conducting state for the duration of the set time $T_{on}$, which expires at point 2240. During this time $T_{on}$, the battery cell voltage 2208 dips (assuming that the load is still requiring current draw from the battery 50, such as, for example, a power tool user has the trigger switch depressed throughout the duration of the second mode 2234). The microcontroller 140 (or circuit 130) drives the semiconducting switch 180 back to the non-conducting state at point 2240 until the expiration of the predetermined time $T_{burst}$ at point 2245. During this time $T_{burst}$, the battery cell voltage 2208 can recover since no current is being supplied to the battery 50.

Still referring to FIG. 67, the semiconducting switch 180 is driven to the conducting state at point 2245 until point 2250, which is the expiration of the set time $T_{on}$. During the time $T_{on}$, the battery cell voltage 2208 experiences another dip. Again, the switch 180 is driven to the non-conducting state at point 2250, and the battery cell voltage 2208 can recover during this time. At point 2255, the microcontroller 140 (or circuit 130) drives the switch 180 back to the conducting state, and at point 2260, the microcontroller 140 (or circuit 130) then drives the switch 180 to the non-conducting state.

During the predetermined time $T_{burst}$, the battery cell voltage 2208 recovers to the second voltage threshold $V_2$ at point 2265. In some constructions, at point 2265, the battery 50 can operate in the first mode 2206 again. Similarly, upon conclusion of the first mode 2206, the battery 50 can enter the second mode 2234 of operation again. In other constructions, if the battery cell voltage 2208 does not recover to the second voltage threshold $V_2$, the battery 50 can continue operating in the second mode 2234 until a predefined amount of time expires (e.g., approximately 1-min) or until the battery voltage 2208 reaches a shutdown voltage threshold $V_{shutdown}$, where the battery 50 can perform a hard shutdown. In still further constructions, when the second mode 2234 is operating in the pulse mode 5030, the battery 50 continues to operate in the second mode 2234 regardless if the battery cell voltage 2208 recovers to the second voltage threshold $V_2$ at point 2265. In still further constructions when the battery 50 operates in the pulse mode 5030 during the second mode 2234 of operation, the battery 50 can exit the pulse mode 5030 only when the microcontroller 140 disables the battery 50 after a predefined amount of time expires, regardless of whether or not the battery cell voltage 2208 recovers.

If the battery 50 is being used with a power tool 55, such as a driver drill 58, and the user is depressing the trigger switch of the drill 58, the drill 58 will receive small bursts of power when the battery 50 operates in the above-described second mode 2234. This can create a more perceptible signal to the user indicating that the battery 50 is nearing end of discharge or that the battery 50 is operating in low temperatures with large voltage fluctuations (typically due to a high current draw from the load).

In other constructions, the second mode 2234 of operation can include another hysteretic method of operation for the semiconducting switch 180. For example, rather than waiting for the battery cell voltage 2208 to recover to the second voltage threshold $V_2$ during the second mode 2234 of operation, the microcontroller 140 (or circuit 130) can drive the semiconducting switch 180 to the conducting state when the battery cell voltage 2208 recovers to a third voltage threshold $V_3$, which can be lower than the second voltage threshold $V_2$.

In further constructions, the second mode 2234 of operation can include the similar hysteretic method of operation for the semiconducting switch 180 as the first mode 2206, except for establishing a longer shutdown time $T_{off}$. For example, during the second mode 2234 of operation, the battery cell voltage 2208 can still need to recover to the second voltage threshold $V_2$ prior to the expiration of the shutdown time $T_{off}$. However, in the second mode 2234, the shutdown time $T_{off}$ can be, for example, approximately 200-ms rather than 100-ms.

In still further constructions, the microcontroller 140 (or circuit 130) can drive the semiconducting switch 180 to the conducting state with a variable duty-cycle when the battery 50 is operating in the second mode 2234. For example, the microcontroller 140 (or circuit) can vary the length of the set time $T_{on}$ to gradually decrease or increase throughout operation in the second mode 2234. The microcontroller 140 (or circuit 130) can also vary the length of the predetermined time $T_{burst}$ to gradually decrease or increase throughout operation in the second mode 2234, for example. The microcontroller 140 (or circuit 130) can further vary both the length of the set time $T_{on}$ and the length of the predetermined time $T_{burst}$ to gradually decrease or increase throughout operation in the second mode 2234.

In still further constructions, the microcontroller 140 (or circuit 130) can continue to operate the semiconducting switch 180 in the second mode 2234 of operation until the battery 50 receives a signal from an electrical device, such as, for example, a battery charger 60. The signal can indicate to the microcontroller 140 (or circuit 130) to activate the semiconducting switch 180 into a conducting state. In other constructions, the microcontroller 140 can hold the battery 50 in the second mode 2234 of operation if another abnormal condition in the battery 50 is detected, such as, for example, an imbalance between battery cells 80, high battery or battery cell temperature, low battery cell temperature, or the like.

In these above-described variations of the second mode 2234 of operation, the battery 50 can also create a more perceptible signal to the user indicating that the battery 50 is operating in the second mode 2234, that the battery 50 is nearing end of discharge or that the battery 50 is operating in low temperatures with large voltage fluctuations (typically due to a high current draw from the load).

As discussed previously, the battery 50 can include a second module 5015 that monitors battery voltage (e.g., total voltage of the battery cells 80). In this example, the second module 5015 can detect when the battery voltage drops below a predetermined threshold that is representative of a battery voltage nearing or at the voltage indicative of the disable-required state. In some constructions, when the battery voltage drops to the predetermined threshold, the battery 50 enters a third mode 5070 of operation (shown in FIG. 90).

Figure 90:
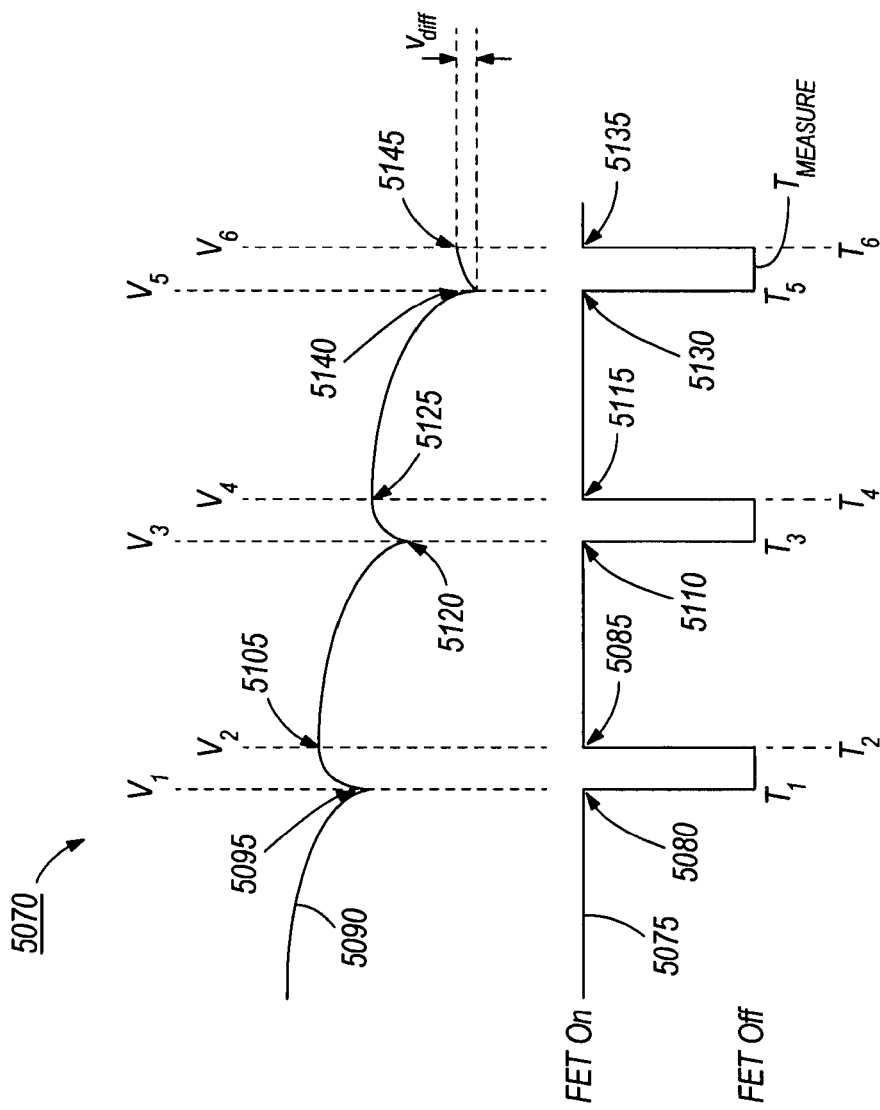
FIG. 90 is a graphical representation of a third mode of operation for a battery, such as one of the batteries shown in FIGS. 1-3.
Figure 91:
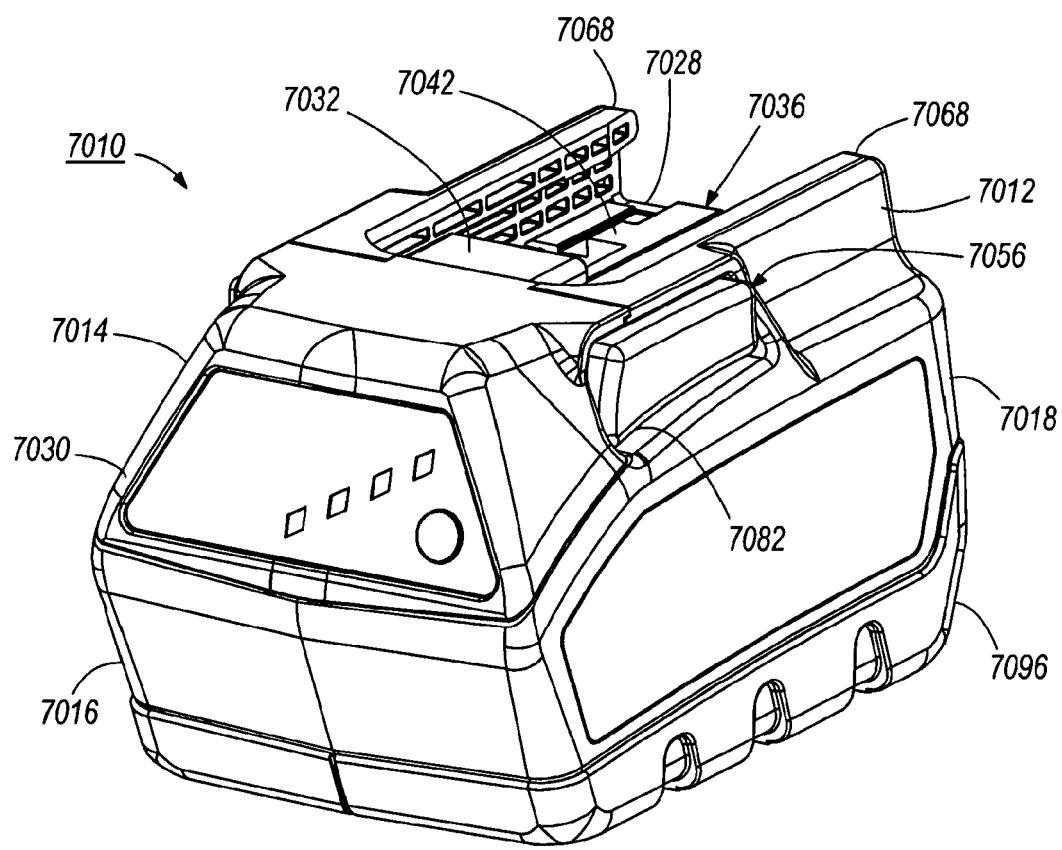
FIG. 91 is a front perspective view of a battery pack.
Figure 92:
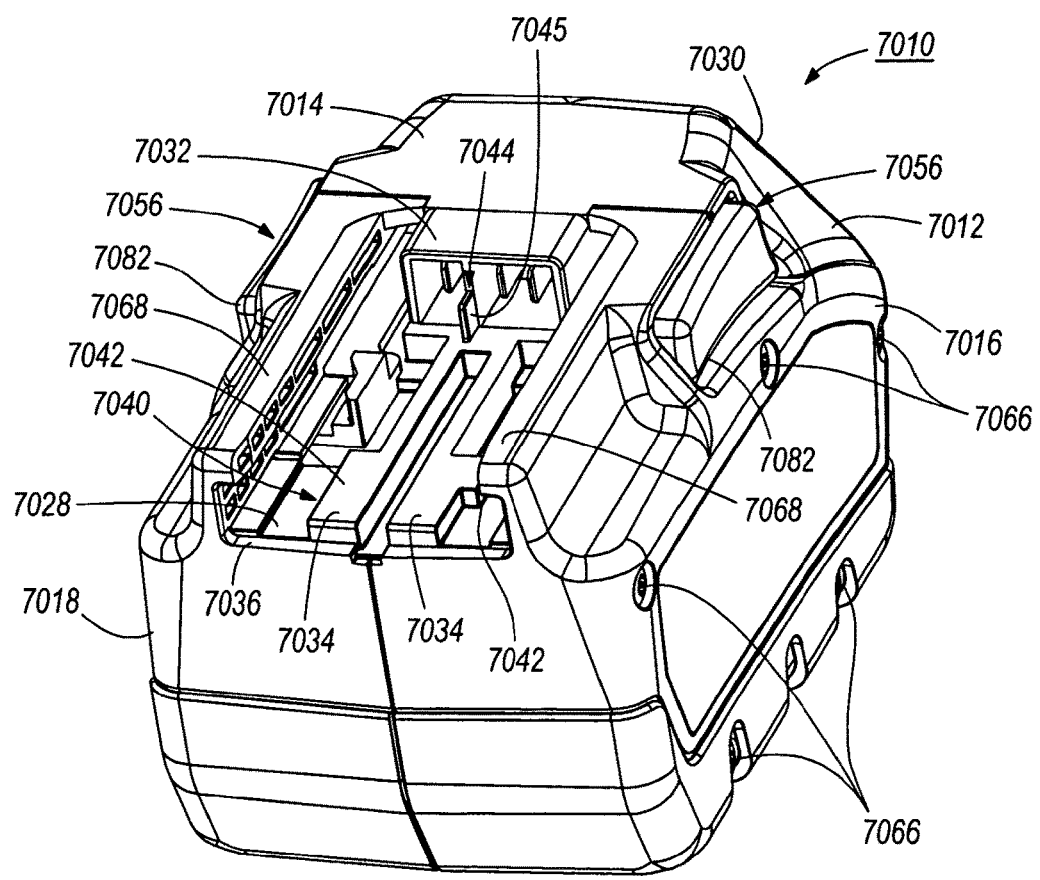
FIG. 92 is a rear perspective view of the battery pack of FIG. 91.
Figure 93:
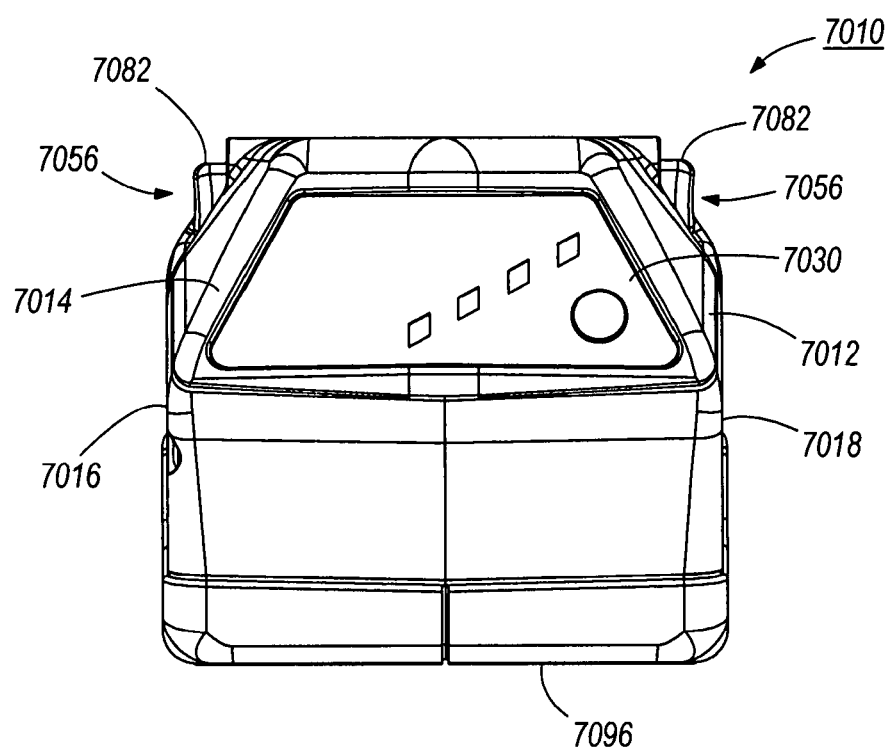
FIG. 93 is a front view of the battery pack of FIG. 91.
Figure 94:
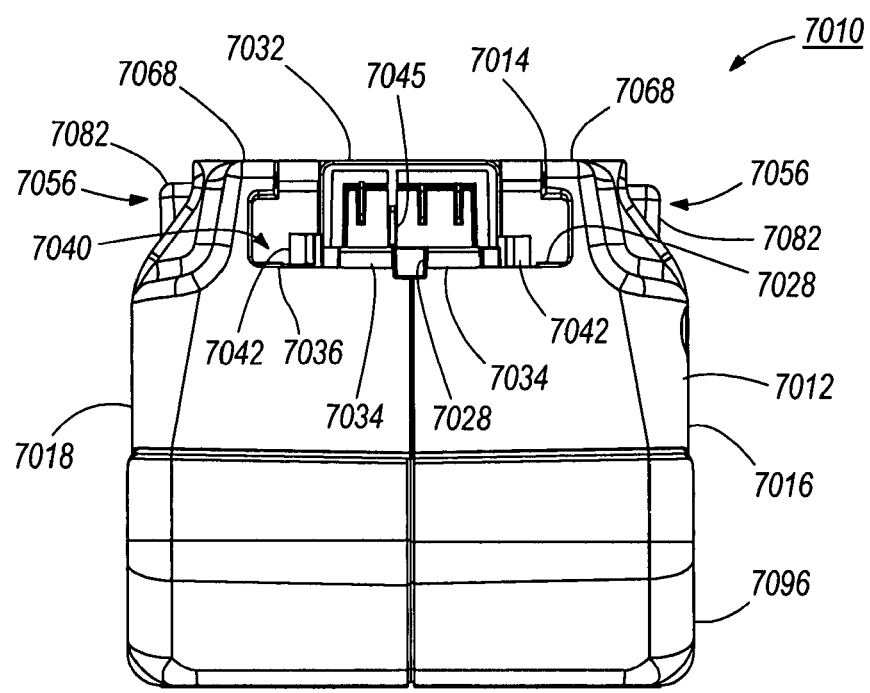
FIG. 94 is a rear view of the battery pack of FIG. 91.
Figure 95:
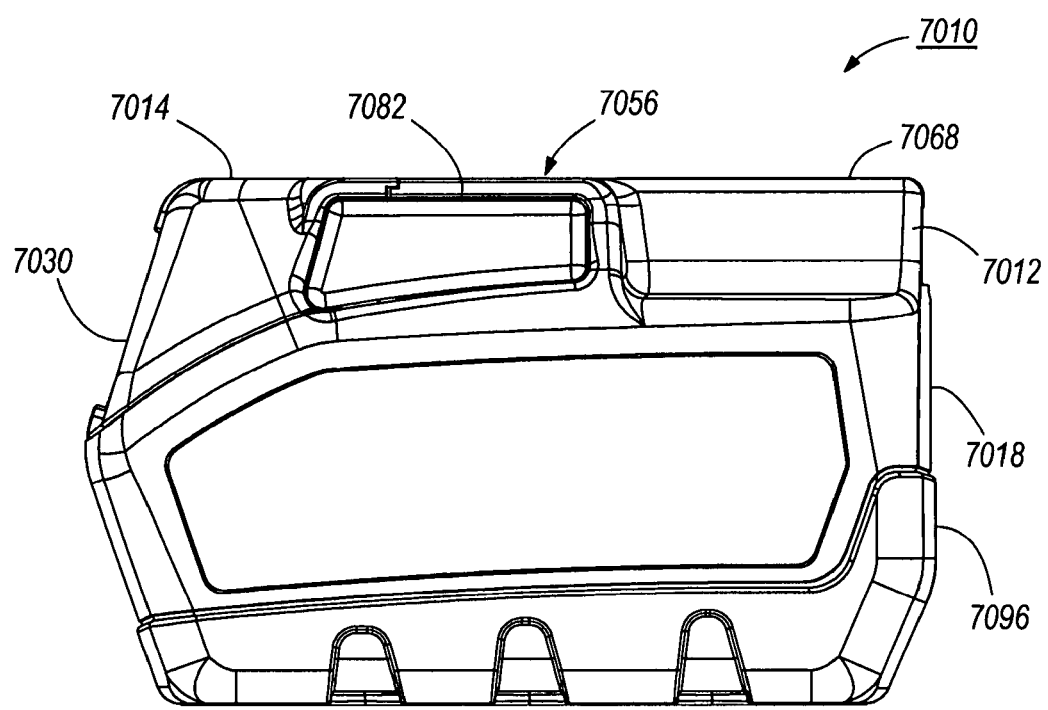
FIG. 95 is a left side view of the battery pack of FIG. 91.
Figure 96:
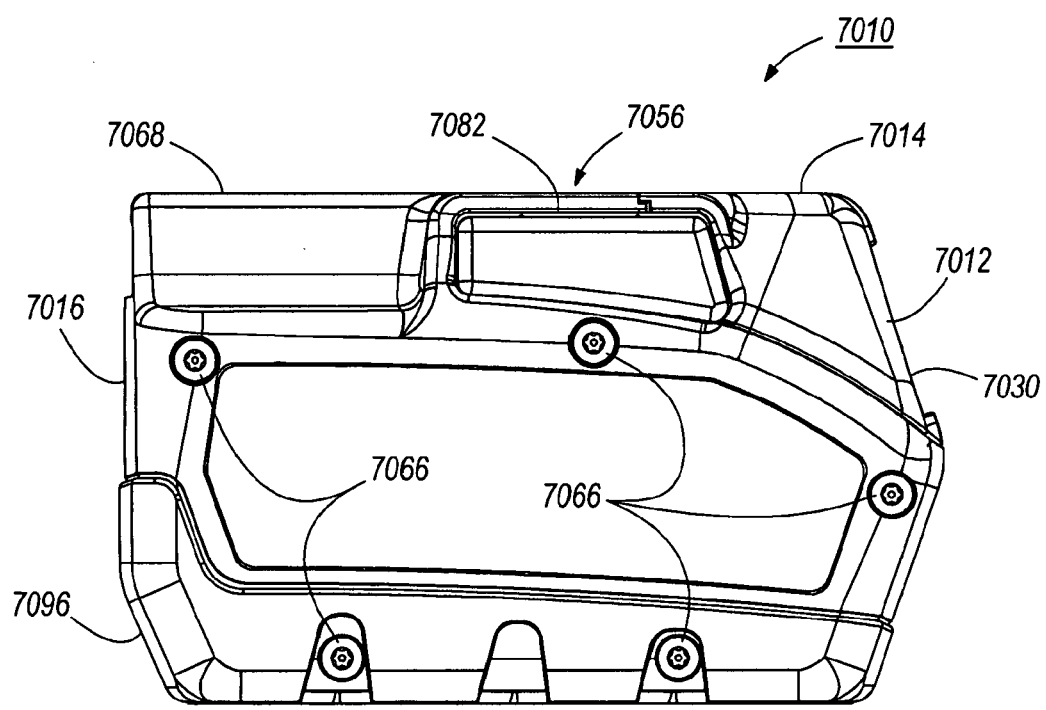
FIG. 96 is a right view of the battery pack of FIG. 91.
Figure 97:
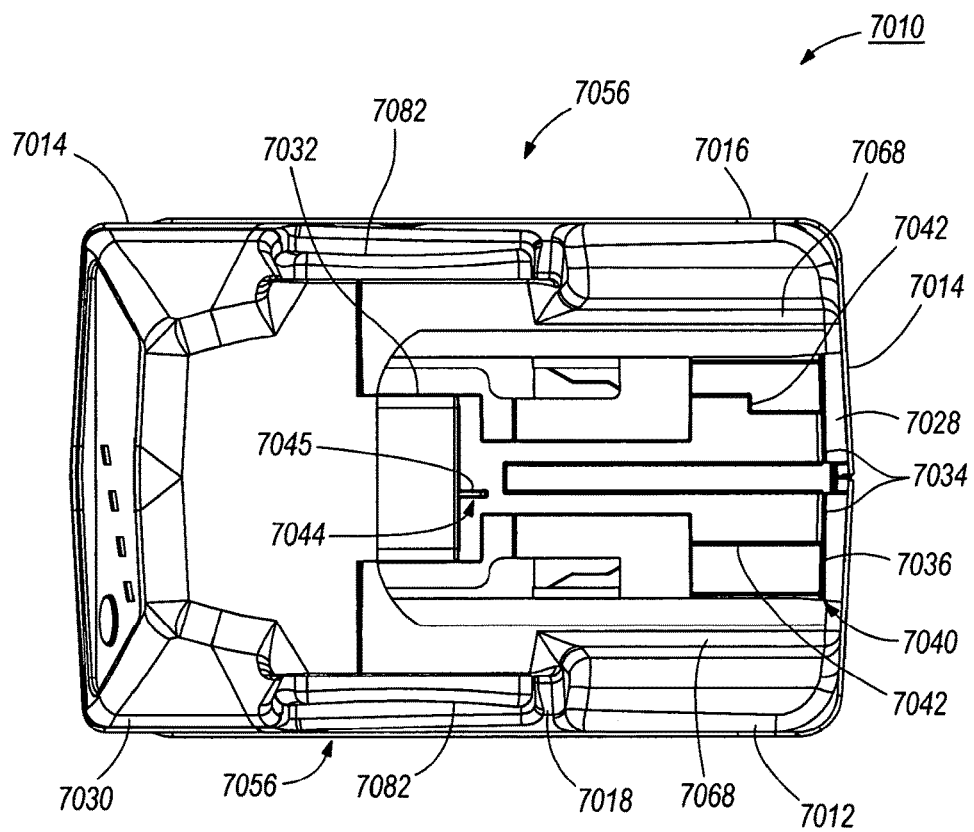
FIG. 97 is a top view of the battery pack of FIG. 91.

FIG. 90 illustrates an exemplary implementation of the third mode 5070 of operation for the battery 50. As shown, the second module 5015 triggers the third mode 5070 of operation when the second module 5015 detects a battery voltage equal to or less than a predetermined threshold. In one example, the predetermined threshold is 25.4 V. In other examples, the predetermined threshold can be greater than or less than 25.4 V. During the third mode 5070 of operation, the second module 5015 turns the switch 180 off periodically for a predetermined measurement time period $T_{measure}$. In one construction, the measurement time period $T_{measure}$ is approximately 0.5-ms once a second. The state 5075 of the switch 180 (e.g., power FET) is shown in FIG. 90.

As shown in the illustrated construction of FIG. 90, the microcontroller 140 makes a battery voltage measurement at time $T_1$ subsequent to the microcontroller 140 biasing the switch 180 to a non-conducting state at point 5080. Just prior to the expiration of the measurement time period $T_{measure}$, the microcontroller 140 makes another battery voltage measurement at time $T_2$. At time $T_2$, the microcontroller 140 biases the switch 180 to a conducting state (at point 5085).

As shown in FIG. 90, the battery voltage 5090 decreases during discharge (e.g., when the switch 180 is in a conducting state and current is being supplied to an electrical device) to a first battery voltage $V_1$ at point 5095. As illustrated, the microcontroller 140 biases the switch 180 into the non-conducting state at point 5095. During the measurement time period $T_{measure}$ when the switch 180 is non-conducting, the battery voltage 5090 begins to recover. Near the end of the measurement time period $T_{measure}$, the battery voltage 5090 recovers to a second battery voltage $V_2$ at point 5105. Once the second battery voltage measurement is made at point 5105, the microcontroller 140 determines the difference $V_{diff}$ between the first battery voltage $V_1$ and the second battery voltage $V_2$. If the difference $V_{diff}$ is substantially equal to or greater than a battery voltage difference threshold, the second module 5015 determines that the battery 50 has a sufficient state of charge and has not neared or entered a disable-required state. In one construction, the difference threshold is approximately 700 mV. In the illustrated construction, the difference $V_{diff}$ between the second battery voltage $V_2$ taken at time $T_2$ (at point 5105) and the first battery voltage $V_1$ taken at time $T_1$ (at point 5095) is greater than the battery voltage difference threshold. As shown in FIG. 90, the second module 5015 continues to operate the battery 50 in the third mode 5070.

Still referring to FIG. 90, at time $T_3$, which is approximately one (1) second from time $T_1$, the microcontroller 140 biases the switch 180 to a non-conducting state at point 5110. Subsequent to biasing the switch 180 at point 5110, the microcontroller 140 makes another battery voltage measurement. Prior to $T_4$ and the expiration of the measurement time period $T_{measure}$, the microcontroller 140 makes another battery voltage measurement before biasing the switch 180 to a conducting state at point 5115.

During time $T_2$ and time $T_3$, the battery voltage 5090 decreases from the second battery voltage $V_2$ at point 5105 to the third battery voltage $V_3$ at point 5120. During the measurement time period $T_{measure}$, the battery voltage 5090 recovers from the third battery voltage $V_3$ at point 5120 to the fourth battery voltage $V_4$ at point 5125. As shown in the illustrated construction, the difference $V_{diff}$ between the fourth battery voltage $V_4$ taken at time $T_4$ (at point 5115) and the third battery voltage $V_3$ taken at time $T_3$ (at point 5110) is greater than the battery voltage difference threshold. Accordingly, the second module 5015 continues battery operation in the third mode 5070.

Still referring to FIG. 90, at time $T_5$, which is, again, approximately one (1) second from time $T_3$, the microcontroller 140 biases the switch 180 to a non-conducting state at point 5130. Subsequent to biasing the switch 180 at point 5130, the microcontroller 140 makes another battery voltage measurement. Prior to $T_6$ and the expiration of the measurement time period $T_{measure}$, the microcontroller 140 makes another battery voltage measurement before biasing the switch 180 to a conducting state at point 5135.

As shown in FIG. 90, during time $T_4$ and time $T_5$, the battery voltage 5090 decrease from the further battery voltage $V_4$ at point 5125 to the fifth battery voltage $V_5$ at point 5140. Again, during the measurement time period $T_{measure}$, the battery voltage 5090 recovers from the fifth battery voltage $V_5$ at point 5140 to the sixth battery voltage $V_6$ at point 5145. In the illustrated construction, the difference $V_{diff}$ between the sixth battery voltage $V_6$ taken at time $T_6$ (at point 5135) and the fifth battery voltage $V_5$ taken at time $T_5$ (at point 5130) is less than the battery voltage difference threshold. Accordingly, the second module 5015 identifies that the battery 50 is nearing a disable-required state and triggers the battery 50 to operate in the pulse mode operation 5030.

As discussed previously, the battery 50 can also include a third module 5020 that monitors battery temperature. When the third module 5020 detects a high battery temperature (also referred to as a "battery over-temperature condition"), the third module 5020 triggers operation of the pulse mode 5030 for the battery 50. In this construction, a battery over-temperature condition is a near disable-required state.

Figure 88:
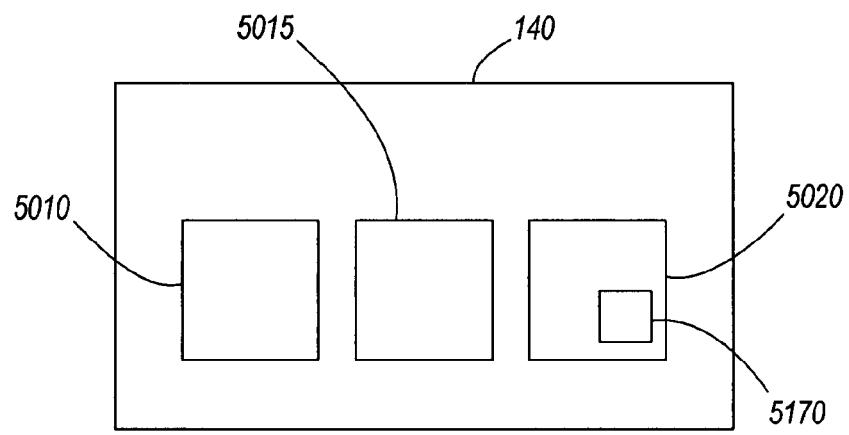
FIG. 88 is a schematic diagram of a microcontroller included in a battery, such as one of the batteries shown in FIGS. 1-3.

As shown in FIG. 88, the third module 5020 includes a temperature counter 5170. As the third module 5020 reads the temperature-sensing device (e.g., the thermistor 150), the third module 5020 increments the temperature counter 5170 by one (1) for every consecutive temperature reading that is equal to or higher than a battery over-temperature threshold. In some constructions the battery over-temperature threshold is approximately 75°. Also, the third module 5020 decrease the temperature counter 5170 by one (1) for every reading that is less than the battery over-temperature threshold. When the temperature counter 5170 accumulates five (5) consecutive battery over-temperature readings, the third module 5020 triggers the battery 50 to operate in the pulse mode 5030. In the exemplary implementation, a count of five (5) consecutive battery over-temperature readings indicates that the battery 50 is nearing a disable-required state.

In some constructions, the microcontroller 140 (or circuit 130) can only enable the battery 50 (i.e., drive the semiconducting switch 180 into the conducting state to allow discharge current flow) when the microcontroller 140 detects that the battery 50 is connected to a load or electrical device. In some constructions, this can provide protection against short circuiting the battery 50.

For example, when the battery 50 is used to power a power tool 55, the microcontroller 140 determines whether or not the battery 50 is connected to the tool 55 before driving the semiconducting switch 180 to the conducting state. For example, the battery 50 can include a mechanical switch (not shown) positioned on the housing 65 or within the terminal supports 70 to detect the presence of and connection to an electrical device, such as the power tool 55. The battery 50 can also include a sensor (not shown) positioned within the battery 50 to detect the presence of and connection to an electrical device. For example, the sensor can be connected to one of the positive terminal 110, the negative terminal 115, the sense terminal 120 or another dedicated terminal to receive or detect a signal from the electrical device, such as a power tool 55.

As mentioned previously, in some constructions and in some aspects, the microcontroller 140 (or circuit 130) periodically interrupts discharge current in order to measure the battery voltage or the voltage of one or more battery cells 80. For example, the microcontroller 140 (or circuit 130) may sample the battery voltage and/or one or more cell voltages at a sampling rate of approximately once every second. When the microcontroller 140 samples one or more voltages, the microcontroller 140 biases the semiconducting switch 180 to a non-conducting state for a brief time interval, such as, for example, approximately 10 µs. When the battery 50 is in use (i.e., providing a discharge current to a load, such as a power tool), the brief interruption of current is unnoticeable to the user. By interrupting the discharge current, the microcontroller 140 can obtain a more accurate state of charge reading of the battery 50.

In some constructions and in some aspects, the circuit 130, such as the microprocessor 140, can include variable response times for responding or reacting to monitored battery characteristics. In some constructions, the variable response time can include multiple monitoring modes for the circuit 130. That is, the circuit 130 (e.g., the microprocessor 140) can operate in multiple modes when detecting and/or monitoring battery characteristics such as, for example, cell state of charge, battery state of charge, and other similar battery characteristics. For example, the microprocessor 140 can include a first mode with a first sampling rate and a second mode with a second sampling rate. In some constructions, the first sampling rate can be set and can differ from the second sampling rate, which can also be set. In other constructions, the first sampling rate can be dependent on a first parameter, which may include, for example, one or more battery characteristics, one or more control signals from an electrical device (e.g., the power tool 55 or the battery charger 60), or the like, and may vary according to that first parameter. Similarly, the second sampling rate can also be dependent on the first parameter or can be dependent on a second parameter (similar to the first parameter, for example), and may vary according to that second parameter. In other constructions, the microprocessor 140 can include additional sampling rates and additional modes, as will be discussed below.

In some constructions, for example, the microprocessor 140 can operate in a first mode or "slow" mode. In these constructions, operation in the slow mode can reduce activation of the switch 180 due to voltage depressions by prolonging the response time. In some constructions, the microprocessor 140 may operate in the slow mode when the load on the battery 20 is not high enough to require a fast response time (e.g., the current draw is relatively low). In some constructions, the microprocessor 140 may operate in the slow mode until the present battery state of charge remaining drops below a predefined threshold, such as, for example, approximately 10% state of charge remaining.

In an exemplary implementation, the microprocessor 140 can sample the cell voltages at a slow rate, such as, for example, once per second, when operating in the slow mode. Since the microprocessor 140 is sampling at a slow rate, the microprocessor 140 experiences a slower response time. In some constructions, the slow mode may be adequate for most monitoring conditions and can reduce the quiescent current drawn by the circuit 130 (e.g., the microprocessor 140 and additional circuitry). In some constructions, the microprocessor 140 can operate in the slow mode as long as the cell voltages are above a predefined threshold or "mode switch" threshold, such as, for example, 3.73 V.

In some constructions, the microprocessor 140 can operate in a second mode or "fast" mode. In these constructions, operation in the fast mode can quicken the response time for detecting an abnormal condition. In some constructions, the microprocessor 140 can operate in the fast mode when the one or more cell voltages drop to the predefined threshold or "mode switch" threshold, such as, for example, 3.73 V. In some constructions, the microprocessor 140 can operate in the fast mode when the present battery state of charge remaining drops to a predefined threshold, such as, for example, approximately 10% state of charge remaining.

In another exemplary implementation, the microprocessor 140 samples the cell voltages at a fast rate, such as, for example, 100 samples per second when operating in the fast mode. In some constructions, the cell voltages sampled by the microprocessor 140 may be averaged over a certain number of samples before activation of the switch 180 occurs. In some constructions, for example, the switch 180 may not be activated by the microprocessor 140 unless the average of thirty samples is equal to or less than the cell reversal threshold. Averaging the samples can have an effect of digitally "filtering" the voltage information that is read by the microprocessor 140 and can provide some delay for the microprocessor 140 to ignore the "inrush" current and/or voltage depressions. Averaging the samples can also have an effect of filtering the voltage information from electrical noise due to external speed control circuits. In some constructions, the number of samples for averaging can vary depending on the operating mode of the microprocessor 140, the type of battery characteristic being monitored, and the like.

In some constructions, the microprocessor 140 may also activate the switch 180 when operating in the fast mode if the cell voltages drop below a predefined threshold, such as a cut-off threshold, for a certain amount of time such as, for example, several seconds. In some constructions, the cut-off threshold can be greater than the cell reversal threshold. For example, the cut-off threshold may be approximately 2 V, and the cell reversal threshold may be approximately 1 V. In cases where voltage drops below 1 V, response time my be much faster (on the order of 300 ms). The variable response times can reduce the amount of nuisance shut-downs while still protecting the cells adequately.

In some constructions, the voltage thresholds (the cut-off threshold and the cell reversal threshold) can be adjusted up or down by the microprocessor 140 in accordance with the battery temperature. This can allow for the optimization based on battery temperature characteristics.

In a further exemplary implementation, the microprocessor 140 can varying the response times by varying the number of samples to be averaged. For example, the microprocessor 140 can sample a battery characteristic such as, for example, battery temperature. According to a first mode, the microprocessor 140 can have a "slow" response time by averaging the battery temperature measurements over 50 samples. According to a second mode, the microprocessor 140 can have a "fast" response time by averaging the battery temperature measurements over 30 samples. In some constructions, the measurements can be sampled at the same rate. In other constructions, the measurements can be sampled at different rates. For example, the first mode can sample the measurements at a rate of approximately 1 sample per second, and the second mode can sample the measurements at a rate of approximately 10 samples per second.

In some constructions, the microprocessor 140 can control and limit the current draw without the need for current-sensing devices, because the microprocessor 140 is capable of sensing a high discharge current by monitoring cell voltages. For example, when a high current load causes the cell voltages to drop to a low level, such as, for example, the cut-off threshold and/or the cell reversal threshold, the microprocessor 140 may activate the switch 180 and disable the battery 20. The microprocessor 140 can indirectly limit the current draw by monitoring the cell voltages and disable the battery 20 when the cell voltages drop to certain levels (e.g., the cut-off threshold and/or the cell reversal threshold).

In some constructions and in some aspects, the circuit 130 (e.g., in some constructions, the microprocessor 140) can monitor battery conditions (e.g., battery cell voltage/present state of charge, battery cell temperature, battery pack voltage/present state of charge, battery pack temperature, etc.) periodically to reduce the parasitic current draw from the battery 50. In these constructions, the microprocessor 140 can operate in a "sleep" mode for a first predefined time period (i.e., a "sleep time period"). During the sleep mode, the microprocessor 140 may draw a low quiescent current from the battery 50. After the sleep time period expires, the microprocessor 140 can "wake up" or, in other words, can operate in an active mode for a second predefined time period (i.e., an "active time period"). During the active mode, the microprocessor 140 can monitor one or more battery conditions.

In some constructions, the sleep time period can be greater than the active time period. In some constructions, the ratio of the active time period to the sleep time period can be low such that the average parasitic current draw is low. In some constructions, the ratio can be adjusted (e.g., increased) during time periods of known battery activity, such as, for example, when the microprocessor 140 senses a discharge current or a charge current approximately equal to a predetermined threshold. In some constructions, when the microprocessor 140 detects certain voltage and/or temperature characteristics, the sleep time period can be decreased and/or the active time period can be increased.

In some constructions and in some aspects, the circuit 130 can include a voltage detection circuit 259. In some constructions, the voltage detection circuit 259 can include a plurality of resistors 260 forming resistor divider networks. As shown in the illustrated construction, the plurality of resistors 260 can include resistors 260*a-d*. The plurality of resistors 260 can be electrically connected to one or more battery cells 80*a-g* and to a plurality of transistors 265. In the illustrated construction, the plurality of transistors 265 can include transistors 265*a-d* or 265*a-f*. In some constructions, the number of resistors included in the plurality of resistors 260 can equal the number of transistors included in the plurality of transistors 265.

In some constructions, voltage characteristics of the battery 50 and/or of the battery cells 80 can be read by the microprocessor 140 through the plurality of resistors 260 when the microprocessor 140 is in the active mode. In some constructions, the microprocessor 140 can initiate a voltage-read event by turning off transistor(s) 270 (i.e., transistor 270 becomes non-conducting). When the transistor(s) 270 is non-conducting, the transistors 265*a-d* become conducting and voltage measurements regarding the battery 50 and/or battery cells 80 can be made by the microprocessor 140. Including the plurality of transistors 265 in the battery 50 can reduce the parasitic current draw from the battery 50, because the transistors 265 are only conducting periodically.

In some constructions and in some aspects, the microprocessor 140 communicates battery pack characteristics and/or conditions to electrical devices, such as, for example, a power tool 55 and/or a battery charger 60, when the battery 50 and the electrical device are electrically connected. In some constructions, the microprocessor 140 digitally communicates to the electrical device in a serial manner. The sense terminal 120 of the battery 50 provides a serial communication link between the microprocessor 140 and the electrical device. The information regarding the battery 50 that can be exchanged between the microprocessor 140 and the electrical device includes, but is not limited to, battery pack chemistry, battery pack nominal voltage, battery pack temperature, battery pack present state of charge, battery cell(s) nominal voltage, battery cell(s) temperature, battery cell(s) present state of charge, calibration techniques/information, charging instructions, number of charge cycles, estimated remaining life expectancy, discharging information, etc.

In some constructions, an electrical device, such as, for example, a battery charger 60, can calibrate the microprocessor 140 when electrical connection is established. In some constructions, the measuring circuitry included in the battery charger 60 will be more precise than the circuitry included in the battery 50. Therefore, the battery charger 60 calibrates the microprocessor 140 and/or the circuit 130 included in the battery 50 to improve battery measurements made by the microprocessor 140 and/or by the circuit 130.

In some constructions, the circuit 130 can also include a voltage regulator 273. The voltage regulator 273 can supply an appropriate voltage to the microprocessor 140, the LEDs 170a-d of the fuel gauge 155 and any other additional electrical component that requires a constant voltage input. In the illustrated construction, the voltage regulator 273 can output approximately 5 V.

In some constructions and in some aspects, the battery 50 may include a heat sink 275. The heat sink 275 can be in thermal communication with the power FET or switch 180. The heat sink 275 can serve to remove heat generated by the switch 180 away from the switch 180.

In some constructions and in some aspects, the battery 50 may also include a heat pipe (not shown) or a fan (not shown) to increase the amount of heat being transferred from the heat sink 275. Such a heat pipe can be in thermal communication with the heat sink 275 in order to remove heat collected by the heat sink 275. Such a fan or blower can be in a position to create a flow of cooling air to pass over the heat sink 275. Vents (not shown) can be positioned in the housing 65 of the battery 50 to allow cool air to enter the battery pack 50 and the heated air to leave the battery pack 50. In some constructions, the heat pipe and/or fan can be positioned to collect and/or remove heat generated by the battery cells 80a-e in addition to or as a substitute for the heat generated by the heat sink 275.

Figure 19:
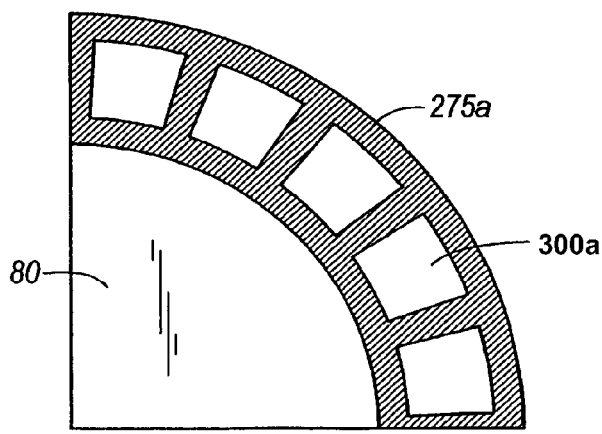
FIG. 19 is a cross-sectional view of a portion of yet another alternate construction of a battery, including a phase change material and a heat sink.
Figure 14D:
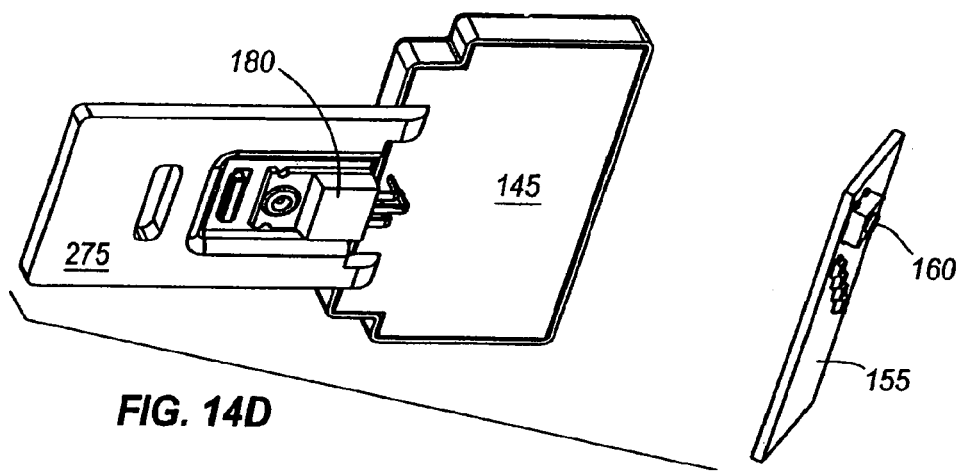
Figure 14E:
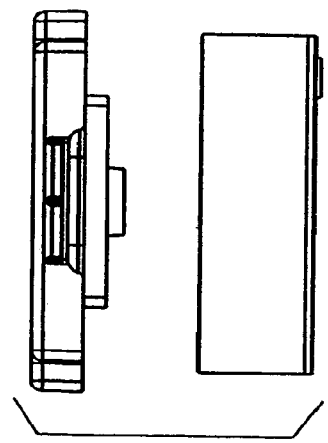
Figure 15:
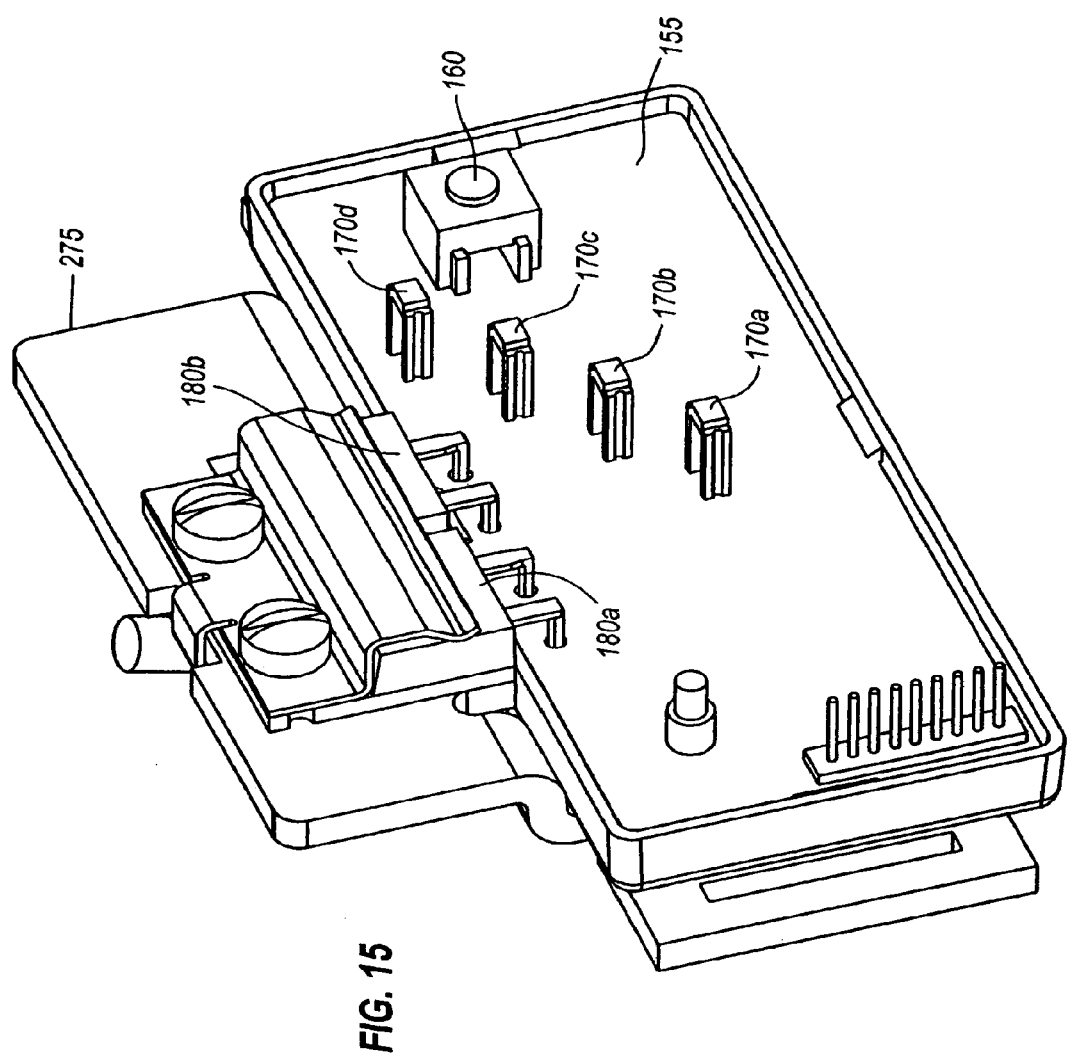
FIG. 15 is a perspective view of a portion of a battery, such as one of the batteries shown in FIGS. 1-3, with portions removed and illustrates the FET and the heat sink
Figure 16:
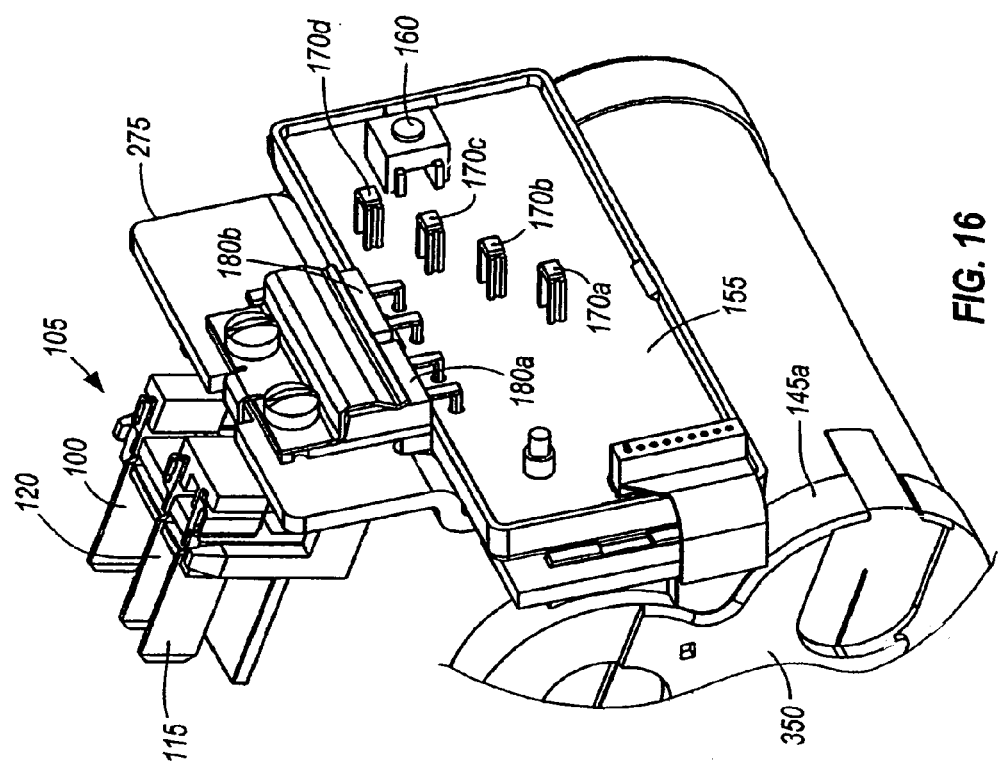
FIG. 16 is another perspective view of a portion of a battery, such as one of the batteries shown in FIGS. 1-3, with portions removed and illustrates the FET and the heat sink.
Figure 18:
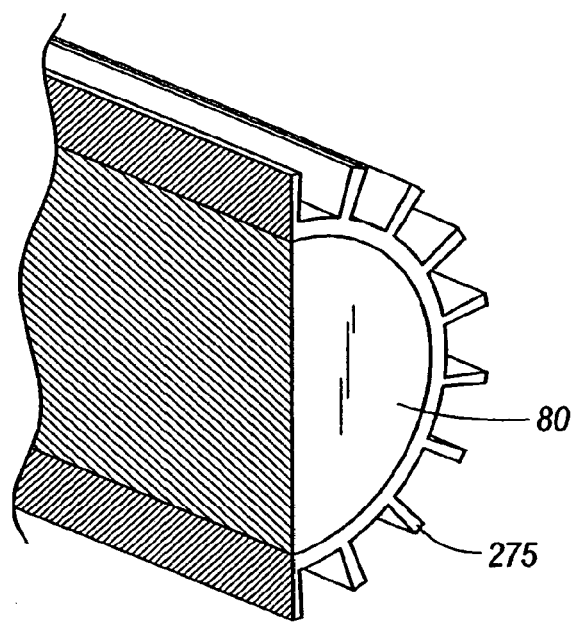
FIG. 18 is a cross-sectional view of a portion of another alternate construction of a battery including a phase change material and a heat sink.
Figure 17:
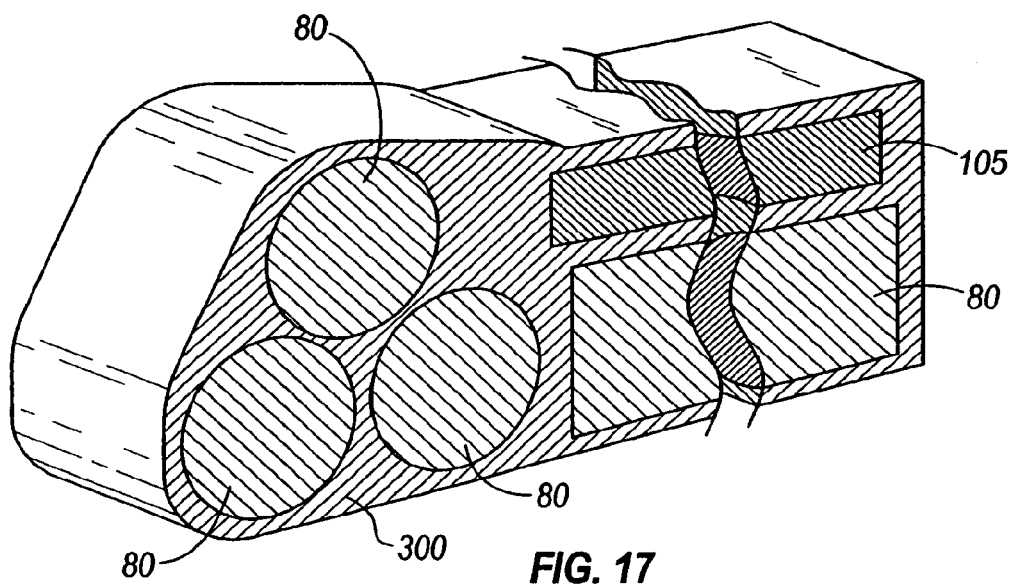
FIG. 17 is a perspective cross-sectional view of a portion of an alternate construction of a battery, including a phase change material.

In some constructions and in some aspects, the battery 50 can also include a phase change material 300 (see FIGS. 17-19). In such constructions, the phase change material 300 can be positioned to absorb and/or to remove heat generated by the battery cells 80a-g and conductive links 100 (not shown in FIGS. 17-19). As the phase change material 300 undergoes phase transformation (e.g., from solid to liquid, from liquid to gas, from liquid to solid, from gas to liquid, etc.) at a phase change temperature, a large amount of energy is absorbed or released (i.e., latent heat of fusion, latent heat of vaporization, etc.). During such a phase transformation, the phase change material 300 can have a relatively constant temperature.

In an exemplary implementation, the temperature of the battery cells 80 may increase as a load is applied to the battery cells 80. In some constructions, as illustrated in FIG. 20, the phase change material 300 can surround each of the battery cells 80. In such constructions, heat generated by the battery cells 80 may be first conducted to an exterior surface 305 of the battery cells 80, and then to the surrounding phase change material 300. As the phase change material 300 continues to absorb heat from the battery cells 80 and conductive links 100, the temperature of the phase change material 300 can increase. As the temperature of the phase change material 300 reaches the phase change temperature, the phase change material 300 can begin to undergo a phase transformation from a first phase to a second phase, while the temperature of the phase change material 300 remains relatively constant and approximately equal to the phase change temperature. In some constructions, the phase change material 300 may continue to undergo phase transformation until the phase change material 300 has completely transformed into the second phase and/or the load has been removed from the battery cells 80 (i.e., the battery cells 80 are no longer generating heat).

In some constructions and in some aspects, the phase change material 300 can have a phase change temperature greater than an expected ambient temperature and less than a maximum allowable battery cell temperature. In some constructions and in some aspects, the phase change material 300 can have a phase change temperature between −34° C. and 116° C. In some constructions and in some aspects, the phase change material 300 can have a phase change temperature in between 40° C. and 80° C. In some constructions and in some aspects, the phase change material 300 can have a phase change temperature between 50° C. and 65° C.

The phase change material 300 can be any suitable phase change material, can have a high latent heat per unit mass, can be thermally cyclable, inert, non-corrosive, non-contaminating, and can comprise paraffin waxes (such as those available from Rubitherm® headquartered in Hamburg, Germany), eutectic mixtures of salts (such as those available from Climator based in Skovde, Sweden), halogenated hydrocarbons and mixtures thereof, salt hydrate solutions, polyethylene glycol, stearic acid, and combinations thereof.

Figure 21A:
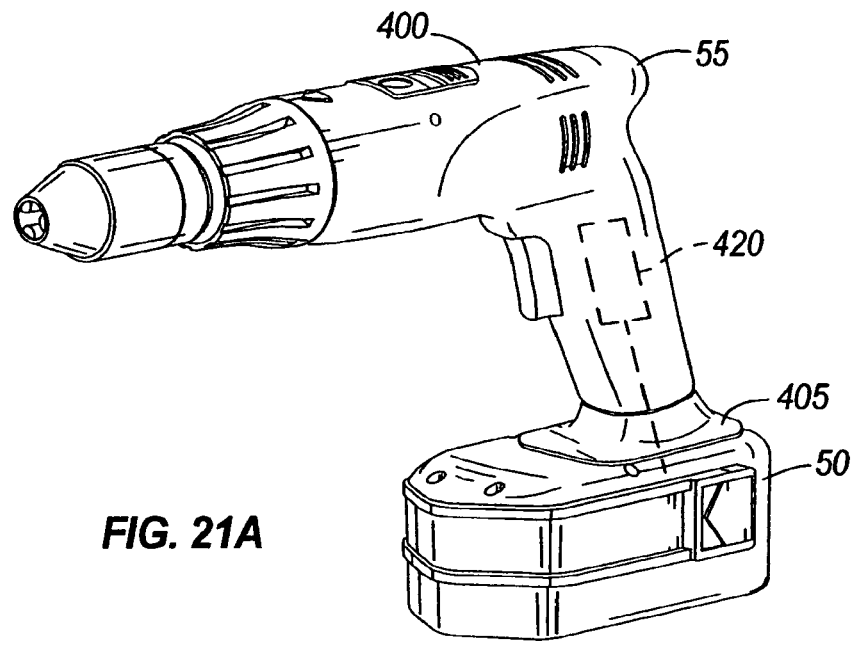
FIGS. 21A-C are a schematic views of a battery, such as one of the batteries shown in FIGS. 1-3, in use with an electrical device, such as a power tool.
Figure 21B:
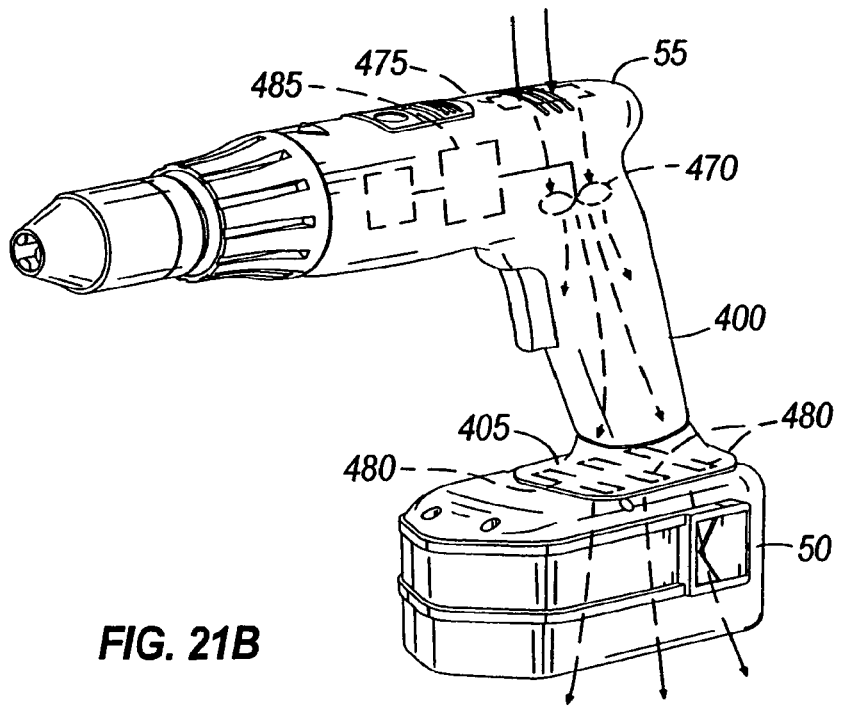
Figure 21C:
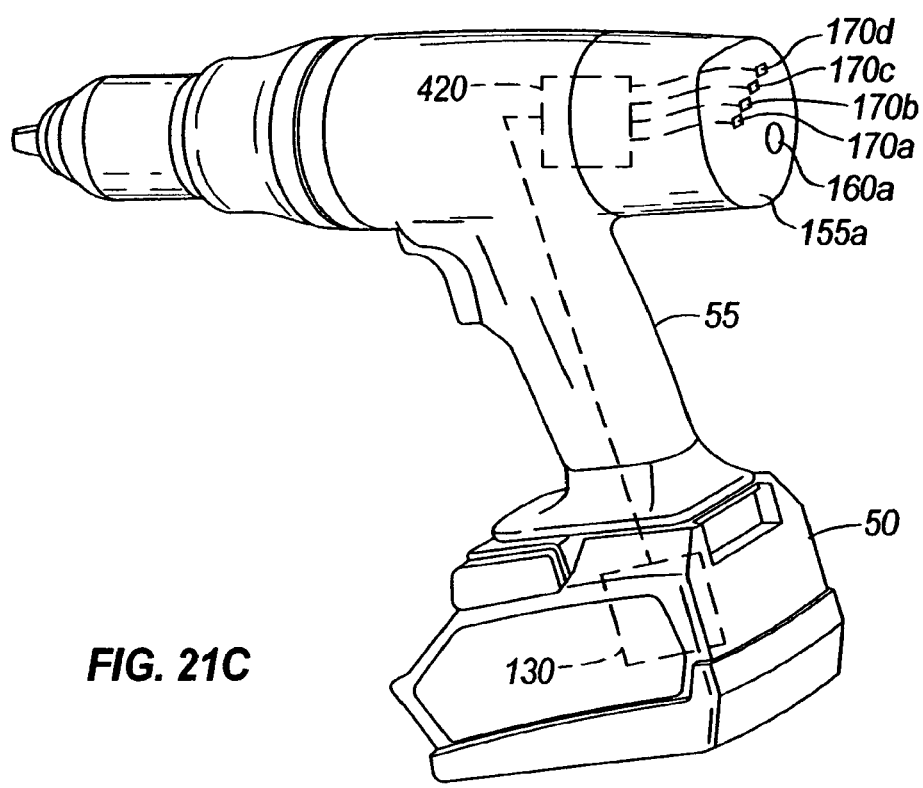
Figure 22:
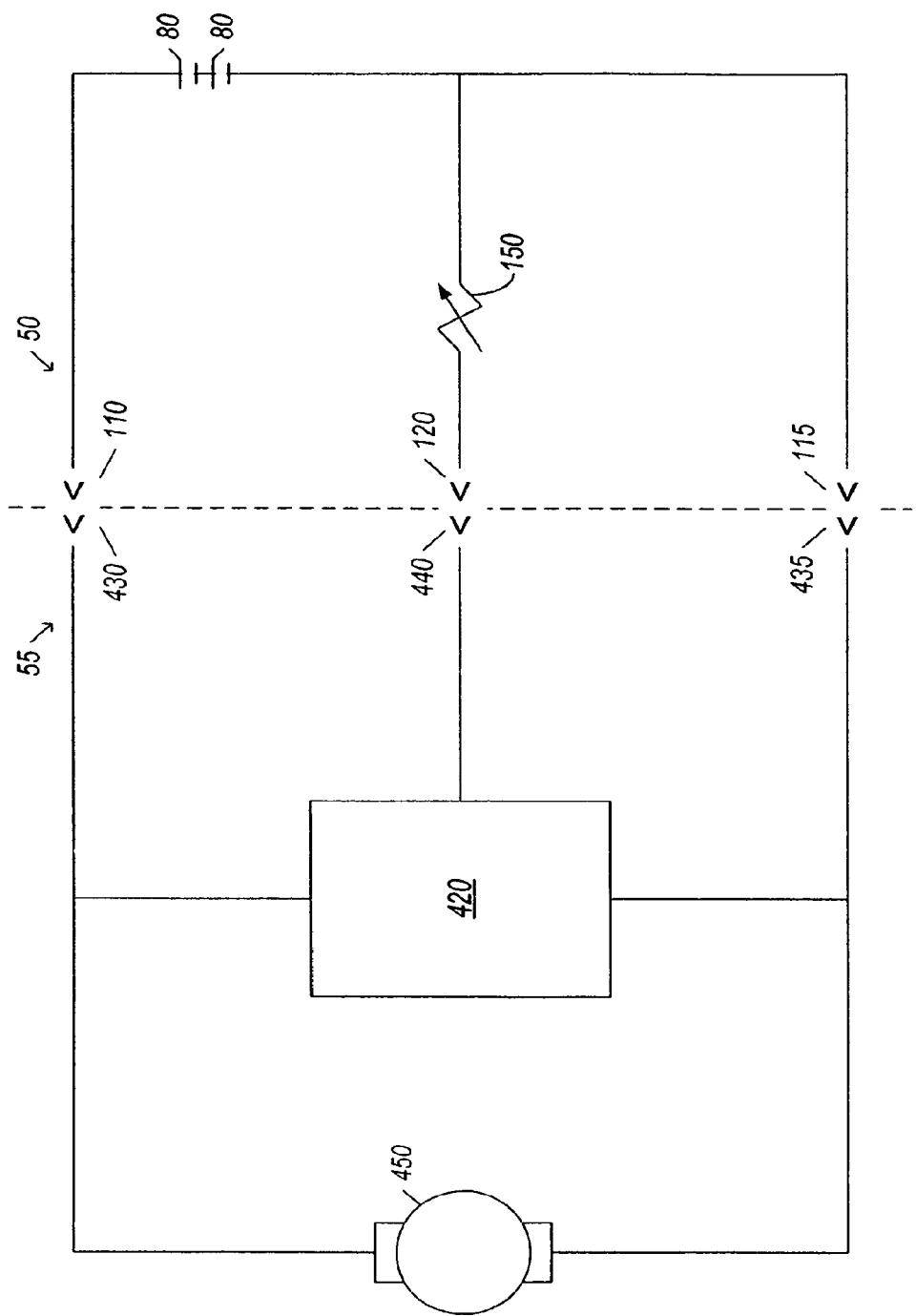
FIG. 22 is another schematic view of a battery, such as one of the batteries shown in FIGS. 1-3, in use with an electrical device, such as a power tool.

An alternate construction of a battery 50A is illustrated in FIGS. 21 and 22. Common elements have the same reference number "A".

In the illustrated construction, the battery 50A can further include a heat sink 275A to spread heat from the battery cell 80A over a greater area of the phase change material 300A. The heat sink 275A may also be employed to provide additional heat storage capacity to absorb and/or remove heat generated by the battery cells 80A.

In some constructions, the heat sink 275A may comprise one element (not shown) that wraps each and all of the battery cells 80a-e. In other constructions, the heat sink 275A may comprise multiple pieces such that each battery cell 80A is substantially wrapped by a heat sink 275A, as shown in FIGS. 21 and 22. In still other constructions, as shown in FIG. 21, the heat sink 275A may include an inner cylindrical portion 320 adjacent the exterior surface 305A of the battery cell 80A, an outer cylindrical portion 325 disposed a radial distance from the inner cylindrical portion 320 and radial ribs 330 spaced a circumferential distance from one another that connect the inner cylindrical portion 320 and the outer cylindrical portion 325 and define a space 335 therebetween. The space 335 may be filled with phase change material 300A. A similar configuration as that shown in FIG. 21 may also be employed to encapsulate multiple battery cells (not shown). In yet other constructions, the heat sink 275A may comprise radial ribs 330, as described above, without employing either or both of the inner cylindrical portion 320 and the outer cylindrical portion 325.

In another alternate construction, as shown in FIG. 22, the heat sink 275B can include an inner cylinder portion 320B and radial ribs 330B as described above, and the phase change material 300B may be offset from the battery cell 80B and the heat sink 275B. It should be understood that other heat sink and phase change material configurations are possible. The heat sink 275 may be formed of a metal (e.g., aluminum), a polymer (e.g., nylon), and/or any other material with high thermal conductivity and specific heat.

In some constructions and in some aspects, the battery 50 can include cushion members or "bumpers" 340. As shown in FIGS. 20A and B, the interior face 345 of the battery housing 65 can include one or more cushion members 340. In some constructions, the cushion members 340 can be integral with the housing 65. In other constructions, the cushion members 340 can be attached or secured to the interior face 345 of the housing 65. In further constructions, the cushion member 340 can be connected to one or more battery cells 80 or to an endcap 350 (partially shown in FIG. 16) surrounding one of the ends of the battery cells 80. In some constructions, the cushion members 345 can absorb energy during impact and protect the battery cells 80 during impact by limiting the amount of energy transferred to the cells 80. The cushion members 345 can include any thermoplastic rubber such as, for example, polypropylene RPT 100 FRHI (e.g., flame retardant-high impact).

As illustrated in FIGS. 21A-C, 22 and 23, the battery 50 can be configured to connect with an electrical device, such as the power tool 55. The power tool 55 includes a housing 400. The housing can provide a connection portion 405 to which the battery 50 can be connected. The connecting portion 405 can include one or more electrical device terminals (shown schematically in FIG. 22) to electrically connect the battery 50 to the power tool 55. The terminals included in the power tool 55 are configured to mate with the terminals 110, 115 and/or 120 included in the battery 50 and to receive power and/or information from the battery 50.

In some constructions, such as the constructions shown schematically in FIGS. 21A-C, the power tool 55 can include circuitry 420 to communicate with the battery 50, receive information from the battery 50, control operation of the power tool 55, and/or control the discharging process of the battery 50. In some constructions, the circuitry 420 may or may not include a microcontroller. In the illustrated construction, the power tool 55 can include a positive terminal 430 to connect to the positive terminal 110 of the battery 50, a negative terminal 435 to connect to the negative terminal 115 of the battery 50 and a sense terminal 440 to connect to the sense terminal 120 of the battery 50. The microprocessor 420 can be electrically connected to each of the terminals 430, 435 and 440.

The circuitry 420 can communicate with the battery 50 or receive information from the battery 50 through the sense terminal 440 regardless whether the battery 50 includes a microprocessor, such as microprocessor 140, or not. In constructions in which the battery 50 includes a microprocessor, such as microprocessor 140, two-way communication can occur across the sense terminals 120 and 440. The microprocessor 140 and circuitry 420 can exchange information back and forth, such as battery characteristics, power tool operating time and power tool requirements (e.g., current and/or voltage ratings).

In constructions in which the battery 50 does not include a microprocessor, the circuitry 420 periodically measures or detects one or more elements or components within the battery 50 to determine battery characteristics and/or battery operating information, such as, for example, battery chemistry, nominal voltage, present battery state of charge, cell voltages, temperature, etc. The circuitry 420 can control the operation of the power tool 55 based on these and other battery characteristics and operating information.

For example, in some constructions, the circuitry 420 can include a processor to be programmed to detect the battery temperature and disable the power tool 55 if the battery temperature is above a threshold temperature. In this example, the microprocessor 420 periodically detects the resistance of a thermistor 150 located in the battery 50 and determines the temperature of the pack 50 during tool operation (i.e., when a motor 450 within the tool 55 is running) The microprocessor 420 then determines if the temperature of the battery 50 is within an appropriate operating range. This can be accomplished by storing one or more temperature ranges within the microprocessor 420, allowing the microprocessor 420 to compare the detected temperature of the battery 50 to the one or more ranges. If the temperature of the battery 50 is not within the appropriate operating range, the microprocessor 420 interrupts the current flow from the battery 50 and/or shuts down the motor 450. In some constructions, the microprocessor 420 continues to disable the motor 450 and/or interrupt the current flow from the battery 50 until the temperature of the battery 50 falls within the appropriate operating range. In some constructions in which the microprocessor 420 determines that the temperature of the battery 50 is not within an appropriate operating range, the microprocessor 420 will not disable the motor 450 until the microprocessor 420 detects a low discharge current being supplied to the motor 450 by the battery 50. In some constructions, the motor 450 is re-enabled (i.e., power tool 55 is operable) when the microprocessor 420 detects that the battery 50 is removed from the power tool 55.

In some constructions and in some aspects, the power tool 55 can also include a fan or blower 470 to force cooling air through the tool 55 and battery pack 50, as shown in FIG. 21B. The battery cells 80a, heat sinks 275, heat pipes (not shown) and/or power FET or switch 180, if included in the battery 50, can then be cooled by the passing air. In such a construction, the battery 50 and the power tool 55 include one or more vents to allow cooling air in and to allow heated air out. The power tool 55 includes one or more inlet vents 475 which, in the illustrated construction, are positioned substantially on top of the power tool housing 400. The power tool 55 also includes one or more outlet vents 480 which are positioned substantially on the bottom of the connecting portion 405 of the power tool 55. The outlet vents 480 included in the power tool 55 are also positioned such that the inlet vents (not shown) of the battery 50 are substantially beneath the outlet vents 480. In the illustrated construction, a motor 485 included in the power tool 55 powers the fan 470. In some constructions, a microprocessor 490 included in the power tool 55 controls the operation of the fan 470. The microprocessor 490 can activate the fan 470 during predetermined time intervals and/or if a high battery temperature is detected.

Figure 68:
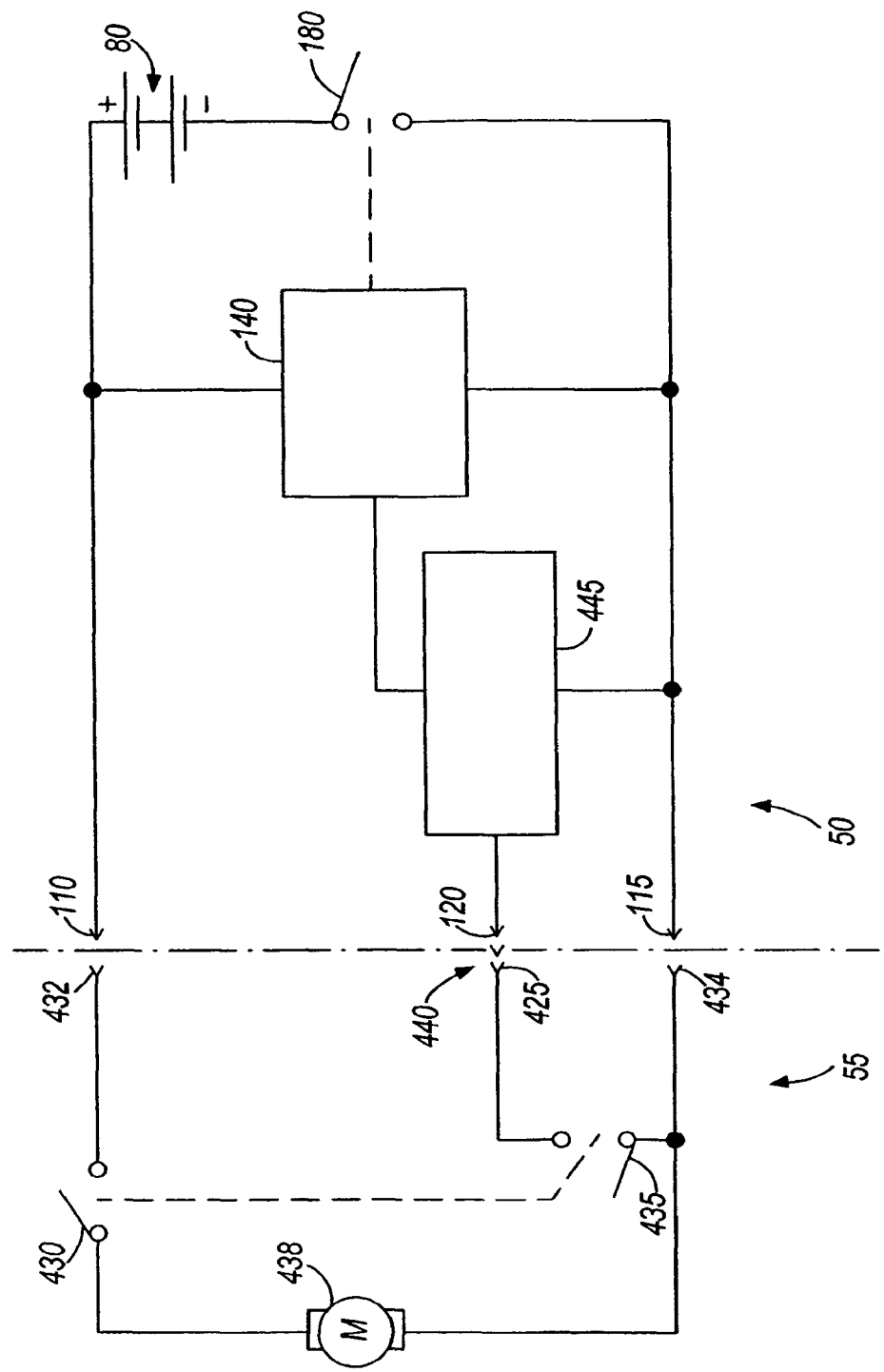
FIG. 68 is another schematic view of a battery, such as one of the batteries shown in FIGS. 1-3, in use with an electrical device, such as a power tool.

In some constructions and in some aspects, for example, the power tool 55 can include circuitry 420 that enables operation of the power tool 55. For example, as shown in FIGS. 21C and 68, the power tool 55 can include circuitry 420 that generates a signal to the microcontroller 140 of the battery 50 through the sense terminal 120 of the battery 50 and a sense terminal 425 of the power tool 55. When the microcontroller 140 receives the signal or detects the signal, the microcontroller 140 can activate the switch 180 (i.e., drives the switch 180 into the conducting state) and enable the battery 50 to supply power to the power tool 55.

In some constructions, the circuitry 420 included in the power tool 55 can include a simply passive circuit having one or more electrical components, such as, for example, resistor(s), capacitor(s), inductor(s), diode(s) and the like. In other constructions, the circuitry 420 can include microcontroller (not shown) power by a small battery (not shown) included in the tool 55 or powered by signals from the microcontroller 140 of the battery 50. In further constructions, the circuitry 420 can include other suitable components for generating a signal.

In still further constructions, the circuitry 420 can include memory that is accessed by the microcontroller 140 through the sense terminal 120 of the battery and the sense terminal 425 of the power tool 55. The memory can provide the necessary signal indicating an established connection between the tool 55 and battery 50 when accessed by the microcontroller 140. In some constructions, the memory can also include additional information to aid in the operation of the battery 50 and power tool 55. For example, the memory can include tool characteristics, such as, for example, the type of tool 55, prior tool use information (e.g., average run-time, average current draw, and the like), voltage, current and/or power ratings of the tool 55, and the like. The memory can also include other information to be supplied to the battery microcontroller 140, such as, for example, voltage converting information (e.g., tool 55 requires 12 V and battery 50 typically supplies 18 V), different rates for microcontroller 140 to sample battery characteristics, different thresholds for discharge operation, and the like.

In some constructions, the battery 50 may only be enabled when the electrical device is activated. For example, as shown in FIG. 68, the battery 50 can detect activation of a trigger switch 430 of a power tool 55. In this construction, the power tool 55 includes a trigger switch 430 which activates operation of the power tool 55. The trigger switch 430 is connected to the motor 438 and a positive terminal 432 of the tool 55. The tool 55 also includes an auxiliary switch or contact 435 that is responsive to the activation of the trigger switch 430. As shown in FIG. 68, the auxiliary contact 435 is connected to an information terminal, such as, for example, a sense terminal 425 of the tool 55, and to a negative terminal 434 of the tool 55.

In operation, when a user depresses the trigger switch 430 (closing the switch 430 and traditionally completely the circuit from the battery 50 to the tool 55), the auxiliary contact 435 in the tool 55 also closes. The microcontroller 140 in the battery 50 detects the closure of the auxiliary switch 425 through the sense terminal 120 or another information terminal. The microcontroller 140 drives the semiconducting switch 180 to the conducting state in order to power to the tool 55.

In this construction, the microcontroller 140 can detect the presence of the communication line 440 between the battery 40 and the tool 55 and can distinguish between a short connection and an open connection. The battery 50 can also include a communication line interface 445 to provide switch debounce, detection of dirty contacts, vibration proofness, minimum on and off times, and the like.

Also shown in FIG. 21C, the circuit 130 included in the battery 50 can communicate state of charge information to the microcontroller 420 included in the power tool 55. In this construction, the circuitry 420 in the power tool 55 can display the battery state of charge information on a fuel gauge 115a included on or in the housing of the tool 55. In this construction, the fuel gauge 155a can be similar to the fuel gauge 155 included in the battery 50 and can be operated in a similar fashion (e.g., in an automatic displaying mode, in a manual displaying mode, and the like). In some constructions, the fuel gauge 155a can include a push-button 160 and can include more or fewer LEDs (e.g., LEDS 170a-d) than shown and described.

Figure 23:
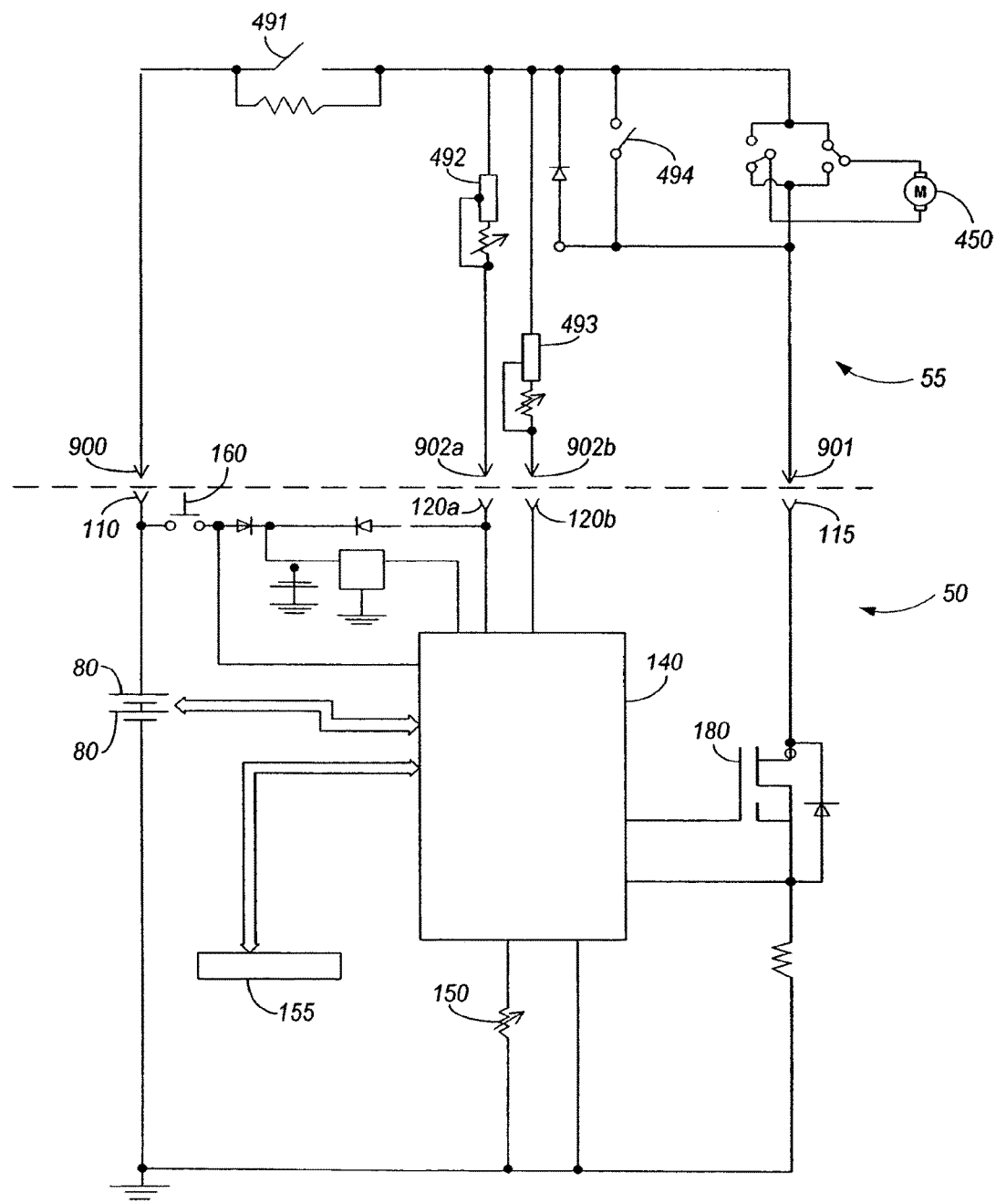
FIG. 23 is yet another schematic diagram of a battery, such as one of the batteries shown in FIGS. 1-3, in use with an electrical device, such as a power tool.

As shown in FIG. 23, the circuit 130 included in the battery 50 can also be used to control operation of an electrical device, such as a power tool 55. In the construction shown, the power tool 55 include a motor 450, a trigger switch 491 activated by a user, a speed control circuit 492, an electric clutch 493, and a brake 494. The tool 55 also includes a positive terminal 900 to connect to the positive terminal 105 of the battery 50, a negative terminal 901 to connect to the negative terminal 110 of the battery 50, and two sense terminals 902a and 902b to connect to two sense terminals 120a and 120b of the battery 50, respectfully. In other constructions, the power tool 55 and battery 50 can have more or fewer terminals than shown and described.

In this construction, the circuit 130 can provide tool speed control as well as monitor battery pack parameters or characteristics. The power MOSFET or switch 180 can control the switching function of the speed control circuit of the tool 55. In this construction, the power MOSFET used for the speed control circuit 492 can be included in the battery 50 rather than the power tool 55.

Figure 24:
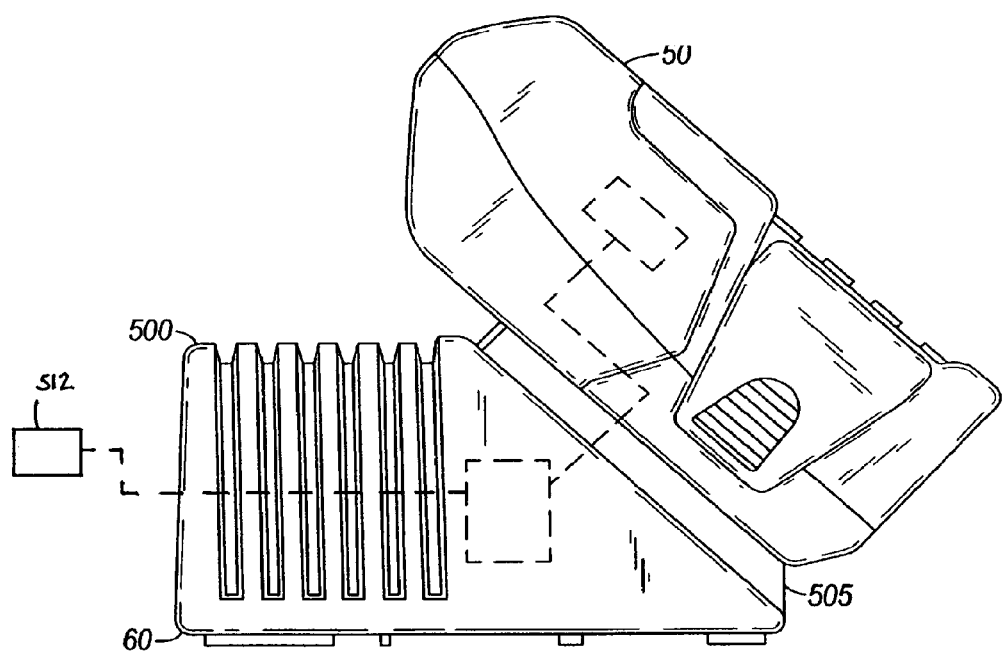
FIG. 24 is a side view of a battery, such as one of the batteries shown in FIGS. 1-3, in use with another electrical device, such as a battery charger.

As shown in FIG. 24, the battery 50 is also configured to connect with an electrical device, such as the battery charger 60. The battery charger 60 includes a housing 500. The housing 500 provides a connection portion 505 to which the battery 50 is connected. The connecting portion 505 includes one or more electrical device terminals (not shown) to electrically connect the battery 50 to the battery charger 60. The terminals included in the battery charger 60 are configured to mate with the terminals included in the battery 50 and to transfer and receive power and information from the battery 50.

In some constructions and in some aspects, the battery charger 60 also includes a microprocessor or microcontroller 510. The microcontroller 510 controls the transfer of power between the battery 50 and the battery charger 60. In some constructions, the microcontroller 510 controls the transfer of information between the battery 50 and the battery charger 60. In some constructions, the microcontroller 510 identifies and/or determines one or more characteristics or conditions of the battery 50 based on signals received from the battery 50. Also, the microcontroller 510 can control operation of the charger 60 based on identification characteristics of the battery 50.

In some constructions and in some aspects, the battery charger 60 bases the charging scheme or method for charging the battery 50 on the temperature of the battery 50. In one construction, the battery charger 60 supplies a charging current to the battery 50 while periodically detecting or monitoring the temperature of the battery 50. If the battery 50 does not include a microprocessor, the battery charger 60 periodically measures the resistance of a thermistor, such as thermistor 150, after predefined periods of time. If the battery 50 includes a microprocessor, such as microprocessor 140, then the battery charger 60 either: 1) interrogates the microprocessor 140 periodically to determine the battery temperature and/or if the battery temperature is outside an appropriate operating range(s); or 2) waits to receive a signal from the microprocessor 140 indicating that the battery temperature is not within an appropriate operating range.

In some constructions, once the battery temperature exceeds a predefined threshold or does not fall within an appropriate operating range, the battery charger 60 interrupts the charging current. The battery charger 60 continues to periodically detect or monitor the battery temperature or waits to receive a signal from the microprocessor 140 indicating that the battery temperature is within an appropriate operating range. When the battery temperature is within an appropriate operating range, the battery charger 60 may resume the charging current supplied to the battery 50. The battery charger 60 continues to monitor the battery temperature and continues to interrupt and resume the charging current based on the detected battery temperature. In some constructions, the battery charger 60 terminates charging after a predefined time period or when the present battery state of charge reaches a predefined threshold.

In some constructions and in some aspects, the battery 50 and/or the electrical devices, such as the power tool 55 and battery charger 60, are capable of detecting imbalanced battery cells within the battery 50. In some constructions, rather than monitoring each battery cell 80a-e individually, a microprocessor, such as, for example, the microprocessor 140, 420, 490 and/or 510 (the "monitoring microprocessor"), monitors only two groups of battery cells 80 and determines cell imbalance using a ratio of voltages of the two cell groups.

Figure 25:
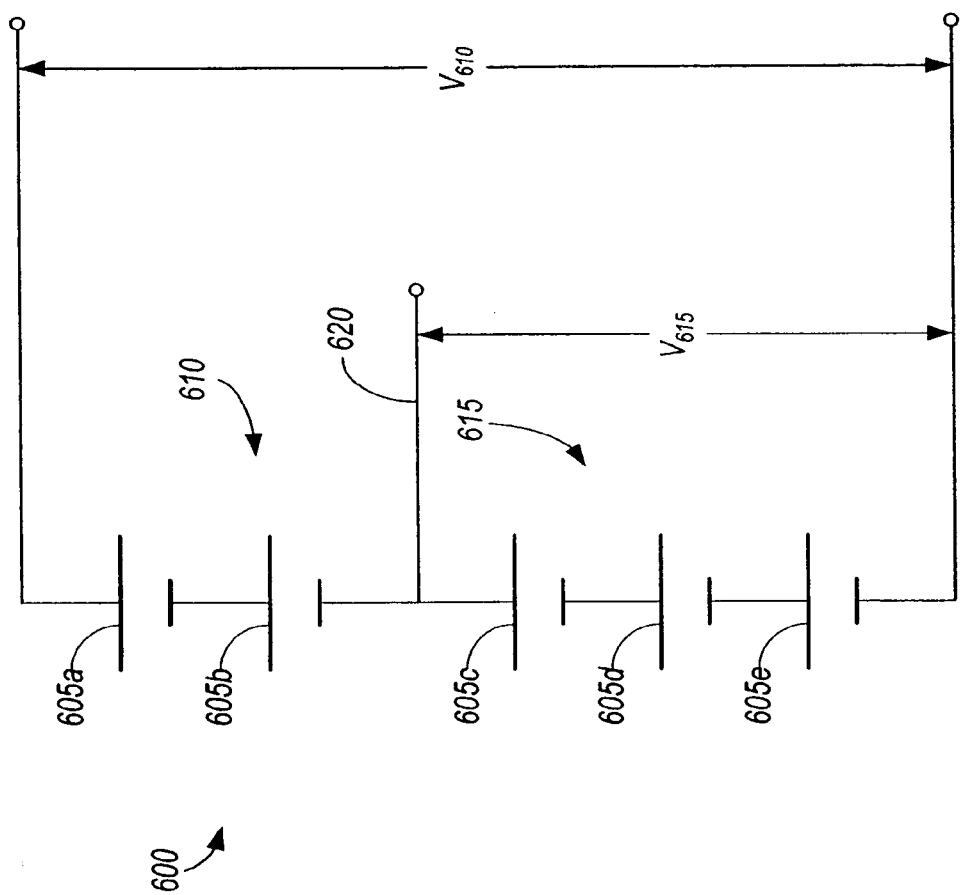
FIG. 25 is a partial schematic view of a battery, such as one of the batteries shown in FIGS. 1-3.

For example, a battery 600 is partially shown in FIG. 25. In some constructions, the battery 600 is similar to battery 50 and includes a microprocessor 140. In other constructions, the battery 600 does not include a microprocessor. In the illustrated construction, the battery 600 includes five battery cells 605a, 605b, 605c, 605d and 605e, each having substantially the same nominal voltage, such as, for example, approximately 4 V.

The battery cells 605a-e are arranged into two groups, group 610 and group 615. Group 610 includes battery cells 605a and 605b, and group 615 includes battery cells 605c, 605d and 605e.

The battery 600 also includes a lead or tap 620 which provides a voltage $V_{615}$ across group 615 (i.e., the total voltage of battery cells 605c, 605d and 605e). When the battery cells 605a-e are approximately fully charged, the voltage $V_{615}$ of group 615 equals approximately 12 V. The voltage $V_T$ is the voltage across all of the battery cells 605a-e. When the battery cells 605a-e are substantially fully charged, the voltage $V_T$ equals approximately 20 V.

The monitoring microprocessor is programmed to monitor voltages $V_{615}$ and $V_T$. In some constructions, the monitoring microprocessor monitors the voltages $V_{615}$ and $V_T$ either continuously or periodically and calculates a ratio R between the measured voltages $V_{615}$ and $V_T$. The ratio R is determined by the equation:

$$R = V_{615}/V_T \quad [e1]$$

When the cells 605a-e are substantially balanced, the ratio R equals approximately 0.6. If one or more cells from the first group 610 are imbalanced (i.e., has a present cell state of charge or cell voltage lower than the other cells) during charging or discharging, the ratio R will be higher than 0.6. If one or more cells from the second group 615 are imbalanced during charging or discharging, the ratio R will be lower than 0.6. If two cells, one from the first group 610 and one from the second group 615 (e.g., cell 605a and cell 605e) are imbalanced during charging or discharging, the ratio R will be higher than 0.6. In other words, if an imbalanced cell occurs, the ratio R will deviate plus or minus from the balanced ratio of 0.6. If the monitoring microprocessor detects a cell imbalance, that is, calculates a ratio R substantially higher or lower than the balance ratio of 0.6, operation of the battery 600 (i.e., charging and/or discharging) is interrupted or changed. In some constructions and in some aspects, operation of the battery 600 is interrupted or changed when the ratio R is not included within the range of approximately 0.55 to approximately 0.65.

Figure 26:
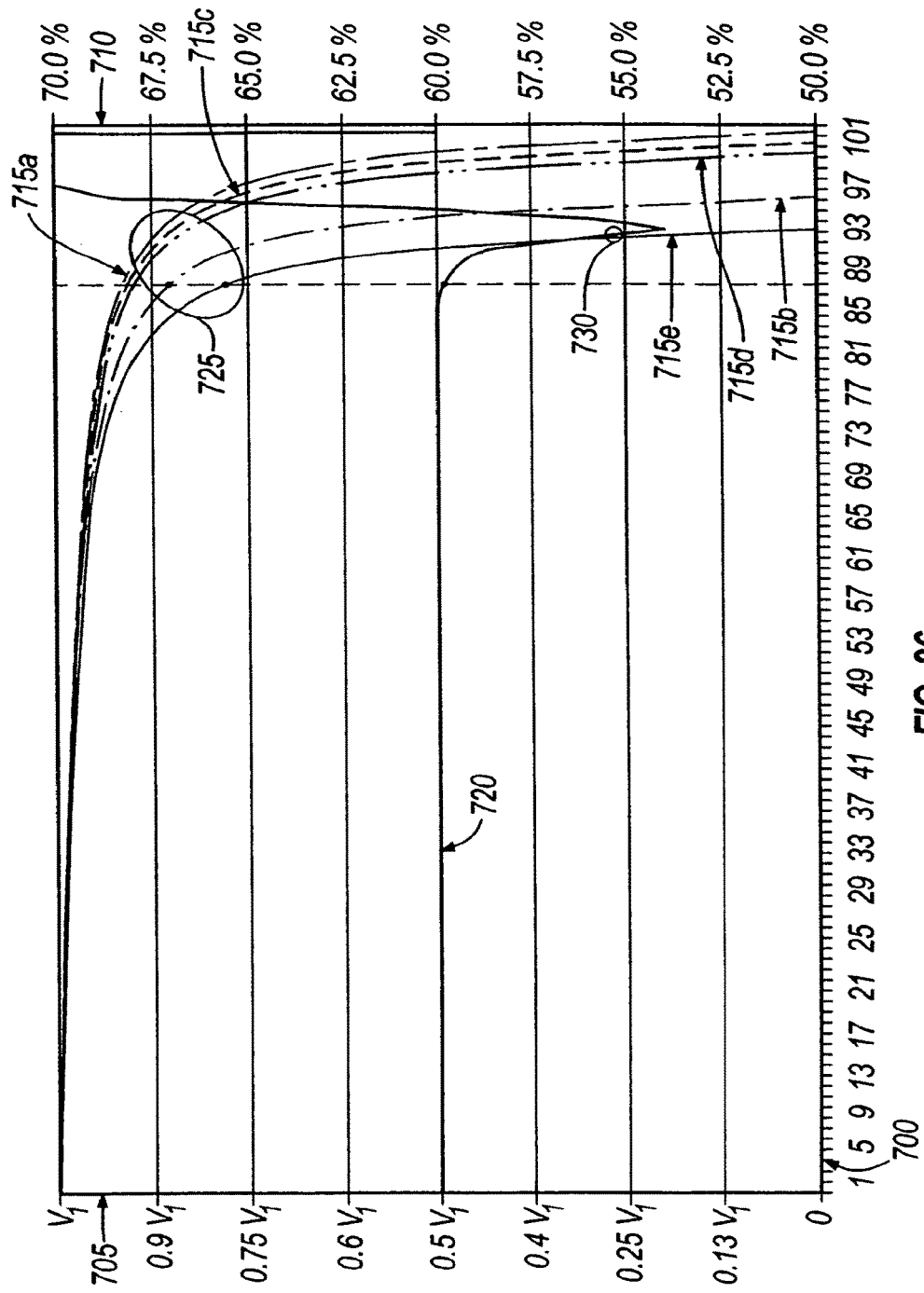
FIGS. 26-27 are graphs illustrating cell voltage and a ratio of cell voltages over time.
Figure 27:
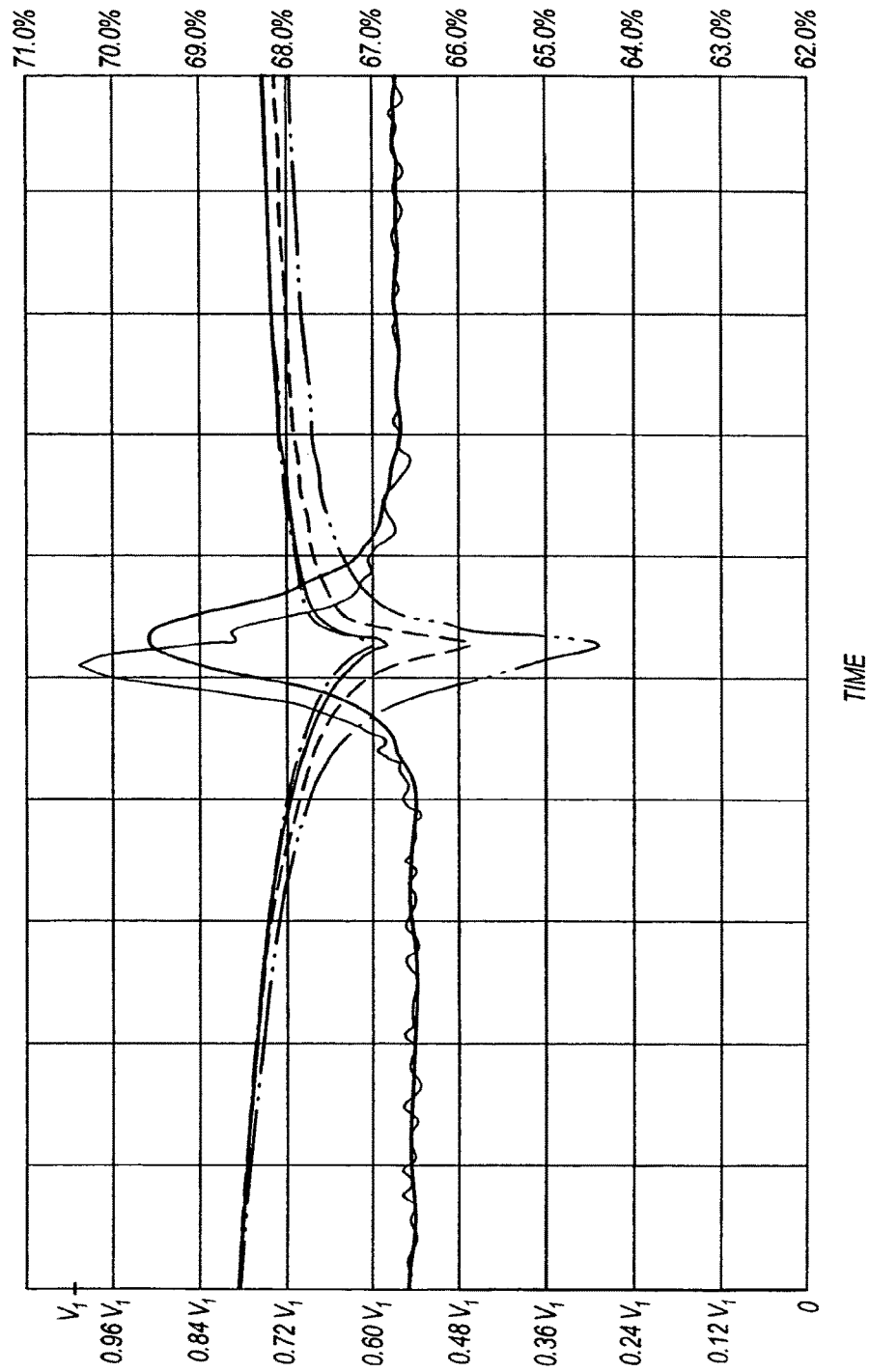

FIGS. 26 and 27 are graphs which illustrates an example of approximately when an imbalance occurs within the battery 600 and how the ratio R deviates from its balanced ratio during this occurrence. In this example, each cell 605a-e has a nominal voltage of approximately 4 V, and the balanced ratio for ratio R is approximately 0.6 or 60.0%.

In the illustrated construction, axis 700 represents time in seconds, axis 705 represents voltage in volts, and axis 710 represents a ratio or a percentage in volts/volts. Line 715a represents the voltage of cell 605a over time, line 715b represents the voltage of cell 605b over time, and line 715c represents the voltage of cell 605c over time. Line 715d represents the voltage of cell 605d over time, line 715e represents the voltage of cell 605e over time, and line 720 represents the ratio R over time.

In the illustrated example, an imbalance (represented on the graph by numeral 725) occurs approximately at 86 seconds. The imbalance 725 is caused by cell 605e, which is included with group 615. At this time (t=86 s), the ratio 720 begins to decrease or deviate from the balanced ratio of 0.6 (i.e., 60%). Since the ratio 720 is decreasing, it can be determined that the imbalanced cell is within group 615. When the ratio R approaches 55.0% at approximately 91 seconds (indicated in FIG. 28 by the numeral 730), the voltage of cell 605e is approximately 1 V. In some constructions, the monitoring microprocessor detects that the ratio R has fallen to approximately 55.0% and then terminates operation of the battery 600 in order to avoid further discharge of cell 605e.

In some constructions, the monitoring microprocessor monitors the voltage of each battery cell instead of using a ratiometric method of monitoring, such as, for example, the microprocessor 140. As previously discussed, the battery 50 includes the plurality of resistors 260 for providing voltage measurements of the battery cells 80. The plurality of resistors 260 are arranged such that the microprocessor 140 can measure the voltage of each battery cells 80a-g approximately at the same time. In some constructions, the microprocessor 140 detects an imbalance within the battery 50 when one or more cells 80 reach approximately 1 V.

In some constructions and in some aspects, the battery 50 or 600 may re-balance the cells 80a-g or 605a-e when an imbalance has been detected. In some constructions, the monitoring microprocessor disables the battery 50 or 600 (e.g. interrupts battery operation, prevents battery operation, etc.) when the balanced ratio R is no longer included within an acceptable range. After the battery 50 or 600 is disabled, the monitoring microprocessor determines which cell(s) 80a-e or 605a-e is imbalanced (the "low voltage cell").

In some construction, the monitoring microprocessor activates or turns on the respective transistors, such as, for example, transistors 265a-f, that are electrically connected to those cells 80a-g or 605-a-e that are not low in present state of charge (i.e., cells having a higher present state of charge than the low voltage cell). The monitoring microprocessor begins a controlled discharge of the high present state of charge cells 80a-g or 605a-e. For example, the monitoring microprocessor will control the small discharge current that will flow from the balanced cells 80a-e or 605a-e through the respective transistors. The monitoring microprocessor will continue to make voltage measurements of the cells 80a-g or 605a-e throughout the controlled discharging process. The monitoring microprocessor will end the controlled discharge process when the present state of charge of the higher state of charge cells 80a-g or 605a-e is reduced to be approximately equal to the previously low voltage cell.

In some constructions, the monitoring microprocessor uses the controlled discharge process to power an indicator, such as, for example, blinking all of the LEDs 170a-d on the fuel gauge 155. In this construction, for example, the blinking LEDs 170a-d indicate to an operator or user that the battery 50 or 600 is disabled and/or is currently in the process of re-balancing the cells 80a-g or 605a-e.

In some constructions and in some aspects, the circuit 130 is capable of storing various data that pertain to the battery 50. For example, in one construction, the circuit 130 can include the microcontroller 140 or a separate memory IC (not shown). In one construction, the microcontroller 140 (or the memory IC) can be programmed with a reference time or date upon assembly of the battery 50. The reference time can be stored as a first time value. The circuit 130 can also include a real-time clock module (not shown), which can be powered by one or more battery cells 80. Once the microcontroller 140 (or the memory IC) is programmed with the reference time/date, the circuit 130 can run the real-time clock until a certain event takes place and can store the time at which the even takes place as a second time value. The circuit 130 or an external device, such as, for example, a battery charger 60, can then determine the elapsed time in which the event took place from the first and second time values.

In one construction, for example, the circuit 130 can determine the elapsed time from manufacturing to the first charge of the battery 50. In this construction, the battery 50 is placed on the battery charger 60 and, when the battery charger 60 begins to supply a charging current to the battery 50, either the microcontroller 140 or the battery charger 60 can identify this instance as being the first charge for the battery 50. During charging, the battery 50 can store the present real-time clock value in the microcontroller 140 (or the memory IC) as the second time value. The elapsed time (as determine from the first and second time values) can be used to better ascertain the warranty period of the battery 50, for example. In other constructions, the circuit 130 can store times corresponding to various events, such as, for example, time(s) of service (such as first, second time, last time, and the like), time(s) of calibration, time(s) of discharging, time(s) of charging, time(s) of shutdown, a combination thereof and the like.

In some constructions and in some aspects, the circuit 130 (or microcontroller 140) can also be programmed to determine and analyze component failures. In some constructions, the microcontroller 140 can also be programmed to determine whether or not shutdown of the battery 50 is required.

In one construction, the microcontroller 140 can be programmed to detect component errors or failures within the battery 50 which are critical for operation (i.e., hard failures). An example of a hard failure can include faulty operation of the semiconducting switch 180. If the microcontroller 140 detects a hard failure within the battery 50, the microcontroller 140 can be programmed to prohibit operation of the battery 50 (i.e., prohibit the battery 50 from supplying discharge current to an electrical device). In these instances, the microcontroller 140 can also activate the fuel gauge 155, for example, to display an indication to the user that a hard failure has been detected and the battery 50 needs to be serviced.

In some constructions, the microcontroller 140 can also be programmed to detect component errors or failures within the battery 50 which are not critical for operation (i.e., soft failures). An example of a soft failure can include faulty operation of the temperature-sensing device. Other examples can include faulty operation of the fuel gauge 155, faulty operation of the voltage detection circuit 259 for one or more battery cells 80, and the like. Similarly to the detection of hard failures, in some constructions, the microcontroller 140 can also activate the fuel gauge 155 to display an indication to the user that a soft failure has been detected, but battery operation can continue.

If the microcontroller 140 detects a component failure within the battery 50, the microcontroller 140 determines if the failure is a hard failure or a soft failure. If the component failure is a soft failure, the microcontroller 140 modifies its operation in order to continue battery operation. For example, if the microcontroller 140 receives a erroneous state of charge reading for a battery cell 80 (e.g., a state of charge reading outside an acceptable range, such as, for example, 0 V to approximately the nominal voltage of the battery cell 80), the microcontroller 140 can modify operation by assigning an average state of charge value to the battery cell 80 with the erroneous state of charge reading. In this instance, the microcontroller 140 determines the state of charge of the entire battery 50 and divides the battery state of charge by the number of battery cells 80 to produce the average state of charge reading. By using this approximation of the battery cell's current state of charge, the microcontroller 140 can continue battery operation.

In these constructions, when a soft failure has been detected, the battery 50 can continue operation but may not provide the best performance when compared to a battery 50 without any component failures. In some constructions, the ability for the microcontroller 140 to detect and determine soft and hard failures allows the battery 50 to continue operation through those component failures which are not critical to battery operation (thus, not inconveniencing the user with unnecessary shutdown or battery disablements) yet disables battery operation for those components failures which are critical to battery operation.

In some constructions and in some aspects, the battery 50 can include a voltage clamp (not shown) to protect the microcontroller 140 from latching. For example, if the microcontroller 140 latches up, the microcontroller 140 ceases to run any of its software or firmware and the semiconducting switch 180 is not maintained in a conducting state (i.e., causing no current to be drawn from the battery 50). The microcontroller 140 may latch up due to excessive noise being applied to the microcontroller 140 or when a voltage higher than a given input value (such as, for example, 4.1 V) is applied to the power supply or individual pins of the microcontroller 140 (also referred to as "overvoltage"). In some constructions, if the microcontroller 140 latches, the battery 50 can not be discharged or charged. Also, current drawn by the circuit 130 can be much higher than normal. The battery 50 can also be driven to very low voltages and potentially damage one or more battery cells 80 in a relatively short time.

Overvoltages at the microcontroller 140 can include a short from one of the battery terminals, such as the sense terminal 120, to another battery terminal, such as the positive terminal 110, while the semiconducting switch 180 is disabled, or the placement of a battery 50 on a battery charger 60 that is not connected to a power source. In some constructions, the circuit 130 can prevent an overvoltage on the microcontroller 140 by including a voltage clamp (not shown) between the sense terminal 120 and ground. While this prevents the latch up of the microcontroller 140, the voltage clamp can cause higher current drain on the battery 50 if the battery 50 is placed on a battery charger 60 that is not connected to a voltage source. A secondary switch (not shown) included in the circuit of the battery charger 60 can disconnect the sense terminal 120 of the battery 50 or the sense terminal of the battery charger 60 when the battery charger 60 is not powered. In other constructions, the battery charger circuit can include a relay (not shown).

In some constructions and in some aspects, if the thermistor 150 in the battery 50 fails, the microcontroller 140 can use an onboard temperature sensor that is included in the microcontroller 140. The onboard temperature sensor can be used to verify the thermistor readings and override any reading if it appears the reading is erroneous. In these constructions, the onboard temperature sensor would then allow the battery 50 to continue operation in the event of a thermistor 150 failure.

As mentioned previously, in some constructions and in some aspects, the microcontroller 140 can store one or more security codes that may disable the battery 50 until a verification process (such as a handshake, for example) is stabled with an electrical device.

In some constructions, a user can program one or more batteries 50 with a custom security code which can only be read by certain electrical devices, such as one or more battery chargers 60, programmed with a similar code. Similarly, a user can program one or more battery chargers 60 with a custom security code such that the battery charger 60 can only communicate and/or charge batteries 50 with a corresponding security code. In these constructions, the security codes provide a level of theft deterrent since the programmed batteries 50 and programmed battery chargers 60 can only communicate and transfer power with electrical devices and batteries having corresponding security codes.

In one exemplary implementation, each battery 50 includes a default security code, such as 000. The default security code allows the battery 50 to communicate and receive charge from any battery charger 60, regardless of the charger's security code. The batteries 50 and battery chargers 60 can be programmed in a variety of ways. For example, if one or more batteries 50 and a battery charger 60 are sold as a set, the one or more batteries 50 and the charger 60 can be programmed with a security code by the manufacturer or dealer. A battery 50 can be programmed separately from the battery charger 60 or the battery 50 and battery charger 60 can be programmed almost simultaneously while the battery 50 is connected to the charger 60.

In one construction for programming the battery charger 60 and battery 50, the battery 50 connects to attempts to establish communication with the charger 60. If communication is established, then the battery 50 either includes a default security code or a security code that the battery charger 60 recognizes. The security code associated with the battery charger 60 can be stored in the charger's controller or can be stored external from the charger 60. For example, the code can be included in a key fob, a transponder, a bar code or a similar physical external device that a user needs to input into the battery charger 60. As shown in FIG. 24, the battery charger 60 can be equipped with an input device 512 that can receive the security code from an external source. In some constructions, the input device 512 can include a receiver, a bar code reader, a magnetic card reader, a key, a touch screen or key pad (for a user to manually enter the security code) or other similar devices.

When communication is established, in some constructions, the user can prompt the battery charger 60 to write the corresponding security code to the battery 50. In other constructions, the write instruction is automatic. The prompt can include keying the security code into the input device 512 of the charger 60 and/or selecting a switch or button on the charger 60. The battery charger 60 proceeds to send the code to the battery 50 and the battery 50 stores the code in its microprocessor 140. In some constructions, a user can program various batteries 50 and battery chargers 60 with the same security code.

In some constructions, the battery charger 60 can disable the security feature. In these constructions however, the battery charger 60 may still not be able to communicate and charge a battery 50 having a security code. In some constructions, the battery 50 can disable the security feature via a battery charger 60 which communication has been established or a service center.

Figure 28:
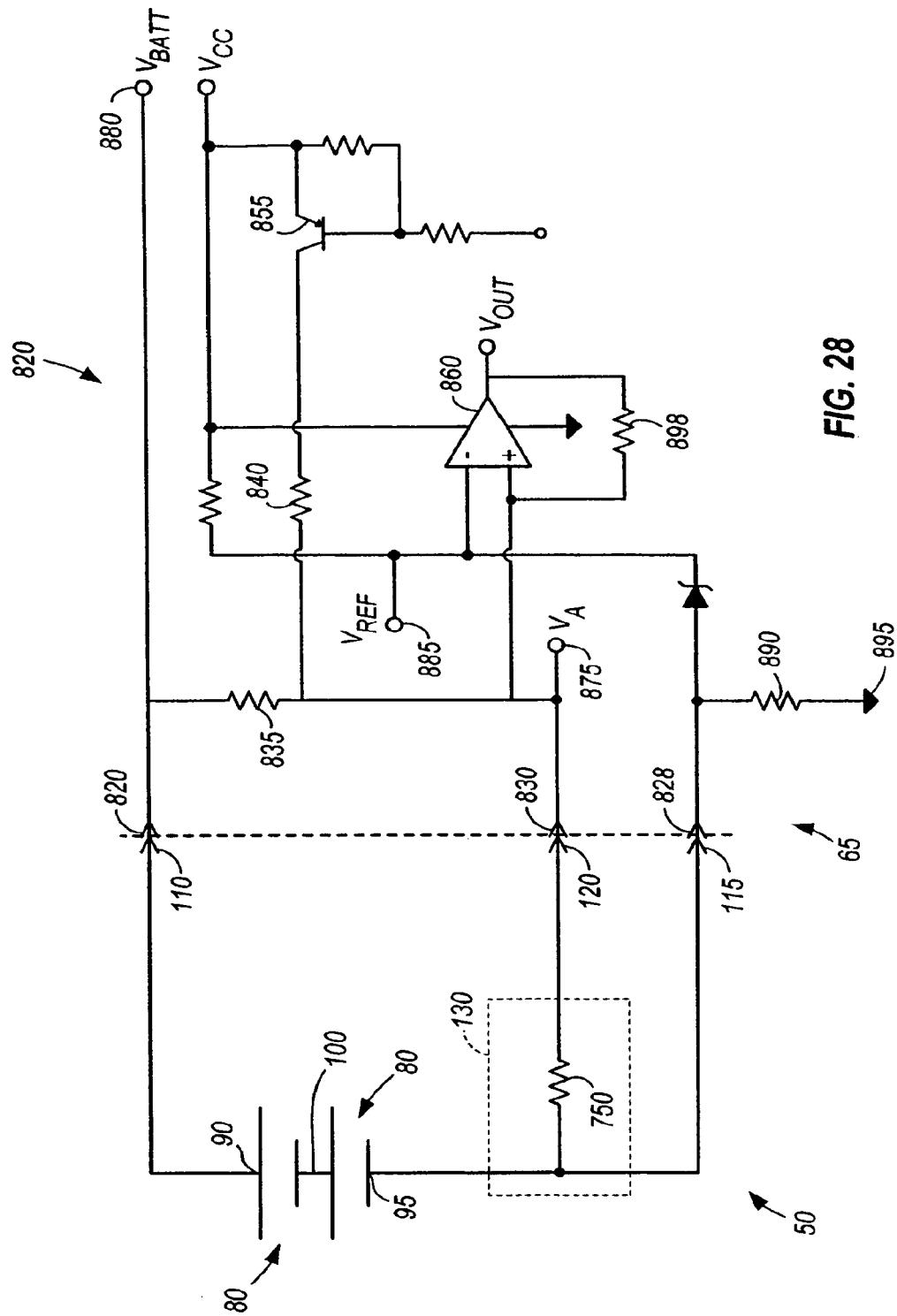
FIG. 28 is a schematic diagram of a construction of a battery charging system.

A further schematic diagram of the battery 50 is schematically illustrated in FIG. 28. In some constructions, the circuit 130 includes an electrical component such as, for example, an identification resistor 750, and the identification resistor 750 can have a set resistance. In other constructions, the electrical component may be a capacitor, an inductor, a transistor, a semiconducting element, an electrical circuit or another component having a resistance or capable of sending an electrical signal such as, for example, a microprocessor, a digital logic component and the like. In the illustrated construction, the resistance value of the identification resistor 750 can be chosen based on characteristics of the battery 50, such as the nominal voltage and the chemistry of the battery cells 80. A sense terminal 120 can electrically connect to the identification resistor 750.

The battery 50, shown schematically in FIG. 28, can electrically connect to an electrical device, such as a battery charger 820 (also shown schematically) to receive or transfer power. The battery charger 820 can include a positive terminal 825, a negative terminal 828 and a sense terminal 830. Each terminal 820, 828, 830 of the battery charger 820 can electrically connect to the corresponding terminal 110, 115, 120 (respectively), of the battery 50. The battery charger 820 also can include a circuit having electrical components, such as, for example, a first resistor 835, a second resistor 840, a solid-state electronic device or semiconductor 855, a comparator 860 and a processor or microcontroller (not shown). In some constructions, the semiconductor 855 can include a transistor capable of operating in saturation or an "ON" state and capable of operating in cut-off or an "OFF" state. In some constructions, the comparator 860 can be a dedicated voltage monitoring device, a microprocessor or a processing unit. In other constructions, the comparator 860 can be included in the microcontroller (not shown).

In some constructions, the microcontroller (not shown) can be programmed to identify the resistance value of the electrical component in the battery 50, such as the identification resistor 750. The microcontroller can also be programmed to determine one or more characteristics of the battery 50, such as, for example, the battery chemistry and the nominal voltage of the battery 50. As previously mentioned, the resistance value of the identification resistor 750 may correspond to a dedicated value associated with one or more certain battery characteristics. For example, the resistance value of the identification resistor 750 can be included in a range of resistance values corresponding to the chemistry and to the nominal voltage of the battery 50.

In some constructions, the microcontroller can be programmed to recognize a plurality of resistance ranges of the identification resistor 750. In these constructions, each range corresponds to one battery chemistry, such as, for example, NiCd, NiMH, Li-ion, and the like. In some constructions, the microcontroller can recognize additional resistance ranges, each corresponding to another battery chemistry or another battery characteristic.

In some constructions, the microcontroller can be programmed to recognize a plurality of voltage ranges. The voltages included in the voltage ranges can be dependent on or correspond to the resistance value of the identification resistor 750, such that the microcontroller can determine the value of the resistor 750 based on the measured voltage.

In some constructions, the resistance value of the identification resistor 750 can be further chosen to be unique for each possible nominal voltage value of the battery 50. For example, in one range of resistance values, a first dedicated resistance value can correspond to a nominal voltage of 21 V, a second dedicated resistance value can correspond to a nominal voltage of 16.8 V, and a third dedicated resistance value can correspond to a nominal voltage of 12.6 V. In some constructions, there can be more or fewer dedicated resistance values, each corresponding to a possible nominal voltage of the battery 50 associated with the resistance range.

In an exemplary implementation, the battery 50 electrically connects to the battery charger 820. To identify a first battery characteristic, the semiconductor 855 switches to the "ON" state under the control of additional circuitry (not shown). When the semiconductor 855 is in the "ON" state, the identification resistor 750 and resistors 835 and 840 create a voltage divider network. The network establishes a voltage $V_A$ at a first reference point 875. If the resistance value of the resistor 840 is significantly lower than the resistance value of the resistor 835, then the voltage $V_A$ will be dependent upon the resistance values of the identification resistor 750 and the resistor 840. In this implementation, the voltage $V_A$ is in a range determined by the resistance value of the identification resistor 750. The microcontroller (not shown) measures the voltage $V_A$ at the first reference point 875 and determines the resistance value of the identification resistor 750 based on the voltage $V_A$. In some constructions, the microcontroller compares the voltage $V_A$ to a plurality of voltage ranges to determine the battery characteristic.

In some constructions, the first battery characteristic to be identified can include the battery chemistry. For example, any resistance value below 150 k ohms may indicate that the battery 50 has a chemistry of NiCd or NiMH, and any resistance value approximately 150 k ohms or above may indicate that the battery 50 has a chemistry of Li or Li-ion. Once the microcontroller determines and identifies the chemistry of the battery 50, an appropriate charging algorithm or method may be selected. In other constructions, there are more resistance ranges which each correspond to another battery chemistry than in the above example.

Continuing with the exemplary implementation, to identify a second battery characteristic, the semiconductor 855 switches to the "OFF" state under the control of the additional circuitry. When the semiconductor 855 switches to the "OFF" state, the identification resistor 750 and the resistor 835 create a voltage divider network. The voltage $V_A$ at the first reference point 875 is now determined by the resistance values of the identification resistor 750 and the resistor 835. The resistance value of the identification resistor 750 is chosen such that, when the voltage $V_{BATT}$ at a second reference point 880 substantially equals the nominal voltage of the battery 50, the voltage $V_A$ at the first reference point 875 substantially equals a voltage $V_{REF}$ at a third reference point 885. If the voltage $V_A$ at the first reference point 875 exceeds the fixed voltage $V_{REF}$ at the third reference point 885, an output $V_{OUT}$ of the comparator 860 changes state. In some constructions, the output $V_{OUT}$ can be used to terminate charging or to serve as an indicator to commence additional functions, such as a maintenance routine, an equalization routine, a discharging function, additional charging schemes, and the like. In some constructions, voltage $V_{REF}$ can be a fixed reference voltage.

In some constructions, the second battery characteristic to be identified can include a nominal voltage of the battery 50. For example, a general equation for calculating the resistance value for the identification resistor 750 can be:

$$R_{100} = \frac{V_{REF} \cdot R_{135}}{V_{BATT} - V_{REF}} \quad [e1]$$

wherein $R_{100}$ is the resistance value of the identification resistor 750, $R_{135}$ is the resistance value of the resistor 835, $V_{BATT}$ is the nominal voltage of the battery 50 and $V_{REF}$ is a fixed voltage, such as, for example, approximately 2.5 V. For example, in the range of resistance values for the Li-ion chemistry (set forth above), a resistance value of approximately 150 k ohms for the identification resistor 750 can correspond to a nominal voltage of approximately 21 V, a resistance value of approximately 194 k ohms can correspond to a nominal voltage of approximately 16.8 V, and a resistance value of approximately 274.7 k ohms can correspond to a nominal voltage of approximately 12.6 V. In other constructions, more or fewer dedicated resistance values may correspond to additional or different battery pack nominal voltage values.

In the illustrated construction, both the identification resistor 750 and the third reference point 885 may be situated on the "high" side of a current sense resistor 890. Positioning the identification resistor 750 and the third reference point 885 in this manner can reduce any relative voltage fluctuations between $V_A$ and $V_{REF}$ when a charging current is present. Voltage fluctuations may appear in voltage $V_A$ if the identification resistor 750 and the third reference point 885 were referenced to ground 895 and a charging current was applied to the battery 50.

In some constructions, the battery charger 820 can also include a charger control function. As previously discussed, when the voltage $V_A$ substantially equals the voltage $V_{REF}$ (indicative of voltage $V_{BATT}$ equaling the nominal voltage of battery 50), the output $V_{OUT}$ of the comparator 860 changes state. In some constructions, the charging current is no longer supplied to the battery 50 when the output $V_{OUT}$ of the comparator 860 changes state. Once the charging current is interrupted, the battery voltage $V_{BATT}$ begins to decrease. When voltage $V_{BATT}$ reaches a low threshold, the output $V_{OUT}$ of the comparator 860 changes state again. In some constructions, the low threshold of voltage $V_{BATT}$ is determined by a resistance value of a hysteresis resistor 898. The charging current is reestablished once the output $V_{OUT}$ of the comparator 860 changes state again. In some constructions, this cycle repeats for a predefined amount of time as determined by the microcontroller or repeats for a certain amount of state changes made by the comparator 860. In some constructions, this cycle repeats until the battery 50 is removed from the battery charger 820.

In some constructions and in some aspects, the circuit 130 of the battery 50 can also indicate one or more battery characteristics. In some constructions, the battery characteristics include, for example, a nominal voltage and a temperature of the battery 50. The circuit 130 includes an electrical identification component or identification resistor 910, a temperature-sensing device or thermistor 914, a first current-limiting device or protection diode 918, a second current-limiting device or protection diode 922 and a capacitor 926. The identification resistor 910 has a set resistance value which corresponds to one or more certain battery characteristics. In some constructions, the resistance value of the identification resistor 910 corresponds with the nominal voltage of the battery 50 or the battery cell 80. In some constructions, the resistance value corresponds with the chemistry of the battery 50. In some constructions, the resistance value corresponds with two or more battery characteristics or corresponds with different battery characteristic(s). The resistance value of the thermistor 914 is indicative of the temperature of the battery cell 80 and changes as the temperature of the battery cell 80 changes. A sense terminal 930 electrically connects to the circuit 130.

Figure 29:
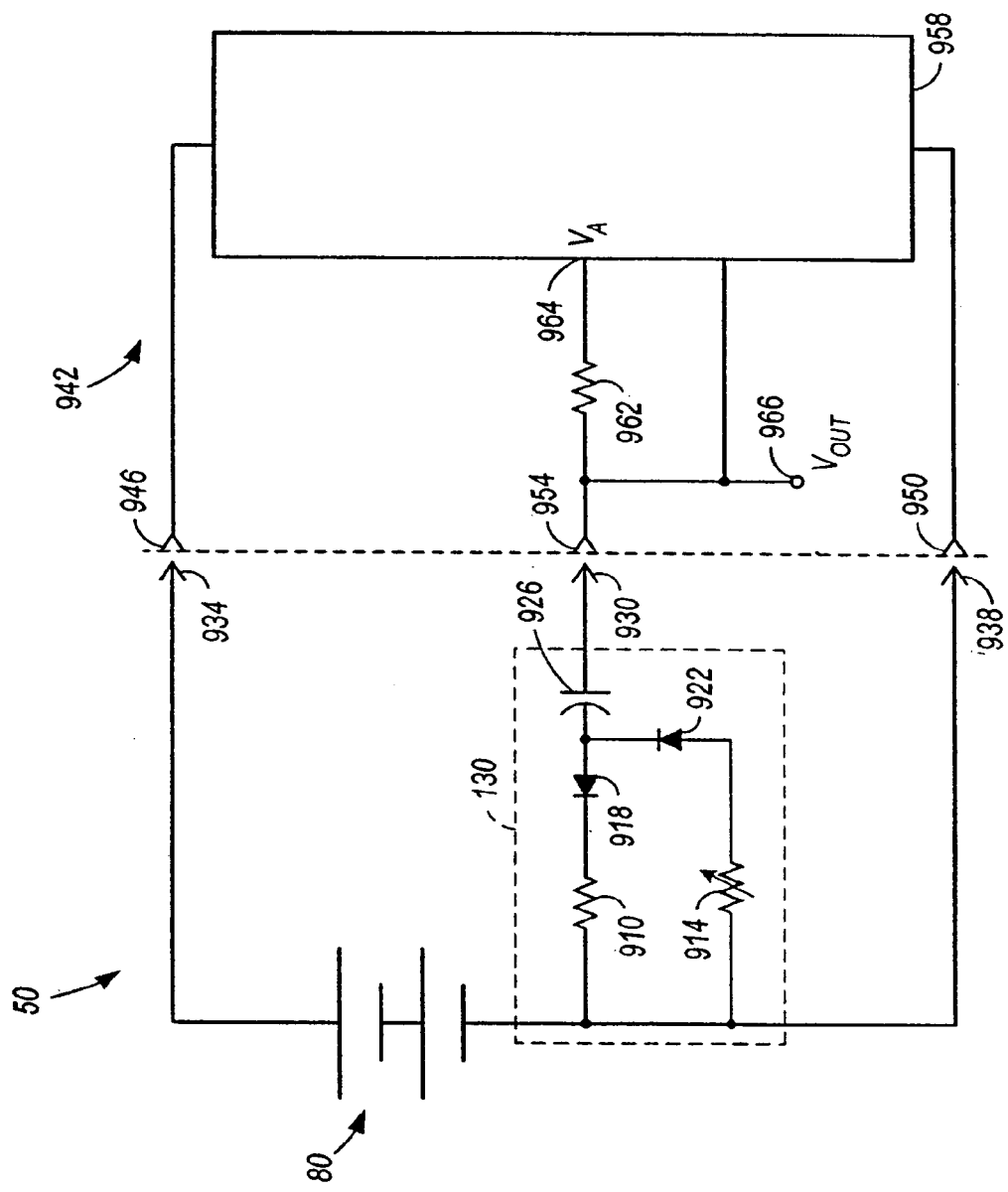
FIG. 29 is a schematic diagram of another construction of the battery charging system.

The battery 50, shown schematically in FIG. 29, electrically connects to an electrical device, such as a battery charger 942 (also shown schematically). The battery charger 942 includes a positive terminal 946, a negative terminal 950 and a sense terminal 954. In a manner similar to the battery 50 and battery charger 820 illustrated in FIG. 28, the positive terminal 934, the negative terminal 938 and the sense terminal 930 of the battery 50 electrically connect to the positive terminal 946, the negative terminal 950 and the sense terminal 954, respectively, of the battery charger 942. The battery charger 942 also includes control circuitry, such as a control device, processor, microcontroller or controller 958 and an electrical component or resistor 962.

Figure 30B:
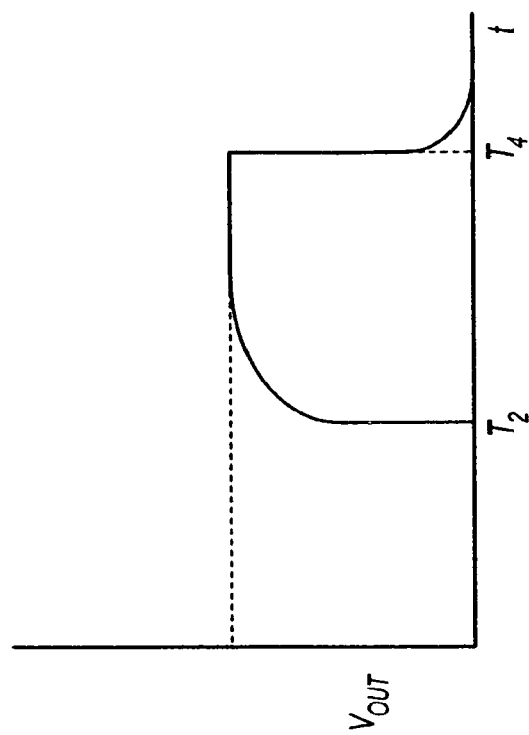
FIGS. 30A-B illustrate the operation of the battery charging system as shown in FIG. 29.
Figure 30A:
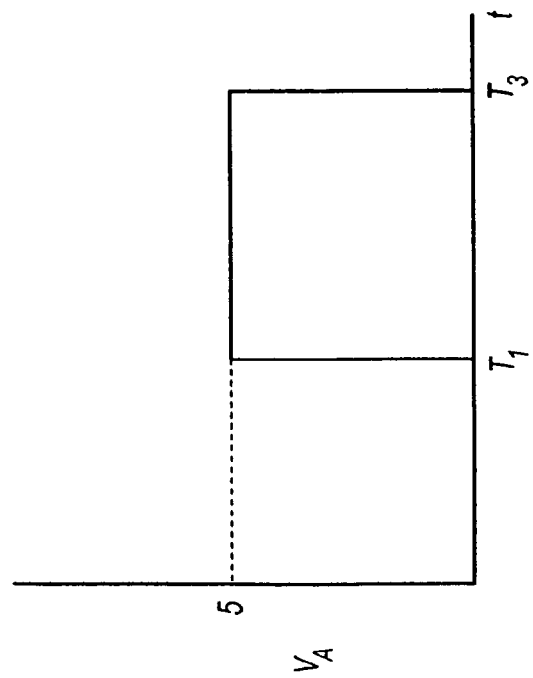

The operation of the battery 50 and battery charger 942 will be discussed with reference to FIGS. 29 and 30A-B. In some constructions, when the battery 50 electrically connects to the battery charger 942 and the capacitor 926 is initially discharged, the controller 958 increases a voltage $V_A$ at a first reference point 964 to approximately a first threshold. In some constructions, the first threshold is approximately 5 V. As shown in FIG. 30A, the controller 958 increases the voltage $V_A$ to the first threshold at approximately a time $T_1$.

When the first threshold is applied to the first reference point 964, a first current path is established within the battery 50 and battery charger 942. The first current path includes the resistor 962, the capacitor 926, the first diode 918 and the identification resistor 910. Once the voltage $V_A$ is raised to approximately the first threshold, the controller 958 measures the voltage $V_{OUT}$ at a second reference point 966. The voltage $V_{OUT}$ at the second reference point 966 quickly rises to a voltage determined by a voltage divider network comprised of the identification resistor 910, the resistor 962 and the forward voltage drop across the diode 918. In some constructions, voltage $V_{OUT}$ will range from approximately 0 V to slightly less than voltage $V_A$. As shown in FIG. 30B, a rise in the voltage $V_{OUT}$ occurs approximately at a time $T_2$, and the controller 958 measures the voltage $V_{OUT}$ at approximately the time $T_2$ or slightly after time $T_2$. In some constructions, time $T_2$ is approximately equal to time $T_1$. In some constructions, time $T_2$ occurs almost immediately after time $T_1$. Time $T_2$ may be later based on tolerances in measurement.

In one construction, the voltage $V_{OUT}$ measured by the controller 958 corresponds to a resistance value for the identification resistor 910. That resistance value corresponds to the nominal voltage of the battery 50. In some constructions, as the resistance value of the identification resistor 910 decreases, the voltage $V_{OUT}$ also decreases.

In the illustrated construction, the voltage $V_{OUT}$ eventually rises to approximately the voltage $V_A$ once the capacitor 926 becomes fully charged. After the capacitor 926 is fully charged, the controller 958 decreases the voltage $V_A$ at the first reference point 964 to a second threshold. In some constructions, the second threshold is approximately 0 V. As shown in FIG. 30A, the controller 958 decreased the voltage $V_A$ to the second threshold at approximately a time $T_3$.

When the second threshold is applied to the first reference point 964, a second current path is established within the battery 50 and battery charger 942. The second current path includes the resistor 962, the capacitor 926, the second diode 922 and the thermistor 914. Once the voltage $V_A$ is lowered to approximately the second threshold, the controller 958 measures the voltage $V_{OUT}$ again at the second reference point 966. The voltage $V_{OUT}$ at the second reference point 966 quickly decreases to a voltage determined by a voltage divider network comprised of the thermistor 914, the resistor 962 and the forward voltage drop across diode 922. In some constructions, $V_{OUT}$ will range from approximately 0 V to slightly less than voltage $V_A$. As shown in FIG. 30B, a decrease in the voltage $V_{OUT}$ occurs approximately at a time $T_4$, and the controller 958 measures the voltage $V_{OUT}$ at approximately the time $T_4$ or slightly after time $T_4$. In some constructions, time $T_4$ is approximately equal to time $T_3$. In some constructions, time $T_4$ occurs almost immediately after time $T_3$. Time $T_4$ may be later based on tolerances in measurement.

In one construction, the voltage $V_{OUT}$ measured by the controller 958 at time $T_4$ corresponds to a resistance value for the thermistor 914. That resistance value corresponds to the temperature of the battery 50. In some constructions, as the resistance value of the thermistor 914 decreases, the voltage $V_{OUT}$ increases.

In some constructions, the capacitor 926 provides a DC blocking function. The capacitor 926 prevents existing battery chargers (e.g., battery chargers which do not recognize newer power tool battery chemistries, such as, for example, the Li or Li-ion chemistries, and which do not have the required corresponding charging algorithms for such newer chemistries) from being able to charge a battery pack having the circuit 130.

Figures 31, 32:
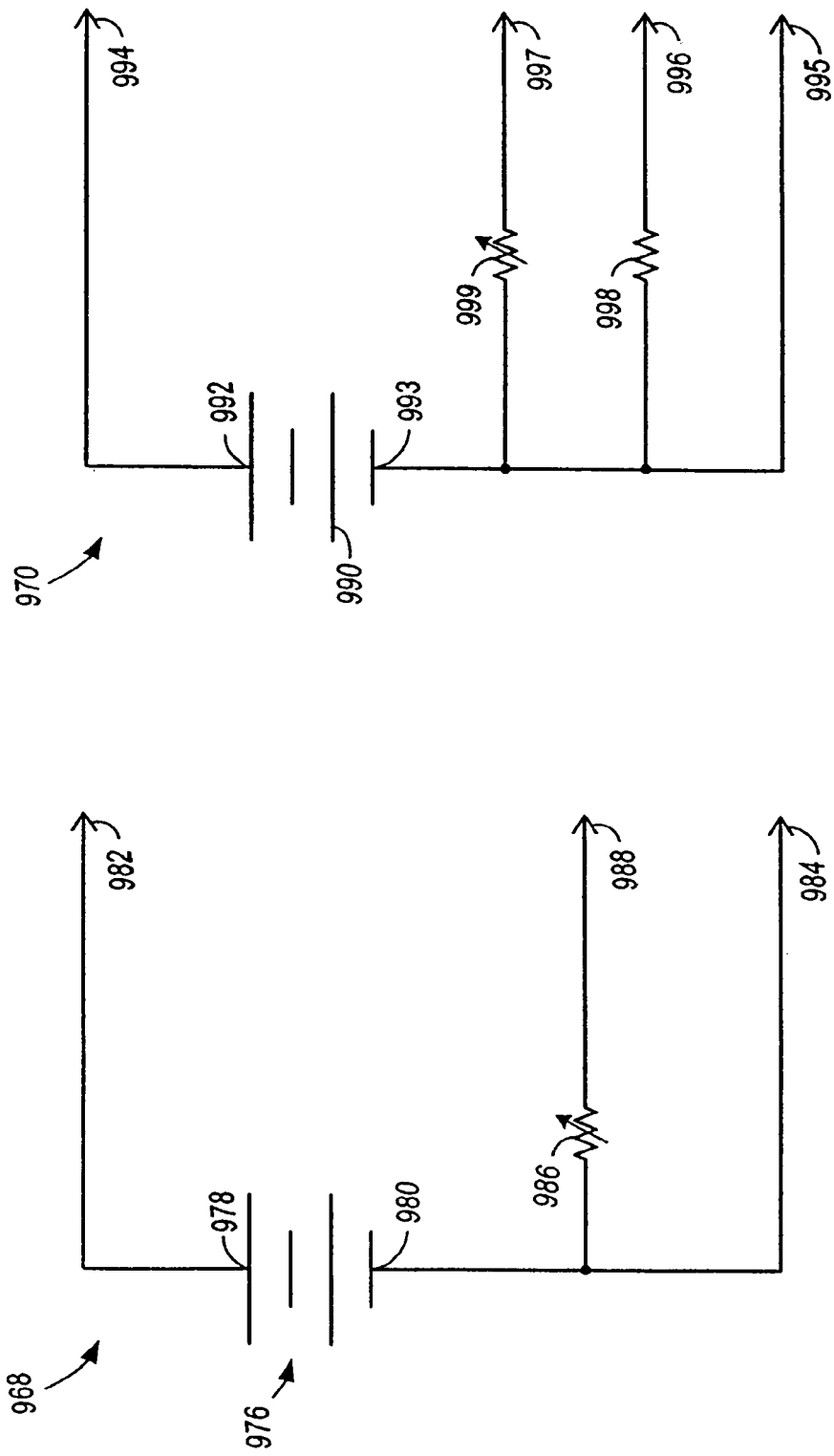
FIG. 31 is a schematic diagram of a prior art battery.
FIG. 32 is a schematic diagram of a battery included in a further construction of the battery charging system.

An existing power tool battery 968 is schematically illustrated in FIG. 31, and a further construction of a battery 970 is schematically illustrated in FIG. 32. Referring to FIGS. 31-34, another battery charging system includes both batteries 968 and 970, an existing battery charger 972 (shown in FIG. 33) and a battery charger 974 (shown in FIG. 34) embodying aspects of the invention.

Referring to FIG. 31, the existing battery 968 includes one or more battery cells 976 each having a chemistry and providing a nominal voltage. Typically, the chemistry of the battery cell 976 is lead-acid, NiCd or NiMH. The battery cell 976 includes a positive end 978 and a negative end 980. A positive terminal 982 electrically connects to the positive end 978 of the cell 976, and a negative terminal 984 electrically connects to the negative end 980 of the cell 976.

The battery 968 also includes an electrical component or thermistor 986. The resistance value of the thermistor 986 is indicative of the temperature of the battery cell 976 and changes as the temperature of the battery cell 976 changes. In some constructions, the resistance value of the thermistor 986 is included in a first range of resistance values. The existing battery charger 972 is capable of identifying a resistance value of the thermistor 986 within this first range and charge the existing battery 968 accordingly. For example, this first range of resistance values includes the resistance values approximately equal to and less than 130 k ohms. If the resistance value of the thermistor 986 is not included in the first range of resistance values, the existing battery charger 972 cannot charge the existing battery 968. The existing battery 968 also includes a sense terminal 988 electrically connected to the thermistor 986.

As shown in FIG. 32, the battery 970 includes one or more battery cells 990 each having a chemistry and providing a nominal voltage of the battery 970. Typically, the chemistry of the battery cell 990 includes, for example, Li, Li-ion or another Li-based chemistry. The battery cell 990 includes a positive end 992 and a negative end 993. A positive terminal 994 electrically connects to the positive end 992 of the cell 990, and a negative terminal 995 electrically connects to the negative end 993 of the cell 990.

The battery 970 also includes two sense terminals 996 and 997. The first sense terminal 996 electrically connects to a first electrical component or an identification resistor 998, and the second sense terminal 997 electrically connects to a second electrical component or a temperature-sensing device or thermistor 999. In some constructions, the resistance value of the identification resistor 998 is not included in the first range of resistance values that can be identified by the existing battery charger 972. For example, the resistance value of the identification resistor 998 is approximately equal to or greater than 150 k ohms. The resistance value of the thermistor 986 is indicative of the temperature of the battery cell 990 and changes as the temperature of the battery cell 990 changes.

Figure 34:
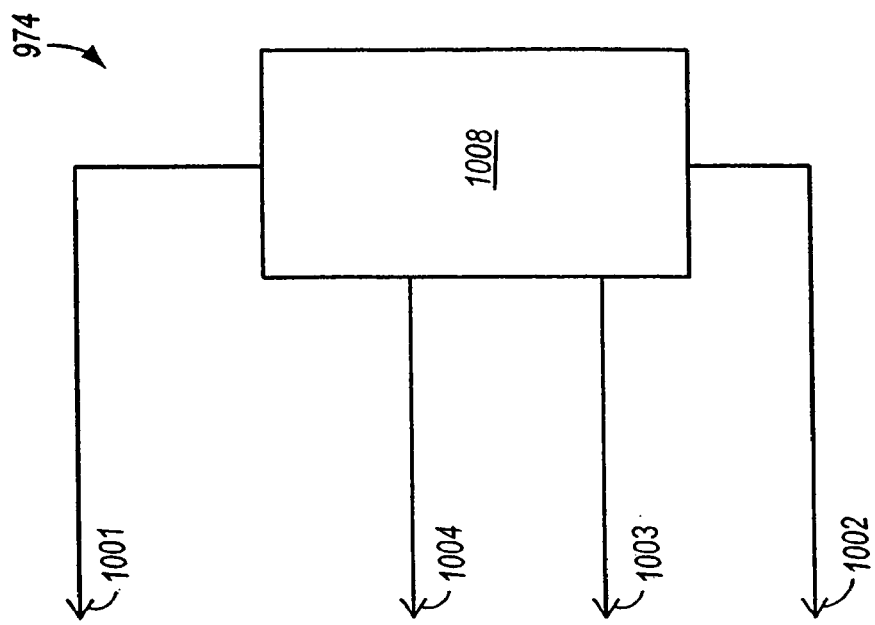
FIG. 34 is a schematic diagram of a battery charger included in the further

As shown in FIG. 34 and in most constructions, the battery charger 974 includes a positive terminal 1001, a negative terminal 1002, a first sense terminal 1003 and a second sense terminal 1004. The first sense terminal 1003 of the battery charger 974 electrically connects to either the first sense terminal 996 of battery 970 or to the sense terminal 988 of the existing battery 968.

Figure 33:
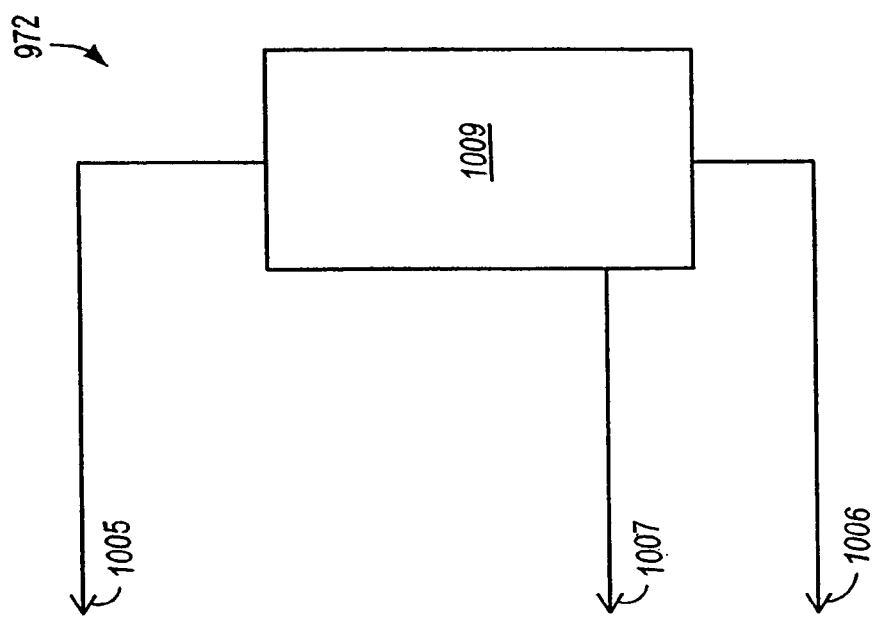
FIG. 33 is a schematic diagram of a prior art battery charger.

As shown in FIG. 33 and in some constructions, the existing battery charger 972 includes a positive terminal 1005, a negative terminal 1006 and a sense terminal 1007. The sense terminal 1007 of the existing battery charger 972 electrically connects to either the first sense terminal 996 of the battery 970 or to the sense terminal 988 of the existing battery 968.

When the existing battery 968 electrically connects to the battery charger 974, the second sense terminal 1004 of the battery charger 974 is not electrically connected to any battery terminal. In some constructions, a control device, microprocessor, microcontroller or controller 1008 included in the new battery charger 974 determines the resistance value of the thermistor 986 through the first sense terminal 1003 and identifies the battery 968 as having a NiCd or NiMH chemistry. The controller 1008 selects an appropriate charging method or algorithm for the existing battery 968 based on the chemistry and the temperature of the battery 968. The battery charger 974 charges the existing battery 968 accordingly.

When the battery 970 electrically connects to the battery charger 974, the second sense terminal 1004 of the battery charger 974 electrically connects to the second sense terminal 997 of the battery 970. In some constructions, the controller 1008 determines the resistance value of the identification resistor 998 and identifies the battery 970 as having, for example, a Li, Li-ion or another Li-based chemistry. For example, a resistance value of approximately 150 k ohms or greater for the identification resistor 998 corresponds to Li, Li-ion or another Li-based chemistry.

In some constructions, the resistance value of the identification resistor 998 is further chosen based on the nominal voltage of the battery 970. For example, a resistance value of approximately 150 k ohms for the identification resistor 998 indicates that the battery 970 has a nominal voltage of approximately 21 V. A resistance value of approximately 300 k ohms corresponds to a nominal voltage of approximately 16.8 V, and a resistance value of approximately 450 k ohms corresponds to a nominal voltage of approximately 12.6 V. In some constructions, as the resistance value of the identification resistor 998 increases, the nominal voltage of the battery 970 decreases. In some constructions, the controller 1008 also determines the resistance value of the thermistor 385. The controller 1008 selects an appropriate charging method or algorithm for the battery 970 based on its chemistry, nominal voltage and/or temperature. The battery charger 974 charges the battery 970 accordingly.

When the existing battery 968 is electrically connected to the existing battery charger 972, the sense terminal 1007 of the battery charger 972 electrically connects to the sense terminal 988 of the existing battery 968. In some constructions, the microcontroller 1009 included in the existing battery charger 972 determines the resistance value of the thermistor 986 and identifies the battery 968 as having a NiCd or NiMH chemistry, if the resistance value of the thermistor 986 is included in the first range of resistance values. The existing battery charger 972 determines the temperature of the existing battery 968 based on the resistance value of the thermistor 986 and selects an appropriate charging method or algorithm for the battery 968 based on its temperature. The existing battery charger 972 charges the existing battery 968 accordingly.

When the battery 970 is electrically connected to the existing battery charger 972, the sense terminal 1007 of the existing battery charger 972 electrically connects to the first sense terminal 996 of the battery 970. The second sense terminal 997 of the battery 970 is not electrically connected to any battery charger terminal of the existing charger 972. In some constructions, the microcontroller 1009 determines the resistance value of the identification resistor 998. In some constructions, the resistance value of the identification resistor 998 is not included in the first range of resistance values that are recognized by the microcontroller 1009. Since the microcontroller 1009 cannot identify the battery 970, the existing battery charger 972 does not implement a charging method or algorithm. The battery 970 is electronically prevented or "locked-out" from being charged by the existing battery charger 972.

Another battery 1030 embodying aspects of the invention is illustrated in FIGS. 35-37, 40-41, 48A, 49-52. The battery 1030 can be similar to the battery 50 illustrated in FIGS. 1-5. For example, the battery 1030 can be connectable to an electrical device or equipment, such as, for example, a cordless power tool 1034 (shown in FIG. 48A) to selectively power the power tool 1034. The battery 1030 can be removable from the power tool 1034 and can be rechargeable by a battery charger 1038 (shown in FIGS. 40-44).

Figure 35:
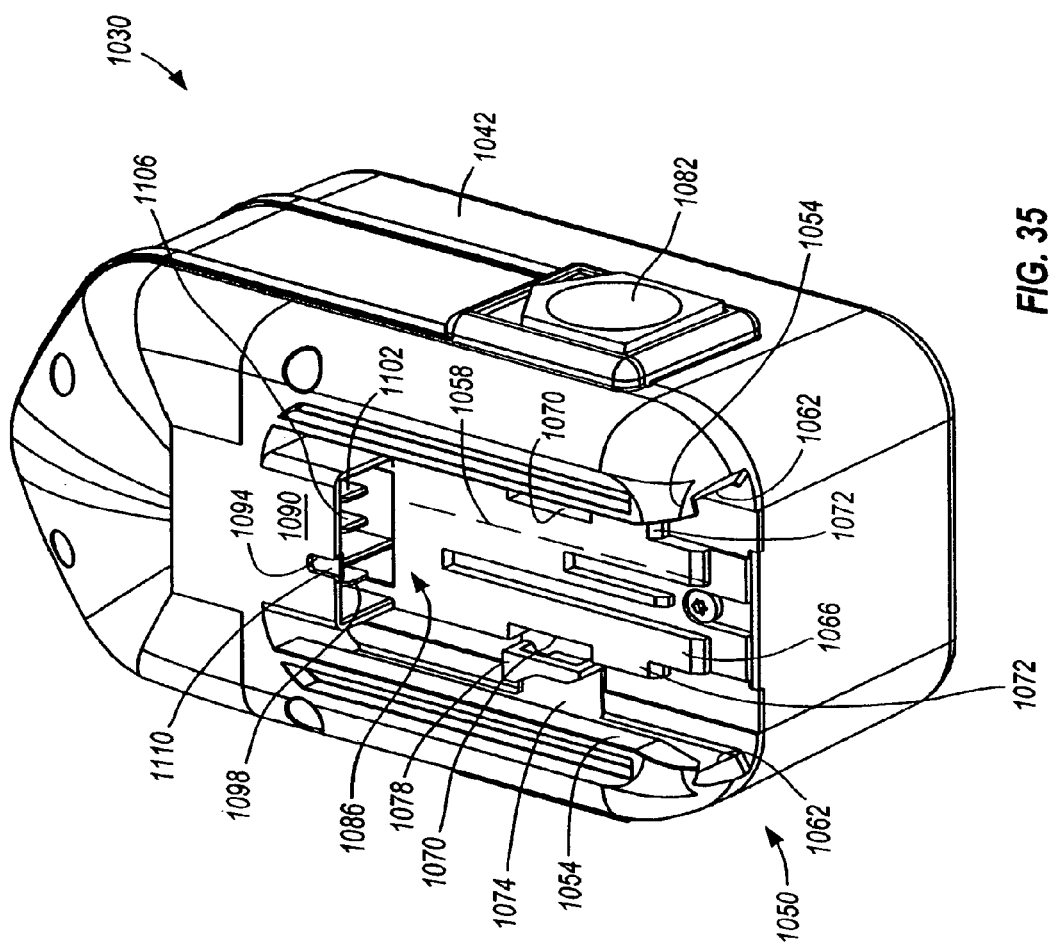
FIG. 35 is a perspective view of a battery.
Figure 36:
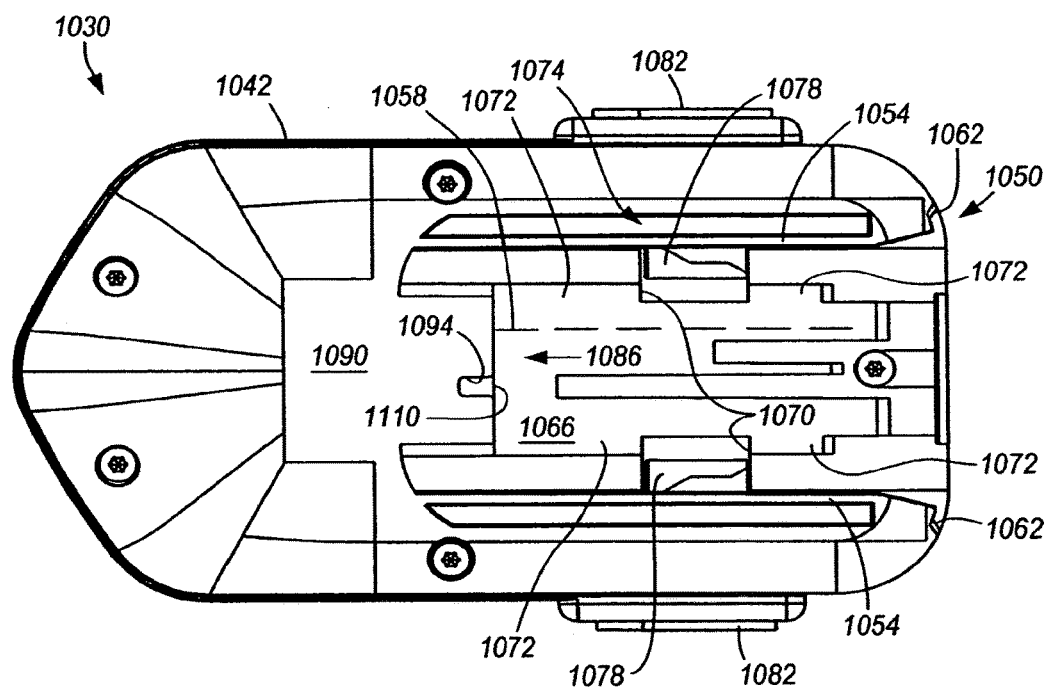
FIG. 36 is a top view of the battery shown in FIG. 35.
Figure 37:
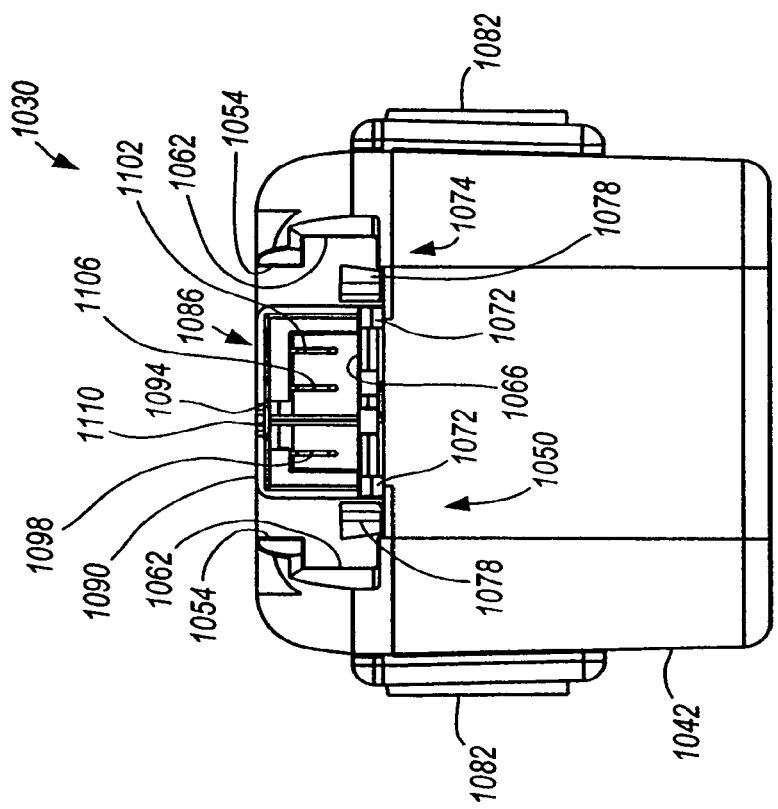
FIG. 37 is a rear view of the battery shown in FIG. 35.
Figure 38:
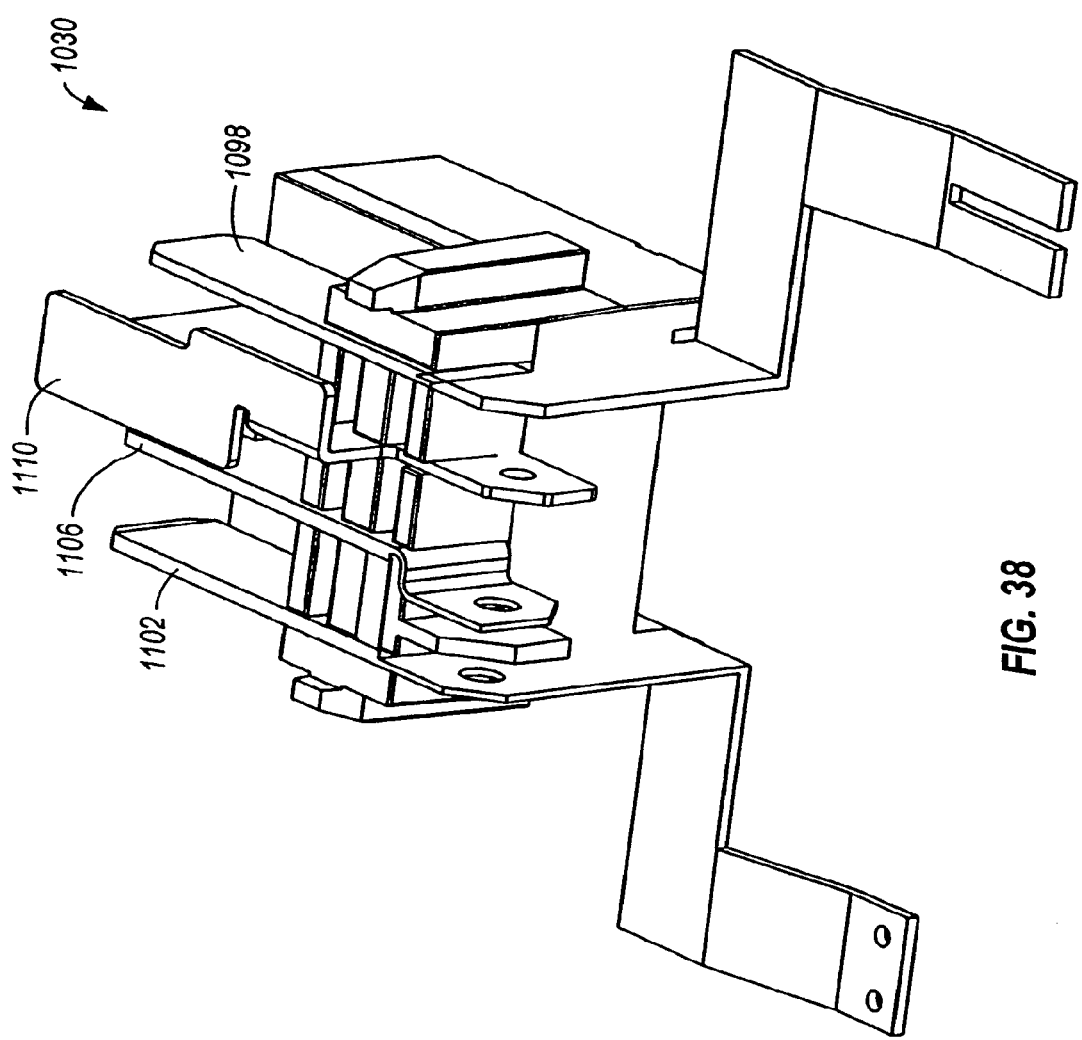
FIG. 38 is a rear perspective view of the terminal assembly of the battery shown in FIG. 35.

As shown in FIGS. 35-37, the battery 1030 can include a housing 1042 and at least one rechargeable battery cell 1046 (schematically illustrated in FIG. 41) supported by the housing 1042. In the illustrated construction, the battery 1030 can be a 18 V battery pack including five approximately 3.6 V battery cells 1046 (one shown) connected in series or can be a 21 V battery pack including five approximately 4.2V battery cells 1046 (one shown) connected in series. In other constructions (not shown), the battery 1030 may have another nominal battery voltage, such as, for example, 9.6 V, 12 V, 14.4 V, 24 V, 28 V, and the like, to power the electrical equipment and be charged by the battery charger 1038. It should be understood that, in other constructions (not shown), the battery cells 1046 can have a different nominal cell voltage and/or may be connected in another configuration, such as, for example, in parallel or in a parallel/series combination.

The battery cell 1046 can be any rechargeable battery cell chemistry type, such as, for example, nickel cadmium (NiCd), nickel-metal hydride (NiMH), Lithium (Li), Lithium-ion (Li-ion), other Lithium-based chemistry, other rechargeable battery cell chemistry, etc. In the illustrated construction, the battery cells 1046 are Li-ion battery cells.

The housing 1042 can provide a support portion 1050 for supporting the battery 1030 on an electrical device, such as the power tool 1034 or the battery charger 1038. In the illustrated construction, the support portion 1050 can provide a C-shaped cross section (see FIG. 37) which is connectable to a complementary T-shaped shaped cross section support portion on the electrical device. As shown in FIGS. 35-37, the support portion 1050 can include rails 1054 extending along a support axis 1058 and defining grooves 1062. An intermediate ridge 1066 can also be provided to engage with a surface of the electrical device support portion. Recesses 1070 (see FIGS. 35-36) can be defined in the ridge 1066 so that the ridge 1066 has laterally-outwardly extended portions 1072.

The battery 1030 can also include (see FIGS. 35-37) a locking assembly 1074 operable to lock the battery 1030 to an electrical device, such as, for example, to the power tool 1034 and/or to a battery charger 1038. In some constructions, the locking assembly 1034 can include locking members 1078 which are movable between a locked position, in which the locking members 1078 engage a corresponding locking member on the electrical device to lock the battery 1030 to the electrical device, and an unlocked position. The locking assembly 1074 can also include actuators 1082 for moving the locking members 1078 between the locked position and the unlocked position. Biasing members (not shown) can bias the locking members 1078 toward the locked position.

Figure 41:
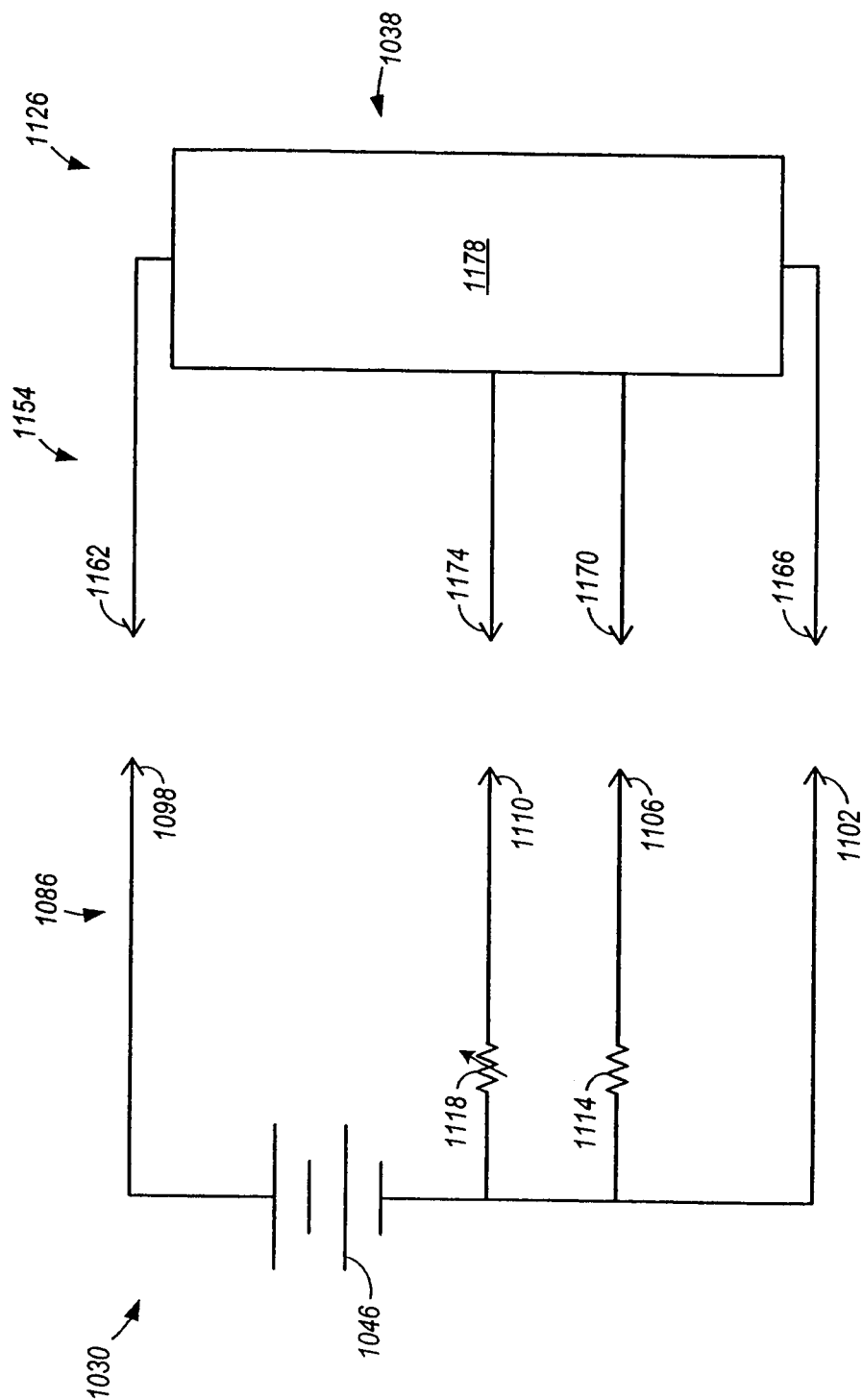
FIG. 41 is a schematic diagram of the battery and the battery charger shown in FIG. 40.

The battery 1030 can also include (see FIGS. 35-39 and 41) a terminal assembly 1086 operable to electrically connect the battery cells 1046 to a circuit in the electrical device. The terminal assembly 1086 can include (see FIGS. 35-37) a terminal housing 1090 provided by the housing 1042. In the illustrated construction and in some aspects, a window or opening 1094 can be provided in the terminal housing 1090. The terminal assembly 1086 can include (see FIGS. 35, 37-39 and 41) a positive battery terminal 1098, a ground terminal 1102, a first sense terminal 1106 and a second sense terminal 1110. As schematically illustrated in FIG. 41, the terminals 1098 and 1102 are connected to the opposite ends of the cell or series of cells 1046.

The sense terminals 1106 and 1110 can be connected to electrical components 1114 and 1118, respectively, which are connected in the circuit of the battery 1030. The sense terminals 1106 and 1110 can communicate information regarding the battery 1030 to an electrical device. For example, one electrical component, such as the electrical component 1114, connected to the sense terminal 1106 may be an identification component, such as a resistor, to communicate the identification of a characteristic of the battery 1030, such as, for example, the chemistry of the battery cells 1046, the nominal voltage of the battery 1030, etc. The other electrical component, such as the electrical component 1118, connected to the sense terminal 1110 may be a temperature-sensing device or thermistor to communicate the temperature of the battery 1030 and/or of the battery cell(s) 1046.

In other constructions, the electrical components 1114 and 1118 can be other suitable electrical components capable of generating an electrical signal such as, for example, a microprocessor, a controller, digital logic components, and the like, or the components 1114 and 1118 can be other suitable passive electrical components such as, for example, resistors, capacitors, inductors, diodes, and the like.

It should be understood that, in other constructions (not shown), the electrical components 1114 and 1118 may be other types of electrical components and may communicate other characteristics or information about the battery 1030 and/or of the battery cell(s) 1046. It should also be understood that "communication" and "communicate", as used with respect to the electrical components 1114 and 1118, may also encompass the electrical component(s) 1114 and/or 1118 having or being in a condition or state which is sensed by a sensor or device capable of determining the condition or state of the electrical component(s) 1114 and/or 1118.

Figure 39:
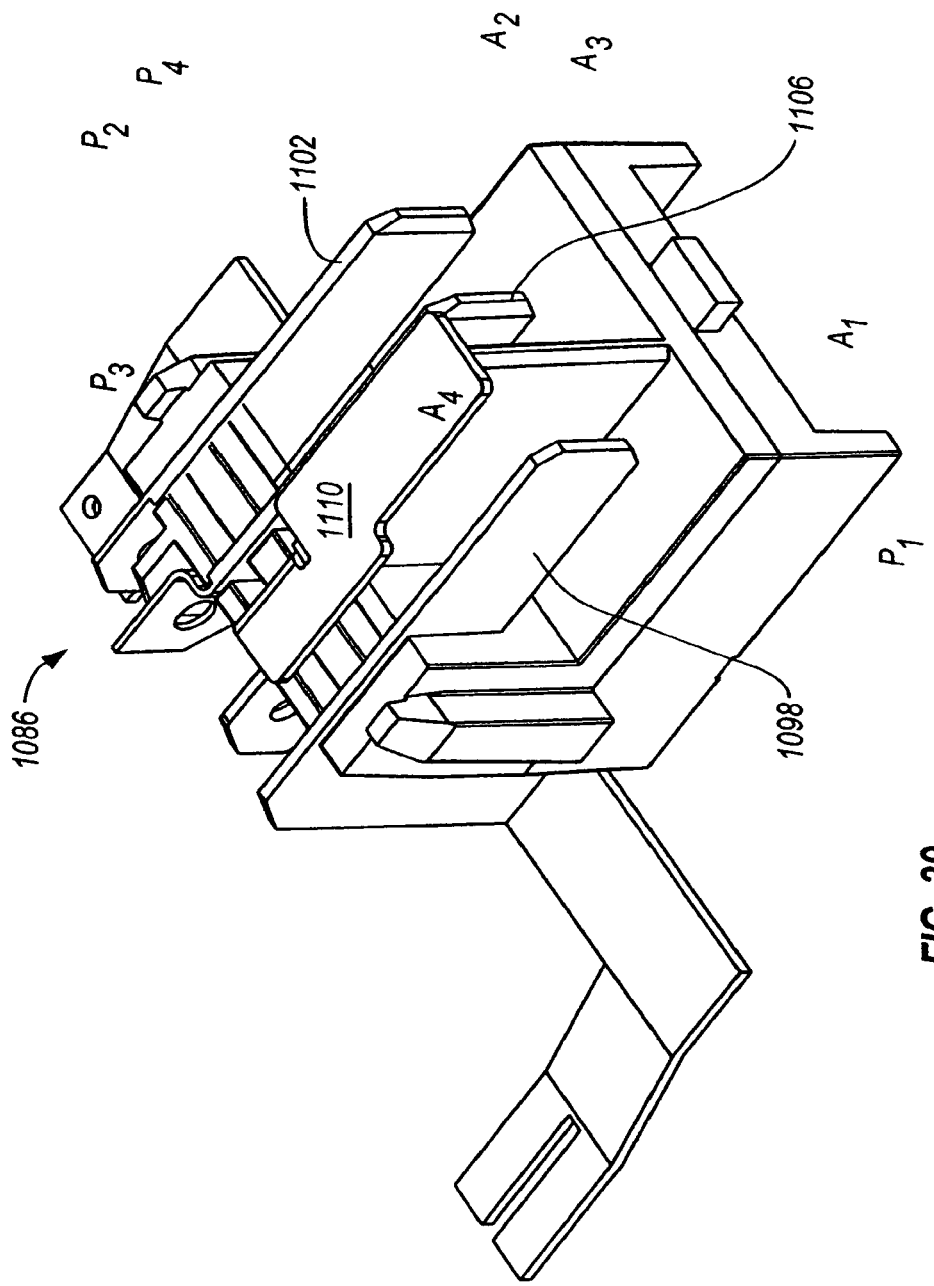
FIG. 39 is a front perspective view of the terminal assembly of the battery shown in FIG. 35.

As shown in FIG. 39, the terminals 1098, 1102 and 1106 can be oriented in planes $P_1$, $P_2$ and $P_3$, respectively, which are substantially parallel to one another. The terminal 1110 can be oriented in a plane $P_4$ which is oriented to be non-parallel to at least one of, and, in the illustrated construction, to all of the other planes $P_1$, $P_2$ and $P_3$. In one construction, the plane $P_4$ can be normal to the planes $P_1$, $P_2$ and $P_3$. The terminals 1098, 1102, 1106 and 1110 can extend along respective axes $A_1$, $A_2$, $A_3$ and $A_4$, and, in the illustrated construction, the terminal axes $A_1$, $A_2$, $A_3$ and $A_4$ are parallel to (see FIGS. 35 and 37) the support axis 1058.

Figure 40:
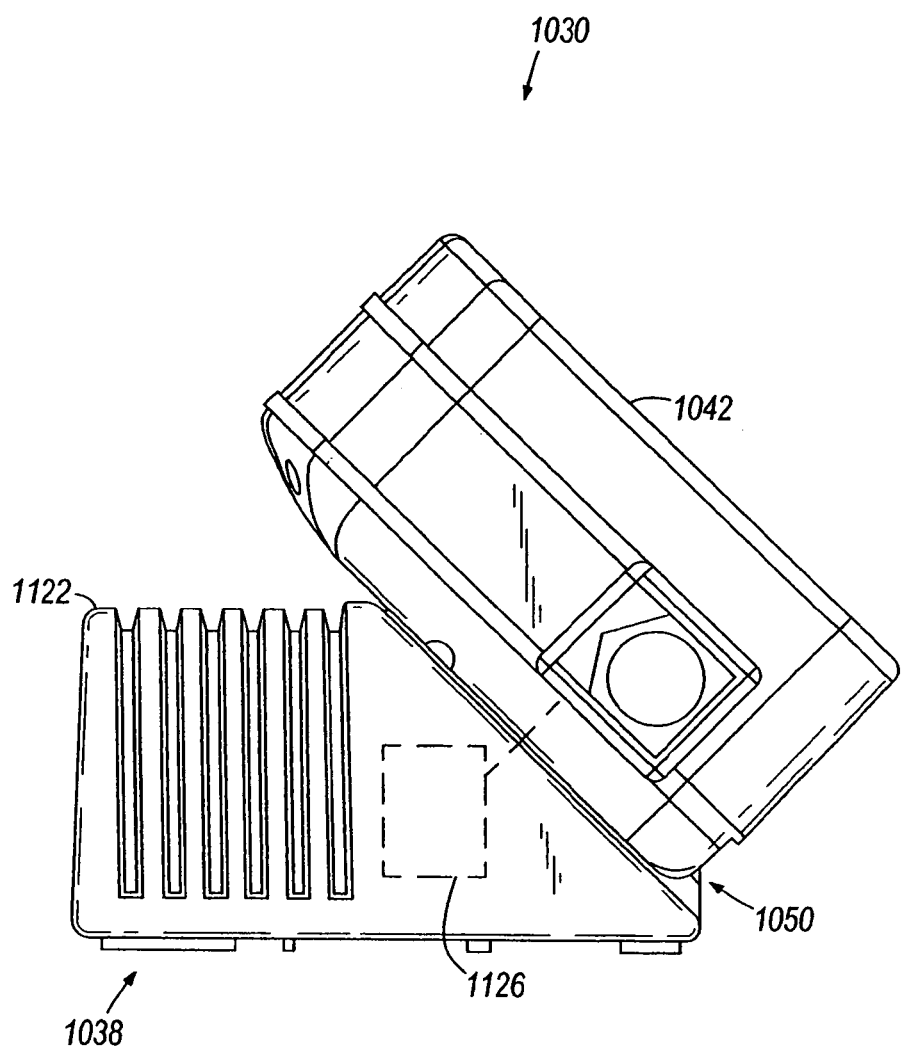
FIG. 40 is a side view of the battery shown in FIG. 35 and an electrical component, such as a battery charger.

As shown in FIGS. 40-44, the battery charger 1038 embodying aspects of the invention can be connectable to the battery 1030 (as shown in FIG. 40) and can be operable to charge the battery 1030. The battery charger 1038 can include a charger housing 1122 and a charging circuit 1126 (schematically illustrated in FIG. 41) supported by the housing 1122 and connectable to a power source (not shown). The charging circuit 1126 can be connectable to the terminal assembly 1086 of the battery 1030 (schematically illustrated in FIG. 41) and can be operable to transfer power to the battery 1030 to charge the battery cell(s) 1046.

In some constructions and in some aspects, the charging circuit 1126 can operate to charge the battery 1030 in a manner similar to that described in U.S. Pat. No. 6,456,035, issued Sep. 24, 2002, and U.S. Pat. No. 6,222,343, issued Apr. 24, 2001, which are hereby incorporated by reference. In other constructions, the charging circuit 1126 can operate to charge the battery 1030 in a manner similar to that described in prior filed U.S. provisional application Ser. No. 60/440,692 filed Jan. 17, 2003, the entire contents of which are hereby incorporated by reference.

Figure 42:
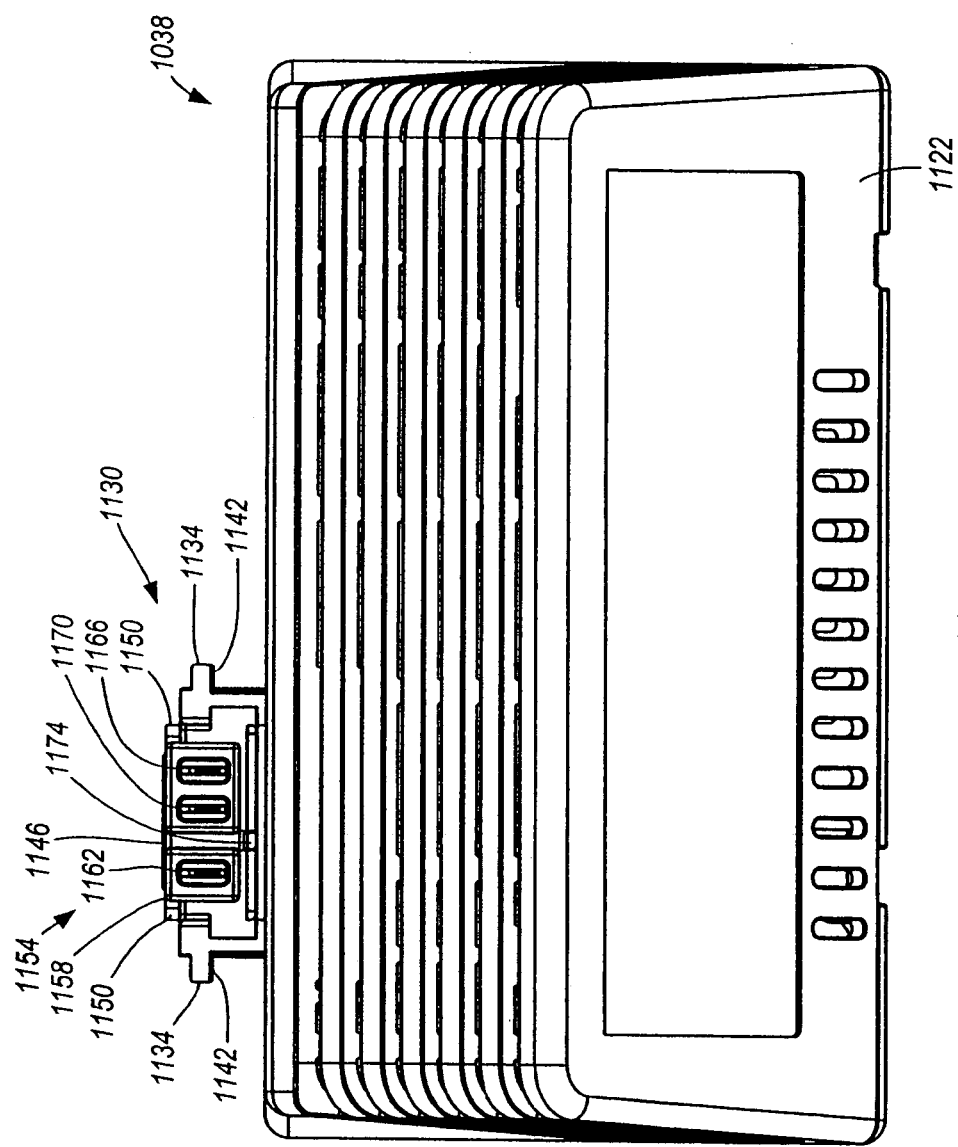
FIG. 42 is a perspective view of the battery charger shown in FIG. 40.
Figure 43:
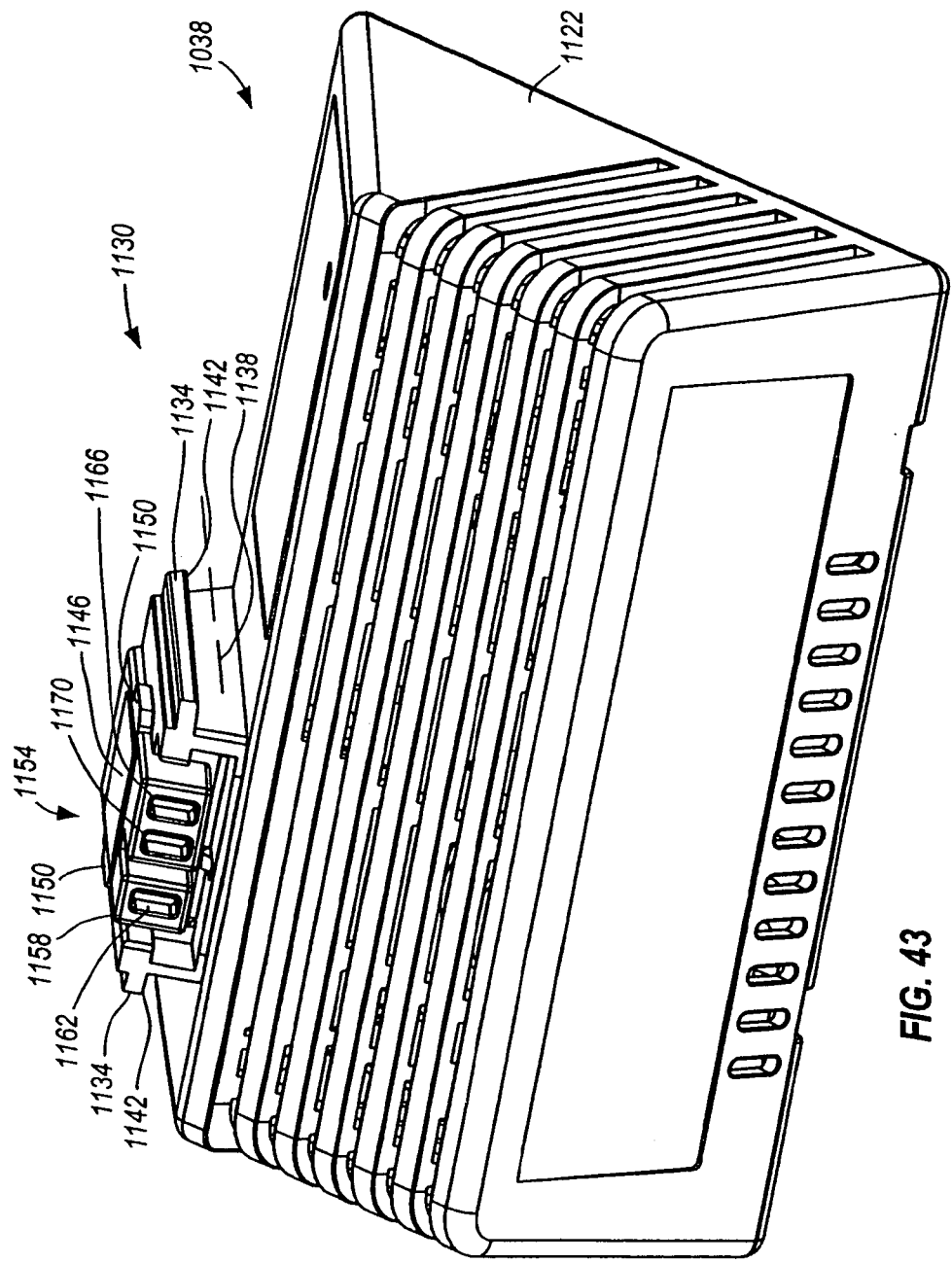
FIG. 43 is another perspective view of the battery charger shown in FIG. 40.
Figure 44:
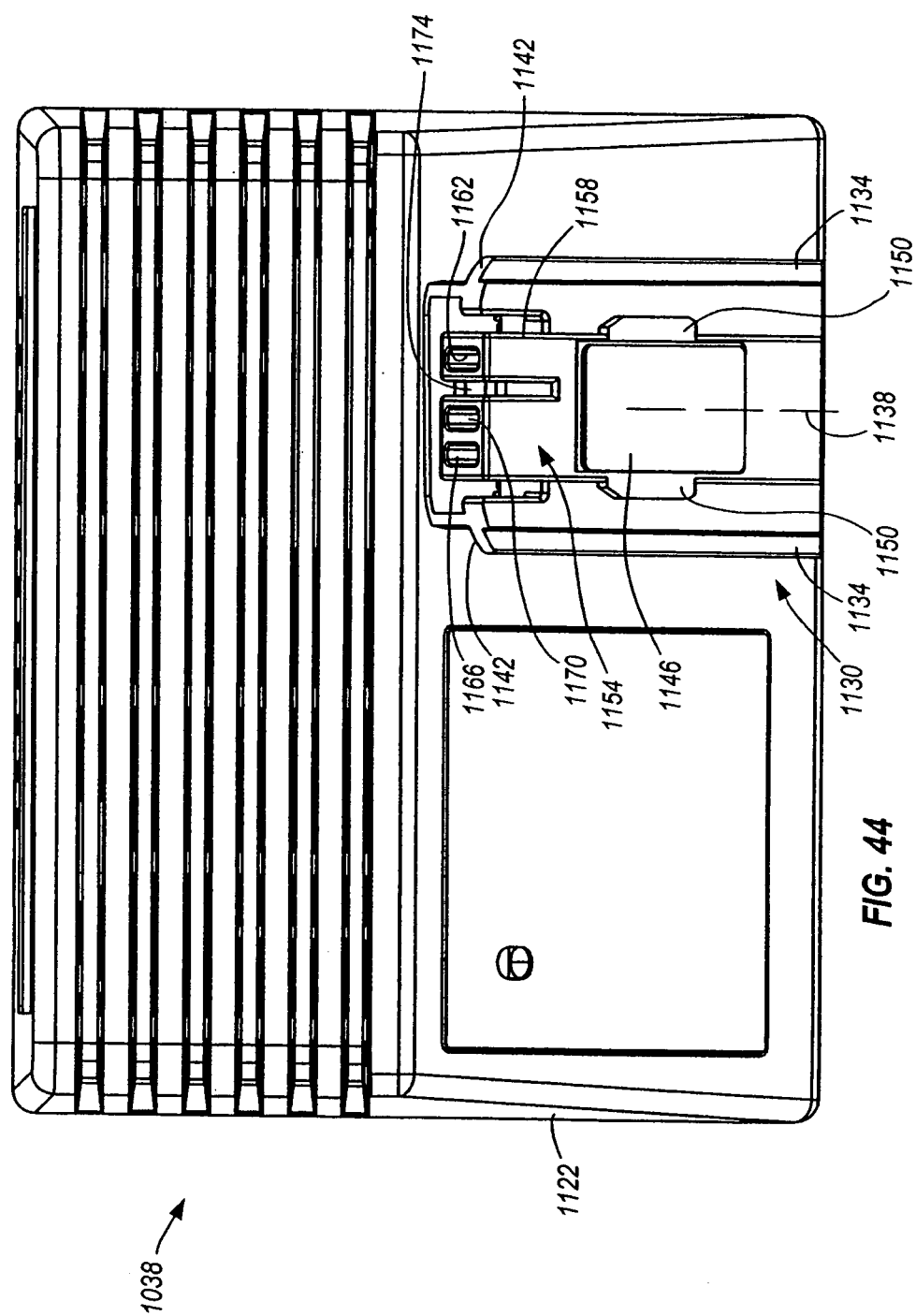
FIG. 44 is a top view of the battery charger shown in FIG. 40.
Figure 45:
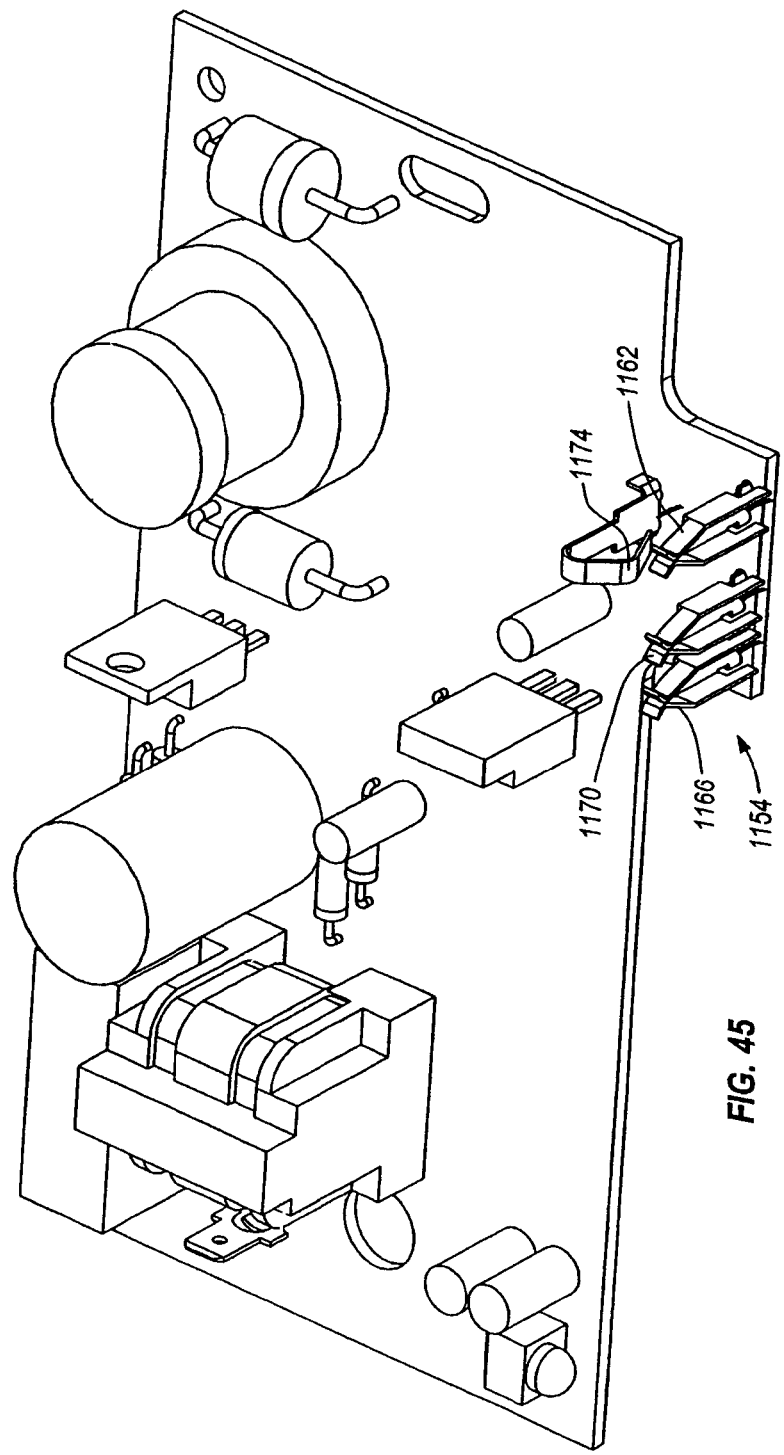
FIG. 45 is a perspective view of the terminal assembly of the battery charger shown in FIG. 40.
Figure 46:
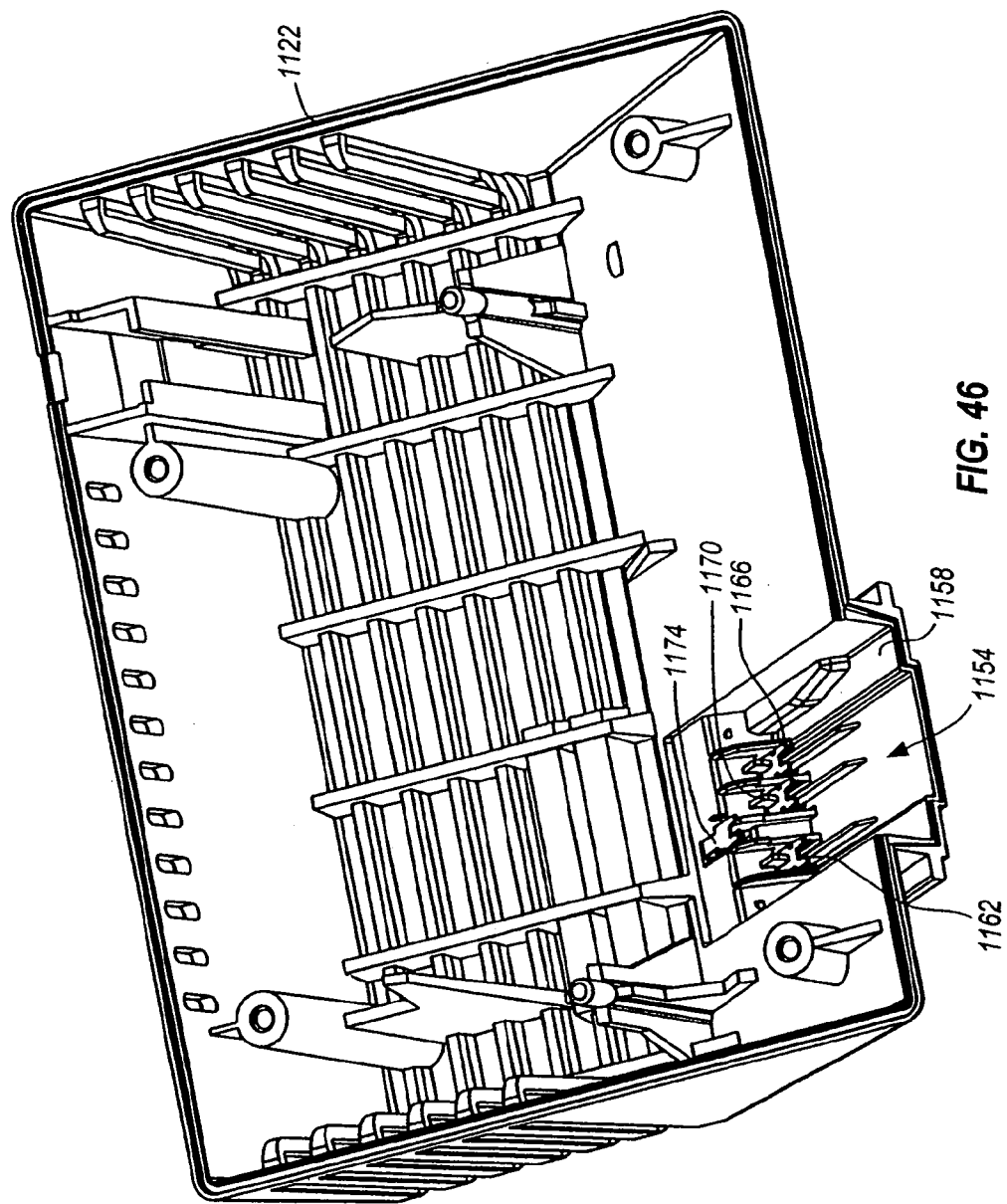
FIG. 46 is a perspective view of the inner portion of the housing of the battery charger shown in FIG. 40.
Figure 47:
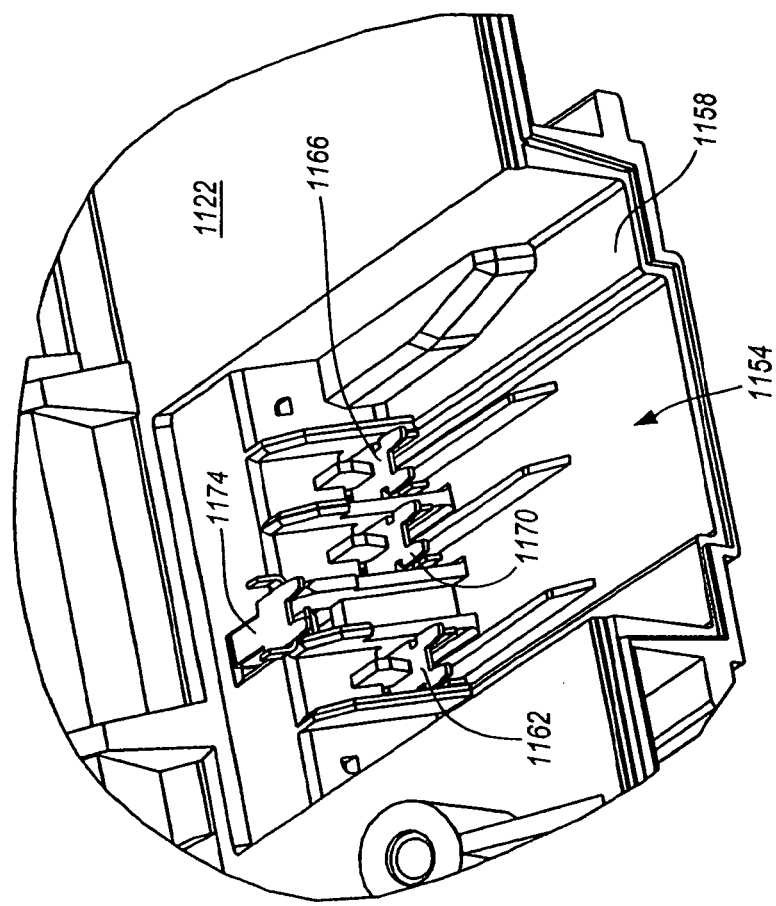
FIG. 47 is an enlarged perspective view of a portion of the battery charger shown in FIG. 46 and illustrating the terminal assembly of the battery charger.

As shown in FIGS. 42-44, the housing 1122 can provide a battery support portion 1130 for supporting the battery 1030. The support portion 1130 can have (see FIG. 42) a generally T-shaped cross section which can be complementary to the C-shaped cross section of the support portion 1050 of the battery 1030. The support portion 1130 can include (see FIGS. 42-44) rails 1134 which extend along a support axis 1138 and which define grooves 1142. The support portion 1130 can also include a surface 1146 which is engageable with the ridge 1066.

Projections or ribs 1150 can extend from the surface 1146. When the battery 1030 is positioned on the support portion 1130, the ribs 1150 can be generally laterally aligned with the locking members 1078 to maintain the locking members 1078 in the locking position. In one constructions, the ribs 1150 are lowered to ensure that the ribs 1150 do not engage with the ridge 1066 on the support portion 1050 of the battery 1030, which would prevent the battery 1030 from being connected to the battery charger 1038.

The battery charger 1038 can also include (see FIGS. 41-47) a terminal assembly 1154 operable to electrically connect the charging circuit 1126 to the terminal assembly 1086 of the battery 1030 (as schematically illustrated in FIG. 41). As shown in FIGS. 42-44 and 46-47, the terminal assembly 1154 can include a terminal housing 1158 provided by the support portion 1130. The terminal assembly 1154 also can include (see FIGS. 41-47) a positive terminal 1162, a negative terminal 1166, a first sense terminal 1170 and a second sense terminal 1174. The charger terminals 1162, 1166, 1170 and 1174 can be connectable to the battery terminals 1098, 1102, 1106 and 1110, respectively (as schematically illustrated in FIG. 41).

The charger terminals 1162, 1166, 1170 and 1174 can be connected to the charging circuit 1126. The charging circuit 1126 can include a microcontroller 1178 for controlling charging of the battery 1030. The controller 1178 is operable to communicate with or sense the condition or state of the electrical components 1114 and 1118 of the battery 1030 to identify one or more characteristics and/or conditions of the battery 1030, such as, for example, the nominal voltage of the battery 1030, the chemistry of the battery cell(s) 1046, the temperature of the battery 1030 and/or of the battery cell(s) 1046, etc. Based upon determinations made by the controller 1178, the controller 1178 can control the charging circuit 1126 to properly charge the battery 1030.

As shown in FIGS. 35, 37-39, the battery terminals 1098, 1102 and 1106 can be male blade terminals. As shown in FIG. 42, the charger terminals 1162, 1166 and 1170 can be female terminals operable to receive the male blade terminals 1098, 1102 and 1106. The battery terminal 1110 (see FIGS. 35-39) and the charger terminal 1174 (see FIGS. 42-44) can provide a cantilever spring-type engagement. In the illustrated construction (see FIGS. 42-44), the charger terminal 1174 can extend generally perpendicularly to the support axis 1138 to provide a sliding engagement and contact with the battery terminal 1110.

Figure 48A:
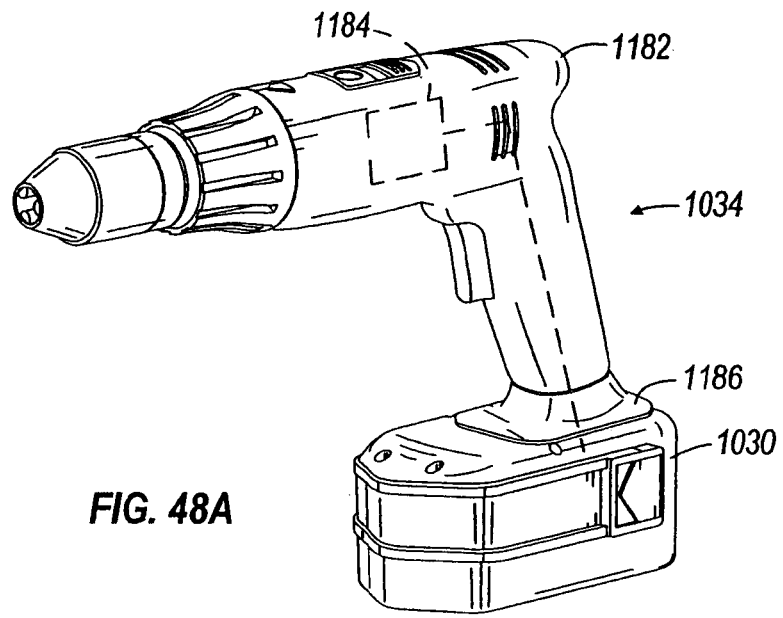
FIG. 48A is a perspective view of an electrical device, such as a power tool, for use with the battery shown in FIG. 35.
Figure 48B:
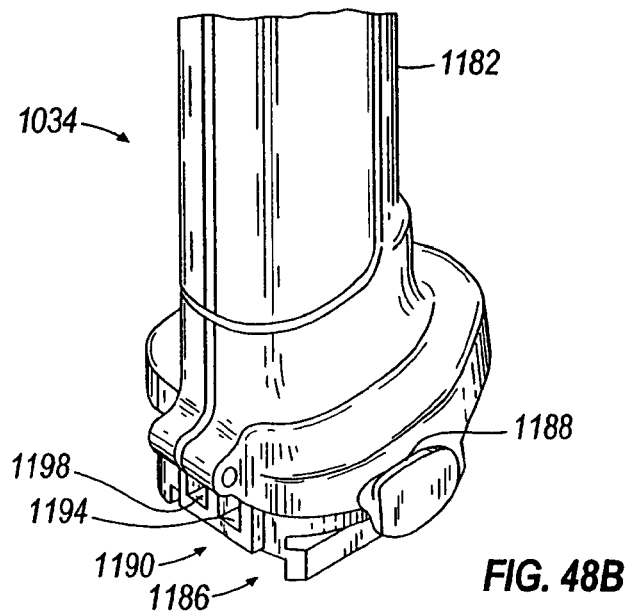
FIG. 48B is a perspective view of the support portion of the power tool shown in FIG. 48A.
Figure 49:
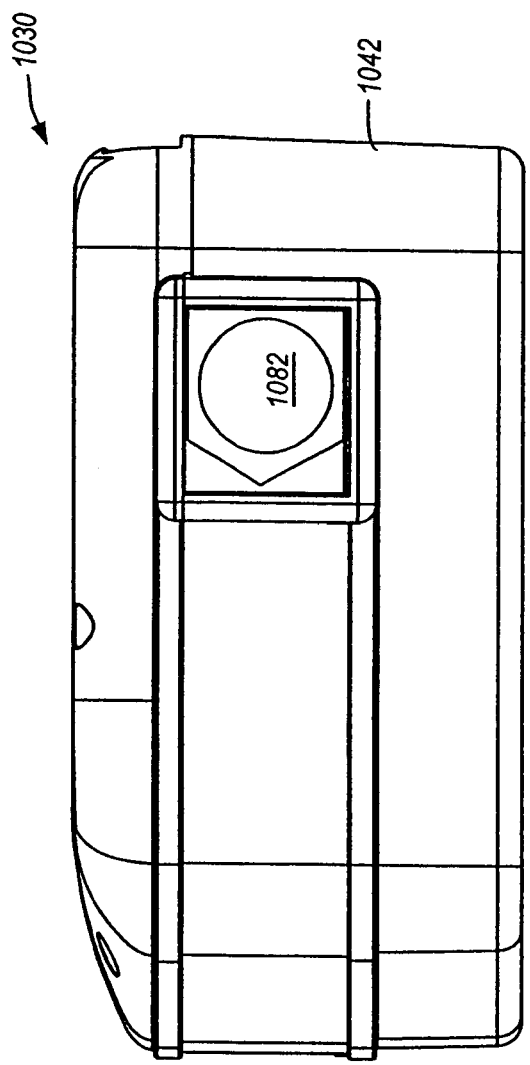
FIG. 49 is a right side view of the battery shown in FIG. 35.
Figure 50:
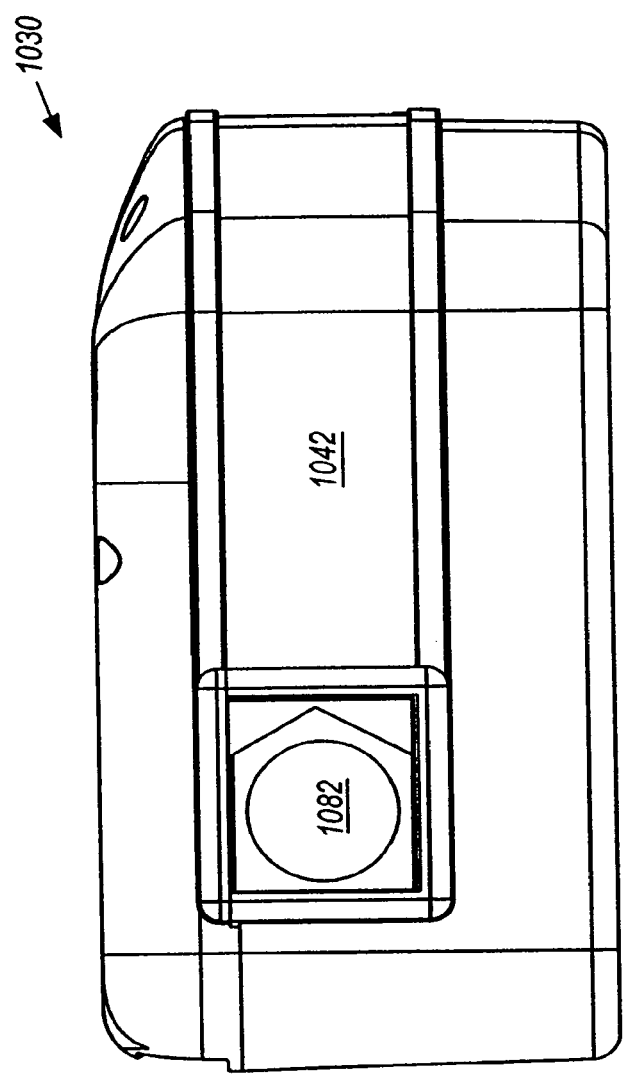
FIG. 50 is a left side view of the battery shown in FIG. 35.
Figure 51:
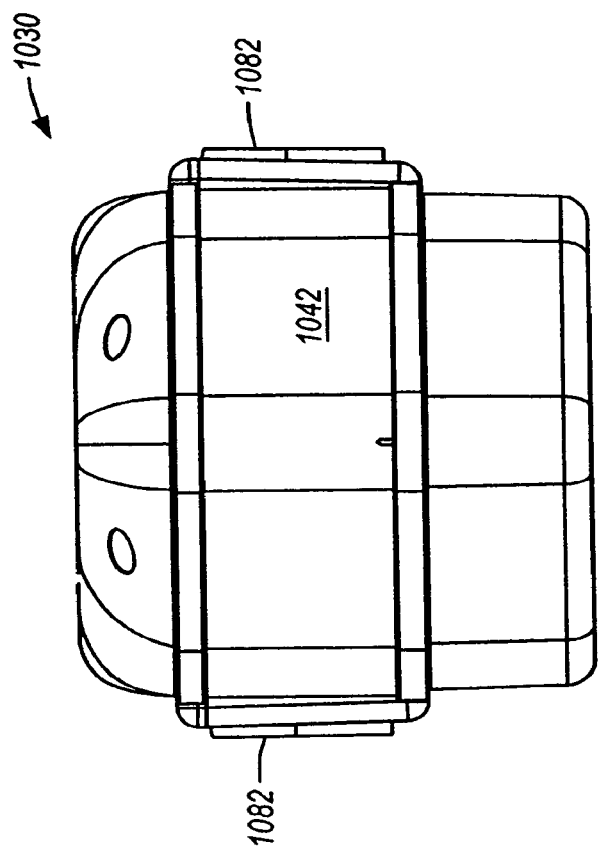
FIG. 51 is a front view of the battery shown in FIG. 35.
Figure 52:
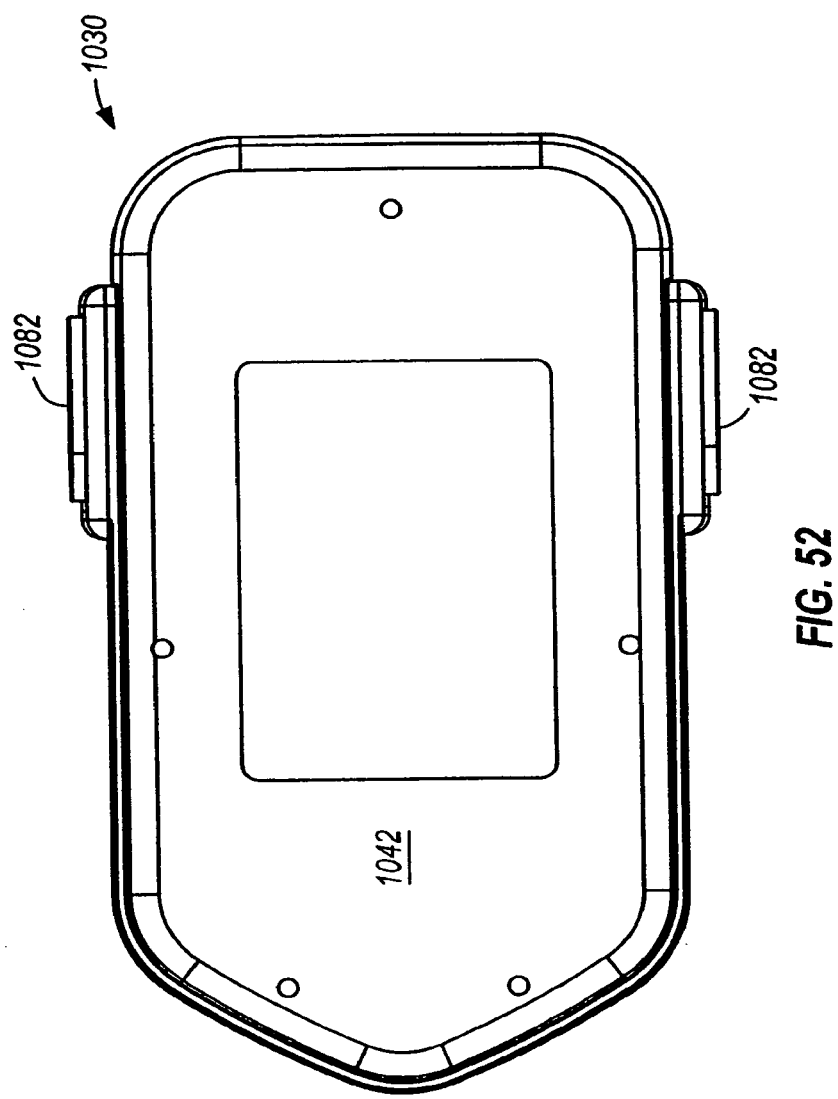
FIG. 52 is a bottom view of the battery shown in FIG. 35.
Figure 53:
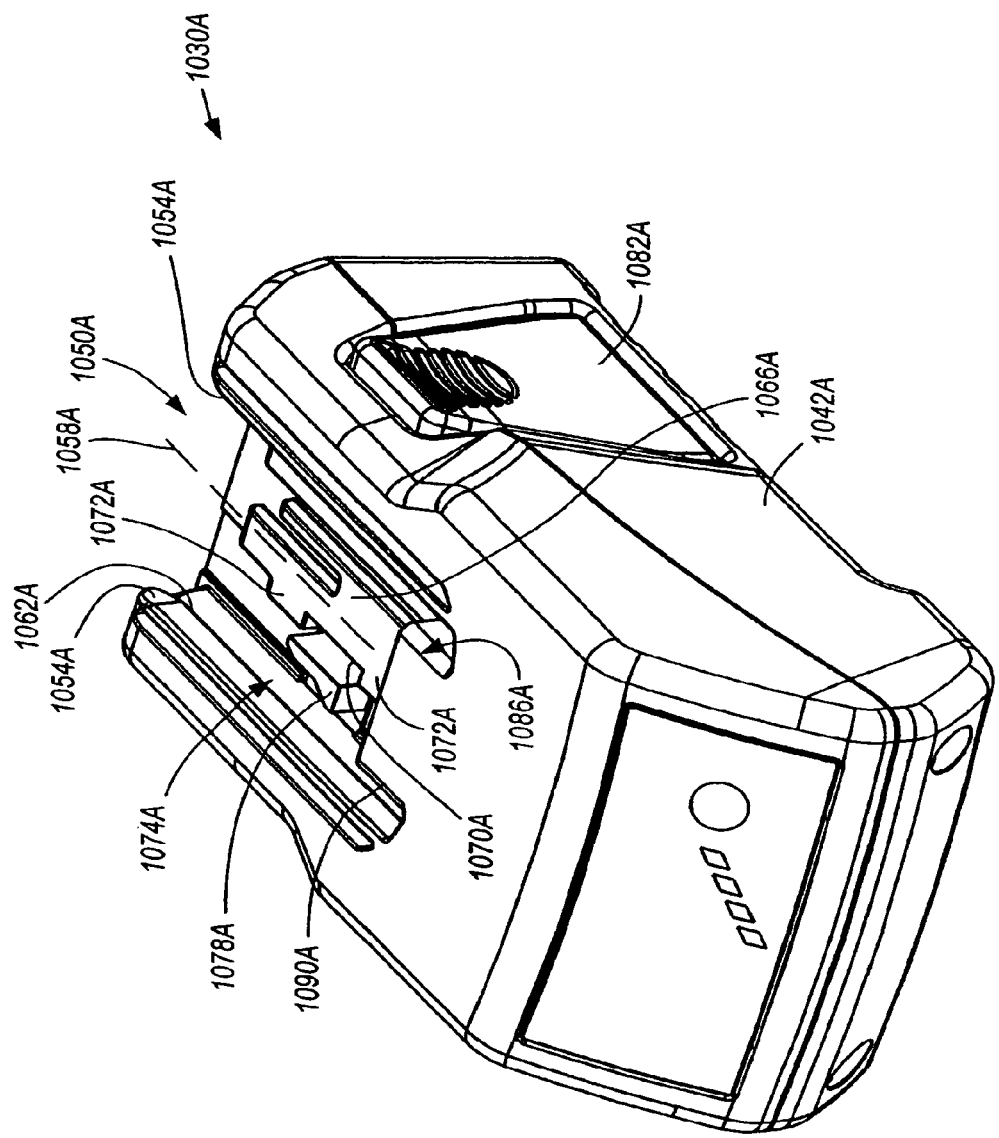
FIG. 53 is a front perspective view of an alternate construction of a battery.
Figure 54:
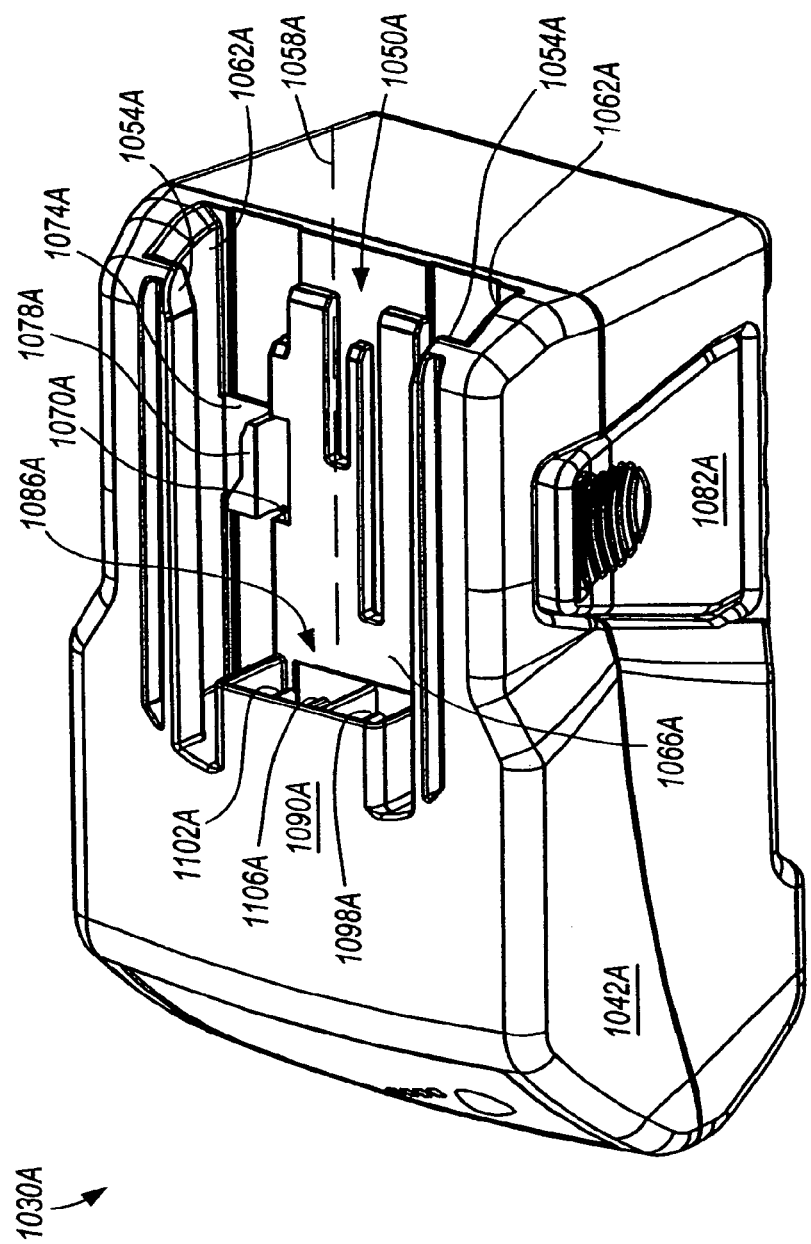
FIG. 54 is a rear perspective view of the battery shown in FIG. 53.

The battery 1030 can be connectable to electrical equipment, such as, for example, the power tool 1034 (shown in FIG. 48A), to power the tool 1034. The power tool 1034 includes a housing 1182 supporting an electric motor 1184 (schematically illustrated) selectively powered by the battery 1030. The housing 1182 can provide (see FIG. 48B) a support portion 1186 on which the battery 1030 can be supported. The support portion 1186 can have a generally T-shaped cross section which can be complementary to the C-shaped cross section of the support portion 1050 of the battery 1030. The support portion 1186 also can define locking recesses 1188 (one shown) in which the locking members 1078 are engageable to lock the battery 1030 to the power tool 1034.

The power tool 1034 can also include a terminal assembly 1190 (partially shown in FIG. 48B) connectable to the terminal assembly 1086 of the battery 1030 so that power is transferable from the battery 1030 to the power tool 1034. In the illustrated construction, the terminal assembly 1190 can include a positive terminal 1194 and a negative terminal 1198 which are connected to the terminals 1098 and 1102, respectively, of the battery 1030.

It should be understood that, in other constructions (not shown), the terminal assembly 1190 may include additional terminals (not shown) which are connectable to the sense terminals 1106 and/or 1110 so that information regarding the battery 1030, such as, for example, one or more characteristics of the battery 1030 and/or conditions of the battery 1030, may be communicated to or sensed by the power tool 1034. In such constructions, the power tool 1034 may include a controller (not shown) to determine the communicated or sensed information regarding the battery 1030 and to control operation of the power tool 1034 based on this information.

An alternative construction of a battery 1030A embodying aspects of the invention is illustrated in FIGS. 53-56. Common elements are identified by the same reference number "A".

As shown in FIGS. 53-56, the battery 1030A can include a housing 1042A supporting one or more cells (not shown but similar to the cells 1046). The battery 1030A can include a support portion 1050A which has (see FIG. 56) a generally C-shaped cross section which can be complementary to (see FIG. 42) the support portion 1130 of the battery charger 1038 and to (see FIG. 48B) the support portion 1186 of the power tool 1034 so that the battery 1030A is connectable to the battery charger 1038 and the power tool 1034.

Figure 55:
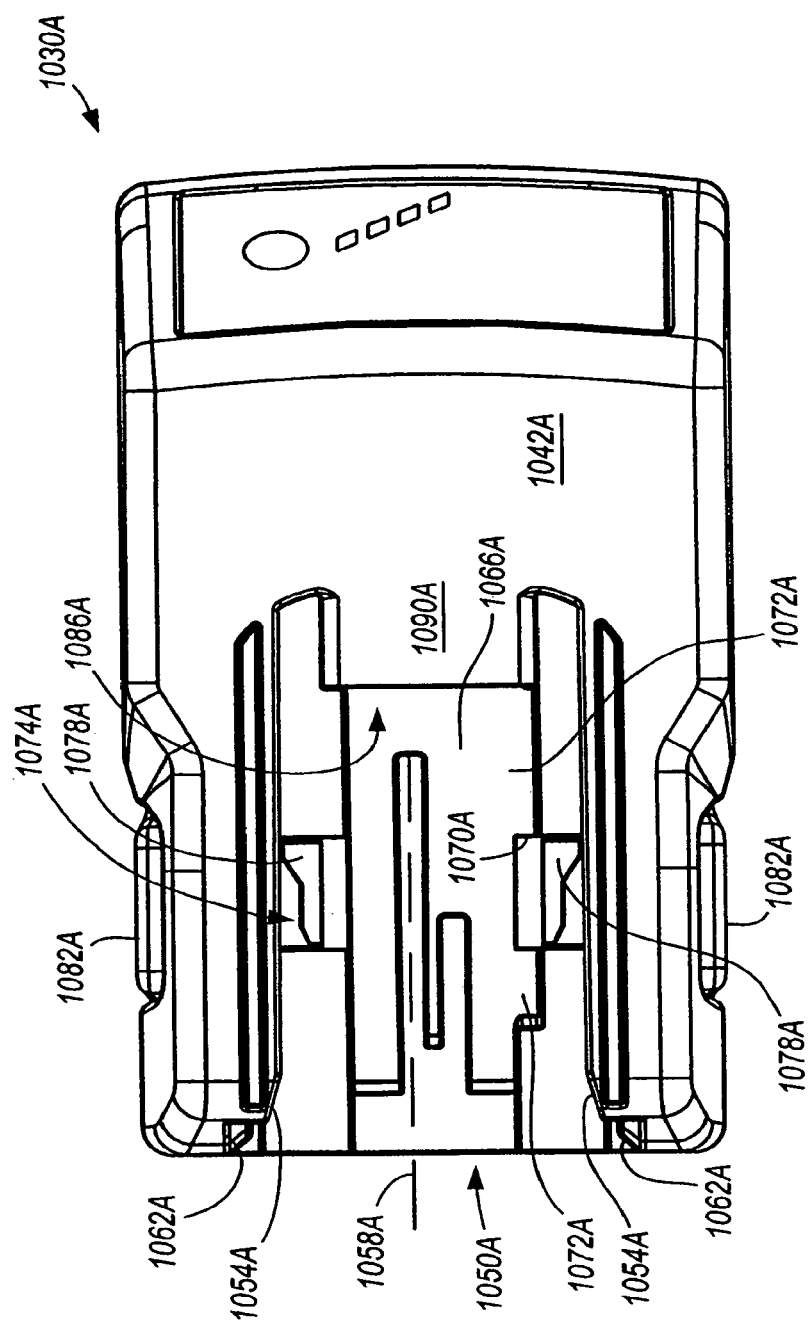
FIG. 55 is a top view of the battery shown in FIG. 53.
Figure 56:
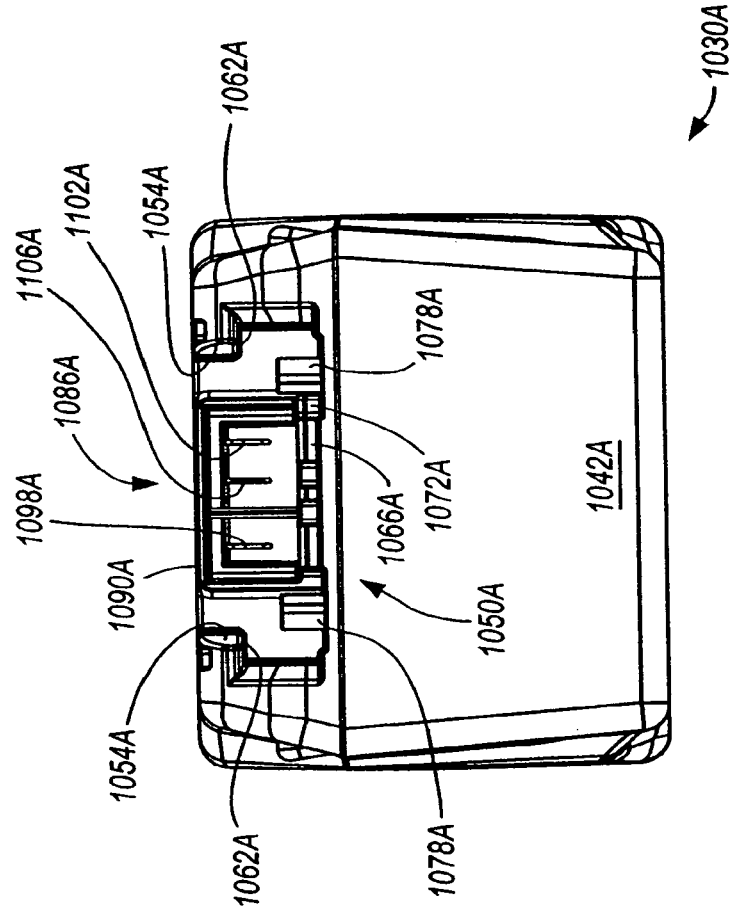
FIG. 56 is a rear view of the battery shown in FIG. 53.
Figure 57:
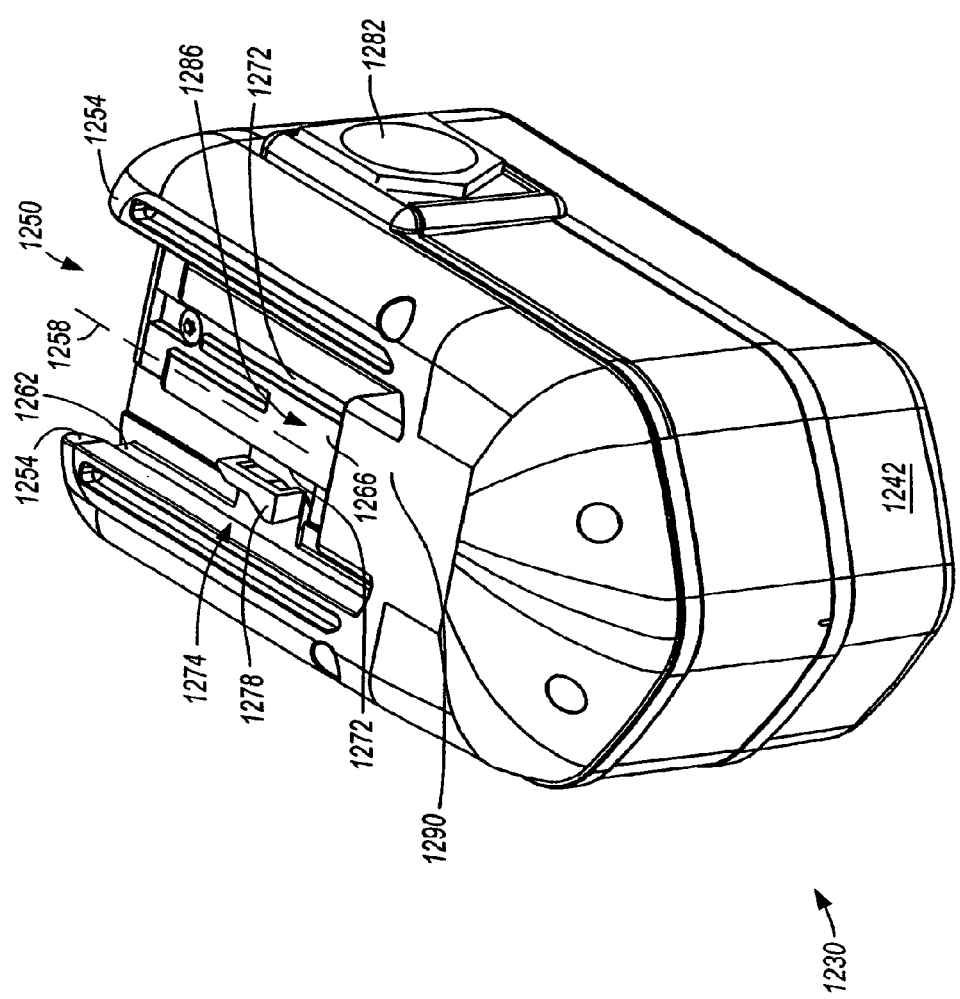
FIG. 57 is a front perspective view of a prior art battery.

As shown in FIGS. 53-56, the support portion 1050A can include the ridge 1066A. As shown in FIG. 55, the ridge 1066A can extend farther to one lateral side (the lower lateral side in FIG. 55) to provide a laterally-outwardly extended portion 1072A.

For some constructions and for some aspects, additional independent features, structure and operation of the battery 1030A are described in more detail above.

When the battery 1030A is positioned on the support portion 1130 of the battery charger 1038, the lowered ribs 1150 (shown in FIG. 42) do not engage with (see FIG. 55) the extended portion 1072A of the ridge 1066A on the support portion 1050A of the battery 1030A so that the battery 1030A is not prevented from being connected to the battery charger 1038.

FIGS. 57-61 illustrate a prior art battery 1230. The battery 1230 can include a housing 1242 and at least one rechargeable battery cell 1246 (schematically illustrated in FIG. 61) supported by the housing 1242. In the illustrated construction, the battery 1230 is an 18V battery pack including 15 approximately 1.2 V battery cells 1246 connected in series. In other constructions (not shown), the battery 1230 may have another nominal voltage, such as, for example, 9.6V, 12V, 14.4V, 24V, etc., to power the electrical equipment and be charged by the battery charger 1038. It should be understood that, in other constructions (not shown), the battery cells 1246 may have a different nominal cell voltage and/or may be connected in another configuration, such as, for example, in parallel or in a parallel series combination. The battery cells 1246 may be a rechargeable battery cell chemistry type, such as, for example, NiCd or NiMH.

As shown in FIGS. 57-60, the housing 1242 can provide a support portion 1250 for supporting the battery 1230 on an electrical device, such as the power tool 1034 (shown in FIG. 48) or the battery charger 1038 (shown in FIG. 42). In the illustrated construction, the support portion 1250 can provide (see FIG. 60) a C-shaped cross section which is connectable to a complementary T-shaped cross section support portion on the electrical device (the support portion 1186 on the power tool 1034 (shown in FIG. 48B) and/or the battery support portion 1130 on the battery charger 1038 (shown in FIG. 42)). As shown in FIGS. 57-60, the support portion 1250 can include rails 1254 extending along a support axis 1258 and defining grooves 1262, an intermediate ridge 1266 can be provided to engage with a surface of the electrical device support portion. The ridge 1266 can have substantially linear and uninterrupted lateral surfaces 1272. The ridge 1266 does not provide laterally-outwardly extended portions (like the extended portions 1072 of the battery 1030 (shown in FIG. 36) or the extended portion 1072A of the battery 1030A (shown in FIG. 55)).

The battery 1230 also can include (see FIGS. 57-60) a locking assembly 1274 operable to lock the battery 1230 to an electrical device, such as, for example, to the power tool 1034 (shown in FIG. 48A) and/or to a battery charger. The locking assembly 1274 can include (see FIGS. 57-60) locking members 1278 which are moveable between a locked position, in which the locking members 1278 can engage a corresponding locking member on the electrical device (such as the locking recess 1188 on the power tool 1034) to lock the battery 1230 to the electrical device, in an unlocked position. The locking assembly 1274 can also include actuators 1282 for moving the locking members 1278 between the locked position and the unlocked position. Biasing members (not shown) can bias the locking members 1278 toward the locked position.

Figure 58:
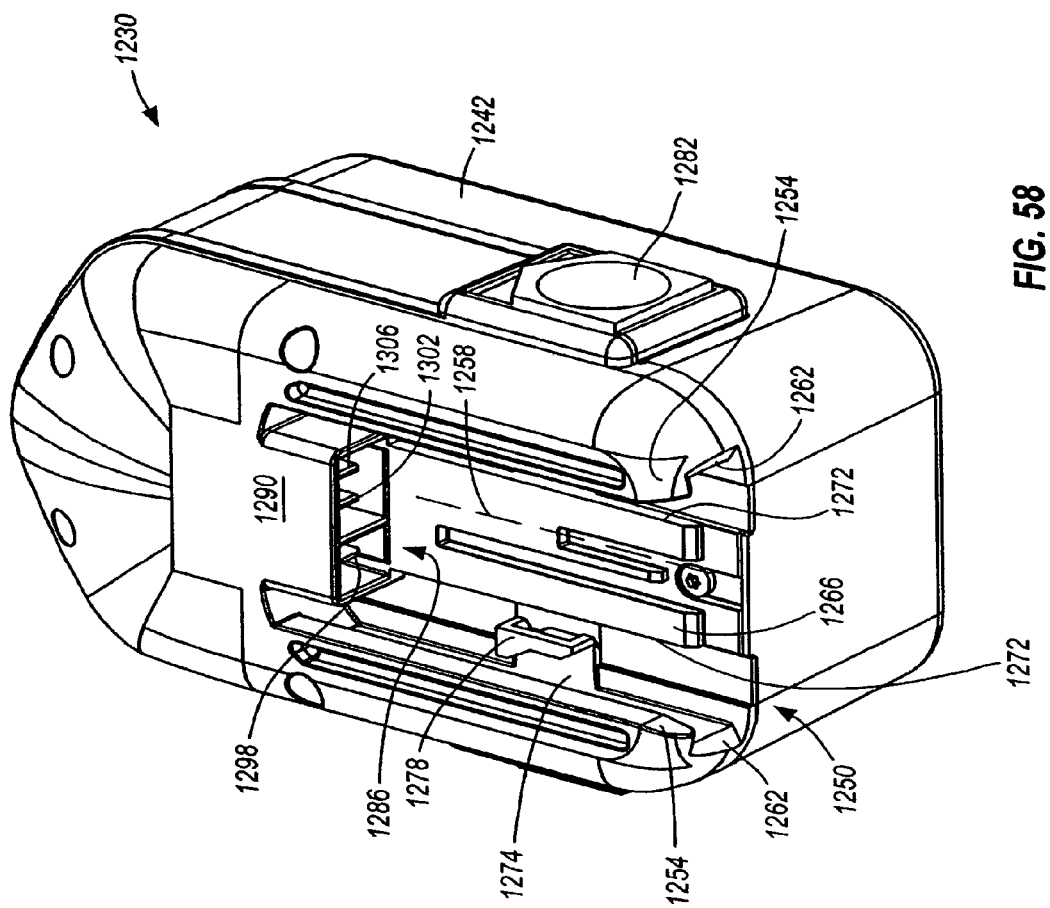
FIG. 58 is a rear perspective view of the battery shown in FIG. 57.
Figure 59:
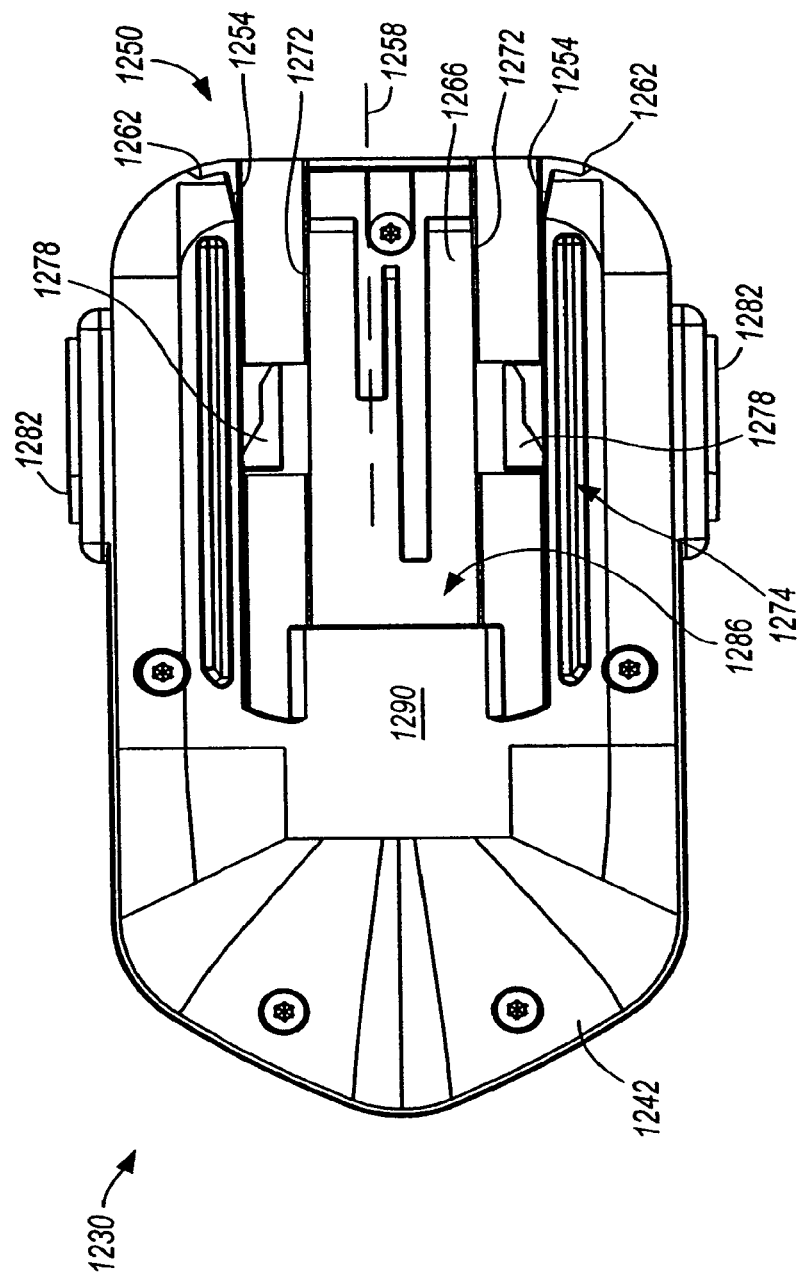
FIG. 59 is a top view of the battery shown in FIG. 57.
Figure 60:
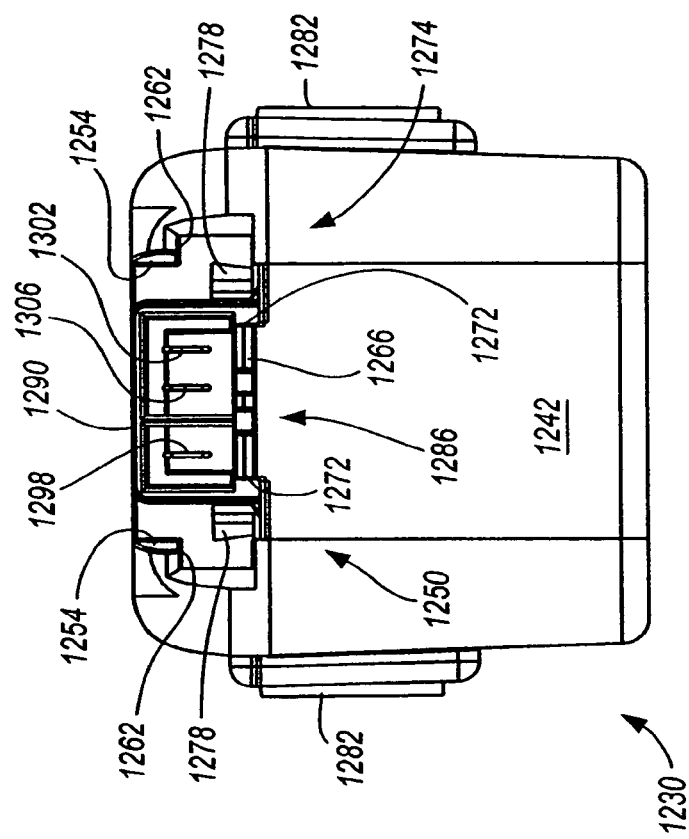
FIG. 60 is a rear view of the battery shown in FIG. 57.

The battery 1230 can include (see FIGS. 58 and 60) a terminal assembly 1286 operable to electrically connect battery cells 1246 to a circuit in the electrical device. The terminal assembly 1286 includes a terminal housing 1290 provided by the housing 1242. The terminal assembly 1286 can include a positive battery terminal 1298, a ground terminal 1302, and a sense terminal 1306. As shown in FIGS. 58 and 60, the terminals 1298, 1302 and 1306 can be oriented in planes which are substantially parallel to one another and can extend along respective axes which are parallel to the support axis 1258.

Figure 61:
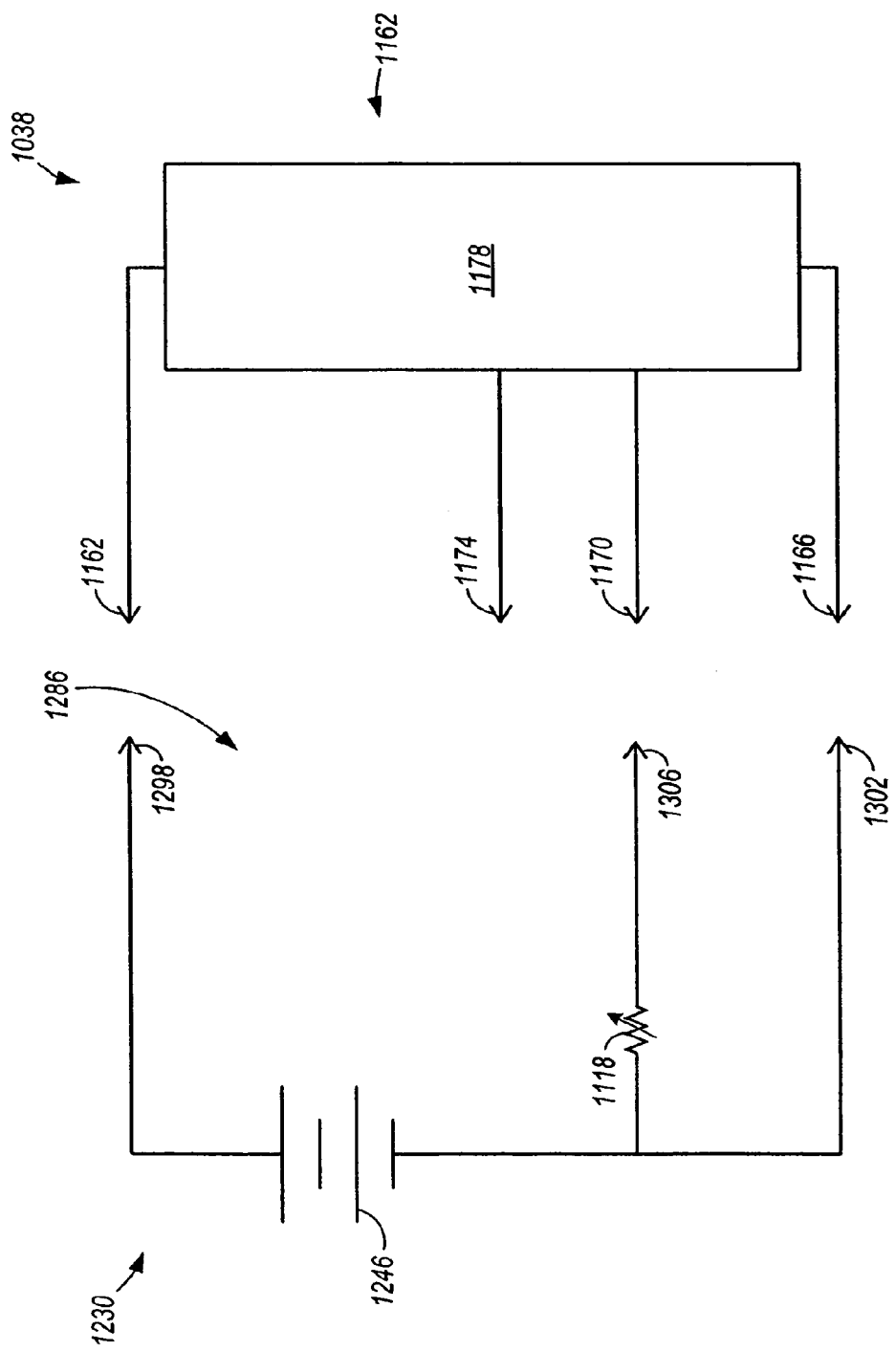
FIG. 61 is a schematic diagram of the prior art battery shown in FIG. 57 and the battery charger shown in FIG. 40.

As schematically illustrated in FIG. 61, the terminals 1298 and 1302 can be connected to the opposite ends of the cell or series of cells 1246. The sense terminal 1306 can be connected to an electrical component 1314 which is connected in the circuit of the battery 1230. In the illustrated construction, the electrical component 1314 can be a temperature-sensing device or thermistor to communicate the temperature of the battery 1230 and/or of the battery cells 1246.

As schematically illustrated in FIG. 61, the battery 1230 can be connectable to the battery charger 1038, and the battery charger 1038 can be operable to charge the battery 1230. The battery terminals 1298, 1302 and 1306 can be connectable to three of the charger terminals 1162, 1166 and 1170, respectively. The microcontroller 1178 can identify the battery 1230 (or determines that the battery 1230 is not a battery 1030 or a battery 1030A) and identify the condition of the electrical component 1314 or thermistor to sense the temperature of the battery 1230. The microcontroller 1178 can control charging of the battery 1230.

The battery 1230 can be supported on the support portion 1130 of the battery charger 1038. The ribs 1150 (shown in FIG. 42) may not engage the ridge 1266 on the support portion 1250 of the battery 1230 (shown in FIGS. 57-60) so that the battery 1230 is not prevented from being connected to the battery charger 1038.

The battery 1230 can be connectable to electrical equipment, such as, for example, the power tool 1034 (shown in FIG. 48A), to power the power tool 1034. The battery 1230 can be supported on the support portion 1186 of the power tool 1034 (shown in FIG. 48B) and can be connectable to the motor 1184 (schematically illustrated in FIG. 48A) to power the motor 1184.

FIGS. 62-65 illustrate another battery charger 1338. The battery charger 1338 can include a charger housing 1342 and a charging circuit 1346 (schematically illustrated in FIG. 65) supported by the housing 1342 and connectable to a power source (not shown). The charging circuit 1346 can be connectable to the terminal assembly 1286 of the battery 1230 and can be operable to transfer power to the battery 1230 to charge the battery cells 1246.

Figure 62:
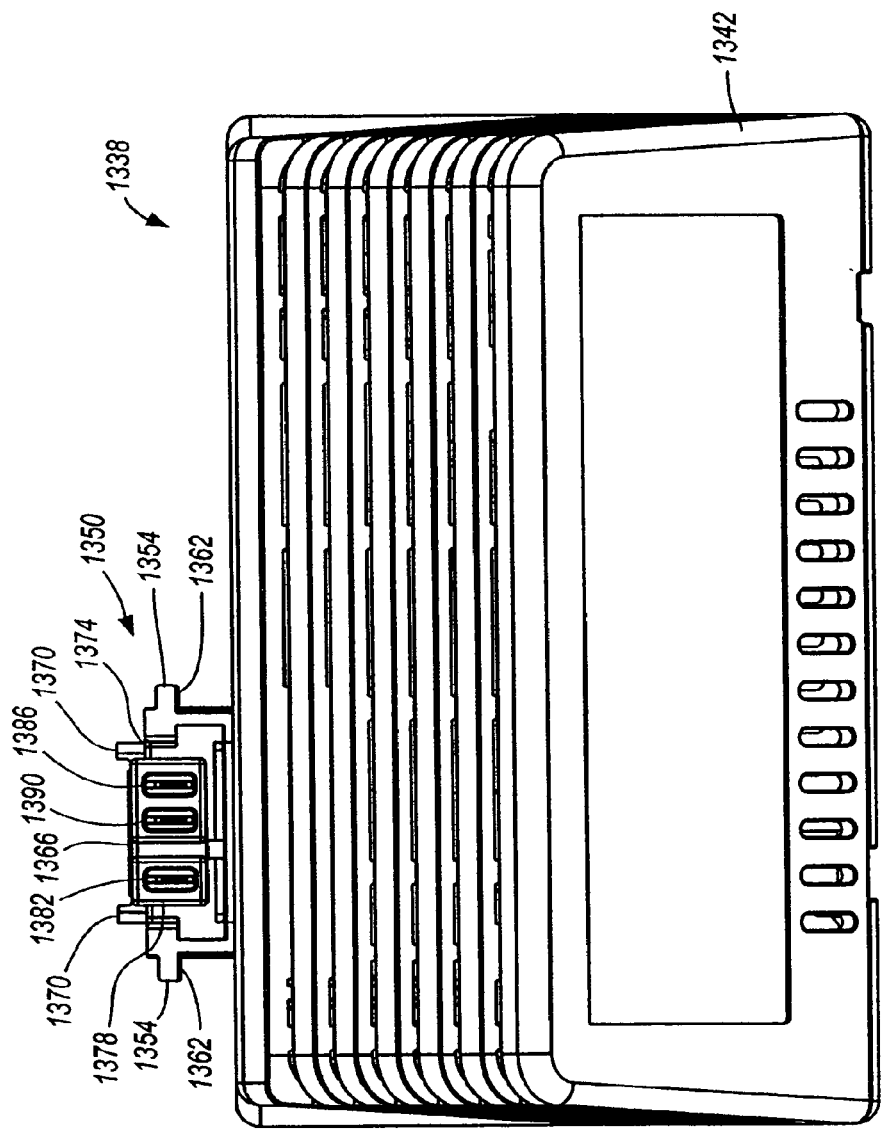
FIG. 62 is a perspective view of a prior art battery charger.
Figure 63:
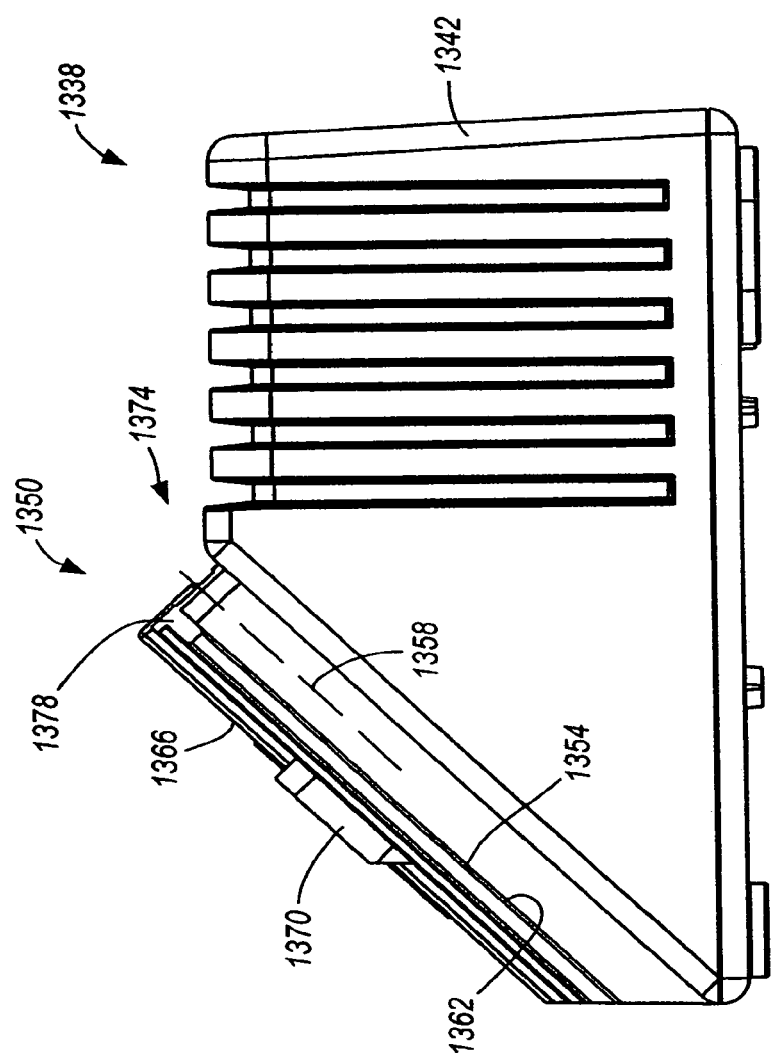
FIG. 63 is a side view of the battery charger shown in FIG. 62.
Figure 64:
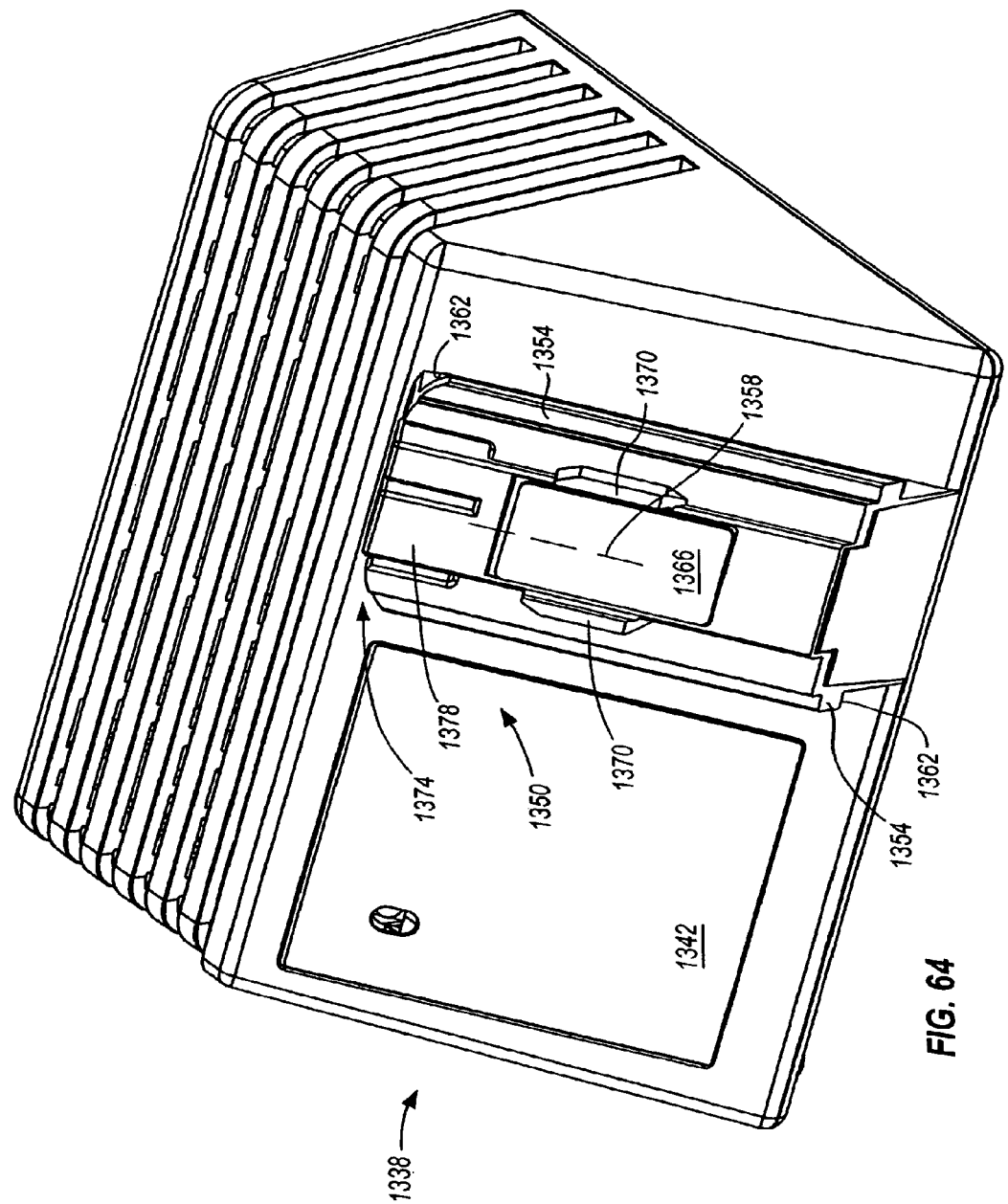
FIG. 64 is another view of the battery charger shown in FIG. 62.

As shown in FIGS. 62-64, the housing 1342 can provide a battery support portion 1350 for supporting the battery 1230. The support portion 1350 can have (see FIG. 62) a generally T-shaped cross section which may be complementary to the C-shaped cross section of the support portion 1250 of the battery 1230 (shown in FIG. 60). The support portion 1350 can include (see FIGS. 62-64) rails 1354 which extend along a support axis 1358 and which define grooves 1362. The support portion 1350 can include a surface 1366 which can be engageable with the ridge 1266.

Projections or ribs 1370 can extend from the surface 1366. The ribs 1370 can extend farther from the surface 1366 than (see FIGS. 43-44) the ribs 1150 extend from the surface 1146 of the battery charger 1038. When the battery 1230 is supported on the support portion 1350, the ribs 1370 can slide along (see FIG. 59) the lateral edges of the ridge 1266 so that the battery 1230 is connectable to the battery charger 1338. The ridge 1266 of the battery 1230 may be more narrow in a lateral direction than (see FIG. 36) the ridge 1066 of the battery 1030 and may not include the extended portions 1072.

Figure 65:
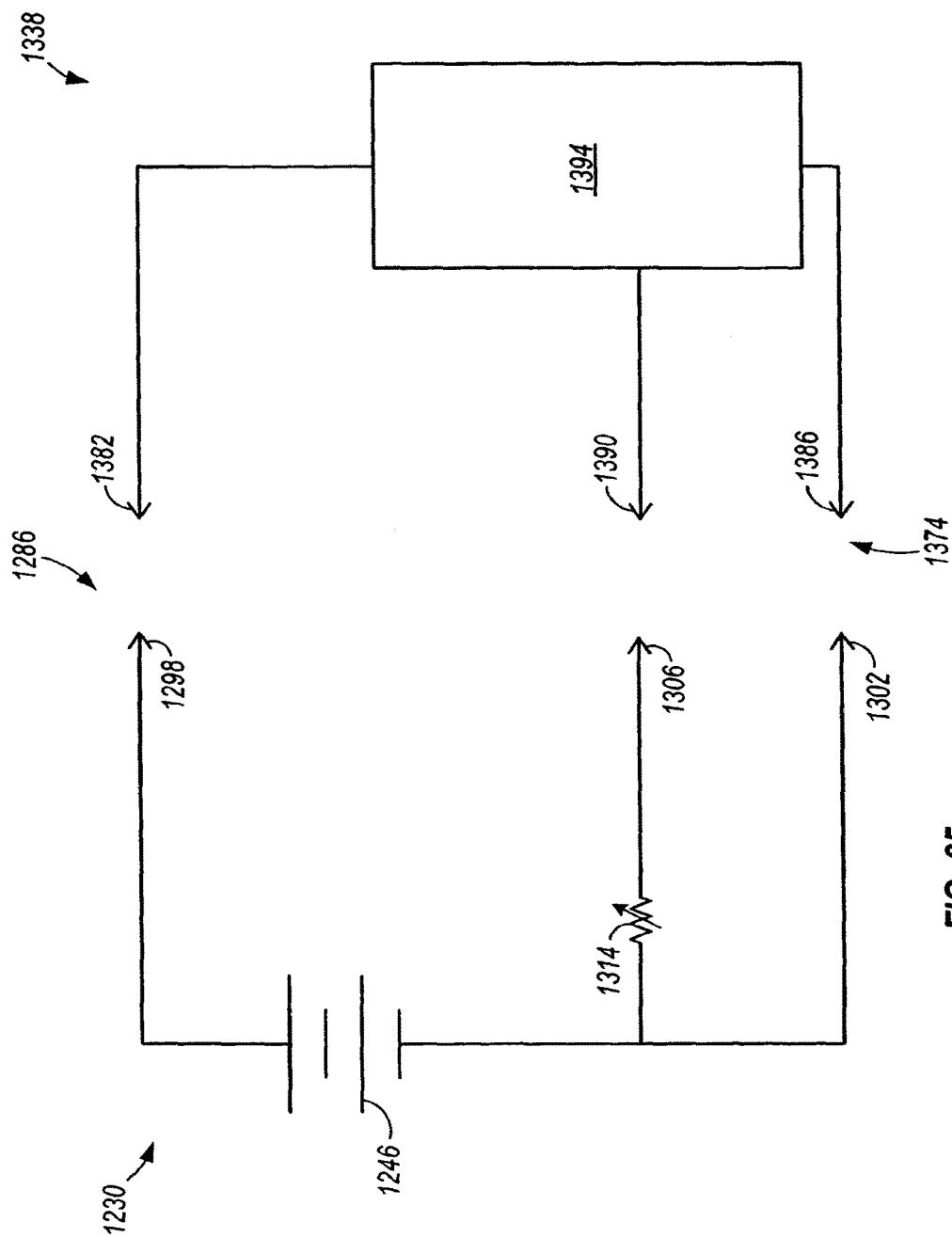
FIG. 65 is a schematic diagram of the prior art battery shown in FIG. 57 and the prior art battery charger shown in FIG. 62.

As shown in FIGS. 62-65, the battery charger 1338 can include a terminal assembly 1374 operable to electrically connect the charging circuit 1346 to the terminal assembly 1286 of the battery 1230. The terminal assembly 1374 can include (see FIGS. 62-64) a terminal housing 1378 provided by the support portion 1350. The terminal assembly 1374 also can include a positive terminal 1382, a negative terminal 1386 and a sense terminal 1390. As schematically illustrated in FIG. 65, the charger terminals, 1382, 1386 and 1390 can be connectable to the battery terminals 1298, 1302 and 1306, respectively.

The charging circuit 1346 can include a microcontroller 1394 for controlling charging of the battery 1230. The controller 1394 can determine the temperature of the battery 1230 by sensing the condition of the electrical component 1314 or thermistor. Based upon the determinations made by the controller 1394, the controller 1394 can control the charging circuit 1346 to properly charge the battery 1230.

In an exemplary implementation, if a user attempts to connect the battery 1030 to the battery charger 1338, a portion of the battery charger 1338, such as the upwardly-extended ribs 1370 (shown in FIG. 62), may prevent the battery 1030 from being connected to the battery charger 1338. As the battery 1030 is positioned on the support portion 1350, the ribs 1370 engage the laterally-wider extended portions 1072 of the ridge 1066 of the support portion 1050 of the battery 1030 (shown in FIG. 36) to prevent the battery 1030 from being fully connected to the battery charger 1338. The ribs 1370 are positioned on the support portion 1350 so that the terminal assembly 1086 of the battery 1030 is not connectable to the terminal assembly 1374 of the charger 1338.

In some aspects, the invention provides a battery, such as the battery 1030 or 1030A, and/or a battery charger, such as the battery charger 1038, having additional communication or sense path(s). In some aspects, the invention provides a charger, such as the charger 1038, which is capable of charging battery packs having additional communication or sense path(s), such as the battery 1030 or 1030A, and batteries not having the additional communication or sense path(s), such as the battery 1230. In some aspects, the invention provides a "mechanical lockout" to prevent a battery, such as the battery 1030 or 1030A, from being connected to a charger, such as an existing charger 1338, while the battery, such as the battery 1030 or 1030A, may be used with a corresponding existing electrical device, such as the power tool 1034.

Figure 69:
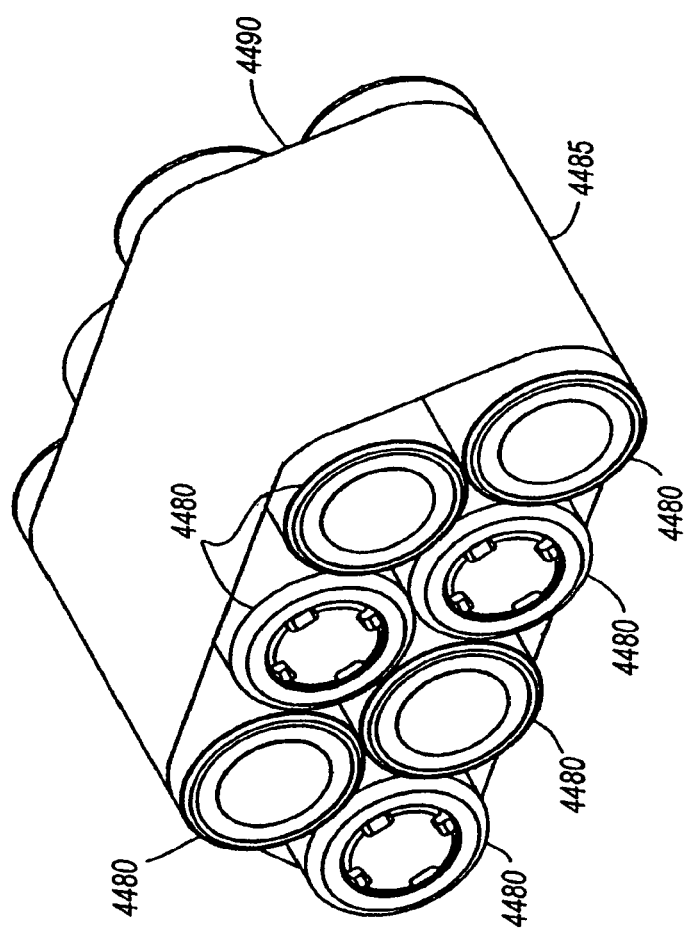
FIG. 69 is a perspective view of a portion of a battery, such as one of the batteries shown in FIGS. 1-3.

As shown in FIG. 69, the battery 50 can also include serviceable battery cells 4480. If a malfunction occurs with one or more cells 4480 included in the battery 50, the serviceable cells 4480 can be replaced as a group or package 4485. As shown in FIG. 69, the cells 4480 can be grouped together and wrapped with a plastic covering 4490. The package 4485 can be inserted into the housing 65 of the battery 50, a portion of which is shown in FIG. 70.

Figure 70:
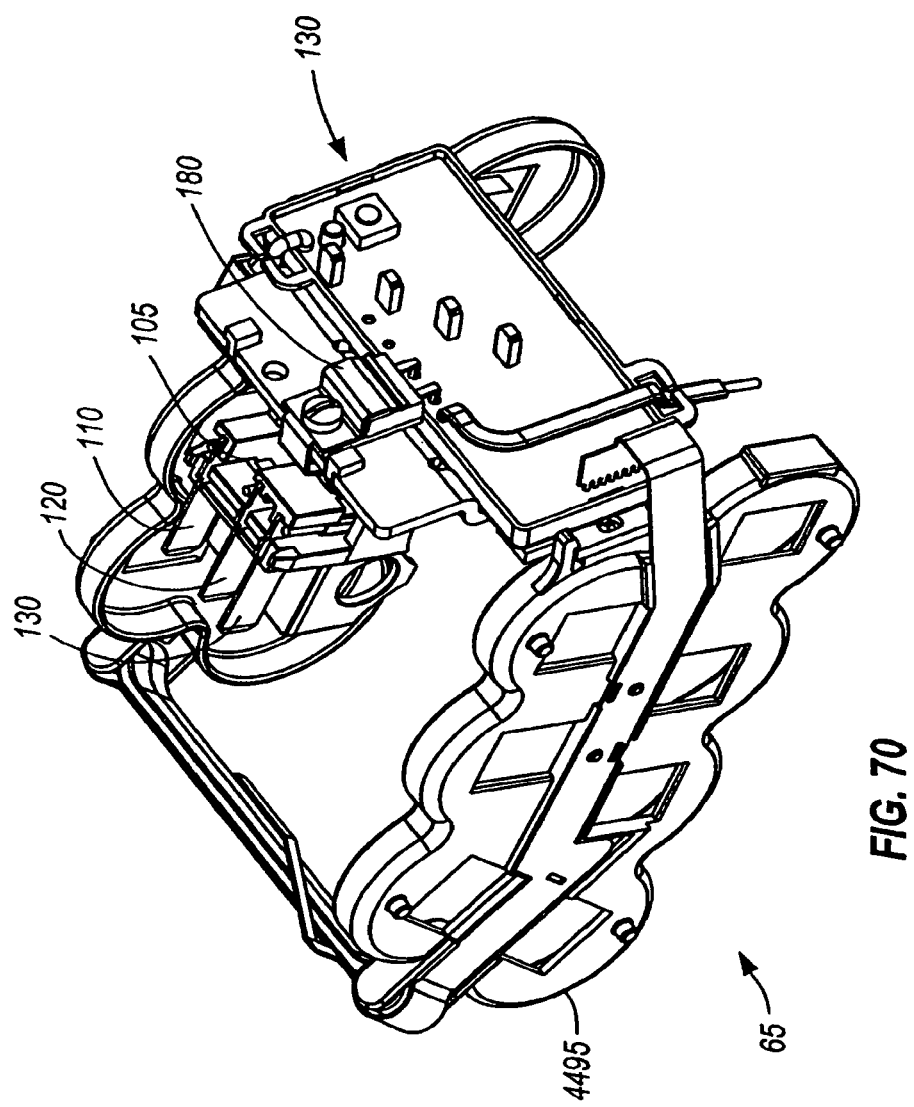
FIG. 70 is a perspective view of another portion of a battery, such as one of the batteries shown in FIGS. 1-3.
Figure 71:
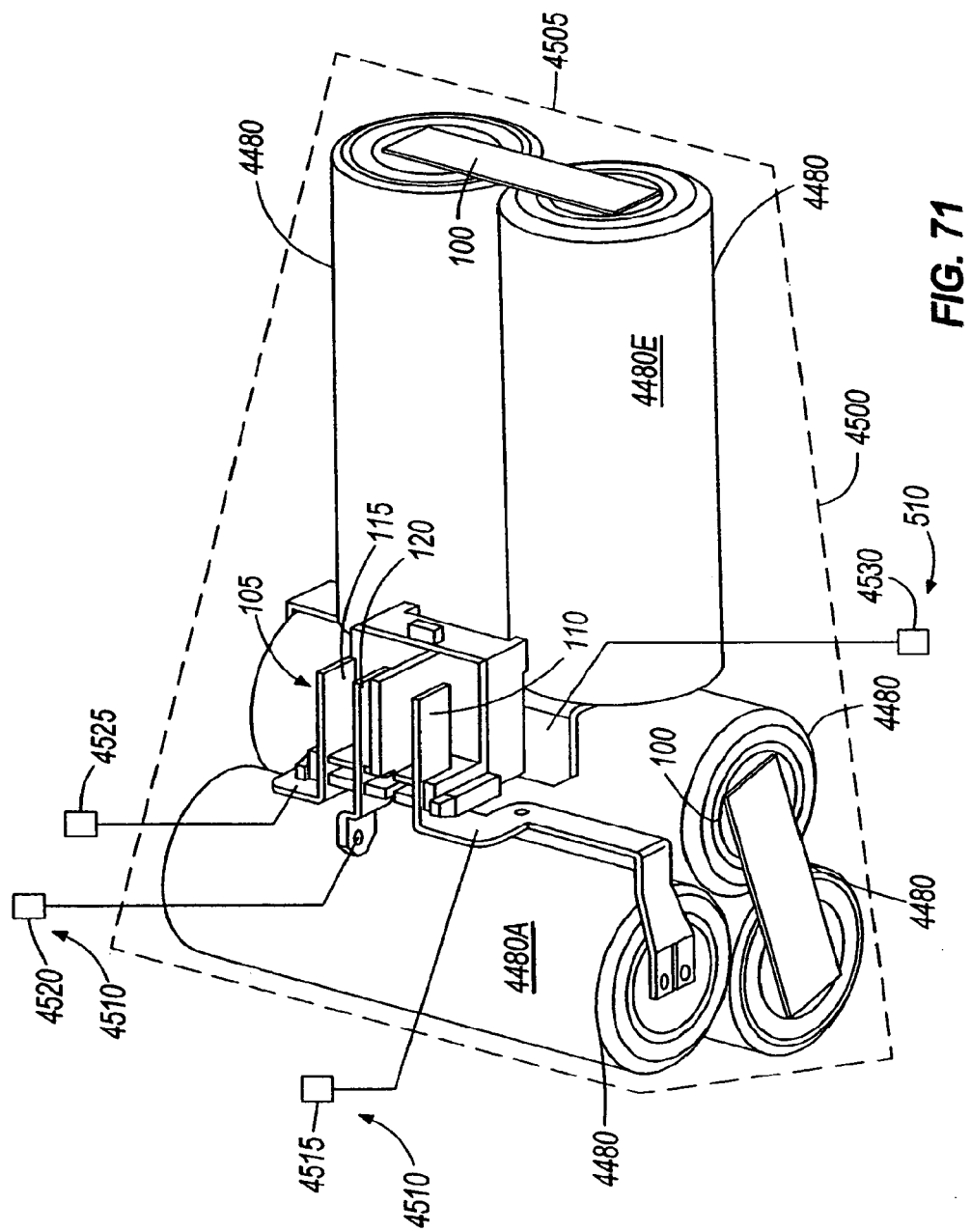
FIG. 71 is a perspective view of a further portion of a battery, such as one of the batteries shown in FIGS. 1-3.

Referring to FIGS. 69-71, the package 4485 is positioned within the endcaps 4495 of the housing 65. The proper electrical leads (not shown) are connected between the positive terminal 110, the negative terminal 115 and the circuit 130 (e.g., the switch 180, the microcontroller 140 and the like) and the cells 4480.

In another construction (shown in FIG. 71), the serviceable cells 4420 are grouped together with the terminal block 105 (and the positive terminal 110, the negative terminal 115, and the sense terminal 120) into a single package 4500. As shown in FIG. 71, the cells 4480 are connected together with the conductive straps or links 100. The first cell 4480a is also connected to the positive terminal 120.

The cells 4480 are wrapped in a plastic covering or suitable insulating housing 4505. The housing 4505 (shown schematically) exposes the terminal block 105. The package 4500 also includes several electrical connectors 4510 to establish the electrical connections between the circuit 130 (not shown in FIG. 70), such as, for example, the microcontroller 140 and the semiconducting switch 180, and the cells 4480 and terminal block 105. In one construction, the package 4500 includes a first connector 4515 connecting the positive terminal 110 to the positive input of the microcontroller 140 and a second connector 4520 connecting the sense terminal 120 to the sense input of the microcontroller 140. In this construction, the package 4500 also includes a third connector 4525 connecting the negative terminal 115 with the drain 195 of the semiconducting switch 180 and a fourth connector 4530 connecting the source 190 of the semiconducting switch 180 with the negative end 95 of the last battery cell 4480e.

In this construction, the package 4500 provides and establishes the power connections between the cells 4480 and the terminal block 105. The package 4500 is positioned within the housing 65, which includes the circuit 130 (e.g., the semiconducting switch 180, the microcontroller 140, and the like).

Figure 72:
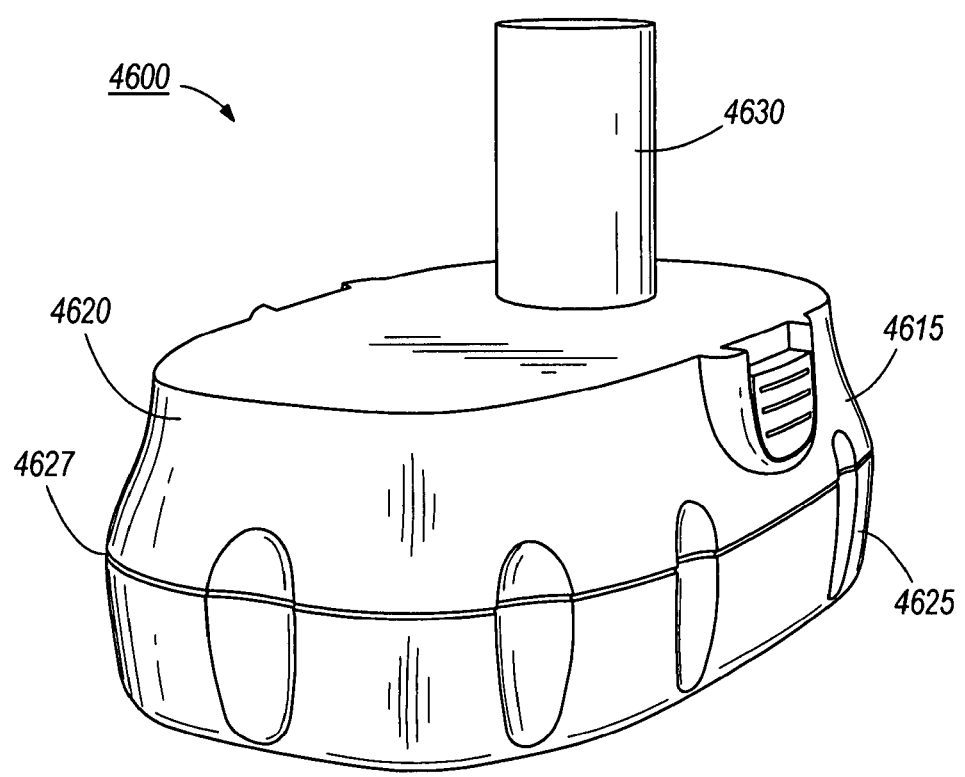
FIG. 72 is a perspective view of another battery.
Figure 73:
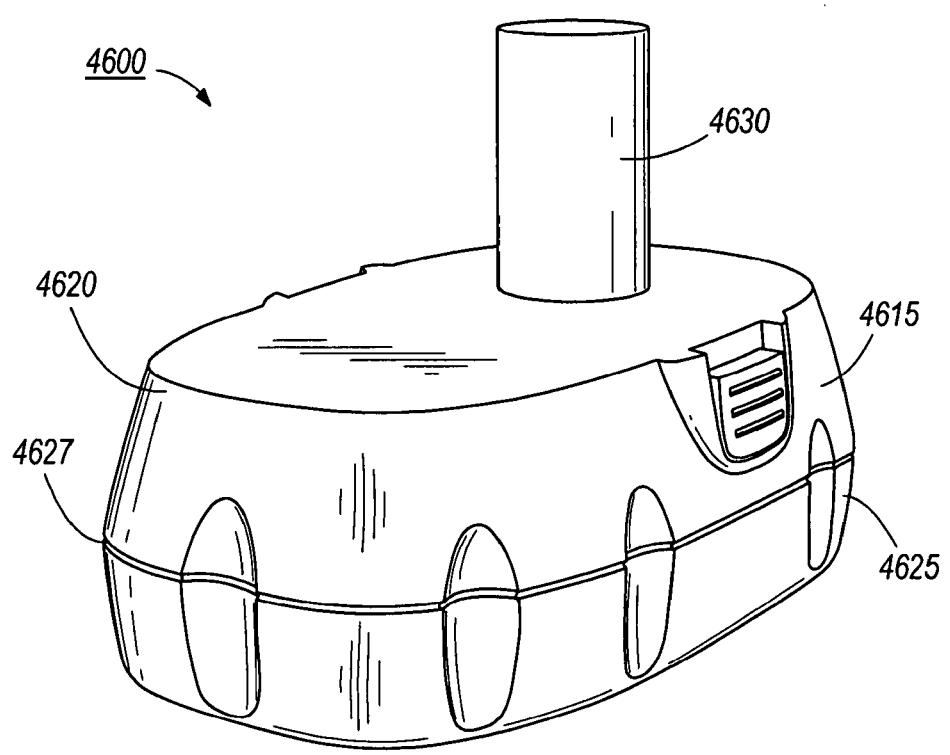
FIG. 73 is a perspective view of still another battery.
Figure 74:
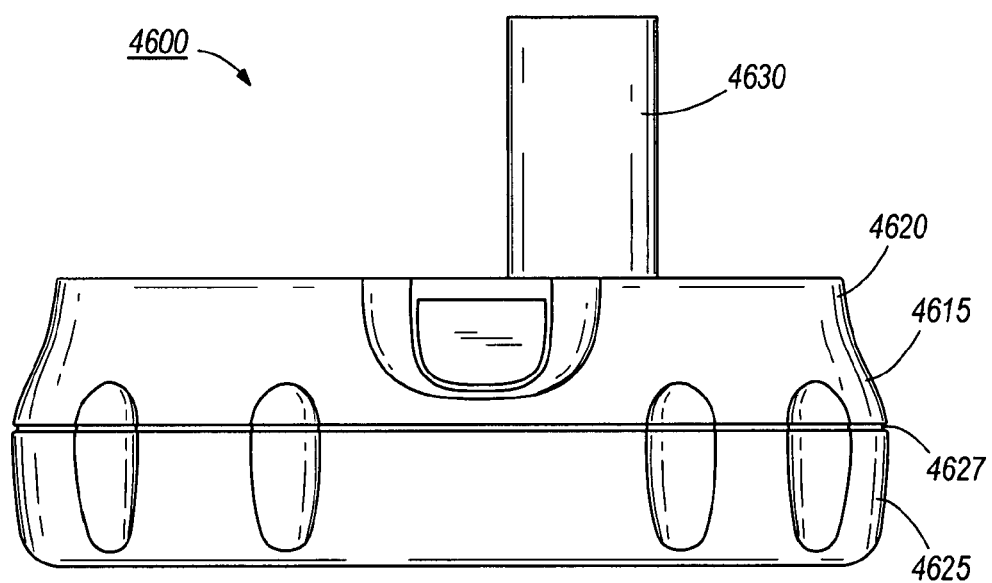
FIG. 74 is a side view of a battery, such as the battery shown in FIG. 73.
Figure 75:
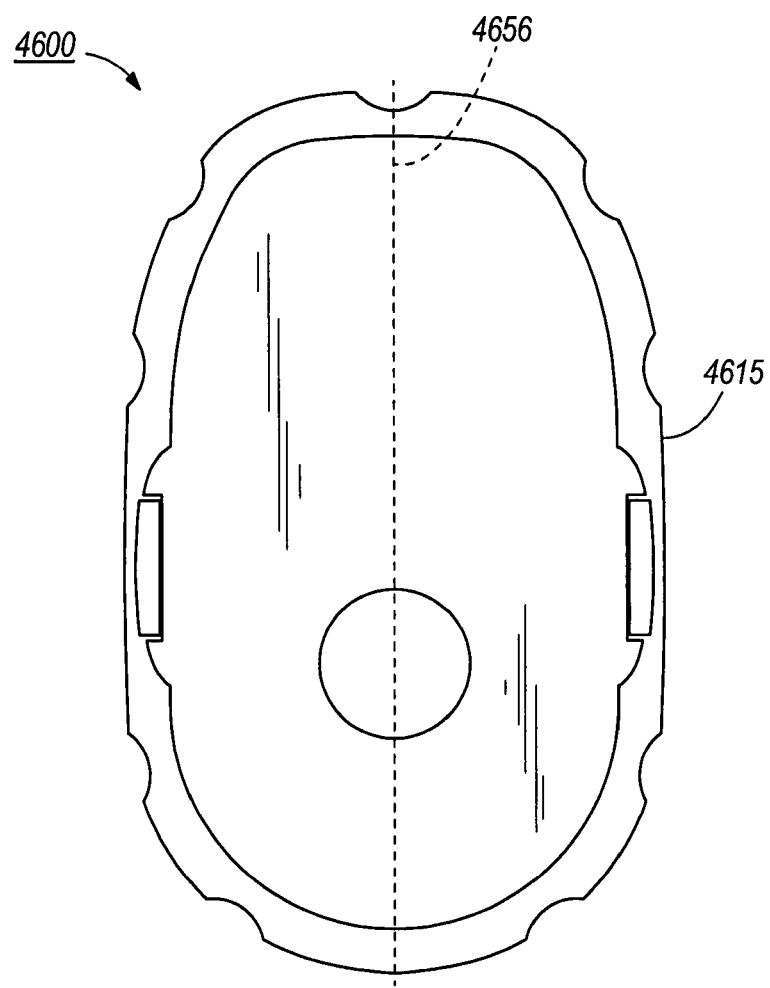
FIG. 75 is a top view of a footprint of a battery, such as the battery shown in FIGS. 72 and 73.

In some construction and in some aspects, the battery 50 can be a "slide-on" battery pack, such as the battery 50 illustrated in FIGS. 1-3. In other constructions, the battery 50 can be a "tower-style" battery pack, such as the tower battery 4600 illustrated in FIG. 72. In these constructions, the tower battery 4600 can include the circuit 130 which in turn can include components to enhance the performance of the tower battery 4600. In other constructions, the battery 4600 may only include portions of the circuit 130 or a portion of the components included in the circuit 130 to enhance the performance of the battery 4600.

As shown in FIGS. 72-76, the tower battery 4600 includes a housing 4615. In some constructions, the housing 4615 can include an upper housing portion 4620 and a lower housing portion 4625. In these constructions, the upper housing portion 4620 is separated from the lower housing portion 4625 by a parting line 4627. As shown in the illustrated constructions, the tower battery 4600 includes a "tower" 4630 or a portion extending from the housing 4615 which mates with an electrical device, such as, for example, a battery charger, various power tools, and the like. The tower 4630 includes the terminal supports (not shown) for the terminal block or assembly (not shown).

The tower battery 4600 also includes one or more battery cells 4650 each having a chemistry and a nominal voltage. Similar to battery 50 and the battery cells 80, the tower battery 4600 can have a battery chemistry of Li-ion, a nominal voltage of approximately 18 V or approximately 21 V (depending on the type of battery cell, for example), and can include five battery cells 4650a, 4650b, 4650c, 4650d and 4650e. In other constructions (not shown), the tower battery 4600 can have a battery chemistry of Li-ion, a nominal voltage of approximately 24 V, approximately 25 V or approximately 28 V (depending on the type of battery cell, for example) and can include seven battery cells. In further constructions, the tower battery 4600 can have more or fewer battery cells 4650 than shown and described. In an exemplary construction, each battery cell 4650 has a chemistry of Li-ion, and each battery cell 4650 has substantially the same nominal voltage, such as, for example, approximately 3.6 V, approximately 4 V or approximately 4.2 V.

As shown in FIGS. 76-84, the battery cells 4650 are generally cylindrical and can have a cell length 4652 which is more than two times and almost three times the cell diameter 4654. In the illustrated construction and in some aspects, each battery cell 4650 can have a diameter 4654 of about twenty-six millimeters (26 mm) and a length 4652 of at least about sixty millimeters (60 mm). In some constructions, each battery cell 4650 can have a length 4652 of about sixty-five millimeters (65 mm). In some constructions, each battery cell 4650 can have a length 4652 of about seventy millimeters (70 mm).

Figure 76:
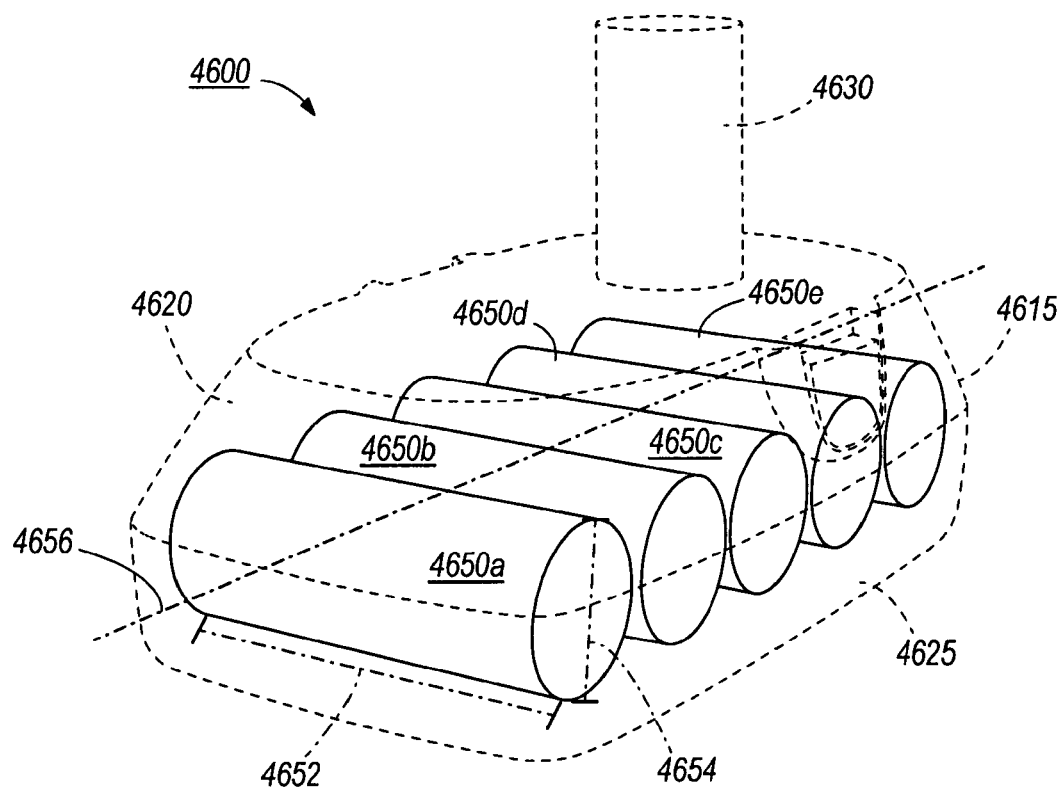
FIG. 76 is a perspective view of a battery, shown in phantom, and illustrating a battery cell arrangement.
Figure 77:
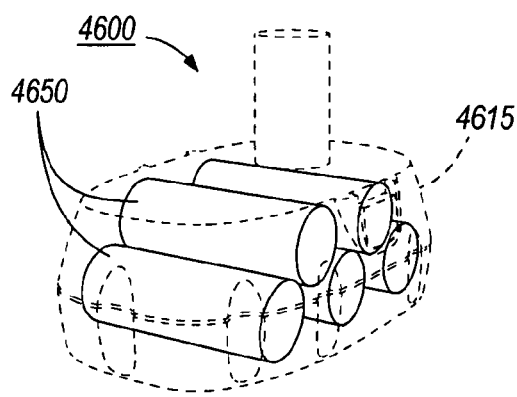
FIG. 77 is a perspective view of another battery, shown in phantom, and illustrating a battery cell arrangement.
Figure 78:
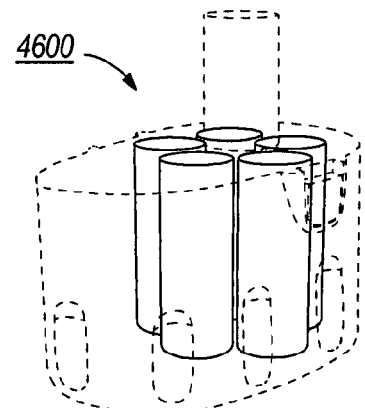
FIG. 78 is a perspective view of a further battery, shown in phantom, and illustrating a battery cell arrangement.
Figure 79:
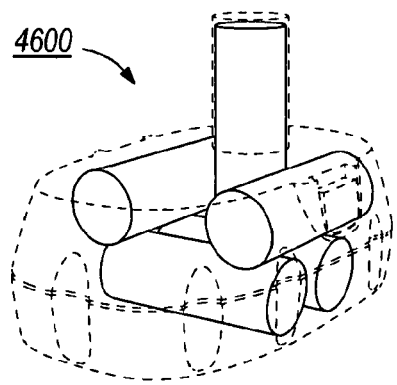
FIG. 79 is a perspective view of still a further battery, shown in phantom, and illustrating a battery cell arrangement.
Figure 80:
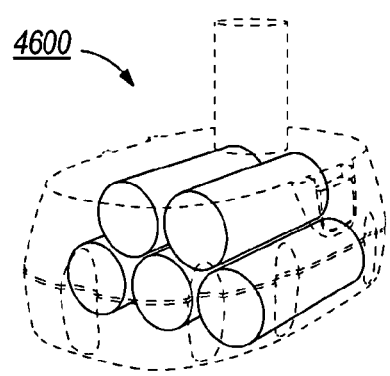
FIG. 80 is a perspective view of still a further battery, shown in phantom, and illustrating a battery cell arrangement.
Figure 81:
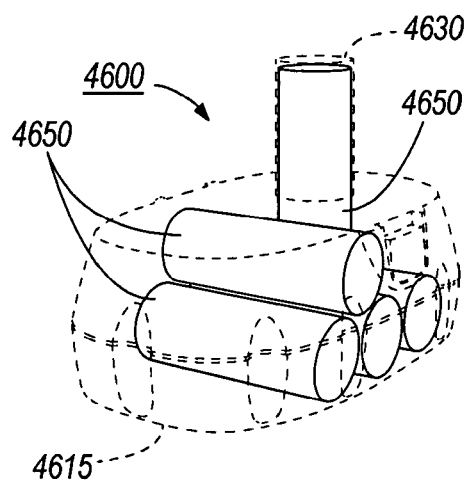
FIG. 81 is a perspective view of still a further battery, shown in phantom, and illustrating a battery cell arrangement.
Figure 82:
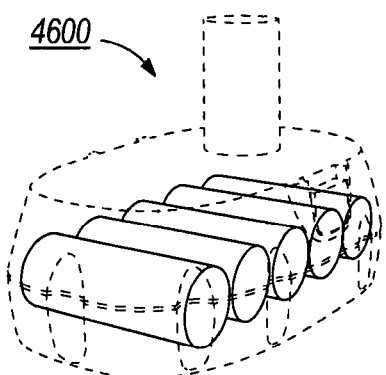
FIG. 82 is a perspective view of still a further battery, shown in phantom, and illustrating a battery cell arrangement.
Figure 83:
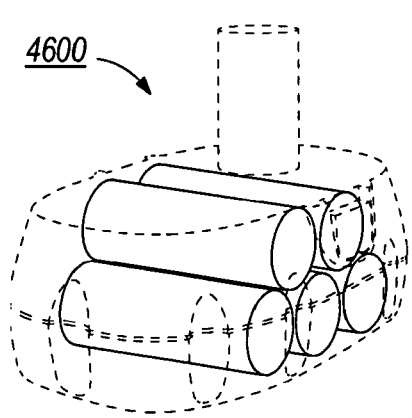
FIG. 83 is a perspective view of still a further battery, shown in phantom, and illustrating a battery cell arrangement.
Figure 84:
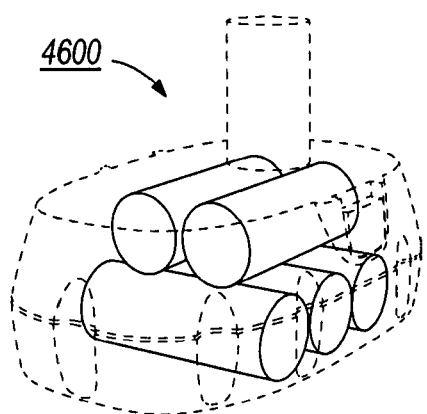
FIG. 84 is a perspective view of still a further battery, shown in phantom, and illustrating a battery cell arrangement.

The battery cells 4650 illustrated in FIGS. 76-84 are longer than the present NiCd and NiMH battery cells (not shown). The battery cells 4650 have to be arranged in a different manner than the traditional NiCd and NiMH cells. One example of the arrangement for the battery cells 4650 in the tower battery 4600 is shown in FIG. 76. The battery cells 4650 are arranged such that the cell length 4652 of each cell is perpendicular to the battery length (shown as the axis 4656).

Other constructions or examples of battery cell arrangements are illustrated in FIGS. 77-84.

Figure 85:
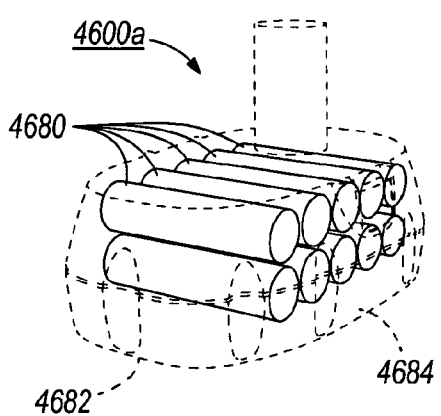
FIG. 85 is a perspective view of still a further battery, shown in phantom, and illustrating a battery cell arrangement.
Figure 86:
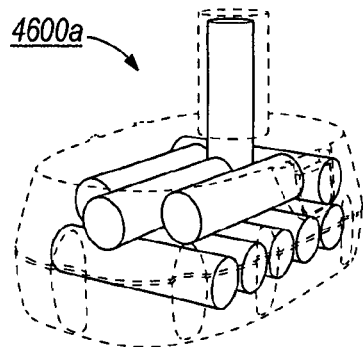
FIG. 86 is a perspective view of still a further battery, shown in phantom, and illustrating a battery cell arrangement.
Figure 87:
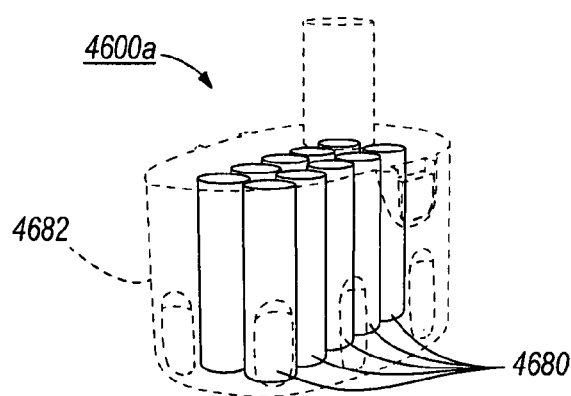
FIG. 87 is a perspective view of still a further battery, shown in phantom, and illustrating a battery cell arrangement.

As shown in FIGS. 85-87, the tower battery 4600a can also include one or more battery cells 4680 which have a different nominal voltage then the battery cells 4650. In the illustration constructions, the battery cells 4680 each have a nominal voltage of approximately 2.2 V or approximately 2.4 V. In the illustrated constructions of FIGS. 85-87, the tower battery 4600a has a approximately the same nominal voltage as the tower battery 4600 illustrated in FIGS. 76-84, but includes ten (10) battery cells 4680.

As shown in FIGS. 85-87, the battery cells 4680 also have different dimensions then the battery cells 4650 illustrated in FIGS. 76-84. The battery cells 4680 shown in FIGS. 85-87 have a cell length 4682 of which is more than three times the cell diameter 4684. In the illustrated constructions, each battery cell 4680 can have a diameter 4684 of about 18.6 millimeters (18.6 mm) and a length 4682 of at least about sixty millimeters (60 mm). In some constructions, each battery cell 4680 can have a length of about sixty-five millimeters (65 mm). In some constructions, each battery cell 4680 can have a length 4682 of about seventy millimeters (70 mm). FIGS. 85-87 also illustrated different constructions or examples of arrangements of the battery cells 4680 for the tower battery 4600*a*.

FIGS. 91-102 show a battery pack 7010 similar to the battery pack 50 shown in FIGS. 2 and 3. The battery pack 7010 includes a housing 7012 having an upper housing portion or cover 7014 and side housing halves 7016, 7018. Together, the cover 7014 and the housing halves 7016, 7018 define an interior space 7020 and substantially enclose one or more battery cells 7024 and the circuit 130. In the illustrated construction, the battery cell 7024 is similar to the battery cells 80 shown and described above. In other constructions, the housing 7012 can have other shapes and configurations. For example, in some constructions and in some aspects, the housing 7012 may be similar to components shown and described in U.S. Design patent application Ser. No. 29/205,933, filed May 21, 2004, the entire contents of which is hereby incorporated by reference.

In the illustrated construction of FIGS. 91-102 and in some aspects, the battery pack 7010 is a 28V battery pack including seven approximately 4.0V rechargeable battery cells 7024 connected in series. In other constructions and in other aspects, the battery pack 7010 may have another nominal voltage, such as, for example, 9.6V, 12V, 18V, 24V, 40V, etc.

The battery cells 7024 may have any battery chemistry such as, for example, lead-acid, Nickel-Cadmium ("NiCd"), Nickel-Metal Hydride ("NiMH"), Lithium ("Li"), Lithium-ion ("Li-ion), Lithium Cobalt ("Li—Co"), Lithium Manganese "(Li—Mn") Spinel, or another Lithium-based chemistry of another rechargeable or non-rechargeable battery chemistry.

In the illustrated construction and in some aspects, the cover 7014 includes a generally horizontal upper surface 7028, an outwardly and downwardly sloping front surface 7030 and a terminal support 7032 positioned between the upper surface 7028 and the front surface 7030. Tracks 7034 extend horizontally along the upper surface 7030 between the terminal support 7032 and a rearward end 7036 of the upper surface 7028 and are engageable in complementary shaped recesses in electrical devices (e.g., a cordless power tool or a battery charger) to at least partially mechanically connect the battery pack 7010 and the electrical device.

In some constructions and in some aspects, the battery pack 7010 includes at least one lockout 7040 which prevents mechanical engagement between the battery pack 7010 and at least some electrical devices (e.g., battery chargers or power tools having a different voltage rating or power capacity than the battery pack 7010). In the illustrated construction of FIGS. 91-102 and in some aspects, the lockout 7040 includes protrusions 7042, which extend outwardly from one or more of the tracks 7034. To connect the battery pack 7010 to an acceptable electrical device, an operator engages the tracks 7034 and the protrusions 7042 of the battery pack 7010 in complementary recesses on the electrical devices. The protrusions 7042 prevent the operator from mechanically connecting the battery pack 7010 to electrical devices (e.g., battery chargers or power tools having a different voltage rating or power capacity than the battery pack 7010) not having complementary structure.

In some constructions and in some aspects, the battery pack 7010 includes a second lockout 7044 which prevents mechanical engagement between the battery pack 7010 and at least some electrical devices (e.g., battery chargers or power tools having a different voltage rating or power capacity than the battery pack 7010). In constructions of the battery pack 7010 having first and second lockout devices 7040, 7044, the first lockout 7042 can prevent mechanical engagement between the battery pack 7010 and some electrical devices and the second lockout 7044 can prevent mechanical engagement between the battery pack 7010 and other electrical devices.

In the illustrated construction of FIGS. 91-102 and in some aspects, the second lockout 7044 includes a protrusion 7045, which extends upwardly from the tracks 7034 adjacent to the terminal support 7032. To connect the battery pack 7010 to an acceptable electrical device, the tracks 7034 and the protrusions 7045 engage complementary recesses on the electrical device to mechanically secure the battery pack 7010 to the electrical device. The protrusion 7045 prevents an operator from mechanically connecting the battery pack 7010 to electrical devices (e.g., battery chargers or power tools having a different voltage rating or power capacity than the battery pack 7010) not having complementary structure.

Figure 99:
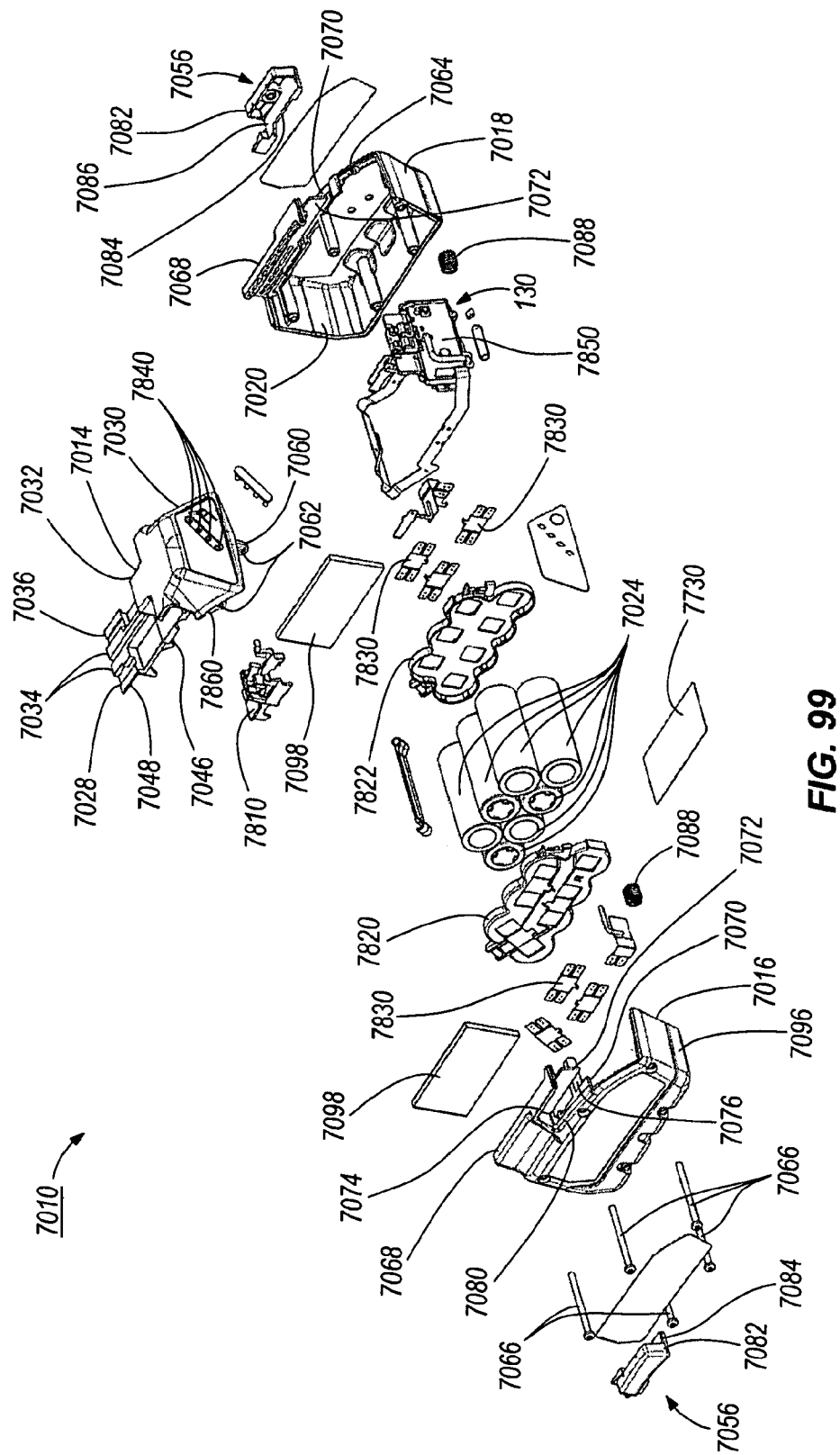
FIG. 99 is an exploded perspective view of the battery pack of FIG. 91.
Figure 100:
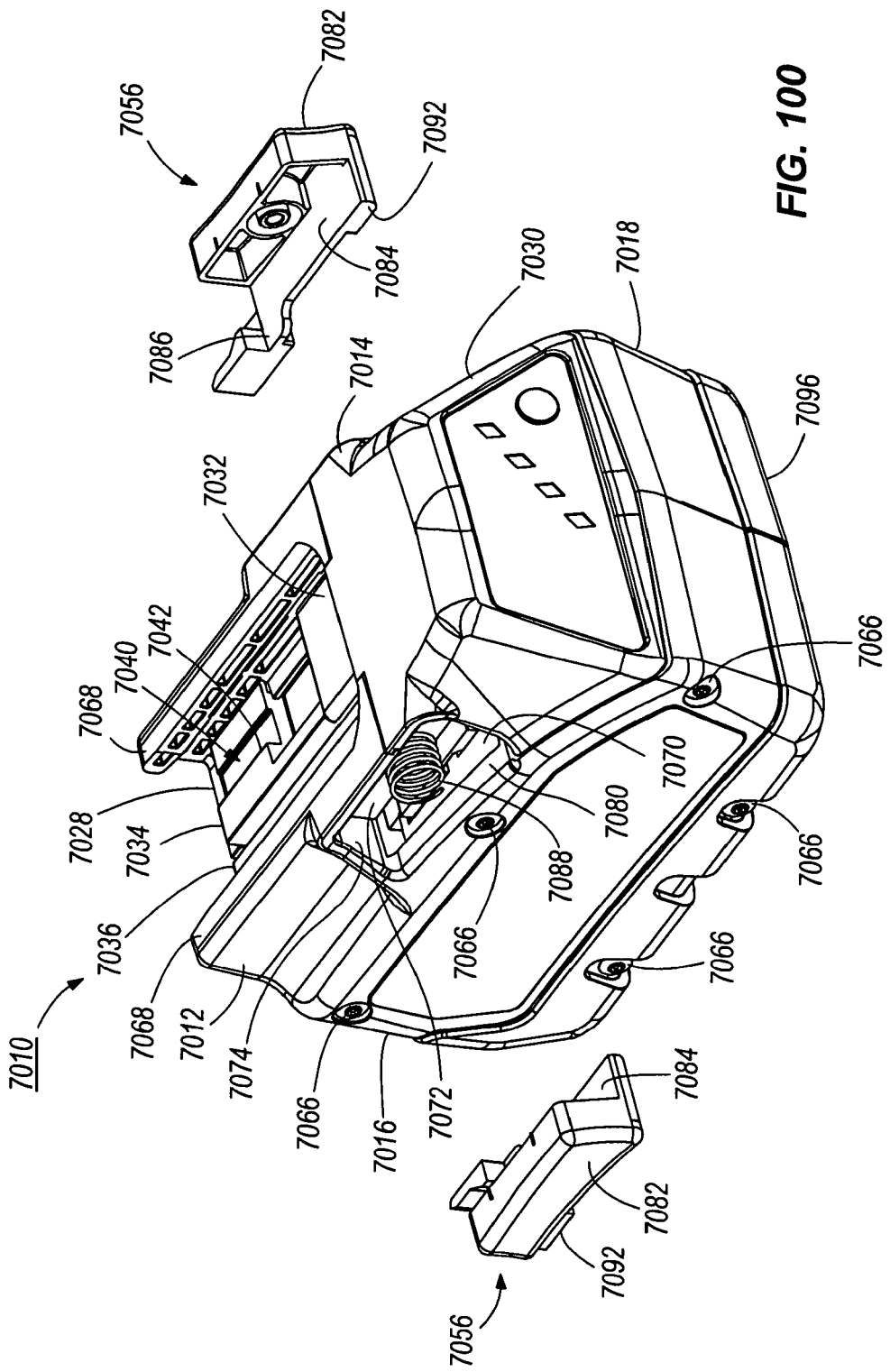
FIG. 100 is a partially exploded perspective view of the battery pack of FIG. 91.
Figure 102:
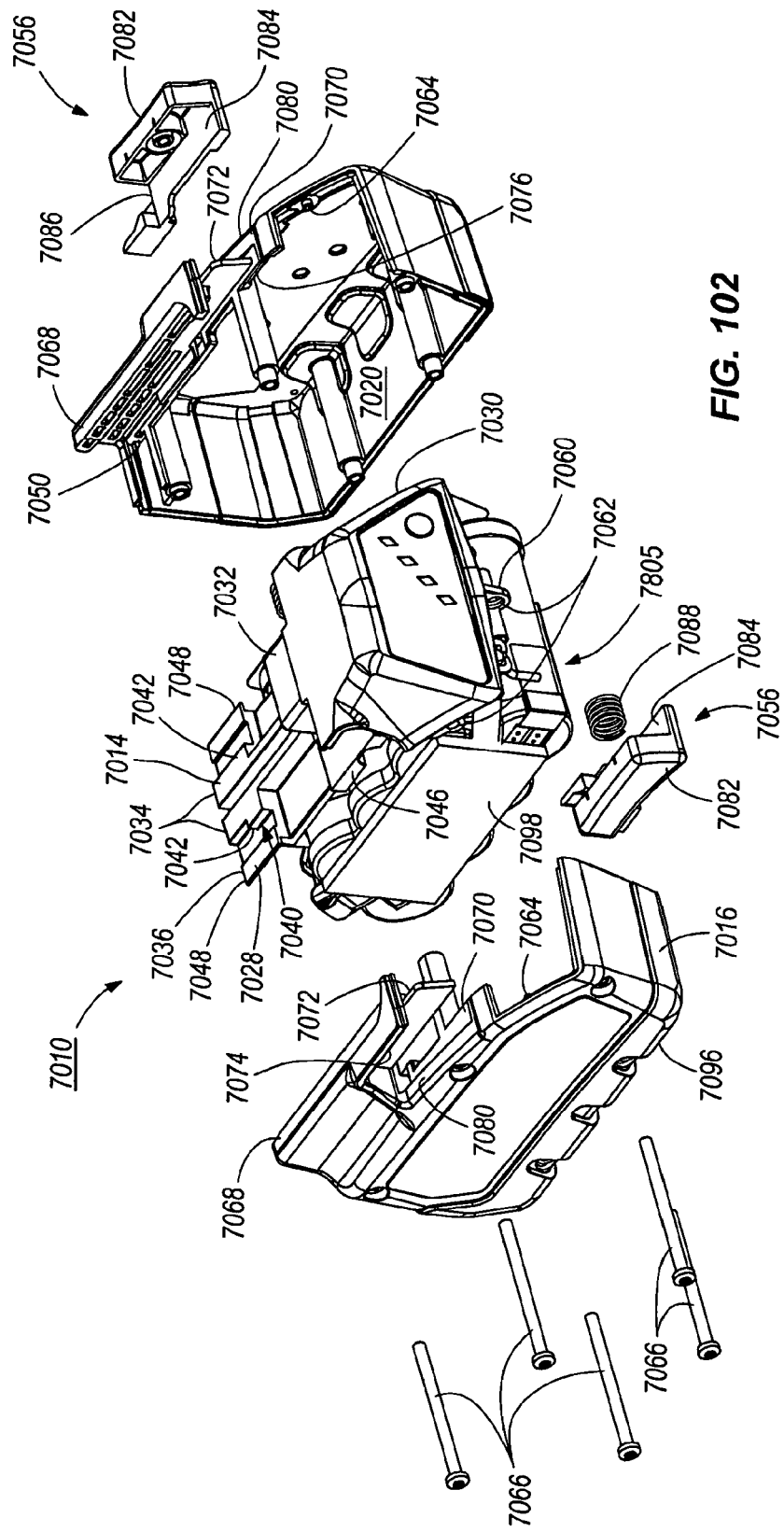
FIG. 102 is yet another partially exploded perspective view of the battery pack of FIG. 91.

As shown in FIGS. 99 and 102, forward and rearward tabs 7046, 7048 extend laterally outwardly from opposite sides of the cover 7014 and are engageable in corresponding recesses 7050 defined in the housing halves 7016, 7018 to secure the cover 7014 between the housing halves 7016, 7018. As explained in greater detail below, in some constructions and in some aspects, the forward tabs 7046 can also or alternately limit movement of latches 7056 with respect to the cover 7014.

Connecting tabs 7060 extend downwardly from the upper and front surfaces 7028, 7030 of the cover 7014 and define recesses 7062. As explained in greater detail below, protrusions 7064 extend outwardly from the housings halves 7016, 7018 and are engageable in the recesses 7062 to secure the cover 7014 between the housing halves 7016, 7018. In the illustrated construction of FIGS. 91-102 and in some aspects, fasteners 7066 extend between the housing halves 7016, 7018 and secure the housing halves 7016, 7018 together.

In the illustrated construction of FIGS. 91-102 and in some aspects, connecting rails 7068 extend upwardly from the housing halves 7016, 7018 on opposite sides of the cover 7014. As explained in greater detail below, the connecting rails 7068 or portions of the connecting rails 7068 are engageable in complementary shaped recesses in electrical devices to mechanically connect the battery pack 7010 to the electrical devices.

In the illustrated construction of FIGS. 91-102 and in some aspects, each of the housing halves 7016, 7018 includes a horizontally extending flange 7070 and a vertically extending flange 7072. Together, the horizontal and vertical flanges 7070, 7072 at least partially define latch recesses 7074 on opposite sides of the battery pack 7010. As shown in FIGS. 99 and 102, slots 7076 separate the horizontal and vertical flanges 7070, 7072 and communicate with the interior space 7020. Guides 7080 extend upwardly from outer edges of the horizontal flanges 7070 and, as explained in greater detail below, limit movement of the latches 7056 with respect to the housing halves 7016, 7018.

As shown in FIGS. 91-102, the latches 7056 include buttons 7082, which extend outwardly through the latch recesses 7074 defined in the housing halves 7016, 7018. In the illustrated construction and in some aspects, the latches 7056 also include laterally extending flanges 7084 and outwardly extending tabs 7086, which extend outwardly and rearwardly from the flanges 7084. The laterally extending flanges 7084 are supported on the horizontal flanges 7070 of the housing halves 7016, 7018 and extend inwardly through the slots 7076 between the horizontal and vertical flanges 7070, 7072 of the housing halves 7016, 7018.

In some constructions and in some aspects, springs 7088 are supported between interior sides of the buttons 7082 and the vertically extending flanges 7072 of the housing halves 7016, 7018. In these constructions and in these aspects, the springs 7088 bias the buttons 7082 outwardly. In addition and as described in greater detail below, the springs 7088 bias the latches 7056 toward locking positions.

Ribs 7092 extend downwardly from the laterally extending flanges 7084 and are engageable with the guides 7080 of the housing halves 7016, 7018 to limit outward movement of the latches 7056 with respect to the housing halves 7016, 7018. The ribs 7092 are also engageable with the forward tabs 7046 on the upper surface 7028 of the cover 7014 to limit lateral movement of the latches 7056 in a direction generally parallel to the outer surface of the buttons 7082.

Locking elements 7094 extend upwardly from the tabs 7086 and are positioned adjacent to the tracks 7034 for engagement in complementary shaped recesses in electrical devices. More specifically, when an operator presses the buttons 7082, the latches 7056 and the locking elements 7094 are moved inwardly toward an unlocking position, in which the locking elements 7094 are not engageable with the electrical devices. When the operator releases the buttons 7082, the springs 7088 move the latches 7056 and the locking elements 7094 outwardly toward a locking position, in which the locking elements 7094 are lockingly engageable in recesses in the electrical devices to mechanically secure the battery pack 7010 to the electrical device.

In other constructions and in other aspects, other movements of the latches 7056, including pivoting movements, vertical sliding movements, etc., can move the latches 7056 between locking and unlocking positions. In the illustrated construction and in some aspects, the battery pack 7010 can include two latches 7056. In other constructions and in other aspects, the battery pack 7010 can include a single latch 7056. In still other constructions and in other aspects, the battery pack 10 can include three or more latches 7056.

In some constructions and in some aspects, the battery pack 7010 also includes a shoe 7096. In the illustrated construction of FIGS. 91-102 and in some aspects, portions of the shoe 7096 are molded with the first and second housing halves 7016, 7018. In these constructions and in these aspects, the shoe 7096 is formed of a resilient material, such as, for example, rubber, plastic, etc., which can absorb impacts, reduce the transmission of vibrations through the battery pack 7010, etc. In addition, in some constructions and in some aspects, the shoe 7096 can have a high-friction outer surface. In these constructions and in these aspects, the shoe 7096 may prevent the battery pack 7010 from sliding or moving along a work surface.

In the illustrated construction and in some aspects, to assemble the battery pack 7010, an operator first connects the springs 7088 to interior sides of the latches 7056. The operator then compresses the springs 7088 against the vertical flanges 7072 of the housing halves 7016, 7018 and slides the latches 7056 into the latch recesses 7074 so that at least a portion of the laterally extending flanges 7084 extend through the slots 7076 in the housing halves 7016, 7018. The latches 7056 are then held in the latch recesses 7074 by the engagement between the ribs 7092 and the guides 7080 and between the ribs 7092 and the forward tabs 7046 of the housing halves 7016, 7018.

After the latches 7056 are positioned in the latch recesses 7074, the operator inserts electrical components, including the battery cells 7024, into the interior space 7020 defined by one of the housing halves 7016, 7018 (e.g., housing half 7016). In the illustrated construction of FIGS. 91-102 and in some aspects, the operator can also insert one or more pads or cushions 7098 into the housing halves 7016, 7018 to protect the electrical components. The operator then aligns the forward and rearward tabs 7046, 7050 of the cover 7014 with corresponding recesses 7050 in the housing halves 7016, 7018 and aligns the protrusions 7064 of the housing halves 7016, 7018 with the recesses 7062 of the cover 7014 before securing the cover 7014 and the housing halves 7016, 7018 together with the fasteners 7066.

In operation, the battery pack 7010 is electrically connectable to an electric device. To secure the battery pack 7010 to an electrical device, an operator aligns the tracks 7034 with corresponding recesses on the electrical device and aligns the connecting rails 7068 with corresponding recesses on the electrical device. The operator then moves the battery pack 7010 into engagement with the electrical device. In some constructions and in some aspects, it may be necessary to depress the buttons 7082 to move the latches 7056 from the locking position toward the unlocking position before engaging the battery pack 7010 and the electrical device. Once the battery pack 7010 and the electrical device are engaged, the springs 7088 move the locking elements 7094 into locking engagement in corresponding recesses in the electrical device to secure the battery pack 7010 to the electrical device.

Once the battery pack 7010 is connected to the electrical device, the battery pack 7010 is operable to supply electrical power to the electrical device (e.g., in constructions in which the electrical device is a power tool), or alternatively, the battery pack 7010 is operable to receive power from the electrical device (e.g., in constructions in which the electrical device is a battery charger).

To remove the battery pack 7010 from the electrical device, the operator depresses the buttons 7082, moving the latches 7056 from the locking position toward the unlocking position. The operator then moves the battery pack 7010 outwardly and away from the electrical device to disengage the tracks 7034 and the rails 7068 from complementary recesses in the electrical device.

In some constructions and in some aspects, the latches 7056 do not engage structure on the electrical device and the battery pack 7010 is not latched to the electrical device. For example, in some constructions and in some aspects (e.g., when the electrical device is a battery charger), the battery pack 7010 is supported on but not secured or latched to the electrical device.

In some constructions and in some aspects, the battery 7010 (and battery 50) can include a device which may prevent tampering of the battery 7010 or may indicate whether or not the battery 7010 was tampered. As shown in FIGS. 91-102, when the battery 50 is assembled, the housing halves 7016, 7018 create a parting line 7725.

Figure 98:
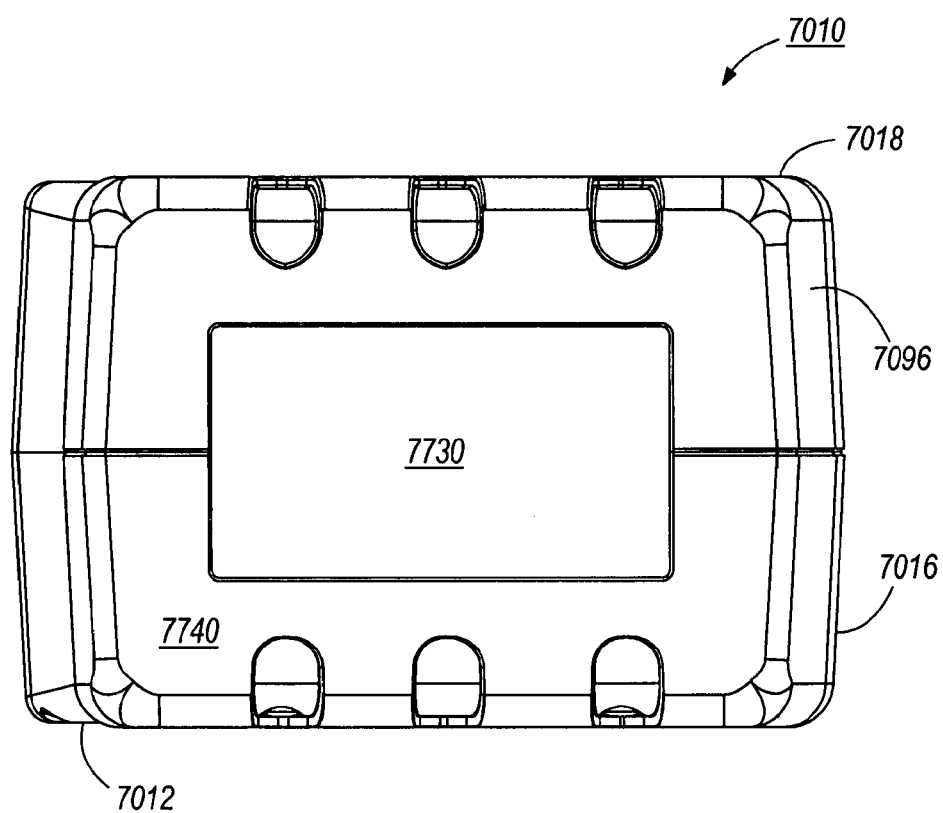
FIG. 98 is a bottom view of the battery pack of FIG. 91.
Figure 101:
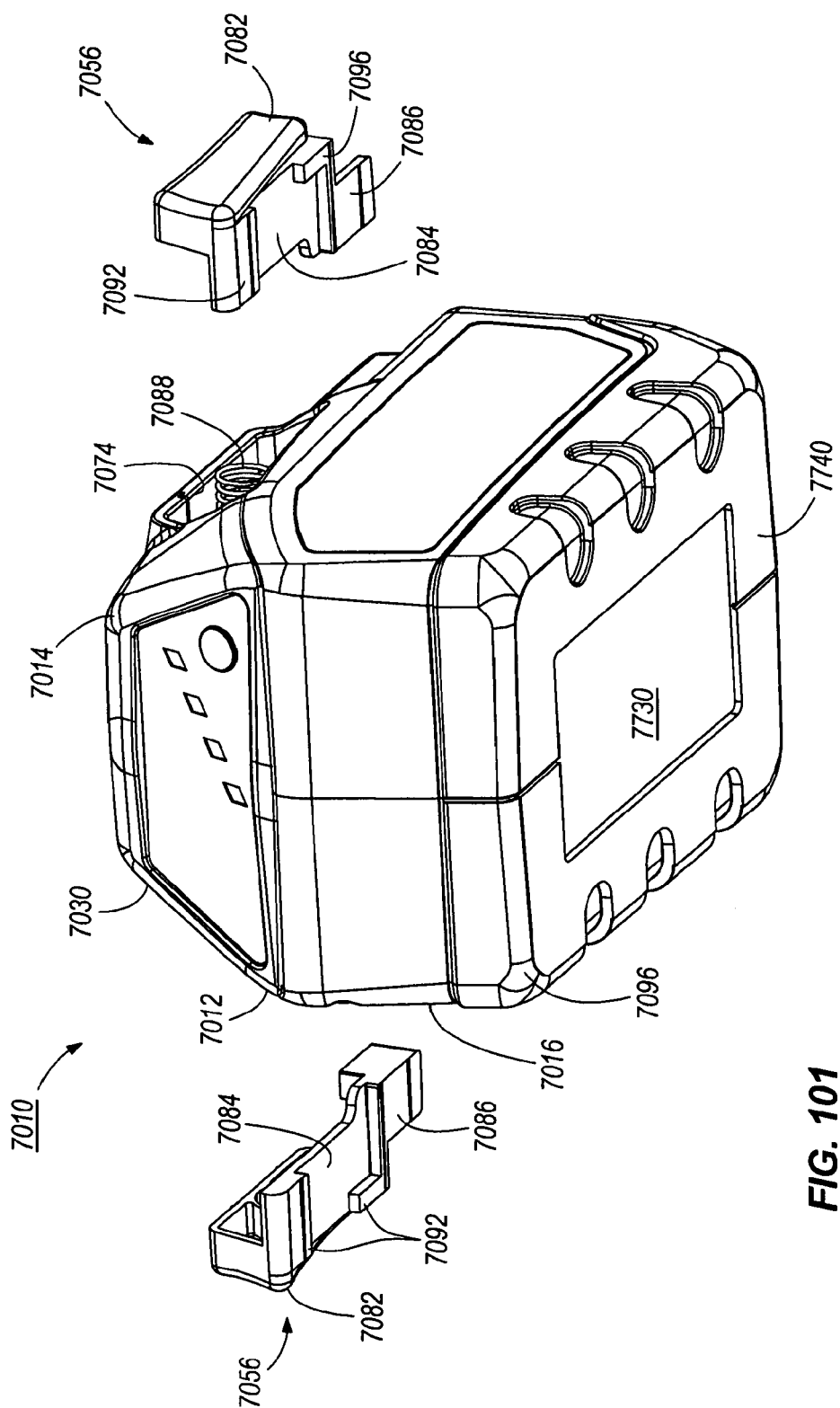
FIG. 101 is another partially exploded perspective view of the battery pack of FIG. 91.

As shown in FIGS. 98, 99 and 101, a device 7730 can be positioned substantially over a portion of the parting line 7725 to help indicate whether or not the battery 7010 has been tampered or attempted to be tampered. In one construction, the device 7730 includes a metal nameplate positioned on the bottom surface 7740 of the battery 7010 and substantially covering a portion of the parting line 7725. The nameplate 7730 can be adhered to the battery 7010 using various conventional methods as is known in the art. To service the battery 7010, an operator would need to cut through the nameplate 7730 along the parting line 7725 to separate the housing halves 7016, 7018.

In some constructions, only qualified operators can service the battery 7010. If a qualified operator notices that the nameplate 7730 of a particularly battery 7010 has been cut or modified, the operator can determine that the battery 7010 was tampered with. In some constructions where a battery 7010 has a warranty, the device 7730 can help indicate which batteries 7010 have valid claims and which batteries 7010 may have been tampered.

In other constructions, the device 7730 can include different one or more different materials or can be positioned on a different location on the battery 7010.

Also as shown in FIGS. 99 and 102, the battery 7010 includes a battery core 7805 and a terminal block 7810. In some constructions, the terminal block 7810 can be similar to the terminal block 105 shown and described above. In some constructions, such as the illustrated constructions of FIGS. 99 and 102, the battery core 7805 includes the battery cells 7024, endcaps 7820 and 7822 and the circuit 130.

In order to make the battery 7010 less susceptible to damage caused by vibration, the battery 50 includes several floating connections. The floating connections allow the various parts to move with respect to one another while still maintaining the electrical connection, in some instances. In other words, the connection between parts is not a rigid physical connection.

In the illustrated constructions, the battery cells 7024 are positioned within the endcaps 7820 and 7822 such that the battery cells 7024 are floating with respect to each other. The conductive straps 7830 link the respective battery cells 7024 to one another. Similarly, the battery core 7805 is floating with respect to the housing of the battery 50. The battery core 7805 is positioned within the battery 50 such that the core 7805 can move. The pads 7098 absorbs any impact from the battery core 7805 when the battery 7010 experiences vibrations. As shown in FIG. 99, the LEDs (not shown) which are included in the fuel gauge (not shown) of the circuit 130 protrude through openings 7840 of the battery cover 7014. The LEDs are fixed to the circuit 130 (e.g., PCB 7850) which is included in the battery core 7805. Accordingly, the LEDs are not rigidly fixed to the housing of the battery 7010. Also, the terminal block 7810 includes the various battery terminals (e.g., positive terminal, negative terminal and sense terminal) shown and described above. The terminal block 7810 includes a floating connection with respect to the battery core 7805 and also with the cover 7014 of the battery 7010. When the battery terminals (and in turn the terminal block 7810) couples with an electrical device, the terminal block 7810 may experience vibration caused by the device. Due to the floating connections between the terminal block 7810 and the housing of the battery 7010 and between the terminal block 7810 and the battery core 7805, the amount of vibration that transfers to the core 7805 and housing will be reduced.

Figure 103:
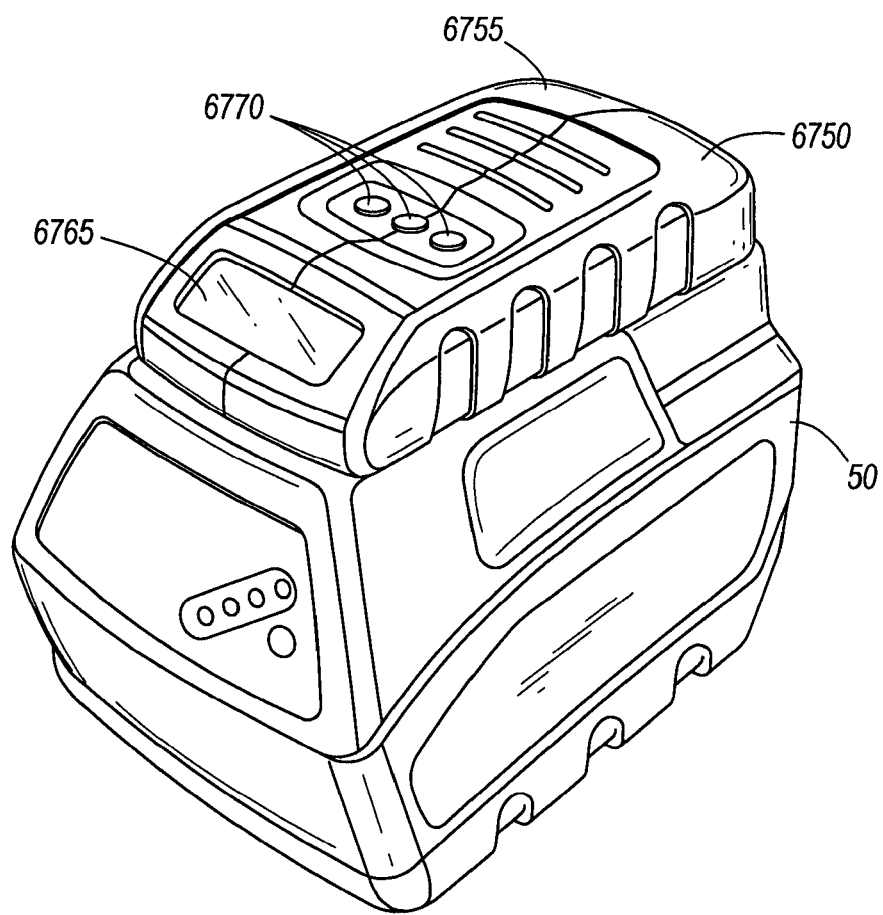
FIG. 103 is a perspective view of a battery connected to a reader.
Figure 104:
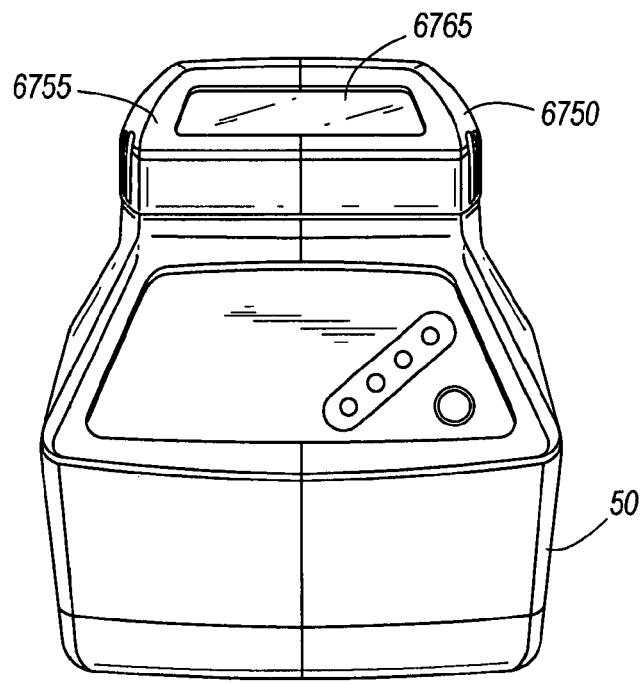
FIG. 104 is a front view of a battery and a reader, such as the battery and reader shown in FIG. 103.
Figure 105:
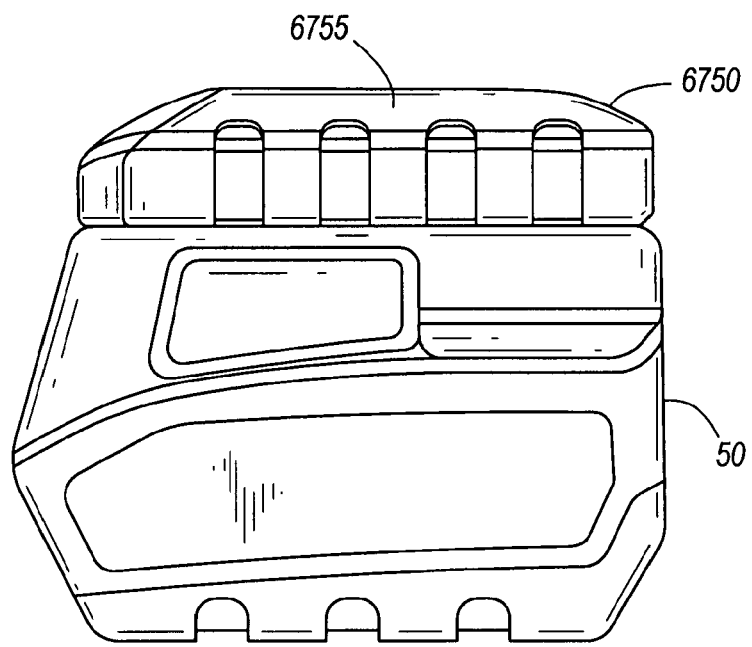
FIG. 105 is a side view of a battery and a reader, such as the battery and reader shown in FIG. 103

As discussed above, the battery 50 can store various information regarding certain battery parameters. In some constructions, the information can be extracted from the battery 50 via a service module 6750 (also referred to as a "reader"). As shown in FIGS. 103-105, the service module 6750 can connect to the terminals (not shown) of the battery 50 and download information stored in the battery 50.

In the illustrated constructions, the service module 6750 includes a housing 6755. The housing 6755 provides terminal supports (not shown). The service module 6750 can further include one or more service terminals (not shown) supported by the terminal supports and connectable to one or more terminals of the battery 50. The service terminals are connected to a reader circuit (not shown). The reader circuit can include a microcontroller and additional non-volatile memory to store the information received from the battery 50. The service module 6730 illustrated in FIGS. 103-105 is battery-powered. In some constructions, the service module 6750 includes a power source, such as a battery, within the housing 6755, or can be powered by the battery 50 when connected. In other constructions, the service module 6750 can include a power cord (not shown) and be adapted to receive AC-power.

As shown in FIG. 103-105, the service module 6750 can further include a display 6755, such as for example, a liquid-crystal display, an LED display or the like. The service module 6750 can also include one or more user activated switches 6770. In some constructions, the display 6755 can display the information stored in the battery 50. In other constructions, the display 6755 can display the information being downloaded into the service module 6750 from the battery 50. In further constructions, the display 6750 can display various functions or menus that a user can select and navigate through to control operation of the service module 6750. For example, a user can select what type of information to download from the battery 50 via one or more switch 6770. In the illustrated constructions, the switches 6770 are push-button switches. In other constructions, the switches 6770 can include various additional inputs, such as a touch screen, a keypad, a serial port, or the like. The service module 6770 can also include one or more output ports (not shown) for transferring downloaded information to another device, such as a computer, for example.

In further constructions, the service module 6750 simply reads information stored in the microcontroller 140 of the battery 50 and displays the information on the display 6755. In these constructions, the service module 6750 does not store the information that is read from the battery 50 or displayed on the display 6755.

The constructions described above and illustrated in the figures are presented by way of example only and are not intended as a limitation upon the concepts and principles of the present invention. As such, it will be appreciated by one having ordinary skill in the art that various changes in the elements and their configuration and arrangement are possible without departing from the spirit and scope of the present invention as set forth in the appended claims.

What is claimed is:

1. A battery pack operable to provide power to a hand-held power tool, the battery pack comprising:
   a housing connectable to and supportable by the hand-held power tool;
   a terminal for electrically connecting the battery pack to the hand-held power tool;
   a cylindrical first battery cell within the housing and defining a first axis;
   a cylindrical second battery cell within the housing and defining a second axis;
   a cylindrical third battery cell within the housing and defining a third axis;
   a cylindrical fourth battery cell within the housing and defining a fourth axis; and
   a cylindrical fifth battery cell within the housing and defining a fifth axis,
   wherein the first battery cell and the second battery cell are arranged with the first axis and the second axis in a common plane, the third axis, the fourth axis, and the fifth axis are each substantially perpendicular to the first battery cell and the second battery cell, the third battery cell is adjacent to the fourth battery cell, the fourth battery cell is adjacent to the fifth battery cell, and the fifth battery cell is adjacent to the third battery cell, the third axis and the fourth axis form a first plane, the fourth axis and the fifth axis form a second plane, and the fifth axis and the third axis form a third plane, and wherein the first plane is not parallel and not perpendicular to the second plane or the third plane, the second plane is not parallel and not perpendicular to the first plane or the third plane, the third plane is not parallel and not perpendicular to the first plane or the second plane, and the first axis and the second axis are not parallel to any of the first plane, the second plane, or the third plane.

2. The battery pack of claim 1, further comprising a locking member configured to secure the battery pack to the power tool.

3. The battery pack of claim 1, wherein the first battery cell has a lithium-based chemistry.

4. The battery pack of claim 3, wherein the lithium-based chemistry is a lithium-ion chemistry.

5. The battery pack of claim 1, wherein the battery pack has a nominal voltage of at least approximately 12V.

6. The battery pack of claim 1, wherein the second battery cell has a cell length between approximately 60 millimeters and approximately 70 millimeters.

7. The battery pack of claim 6, wherein the third battery cell has a cell length between approximately 60 millimeters and approximately 70 millimeters.

8. The battery pack of claim 7, wherein the first battery cell has a cell length between approximately 60 millimeters and approximately 70 millimeters.

9. The battery pack of claim 1, further comprising a printed circuit board.

10. The battery pack of claim 9, wherein the printed circuit board includes a battery pack control device.

11. The battery pack of claim 10, wherein the control device includes a switch.

* * * * *